US010018676B2

(12) United States Patent
Bock et al.

(10) Patent No.: US 10,018,676 B2
(45) Date of Patent: Jul. 10, 2018

(54) ELECTROMAGNETIC SWITCH INTERLOCK SYSTEM AND METHOD

(71) Applicant: ROCKWELL AUTOMATION TECHNOLOGIES, INC., Mayfield Heights, OH (US)

(72) Inventors: Christopher H. Bock, Milwaukee, WI (US); Christopher J. Wieloch, Brookfield, WI (US); James J. Kinsella, Brentwood, TN (US); Stefan T. Dziekonski, Greendale, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 5 days.

(21) Appl. No.: 14/832,762

(22) Filed: Aug. 21, 2015

(65) Prior Publication Data

US 2016/0133417 A1   May 12, 2016

Related U.S. Application Data

(60) Provisional application No. 62/076,392, filed on Nov. 6, 2014.

(51) Int. Cl.
*H01H 9/20* (2006.01)
*G01R 31/327* (2006.01)
(Continued)

(52) U.S. Cl.
CPC ............ *G01R 31/327* (2013.01); *G01K 7/00* (2013.01); *H01H 9/26* (2013.01); *H01H 47/002* (2013.01);
(Continued)

(58) Field of Classification Search
CPC .................................................. H01H 50/323
(Continued)

(56) References Cited

U.S. PATENT DOCUMENTS

| 1,467,745 A | 9/1923 | Zederbohm |
| 1,778,976 A | 10/1930 | Hunter |

(Continued)

FOREIGN PATENT DOCUMENTS

| AT | 88601 T | 5/1993 |
| BE | 514142 A | 9/1952 |

(Continued)

OTHER PUBLICATIONS

Extended European Search Report for EP Application No. 15193373.6 dated Mar. 8, 2016; 10 Pages.
(Continued)

*Primary Examiner* — Alexander Talpalatski
(74) *Attorney, Agent, or Firm* — Fletcher Yoder, P.C.

(57) ABSTRACT

One embodiment describes an interlock for an electromechanical switching system, which includes a housing; a first camming lockout member disposed in the housing and that contacts an auxiliary operator of a first electromechanical switching device; a second camming lockout member disposed in the housing and that contacts an auxiliary operator of a second electromechanical switching device, which the first camming lockout members contacts the second camming lockout member when the first camming lockout member is moved to an actuated position by the first electromechanical switching device to prevent movement of the second camming lockout member to an actuated position.

21 Claims, 53 Drawing Sheets

(51) Int. Cl.
*H01H 50/16* (2006.01)
*G01K 7/00* (2006.01)
*H01H 47/00* (2006.01)
*H01H 47/22* (2006.01)
*H01H 50/00* (2006.01)
*H01H 47/26* (2006.01)
*H01H 47/02* (2006.01)
*H01H 50/38* (2006.01)
*H01H 50/32* (2006.01)
*H01H 89/00* (2006.01)
*H02P 1/26* (2006.01)
*H01H 9/26* (2006.01)
*H01H 9/30* (2006.01)
*H02P 1/32* (2006.01)
*H01H 9/56* (2006.01)
*H01H 71/08* (2006.01)

(52) U.S. Cl.
CPC ............ *H01H 47/02* (2013.01); *H01H 47/22* (2013.01); *H01H 47/26* (2013.01); *H01H 50/002* (2013.01); *H01H 50/16* (2013.01); *H01H 50/323* (2013.01); *H01H 50/38* (2013.01); *H01H 89/00* (2013.01); *H02P 1/26* (2013.01); *H01H 9/56* (2013.01); *H01H 71/082* (2013.01); *H01H 2009/307* (2013.01); *H02P 1/32* (2013.01)

(58) Field of Classification Search
USPC ........................................ 335/160; 200/50.33
See application file for complete search history.

(56) References Cited

U.S. PATENT DOCUMENTS

| | | | |
|---|---|---|---|
| 3,210,491 A * | 10/1965 | Di Marco | H01H 50/323 200/50.35 |
| 3,510,612 A * | 5/1970 | Ward | H01H 50/323 200/50.33 |
| 3,624,471 A | 11/1971 | Japp et al. | |
| 3,875,463 A | 4/1975 | Reuter et al. | |
| 3,919,675 A * | 11/1975 | Degenhart | H01H 50/323 200/50.36 |
| 3,934,110 A | 1/1976 | Denis | |
| 3,982,137 A | 9/1976 | Penrod | |
| 4,019,017 A | 4/1977 | Sitek et al. | |
| 4,056,836 A | 11/1977 | Knauer | |
| 4,070,605 A | 1/1978 | Hoeppner | |
| 4,128,749 A | 12/1978 | Spaderna | |
| 4,152,634 A | 5/1979 | Penrod | |
| 4,268,787 A | 5/1981 | Sloan | |
| 4,354,215 A | 10/1982 | van der Scheer | |
| 4,360,847 A | 11/1982 | Bloomer et al. | |
| 4,398,097 A | 8/1983 | Schell et al. | |
| 4,409,533 A | 10/1983 | Kawabata | |
| 4,413,218 A | 11/1983 | Taylor et al. | |
| 4,425,539 A | 1/1984 | Wills | |
| 4,434,394 A | 2/1984 | Kellogg et al. | |
| 4,445,018 A | 4/1984 | Holmgren | |
| 4,471,183 A | 9/1984 | Bauer et al. | |
| 4,491,708 A | 1/1985 | O'Leary et al. | |
| 4,506,245 A * | 3/1985 | Lerude | H01H 50/045 200/50.32 |
| 4,513,181 A * | 4/1985 | Boysen | H01H 50/323 200/50.33 |
| 4,525,762 A | 6/1985 | Norris | |
| 4,616,203 A | 10/1986 | Kakizoe et al. | |
| 4,642,481 A | 2/1987 | Bielinski et al. | |
| 4,670,810 A | 6/1987 | Valeur | |
| 4,729,056 A | 3/1988 | Edwards et al. | |
| 4,746,885 A * | 5/1988 | Ogata | H01H 50/323 218/113 |
| 4,761,563 A | 8/1988 | Ross et al. | |
| 4,764,840 A | 8/1988 | Petrie et al. | |
| 4,864,157 A | 9/1989 | Dickey | |
| 4,897,755 A | 1/1990 | Polster | |
| 4,922,363 A | 5/1990 | Long et al. | |
| 4,959,746 A | 9/1990 | Hongel | |
| 5,070,291 A | 12/1991 | Nakamura et al. | |
| 5,255,152 A | 10/1993 | Estes, III et al. | |
| 5,440,180 A | 8/1995 | Devault et al. | |
| 5,481,171 A | 1/1996 | Woginrich, Jr. | |
| 5,493,091 A | 2/1996 | Devautour et al. | |
| 5,514,844 A | 5/1996 | Hamano et al. | |
| 5,559,426 A | 9/1996 | Shea et al. | |
| 5,559,657 A | 9/1996 | Lam | |
| 5,757,214 A | 5/1998 | Stoddard et al. | |
| 5,808,851 A | 9/1998 | Birrell | |
| 5,933,304 A | 8/1999 | Irissou | |
| 5,959,517 A | 9/1999 | Wieloch et al. | |
| 6,025,693 A | 2/2000 | Smith | |
| 6,087,800 A | 7/2000 | Becker et al. | |
| 6,140,896 A * | 10/2000 | Heckenkamp | H01H 50/323 200/50.32 |
| 6,377,143 B1 | 4/2002 | Zhou et al. | |
| 6,771,479 B2 | 8/2004 | Vanheesbeke | |
| 6,943,654 B2 | 9/2005 | Zhou et al. | |
| 6,956,728 B2 | 10/2005 | Zhou et al. | |
| 6,967,549 B2 | 11/2005 | Zhou et al. | |
| 7,038,423 B2 | 5/2006 | Reed et al. | |
| 7,057,311 B1 | 6/2006 | Zhou et al. | |
| 7,196,434 B2 | 3/2007 | Zhou et al. | |
| 7,224,557 B2 | 5/2007 | Kinsella et al. | |
| 7,317,264 B2 | 1/2008 | Kinsella et al. | |
| 7,462,791 B1 * | 12/2008 | Flegel | H01H 9/26 200/50.32 |
| 7,576,957 B2 | 8/2009 | Zhou et al. | |
| 7,812,563 B2 | 10/2010 | Unsworth et al. | |
| 7,868,581 B2 | 1/2011 | Qian et al. | |
| 8,305,024 B2 | 11/2012 | Unsworth et al. | |
| 8,310,111 B2 | 11/2012 | Weichert et al. | |
| 8,598,836 B1 | 12/2013 | Rabinovich | |
| 8,610,314 B2 | 12/2013 | Weichert et al. | |
| 2002/0050877 A1 | 5/2002 | Swartzentruber et al. | |
| 2002/0093774 A1 | 7/2002 | Chung | |
| 2003/0223738 A1 | 12/2003 | Wayne et al. | |
| 2004/0169976 A1 | 9/2004 | Zhou et al. | |
| 2004/0245964 A1 | 12/2004 | Schoonenberg | |
| 2005/0013085 A1 | 1/2005 | Kinsella et al. | |
| 2005/0122085 A1 | 6/2005 | Kinsella et al. | |
| 2008/0266733 A1 | 10/2008 | O'leary et al. | |
| 2009/0027824 A1 | 1/2009 | Allen et al. | |
| 2010/0225177 A1 | 9/2010 | Weichert et al. | |
| 2010/0265629 A1 | 10/2010 | Beckerman | |
| 2011/0210615 A1 | 9/2011 | Unsworth et al. | |
| 2013/0025304 A1 | 1/2013 | Dorman | |
| 2013/0169287 A1 | 7/2013 | Fink et al. | |
| 2013/0235505 A1 | 9/2013 | Takeshita et al. | |
| 2014/0265995 A1 | 9/2014 | Kinsella et al. | |

FOREIGN PATENT DOCUMENTS

| | | |
|---|---|---|
| CN | 2415456 Y | 1/2001 |
| CN | 2439101 Y | 7/2001 |
| CN | 2701057 Y | 5/2005 |
| CN | 101044672 A | 9/2007 |
| CN | 201075345 Y | 6/2008 |
| DE | 419075 C | 9/1925 |
| DE | 951020 C | 10/1956 |
| DE | 1264579 B | 3/1968 |
| DE | 2263563 A1 | 7/1974 |
| DE | 4105698 A1 | 8/1992 |
| DE | 4224620 C1 | 3/1994 |
| DE | 19809828 C1 | 7/1999 |
| DE | 102005035658 B3 | 4/2007 |
| EP | 0440498 A2 | 8/1991 |
| EP | 1137032 A2 | 9/2001 |
| EP | 1453073 A1 | 9/2004 |
| EP | 1492142 A2 | 12/2004 |
| EP | 1820259 B1 | 9/2011 |
| GB | 1515563 A | 6/1978 |
| GB | 2073974 A | 10/1981 |

(56) References Cited

FOREIGN PATENT DOCUMENTS

| GB | 2173657 A | 10/1986 |
|---|---|---|
| GB | 2236919 A | 4/1991 |
| GB | 2303005 A | 5/1997 |
| JP | 2014096244 A | 5/2014 |
| WO | 8807283 A1 | 9/1988 |
| WO | 9900811 A1 | 1/1999 |
| WO | 2003028056 A1 | 4/2003 |
| WO | 2006035194 A2 | 4/2006 |

OTHER PUBLICATIONS

Extended European Search Report for EP Application No. 15193379.3 dated Mar. 23, 2016; 10 Pages.
Extended European Search Report for EP Application No. 15193374.4 dated Mar. 21, 2016; 10 Pages.
Extended European Search Report for EP Application No. 15193377.7 dated Mar. 10, 2016; 10 Pages.
Extended European Search Report for EP Application No. 15193378.5 dated Mar. 29, 2016; 11 Pages.
European Partial Search Report for EP Application No. 15193380.1 dated Mar. 8, 2016; 6 Pages.
Extended European Search Report for EP Application No. 15193383.5 dated Mar. 15, 2016; 12 Pages.
Extended European Search Report for EP Application No. 15193380 dated Jun. 9, 2016; 12 Pages.
Wood, W.S.; Flynn, F.; Shanmugasundaram, A. Transient torques in induction motors, due to switching of the supply. Proceedings of the Institution of Electrical Engineers. Jul. 1965, vol. 112, 7, p. 1348-1354.
Kun-Long Chen; Nanming Chen. A New Method for Power Current Measurement Using a Coreless Hall Effect Current Transformer. IEEE Instrumentation and Measurement Society, May 24, 2010, vol. 60, 1, p. 158-169.
Mulukutla, S.S.; Gulachenski, Edward M. A Critical Survey of Considerations in Maintaining Process Continuity During Voltage Dips While Protecting Motors with Reclosing and Bus-Transfer Practices. IEEE Transactions on Power Systems, Aug. 1992, vol. 7, 3, p. 1299-1305.
Cadirci, I.; Ermis, M.; Nalcacl, E.; Ertan, B., et. al. A Solid State Direct on Line Starter for Medium Voltage Induction Motors with Minimized Current and Torque Pulsations. IEEE Transactions on Energy Conversion. Sep. 1999, vol. 14, 3, p. 402-412.
Fischer, F. V. Applied Power Electronics in the Field of Voltage Dip-Proofing. 1992. DPI Binder Rev, 1.0.
Passey, Douglas A.; Chen, Chun F. Arc Suppression of a DC Energized Contactor Under Inductive Load. IEEE Transactions on Industry Applications, Nov. 1985, vol. IA-21, 6, p. 1354-1358.
Peter Vas. Electrical Machines and Drives: A Space-Vector Theory Approach. 1992. Clarendon Press, 1 edition. ISBN-13: 978-0198593782, ISBN-10: 0198593783.
Faiz, J.; Ghaneei, M.; Keyhani, A. Performance Analysis of Fast Reclosing Transients in Induction Motors. IEEE Transactions on Energy Conversion. Mar. 1999, vol. 14, 1, p. 101-107.
Hoffman, D.L. et. al. How New Technology Developments Will Lower Wind Energy Costs. Integration of Wide-Scale Renewable Resources Into the Power Delivery System, 2009 Cigre/IEE PES Joint Symposium. Jul. 29-31, 2009.
J. Bendl; L. Schreier.; J. Kohutka. Torque and current stress by non-simultaneous switching-on of phases of a three-phase induction motor. Acta Tech. CSAV, 1991, vol. 36, 3, p. 359-373.
J. Bendl; L. Schreier. Torque and current stress of a three-phase induction motor due to non-simultaneous switch-on. Electric Machines & Power Systems. 1993. vol. 21, 5, p. 591-603.

Peter Vas. Electrical Machines and Drives, A Space-Vector Theory Approach. Oxford Science Publications, Oxford, 1992.
M.D. McCulloch. The Effects of Voltage Dips on Induction Motors. DPI Binder Rev. 1.0. 1992, MeasuriLogic Inc.
Hamid A. Toliyat; Gerald B. Kliman. Handbook of Electric Motors. CRC Press, Apr. 22, 2004. ISBN 9780824741051.
H.G. Jung; J.Y. Hwang; P.J. Yoon; J.H. Kim. Resistance Estimation of a PWM-Driven Solenoid. International Journal of Automative Technology. 2007, vol. 8, 2, p. 249-258.
Hamid A. Toliyat, Gerald B. Kliman. Handbook of Electric Moteros, Second Edition, Revised and Expanded. 2004 Marcel Dekker, Inc. ISBN: 0-8247-4105-6.
Michael L. Gasperi, Stefan T. Dziekonski, A Platform for Star-Delta Starter Research.
F. C. Aldous, Starting and Speed Control of Induction Motors. The Mechanical Engineer, Feb. 28, 1913, p. 224-226.
Brunke, et al. Elimination of Transformer Inrush Currents by Controlled Switching—Part I—Theoretical Considerations. http://ewh.ieee.org/soc/pes/switchgear/CIGRECSseminar/Txinrushpart1.pdf. Last accessed May 29, 2010, 6 pages.
Brunke, et al. Elimination of Transformer Inrush Currents by Controlled Switching—Part II—Application and Performance Considerations. http://ewh.ieee.org/soc/pes/switchgear/CIGRECSseminar/Txinrushpart2.pdf. Last accessed May 29, 2010, 6 pages.
E.P. Dick, D. Fischer, R. Marttila, C Mulkins, Point-on-Wave Capacitor Switching and Adjustable Speed Drives. IEEE Transactions on Power Delivery, vol. 11, No. 3, Jul. 1996.
Xin Zhou, Lian Zou, Engelbert Hetzmannseder, Asynchronous modular contactor for intelligent motor control applications. Holm Conference on Electrical Contacts, Chicago, 2005.
G. Moraw, W. Richter, H Hutegger, J. Wogerbauer, Point on wave controlled switching of high voltage circuit breakers. Int. Conference on Large High Voltage Electric Systems, Paris, 1988.
Xu Zhihong, Zhang, Intelligent Control Technology of AC Contactor. Peiming, 2005, IEEE/PES Transmission and Distribution Conference & Exhibition: Asia and Pacific Dalian, China.
Peter Unsworth, Elimination of inrush currents in transformers. University of Sussex, 2003.
Peter Unsworth, Star-Delta Starting with Two-stage Contactor Closure, University of Sussex, 2003.
Chinese Office Action dated Apr. 20, 2012 for Chinese Patent Application No. 201010127293.1, 21 pages.
European Search Report dated Oct. 24, 2011 for European Patent Application No. 09007248.9-2214/2226820, 6 pages.
Robbie F. McElveen, Member, IEEE, and Michael K. Toney, Senior Member, IEEE, Starting High-Inertia Loads, IEEE Transactions on Industry Applications, vol. 37, No. 1, Jan./Feb. 2001.
Phillip W. Rowland, P.E. IEEE Member, Low impact motor control with start-delta starting, 1998.
B. G. Lamme, The story of the induction motor, Chief Engineer, Westinghouse Electric & Mfg. Co., A.I. E. E. Sections in District No. 5, at Detroit, Mich., Mar. 18, 1921.
Anderson, J. Electric motor starters. Journal of the Institution of Electrical Engineers, vol. 60, No. 310, pp. 619-640, Aug. 20, 1921.
The Institute of Electical and Electronics Engineers, Inc., IEEE Recommended practice for electric power distribution for Industrial Plants, ANSI/IEEE Std 141-1986 (Revision of IEEE Std 141-1976).
J.F. MacGregor and T. Kourtl, Statistical Process Control of Multivariate Processes, Control Fag. Practice, vol. 3, No. 3, pp. 403-414, 1995.
John F. MacGregor, Christiane Jaeckle, Costas Kiparissides, M. Koutoudi, Process Monitoring and Diagnosis by Multiblock PLS Mehtods, May 1994 vol. 40, No. 5.

\* cited by examiner

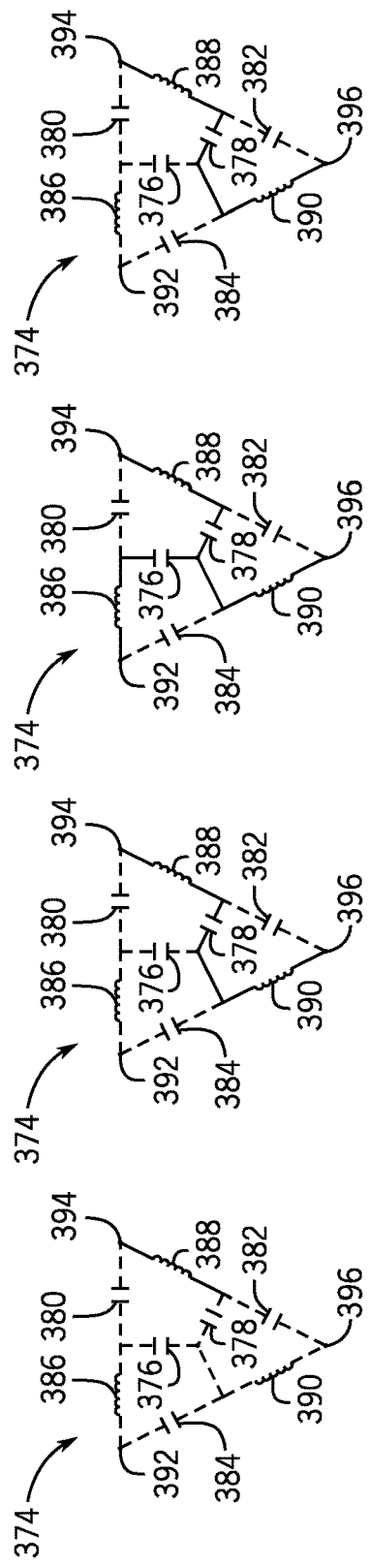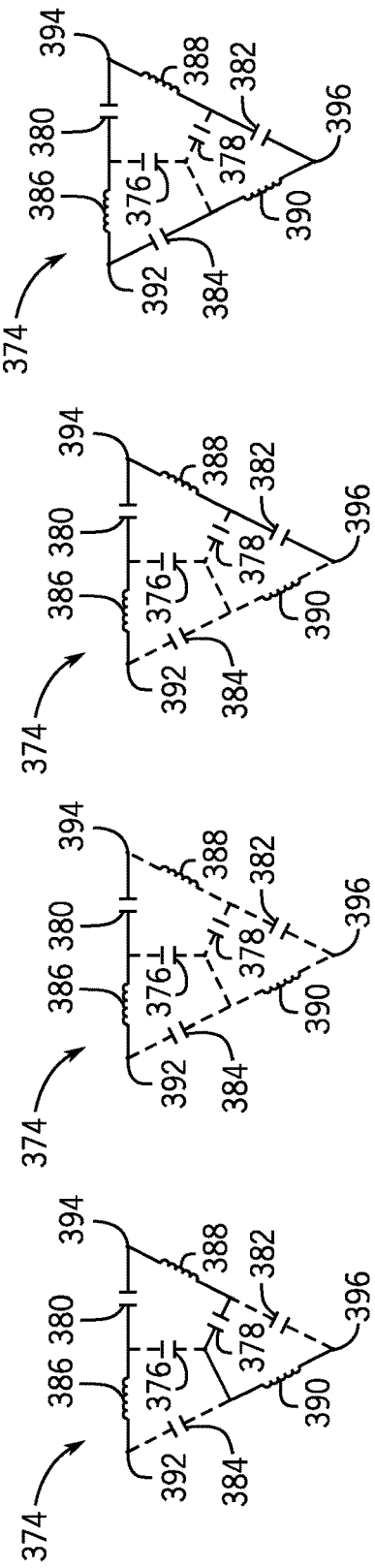

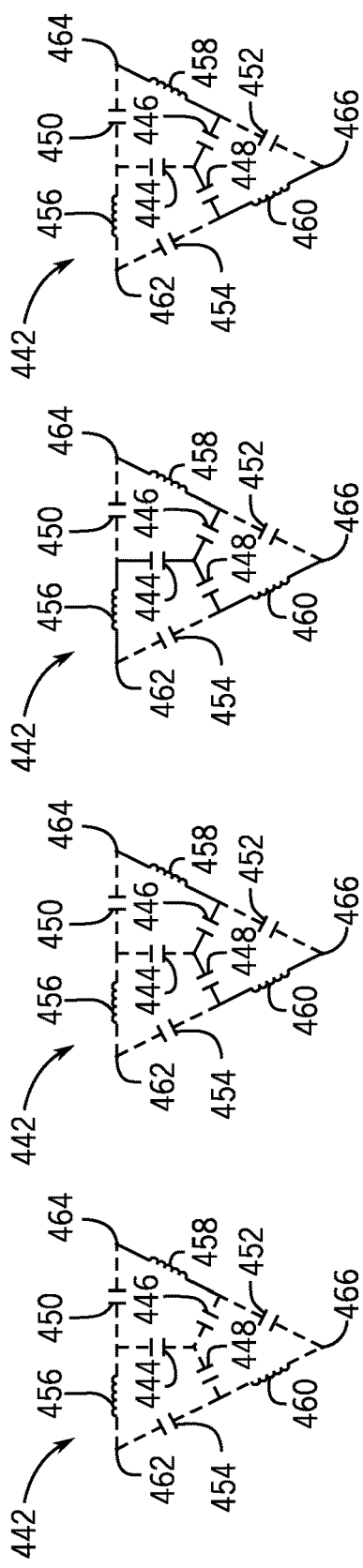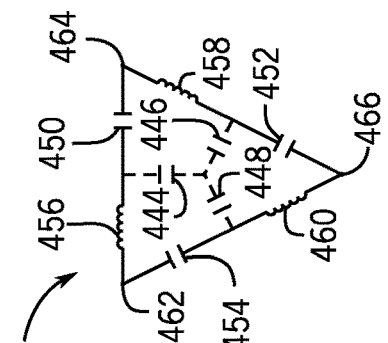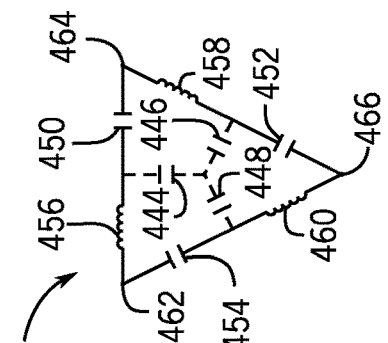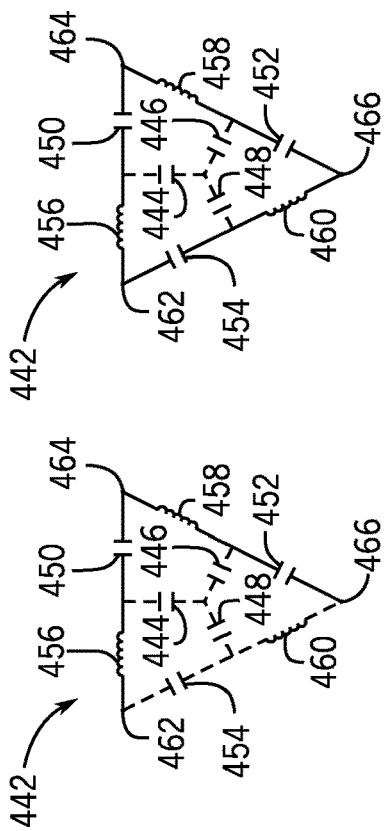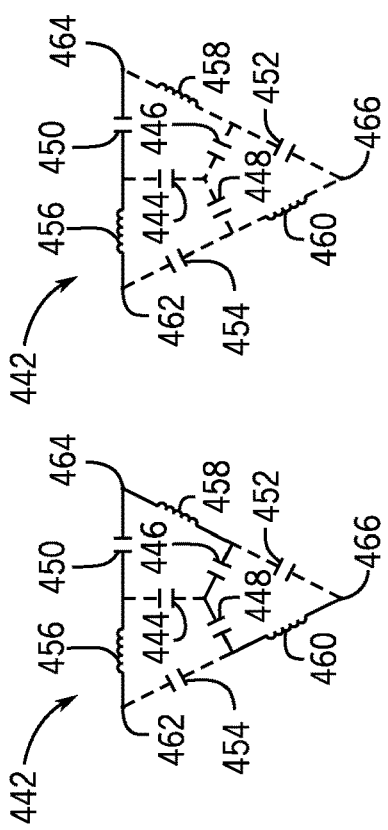

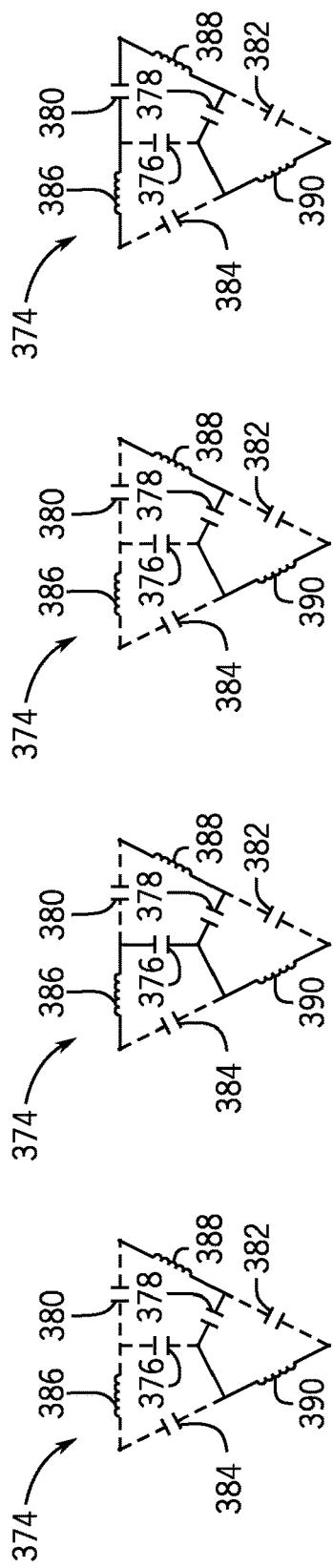

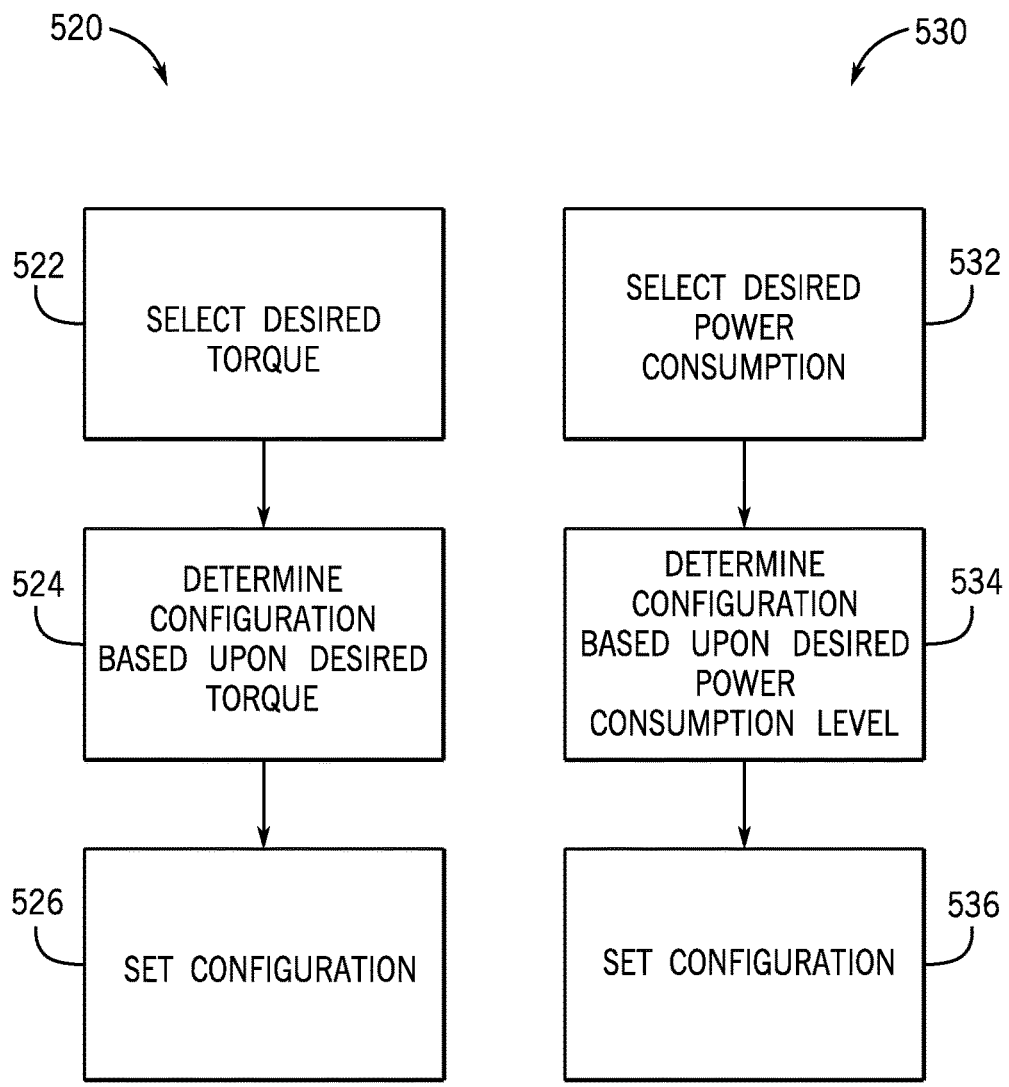

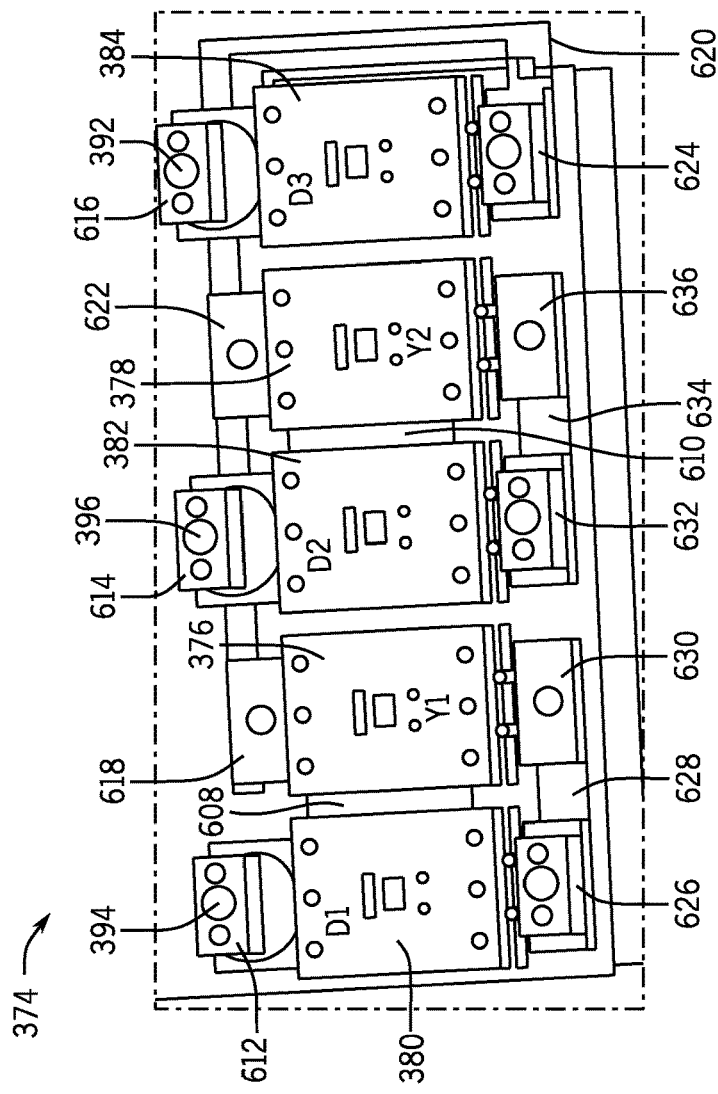
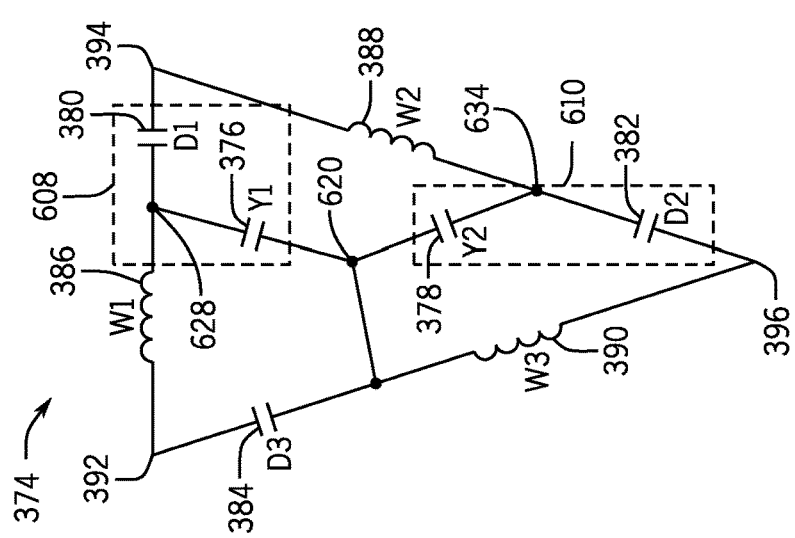
FIG. 61
FIG. 60

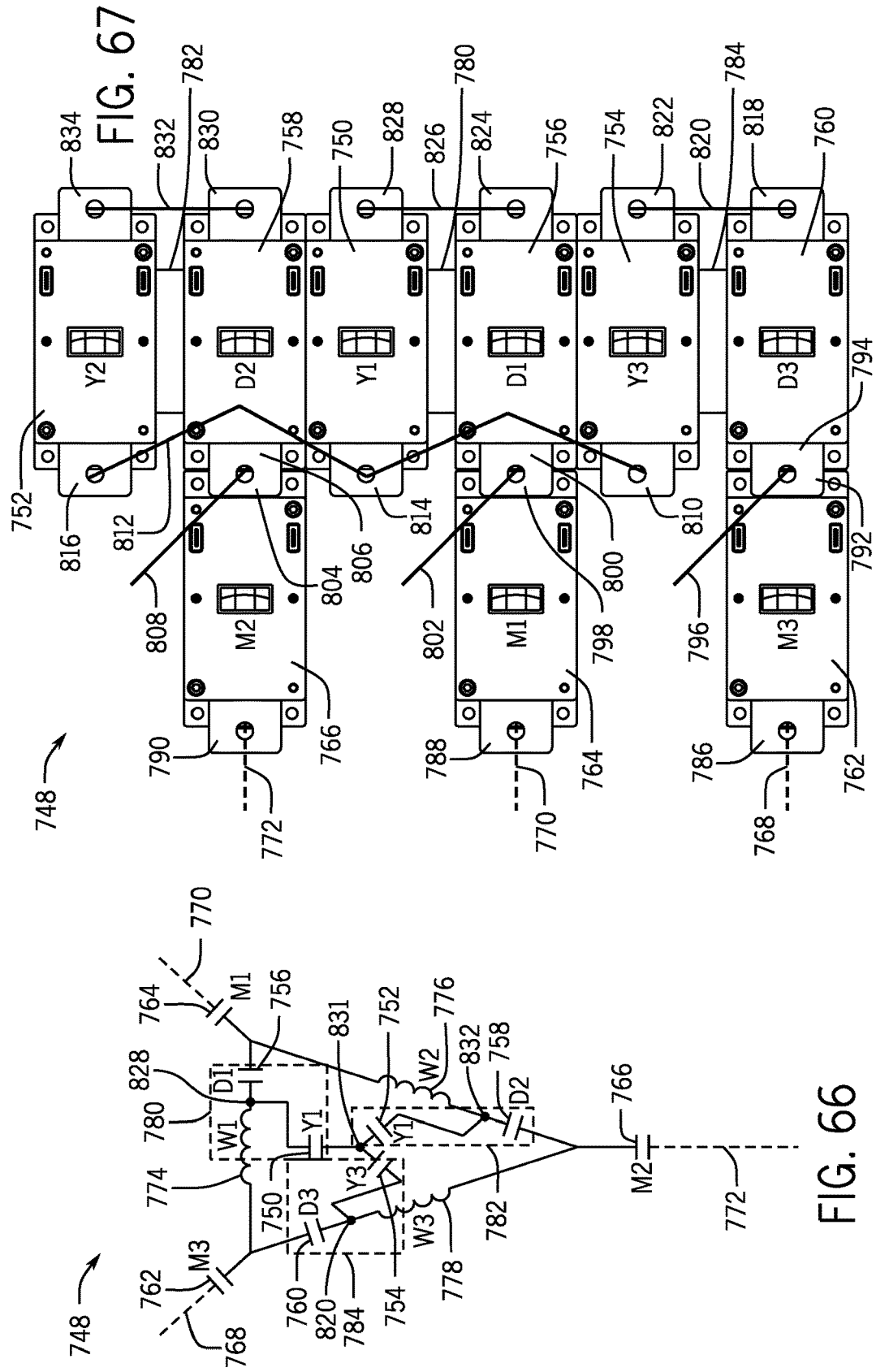

ELECTROMAGNETIC SWITCH INTERLOCK SYSTEM AND METHOD

BACKGROUND

The present disclosure relates generally to switching devices, and more particularly to operation and configuration of the switching devices.

Switching devices are generally used throughout industrial, commercial, material handling, process and manufacturing settings, to mention only a few. As used herein, "switching device" is generally intended to describe any electromechanical switching device, such as mechanical switching devices (e.g., a contactor, a relay, air break devices, and controlled atmosphere devices) or solid state devices (e.g., a silicon-controlled rectifier (SCR)). More specifically, switching devices generally open to disconnect electric power from a load and close to connect electric power to the load. For example, switching devices may connect and disconnect three-phase electric power to an electric motor. As the switching devices open or close, electric power may be discharged as an electric arc and/or cause current oscillations to be supplied to the load, which may result in torque oscillations. To facilitate reducing likelihood and/or magnitude of such effects, the switching devices may be opened and/or closed at specific points on the electric power waveform. Such carefully timed switching is sometimes referred to as "point on wave" or "POW" switching. However, the opening and closing of the switching devices are generally non-instantaneous. For example, there may be a slight delay between when the make instruction is given and when the switching device actually makes (i.e., closes). Similarly, there may be a slight delay between when break instruction is given and when the switching device actually breaks (i.e., opens).

Accordingly, to facilitate making or breaking at a specific point on the electric power waveform, it would be beneficial to determine the delay. More specifically, this may include determining when the switching device makes or breaks.

Additionally, since the switching devices may make to supply electric power to a load, it would be beneficial to determine if there are any faults, such as a phase-to-ground short or a phase-to-phase short, before fully connecting electric power to the load. For example, testing for faults before fully connecting electric power may enable the faults to be detected while minimizing the peak current and/or let through energy resulting from the fault condition.

Furthermore, switching devices may be utilized to provide electric power to electric motors. For example, in some applications, the switching devices may be included in a wye-delta starter or some other motor controlling device. As used herein, a "wye-delta starter" is intended to describe a device that controls operation (e.g., speed, torque, and/or power consumption) of an electric motor by connecting winding in the electric motor in a wye configuration, a delta configuration, or a mixed wye-delta configuration. In fact, in addition to controlling starting of the electric motor, the wye-delta starter may control operation and even stopping of the electric motor.

More specifically, the electric motor may be started by connecting the windings in the motor in a wye configuration to reduce voltage supplied to the windings, which may also reduce the torque produced by the motor. Once started, the windings in the motor may be connected in a delta configuration to increase the voltage supplied to the windings, which may increase the torque produced by the motor. However, as described above, opening and closing the switching devices to connect the electric motor in the wye configuration and to transition from the wye configuration to the delta configuration may discharge electric power (e.g., arcing) and/or cause current oscillations to be supplied to the motor. In some embodiments, reducing the likelihood and magnitude of electric arcing and/or current oscillations may increase the lifespan of the switching devices.

Accordingly, it would be beneficial to reduce the likelihood and magnitude of electric arcing and/or currently oscillations produced when making or breaking a switching device. More specifically, this may include opening and/or closing switching devices in the wye-delta starter at specific points on the electric power waveform.

Moreover, wye-delta starters generally supply electric power to electric motors to run the motors in wye or delta configuration. More specifically, when the motor is run in a wye configuration, the electric motor may use less electric power and produce a first (e.g., lower) torque level, and when the motor is run in a delta configuration, the electric motor may use more electric power and produce a second (e.g., higher) torque level. In other words, running the electric motor with a wye-delta starter enables two operating modes (e.g., less power consumption lower torque and more power consumption higher torque). However, there may be instances when it is desirable to operate the motor somewhere between the two operating modes. For example, it may be desirable to produce more torque than produced when operating in the wye configuration, but consume less electric power than consumed when operating in the delta configuration. Accordingly, it would be beneficial to increase the operational flexibility of a wye-delta starter.

After the electric motor is spinning, electric power may be disconnected from the motor for various reasons, such as a brownout or a lightning strike. More specifically, switching devices (e.g., contactors) may open to disconnect electric power. Once power is disconnected, the momentum of the rotation may keep the motor spinning, but friction (e.g., air resistance) may begin to slow the motor. As such, the frequency of the motor gradually decreases. Subsequently, the electric motor may be restarted by re-closing the switching devices to connect electric power to the motor. In some embodiments, such as reliability sensitive implementation, it may be desirable to restart the electric motor as soon as possible, for example, while the electric motor is still spinning. However, since the frequency of the motor is changing, the phase relationship of the motor relative to the electric power source is also changing, thereby creating a "beat" condition. Therefore, the motor may be out of phase from the source when re-closing the switching devices to reconnect electric power to the motor, which may result in current oscillations and/or torque oscillations. In some embodiments, minimizing the likelihood and magnitude of current oscillations and/or torque oscillations may increase the lifespan of the electric motor and/or a connected load. In some embodiments, minimizing peaks in the current may reduces nuisance tripping of protective circuitry (e.g., circuit breaker or fuses) and, thus, enable the protective circuitry to be sized more advantageously.

Accordingly, it would be beneficial to minimize the magnitude and likelihood of current oscillations and/or torque oscillations produced when the electric motor is restarted. More specifically, this may include restarting the electric motor when the phase of the electric power and the electric motor are substantially in phase, when the phase of the electric power is leading the phase of the electric motor, or at some other desired condition.

As will be described in more detail below, many of the benefits described may be enabled by increasing the amount of control over the electric power supplied to a load. For example, independently controlling each phase of three-phase power may enable detection of faults (e.g., a phase-to-ground short or a phase-to-phase short) while minimizing the duration, the peak current, and/or the let through energy of the faulty condition. Accordingly, it would be beneficial to utilize a switching device capable of increasing control over electric power supplied to the load, for example, by enabling each phase of electric power to be independently controlled.

Additionally, since switching device may be utilized in various implementations, such as a wye-delta starter, a reverser, a motor drive bypass, and so forth, it would be beneficial to utilize a switching device that can be modularly configured for various implementations, for example, to minimize footprint and/or interconnections (e.g., cabling) of the switching devices. More generally, modular arrangements, such as single-phase switching modules that can be incorporated alone or as a group, may enable a highly flexible modular design and manufacturing platform, which allows for assemblies of devices for many different needs and markets.

Moreover, while many of the foregoing improvements may be used together, they may also be used separately with significant potential for improvement in the field of switching and power systems. For example, single-phase switching devices may be used in POW (e.g., timed) application and/or conventional (e.g., non-timed) applications. Additionally, a motor control device (e.g., a wye-delta starter) may also be used in POW (e.g., timed) application and/or conventional (e.g., non-timed) applications. The present disclosure relates to various different technical improvements in the field, which may be used in various combinations to provide advances in the art.

DRAWINGS

These and other features, aspects, and advantages of the present disclosure will become better understood when the following detailed description is read with reference to the accompanying drawings in which like characters represent like parts throughout the drawings, wherein:

FIGS. 43A-43H is a set of equivalent circuit diagrams illustrating phase sequential wye-delta switching utilizing single-pole switching devices for controlling a three-phase motor, in accordance with an embodiment;

FIGS. 47A-47H is a set of equivalent circuit diagrams illustrating phase sequential wye-delta switching utilizing 6 single-pole switching devices, in accordance with certain embodiments;

FIGS. 50A-50F is a set of equivalent circuit diagrams illustrating phase sequential wye-delta switching referenced to known, predicted, or estimated drive torques applied to a three-phase motor, in accordance with an embodiment;

FIGS. 51A and 51B is a set of block diagrams of logic for the torque referenced and power-referenced phase sequential wye-delta switching, in accordance with an embodiment;

FIG. 60 is a diagrammatical representation of a circuit for a 5 pole wye-delta starter constructed of multiple single-pole switching devices interconnected with one another, in accordance with an embodiment;

FIG. 61 is a top view of an assembly of single-pole switching devices to create the circuit of FIG. 60, in accordance with an embodiment;

FIG. 66 is a diagrammatical representation of a circuit for a 9 pole wye-delta starter constructed of multiple single-pole switching devices interconnected with one another, in accordance with an embodiment;

FIG. 67 is a top view of an assembly of single-pole switching devices to create the circuit of FIG. 66, in accordance with an embodiment;

DETAILED DESCRIPTION

One or more specific embodiments of the present disclosure will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," "the," and "said" are intended to mean that there are one or more of the elements. The terms "comprising," "including," and "having" are intended to be inclusive and mean that there may be additional elements other than the listed elements.

Figure 1:
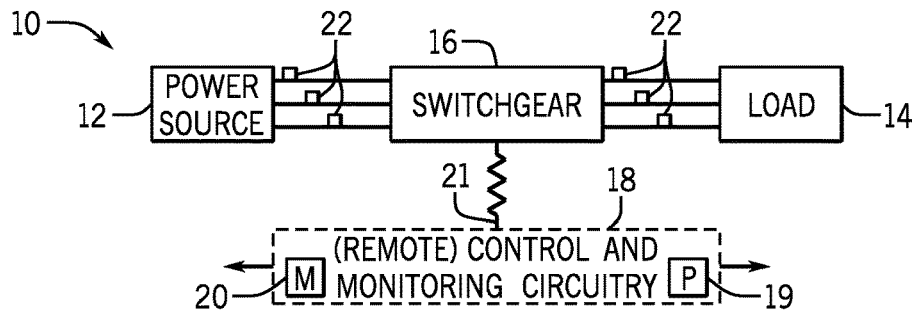
FIG. 1 is a diagrammatical representation of a set of switching devices to provide power to an electrical load, in accordance with an embodiment.

As described above, switching devices are used in various implementations, such as industrial, commercial, material handling, manufacturing, power conversion, and/or power distribution, to connect and/or disconnect electric power from a load. To help illustrate, FIG. 1 depicts a system 10 that includes a power source 12, a load 14, and switchgear 16, which includes one or more switching devices. In the depicted embodiment, the switchgear 16 may selectively connect and/or disconnect three-phase electric power output by the power source 12 to the load 14, which may be an electric motor or any other powered device. In this manner, electrical power flows from the power source 12 to the load 14. For example, switching devices in the switchgear 16 may close to connect electric power to the load 14. On the other hand, the switching devices in the switchgear 16 may open to disconnect electric power from the load 14. In some embodiments, the power source 12 may be an electrical grid.

It should be noted that the three-phase implementation described herein is not intended to be limiting. More specifically, certain aspects of the disclosed techniques may be employed on single-phase circuitry and/or for applications other than power an electric motor. Additionally, it should be noted that in some embodiments, energy may flow from the source 12 to the load 14. In other embodiments energy may flow from the load 14 to the source 12 (e.g., a wind turbine or another generator). More specifically, in some embodiments, energy flow from the load 14 to the source 12 may transiently occur, for example, when overhauling a motor.

In some embodiments, operation of the switchgear 16 (e.g., opening or closing of switching devices) may be controlled by control and monitoring circuitry 18. More specifically, the control and monitoring circuitry 18 may instruct the switchgear 16 to connect or disconnect electric power. Accordingly, the control and monitoring circuitry 18 may include one or more processors 19 and memory 20. More specifically, as will be described in more detail below, the memory 20 may be a tangible, non-transitory, computer-readable medium that stores instructions, which when executed by the one or more processor 18 perform various processes described. It should be noted that non-transitory merely indicates that the media is tangible and not a signal. Many different algorithms and control strategies may be stored in the memory and implemented by the processor 19, and these will typically depend upon the nature of the load, the anticipated mechanical and electrical behavior of the load, the particular implementation, behavior of the switching devices, and so forth.

Additionally, as depicted, the control and monitoring circuitry 18 may be remote from the switchgear 16. In other words, the control and monitoring circuitry 18 may be communicatively coupled to the switchgear 16 via a network 21. In some embodiments, the network 21 may utilize various communication protocols such as DeviceNet, Profibus, Modbus, Ethernet, to mention only a few. For example, to transmit signals between the control and monitoring circuitry 18 may utilize the network 21 to send make and/or break instructions to the switchgear 16. The network 21 may also communicatively couple the control and monitoring circuitry 18 to other parts of the system 10, such as other control circuitry or a human-machine-interface (not separately depicted). Additionally or alternatively, the control and monitoring circuitry 18 may be included in the switchgear 16 or directly coupled to the switchgear, for example, via a serial cable.

Furthermore, as depicted, the electric power input to the switchgear 16 and output from the switchgear 16 may be monitored by sensors 22. More specifically, the sensors 22 may monitor (e.g., measure) the characteristics (e.g., voltage or current) of the electric power. Accordingly, the sensors 22 may include voltage sensors and current sensors. These sensors may alternatively be modeled or calculated values determined based on other measurements (e.g., virtual sensors). Many other sensors and input devices may be used, depending upon the parameters available and the application. Additionally, the characteristics of the electric power measured by the sensors 22 may be communicated to the control and monitoring circuitry 18 and used as the basis for algorithmic computation and generation of waveforms (e.g., voltage waveforms or current waveforms) that depict the electric power. More specifically, the waveforms generated based on input the sensors 22 monitoring the electric power input into the switchgear 16 may be used to define the control of the switching devices, for example, by reducing electrical arcing when the switching devices open or close. The waveforms generated based on the sensors 22 monitoring the electric power output from the switchgear 16 and supplied to the load 14 may be used in a feedback loop to, for example, monitor conditions of the load 14.

Figure 2:
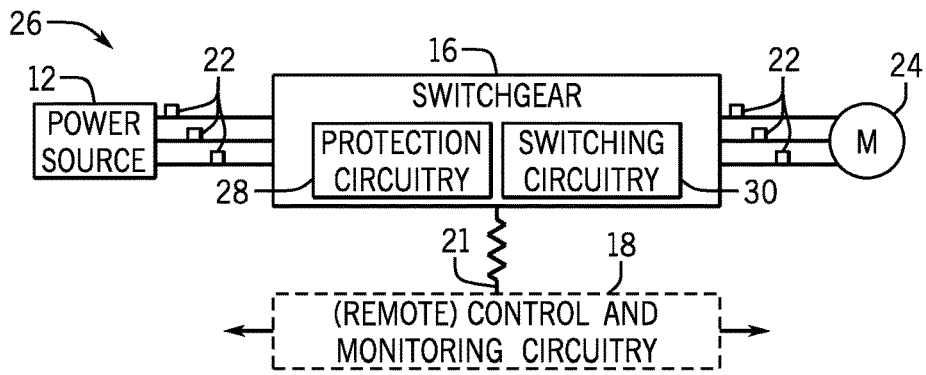
FIG. 2 is a similar diagrammatical representation of a set of switching devices to provide power to an electrical motor, in accordance with an embodiment.
Figure 3:
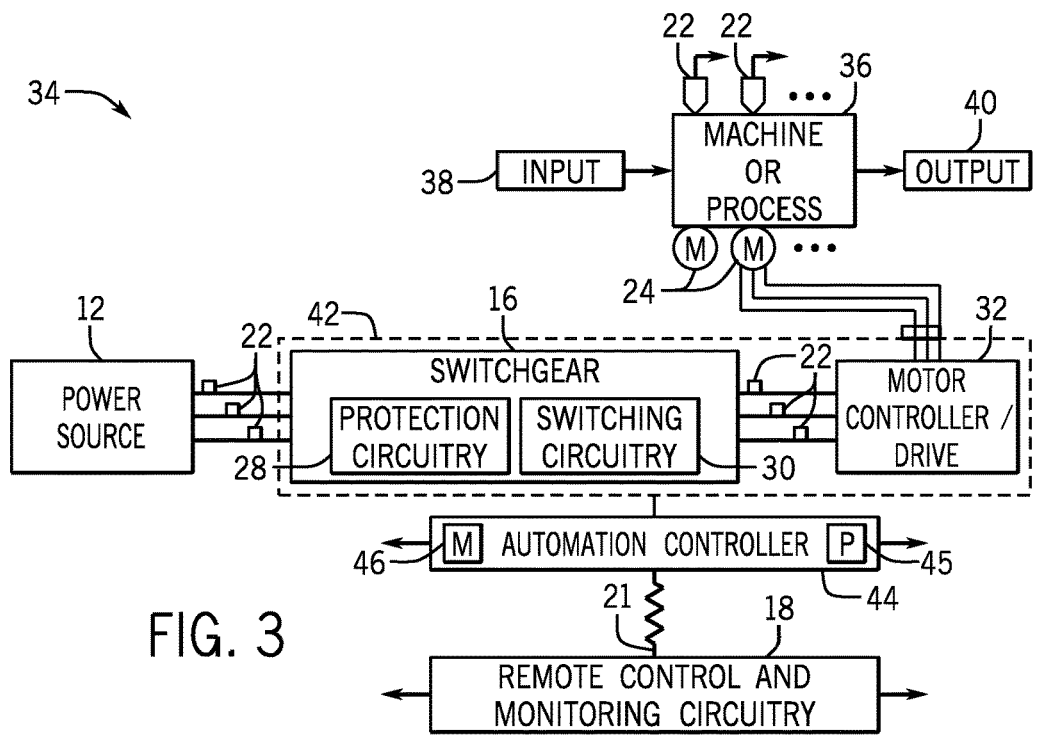
FIG. 3 is a similar diagrammatical representation of a set of switching devices to provide power to an electrical motor, in accordance with an embodiment.

As described above, the switchgear 16 may connect and/or disconnect electric power from various types of loads 14, such as the electric motor 24 included in the motor system 26 depicted in FIG. 2. As depicted, the switchgear 16 may connect and/or disconnect the power source 12 from the electric motor 24, such as during startup and shut down. Additionally, as depicted, the switchgear 16 will typically include or function with protection circuitry 28 and the actual switching circuitry 30 that makes and breaks connections between the power source and the motor windings. More specifically, the protection circuitry 28 may include fuses and/or circuit breakers, and the switching circuitry 30 will typically include relays, contactors, and/or solid state switches (e.g., SCRs, MOSFETs, IGBTs, and/or GTOs), such as within specific types of assembled equipment (e.g., motor starters).

More specifically, the switching devices included in the protection circuitry 28 may disconnect the power source 12 from the electric motor 24 when an overload, a short circuit condition, or any other unwanted condition is detected. Such control may be based on the un-instructed operation of the device (e.g., due to heating, detection of excessive current, and/or internal fault), or the control and monitoring circuitry 18 may instruct the switching devices (e.g., contactors or relays) included in the switching circuitry 30 to open or close. For example, the switching circuitry 30 may include one (e.g., a three-phase contactor) or more contactors (e.g., three or more single-pole, single current-carrying path switching devices).

Accordingly, to start the electric motor 24, the control and monitoring circuitry 18 may instruct the one or more contactors in the switching circuitry 30 to close individually, together, or in a sequential manner. On the other hand, to stop the electric motor 24, the control and monitoring circuitry 18 may instruct the one or more contactors in the switching circuitry 30 to open individually, together, or in a sequential manner. When the one or more contactors are closed, electric power from the power source 12 is connected to the electric motor 24 or adjusted and, when the one or more contactors are open, the electric power is removed from the electric motor 24 or adjusted. Other circuits in the system may provide controlled waveforms that regulate operation of the motor (e.g., motor drives, automation controllers, etc.), such as based upon movement of articles or manufacture, pressures, temperatures, and so forth. Such control may be based on varying the frequency of power waveforms to produce a controlled speed of the motor.

In some embodiments, the control and monitoring circuitry 18 may determine when to open or close the one or more contactors based at least in part on the characteristics of the electric power (e.g., voltage, current, or frequency) measured by the sensors 22. Additionally or alternatively, the control and monitoring circuit 18 may receive an instruction to open or close the one or more contactors in the switching circuitry 30 from another part of the motor system 26, for example, via the network 21.

In addition to using the switchgear 16 to connect or disconnect electric power directly from the electric motor 24, the switchgear 16 may connect or disconnect electric power from a motor controller/drive 32 included in a machine or process system 34. More specifically, the system 34 includes a machine or process 36 that receives an input 38 and produces an output 40.

To facilitate producing the output 40, the machine or process 36 may include various actuators (e.g., electric motors 24) and sensors 22. As depicted, one of the electric motors 24 is controlled by the motor controller/drive 32. More specifically, the motor controller/drive 32 may control the velocity (e.g., linear and/or rotational), torque, and/or position of the electric motor 24. Accordingly, as used herein, the motor controller/drive 32 may include a motor starter (e.g., a wye-delta starter), a soft starter, a motor drive (e.g., a frequency converter), a motor controller, or any other desired motor powering device. Additionally, since the switchgear 16 may selectively connect or disconnect electric power from the motor controller/drive 32, the switchgear 16 may indirectly connect or disconnect electric power from the electric motor 24.

As used herein, the "switchgear/control circuitry" 42 is used to generally refer to the switchgear 16 and the motor controller/drive 32. As depicted, the switchgear/control circuitry 42 is communicatively coupled to a controller 44 (e.g., an automation controller. More specifically, the controller 44 may be a programmable logic controller (PLC) that locally (or remotely) controls operation of the switchgear/control circuitry 42. For example, the controller 44 may instruct the motor controller/driver 32 regarding a desired velocity of the electric motor 24. Additionally, the controller 44 may instruct the switchgear 16 to connect or disconnect electric power. Accordingly, the controller 44 may include one or more processor 45 and memory 46. More specifically, the memory 46 may be a tangible non-transitory computer-readable medium on which instructions are stored. As will be described in more detail below, the computer-readable instructions may be configured to perform various processes described when executed by the one or more processor 45. In some embodiments, the controller 44 may also be included within the switchgear/control circuitry 42.

Furthermore, the controller 44 may be coupled to other parts of the machine or process system 34 via the network 21. For example, as depicted, the controller 44 is coupled to the remote control and monitoring circuitry 18 via the network 21. More specifically, the automation controller 44 may receive instructions from the remote control and monitoring circuitry 18 regarding control of the switchgear/control circuitry 42. Additionally, the controller 44 may send measurements or diagnostic information, such as the status of the electric motor 24, to the remote control and monitoring circuitry 18. In other words, the remote control and monitoring circuitry 18 may enable a user to control and monitor the machine or process 36 from a remote location.

Moreover, sensors 22 may be included throughout the machine or process system 34. More specifically, as depicted, sensors 22 may monitor electric power supplied to the switchgear 16, electric power supplied to the motor controller/drive 32, and electric power supplied to the electric motor 24. Additionally, as depicted, sensors 22 may be included to monitor the machine or process 36. For example, in a manufacturing process, sensors 22 may be included to measure speeds, torques, flow rates, pressures, the presence of items and components, or any other parameters relevant to the controlled process or machine.

As described above, the sensors 22 may feedback information gathered regarding the switchgear/control circuitry 42, the motor 24, and/or the machine or process 36 to the control and monitoring circuitry 18 in a feedback loop. More specifically, the sensors 22 may provide the gathered information to the automation controller 44 and the automation controller 44 may relay the information to the remote control and monitoring circuitry 18. Additionally or alternatively, the sensors 22 may provide the gathered information directly to the remote control and monitoring circuitry 18, for example via the network 21.

Figure 4A:
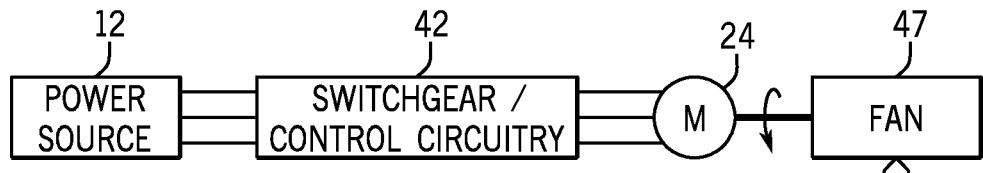
FIGS. 4A-4D is a similar diagrammatical representation of a set of switching devices to provide power to a specific application, in this case a chiller motor, in accordance with an embodiment.

To facilitate operation of the machine or process 36, the electric motor 24 converts electric power to provide mechanical power. To help illustrate, an electric motor 24 may provide mechanical power to various devices, as described in the non-limiting examples depicted in FIGS. 4A-4D. For example, as depicted in FIG. 4A, the electric motor 24 may provide mechanical power to a fan 47. More specifically, the mechanical power generated by the electric motor 24 may rotate blades of the fan 47 to, for example, vent a factory. Accordingly, the switchgear/control circuitry 42 may control operation (e.g., velocity) of the fan 47 by controlling electric power supplied from the power source 12 to the electric motor 24. For example, the switchgear/control circuitry 42 may decrease electric power supplied to the motor 24 to reduce velocity of the fan 47. On the other hand, the switchgear/control circuitry 42 may increase electric power supplied to the motor 24 to increase velocity of the fan 47. As depicted, a sensor 22 may also be included on the fan 47 to provide feedback information regarding operation of the fan 22, such as temperature, velocity, torque, or position, which may be used to adjust operation of the fan 47. In other words, operation of the fan 47 may be adjusted in a feedback loop.

Figure 4B:
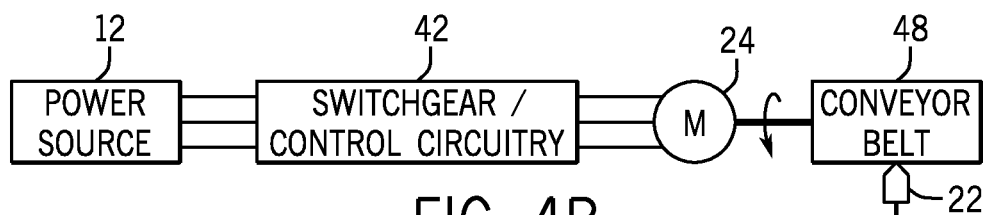

Additionally, as depicted in FIG. 4B, the electric motor 24 may provide mechanical power to a conveyer belt 48. More specifically, the mechanical power generated by the electric motor 24 may rotate the conveyer belt 48 to, for example, move a package along the conveyer belt 48. Accordingly, the switchgear/control circuitry 42 may control operation (e.g., acceleration, velocity, and/or position) of the conveyer belt 48 by controlling electric power supplied from the power source 12 to the electric motor 24. For example, the switchgear/control circuitry 42 may start the conveyer belt 48 by supplying electric power to the motor 24. On the other hand, the switchgear/control circuitry 42 may stop the conveyer belt 48 at a specific position by ceasing electric power supplied to the motor 24. As depicted, a sensor 22 may also be included on the conveyer belt 48 to provide feedback information regarding operation of the conveyer belt 48, such as temperature, velocity, torque, or position, which may be used to adjust operation of the conveyer belt 48. In other words, operation of the conveyer belt 48 may be adjusted in a feedback loop.

Figure 4C:
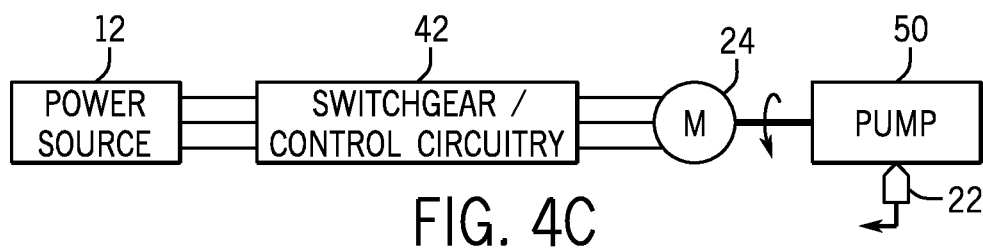

Furthermore, as depicted in FIG. 4C, the electric motor 24 may provide mechanical power to a pump 50. More specifically, the mechanical power generated by the electric motor may drive the pump 50 to, for example, move a fluid (e.g., gas or liquid). Accordingly, the switchgear/control circuitry 42 may control operation (e.g., pumping rate) of the pump 50 by controlling electric power supplied from the power source 12 to the electric motor 24. For example, the switchgear/control circuitry 42 may increase electric power supplied to the motor 24 to increase the pumping rate of the pump 50. On the other hand, the switchgear/control circuitry 42 may decrease electric power supplied to the motor 24 to decrease the pumping rate of the pump 50. As depicted, a sensor 22 may also be included on the pump 50 to provide feedback information regarding operation of the pump 50, such as temperature or pumping rate, which may be used to adjust operation of the pump 50. In other words, operation of the pump 50 may be adjusted in a feedback loop.

Figure 4D:
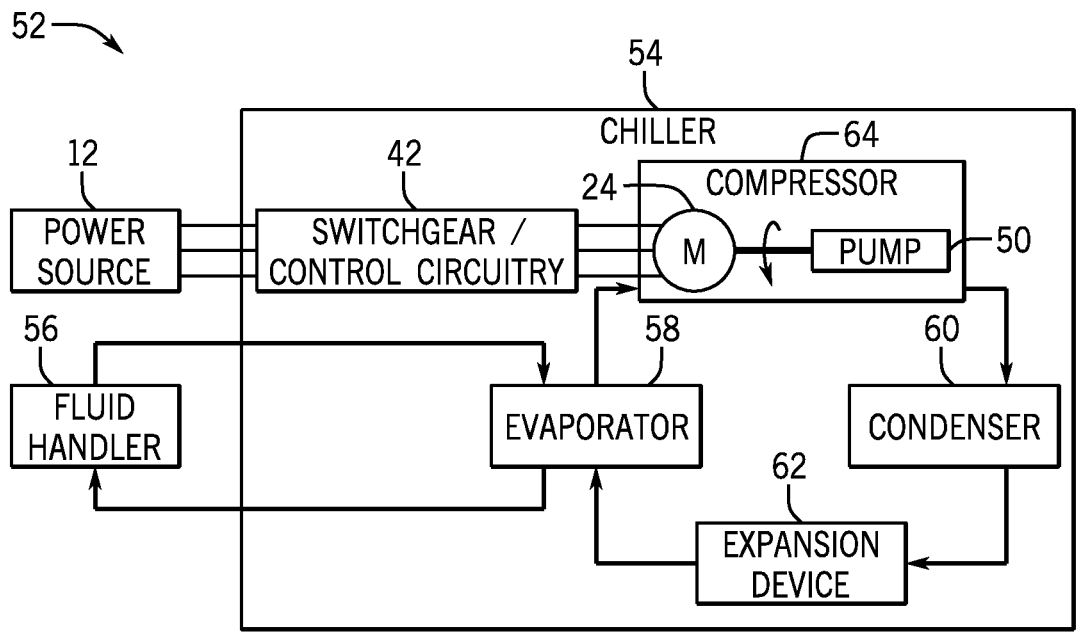

As described above, the electric motor 24 may be used to facilitate a machine or process 36. To help illustrate, FIG. 4D depicts a chiller system 52 that may be used in a process to cool a circulated fluid, such as in an air conditioning or refrigeration system, which includes a chiller 54 and a fluid handler 56. More specifically, the fluid handler 56 circulates the fluid (e.g., air or water) into the chiller 54 to cool the fluid by exchanging heat with a refrigerant in the chiller 54. To facilitate cooling the fluid, the chiller 54 includes an evaporator 58, a condenser 60, an expansion device 62, and a compressor 64, which pumps the refrigerant (e.g., coolant) in the chiller 54. Accordingly, as depicted, the compressor 64 includes the electric motor 24 and the pump 50.

In operation, the compressor 64 compresses refrigerant gas that is condensed in the condenser 60. In the condenser 60, heat from the refrigerant gas is exchanged with cooling water or air, which accepts the heat required for the condensation phase change. In the expansion device 62, the flow of the liquid refrigerant is restricted to reduce the pressure of the refrigerant. In some embodiments, some of the refrigerant may vaporize and absorb heat from surrounding liquid refrigerant to further lower temperature. In the evaporator 58, the latent heat of vaporization of the refrigerant absorbs heat from the fluid circulated from the fluid handler 56 to cool the fluid (often air).

More specifically, one or more electric motors 24 may drive the compressor 64 (and/or the pump 50). For example, when the chiller 54 is a centrifugal chiller, the electric motor 24 may rotate an impeller to compress (e.g., accelerate) refrigerant gas in the chiller 54. Accordingly, the switchgear/control circuitry 42 may control operation of the compressor 64 by controlling electric power supplied to the electric motor 24 from the power source 12. For example, to increase the flow rate (e.g., compression) of refrigerant gas, the switchgear/control circuitry 42 may increase electric power supplied to the electric motor 24 to increase torque and/or velocity compressor. In some embodiments, the switchgear/control circuitry 42 may adjust the electric power supplied by reconfiguring windings of the electric motor 24, for example, from a wye configuration to a delta configuration.

Mechanical loads driven by motors may have a wide range of physical and dynamic characteristics that may affect the strategies for powering the motors. For example, chiller applications may result in highly inertial loads (e.g., that start slowly and with high torque requirements, and that stop quickly once power is removed). Other inertial loads may be difficult to stop and may impose particular torque demands when stopping. Fans will typically have known torque/speed or power curves, as may certain types of pumps. Given that any desired load may be driven by the technology described here, corresponding strategies may be implemented for controlling the application of power.

It should also be noted that, while particular emphasis is placed on powering electric motors by the present technologies, many other loads may benefit from the advances proposed. These may include, but are not limited to, transformers, capacitor banks, linear and other actuators, various power converters, and so forth.

Basic Point-on-Wave (POW) Switching

As discussed in the above examples, the switchgear/control circuitry 42 may control operation of a load 14 (e.g., electric motor 24) by controlling electric power supplied to the load 14. For example, switching devices (e.g., contactors) in the switchgear/control circuitry 42 may be closed to supply electric power to the load 14 and opened to disconnect electric power from the load 14. However, as discussed above, opening (e.g., breaking) and closing (e.g., making) the switching devices may discharge electric power in the form of electric arcing, cause current oscillations to be supplied to the load 14, and/or cause the load 14 to produce torque oscillations.

Accordingly, some embodiments of the present disclosure provide techniques for breaking a switching device in coordination with a specific point on an electric power waveform. For example, to reduce magnitude and/or likelihood of arcing, the switching device may open based on a current zero-crossing. As used herein, a "current zero-crossing" is intended to describe when the current conducted by the switching device is zero. Accordingly, by breaking exactly at a current zero-crossing, the likelihood of generating an arc is minimal since the conducted current is zero.

However, closing the switching device is generally non-instantaneous and the conducted electric power changes rapidly. As such, it may be difficult to break the switching device exactly on the current zero-crossing. In other words, even when aiming for the current zero-crossing it is possible that the switching device actually breaks slightly before or slightly after the current zero-crossing. However, although the current may be relatively low slightly after the current zero-crossing, the magnitude may be increasing and, thus, cause arcing with increased magnitude. On the other hand, the magnitude of the current slightly before the current zero-crossing is low and decreasing. As such, the magnitude of any produced arcing may be small and be extinguished when reaching the current zero-crossing. In other words, the switching device may be opened based at least in part on a current zero-crossing such that the switching device breaks slightly before or at the current zero-crossing.

Similarly, some embodiments of the present disclosure provide techniques for breaking a switching device in coordination with a specific point on an electric power waveform. For example, to reduce magnitude of in-rush current and/or current oscillation, the switching device may close based on a predicted current zero-crossing. As used herein, a "predicted current zero-crossing" is intended to describe where a current zero-crossing would have occurred assuming the switching device was closed and in steady state. In other words, the predicted current zero-crossing may be a multiple of 180° from a subsequent steady state current zero-crossing. Accordingly, by making exactly at a predicted zero-crossing, the conducted current may increase more gradually, thereby reducing magnitude of in-rush current and/or current oscillation.

However, when the switching device is open, the current supplied to the switching device is approximately zero while the voltage is approximately equal to the source voltage. Since the voltage and the current generally a fixed phase difference in steady-state, the voltage supplied to the switching device may be used to determine the predicted current zero-crossing. For example, when the voltage leads the current by 90°, a current zero-crossing occurs 90° after a line-to-line voltage zero-crossing, which may also be 60° after a phase voltage zero-crossing. As used herein, a "line-to-line voltage zero-crossing" is intended to describe when voltage supplied to a switching device is zero relative to another phase and a "phase voltage zero-crossing" is intended to describe when voltage supplied to the switching device is zero relative to ground. Accordingly, the predicted current zero-crossing may occur 90° after the line-to-line voltage zero-crossing when the voltage is at a maximum.

Since opening the switching device is generally non-instantaneous and the conducted electric power changes rapidly, it may be difficult to make the switching device exactly on the predicted current zero-crossing. In other words, even when aiming for the predicted current zero-crossing it is possible that the switching device actually makes slightly before or slightly after the current zero-crossing. However, since the magnitude of the current changes more gradually at the predicted current zero-crossing, magnitude of in-rush current and/or current oscillation may be reduced. In other words, the switching device may be closed based at least in part on a predicted current zero-crossing such that the switching device makes slightly before, slight after, or at the predicted current zero-crossing.

Although some embodiments describe breaking a switching device based on a current zero-crossing or making the switching device based on a predicted current zero-crossing, it should be understood that the switching devices may be controlled to open and close at any desired point on the waveform using the disclosed techniques. To facilitate opening and/or closing at a desired point on the waveform, one or more switching devices may be independently controlled to selectively connect and disconnect a phase of electric power to the load 14. In some embodiments, the one or more switching devices may be a multi-pole, multi-current carrying path switching device that controls connection of each phase with a separate pole. More specifically, the multi-pole, multi-current carrying path switching device may control each phase of electric power by movement of a common assembly under the influence of a single operator (e.g., an electromagnetic operator). Thus, in some embodiments, to facilitate independent control, each pole may be connected to the common assembly in an offset manner, thereby enabling movement of the common assembly to affect one or more of the poles differently.

In other embodiments, the one or more switching devices may include multiple single pole switching devices. As used herein a "single pole switching device" is intended to differentiate from a multi-pole, multi current-carrying path switching device in that each phase is controlled by movement of a separate assembly under influence of a separate operator. In some embodiments, the single pole switching device may be a single pole, multi-current carrying path switching device (e.g., multiple current carrying paths controlled by movement of a single operator) or a single-pole, single current-carrying path switching device, which will be described in more detail below.

As described above, controlling the making (e.g., closing) of the one or more switching devices may facilitate reducing magnitude of in-rush current and/or current oscillations, which may strain the load 14, the power source 12, and/or other connected components. As such, the one or more switching devices may be controlled such that they make based at least in part on a predicted current zero-crossing (e.g., within a range slightly before to slightly after the predicted current zero crossing).

Figure 5A:
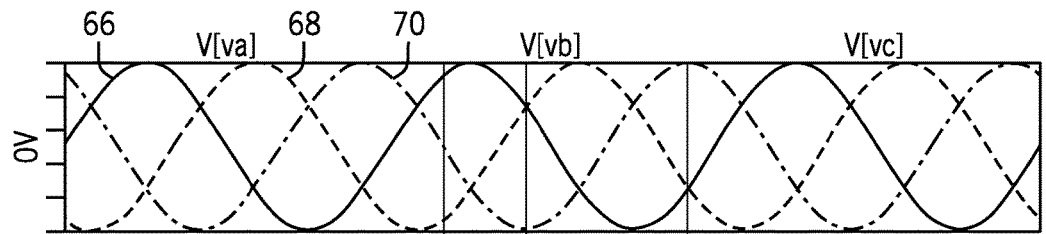
FIGS. 5A-5C is a diagrammatical representation of three-phase POW switching to provide power to a load, in accordance with an embodiment.
Figure 5B:
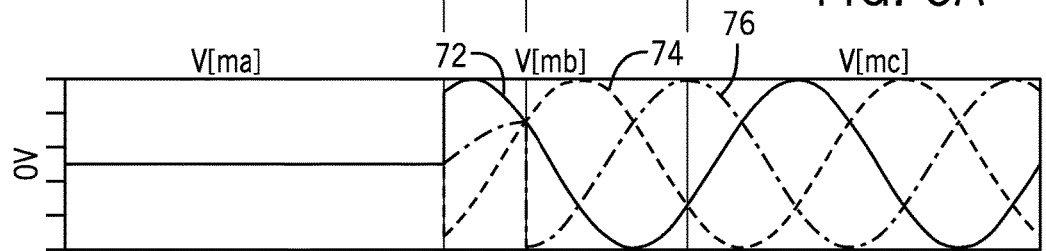
Figure 5C:
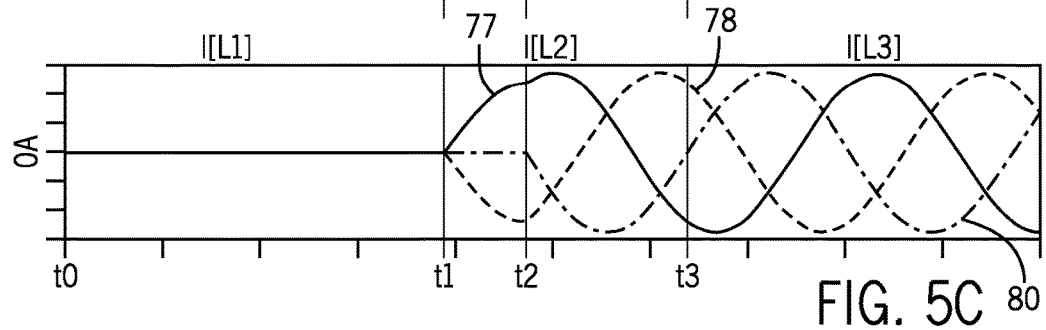

To help illustrate, closing the switching devices to provide three-phase electric power to an electric motor 24 in a wye configuration is described in FIGS. 5A-5C. More specifically, FIG. 5A illustrates the voltage of three-phase electric power (e.g., a first phase voltage curve 66, a second phase voltage curve 68, and a third phase voltage curve 70)

provided by a power source 12. FIG. 5B illustrates the line to neutral voltage supplied to each terminal (e.g., first terminal voltage curve 72, second terminal voltage curve 74, and third terminal voltage curve 76) of the electric motor 24. FIG. 5C illustrates line current supplied to each winding (e.g., first winding current curve 77, second winding current curve 78, and third winding current curve 80) of the electric motor 24. As described above, the waveforms depicted in FIGS. 5A-5C may be determined by control and monitoring circuitry 18 based on measurements collected by the sensors 22.

As depicted, between t0 and t1, electric power is not connected to the electric motor 24. In other words, each of the switching devices is open. At t1, one or more switching devices are closed to start current flow from the power source 12 in two phases (e.g., a first phase and a second phase) of the electric motor 24. To minimize inrush current and/or current oscillations, a first phase and a second phase are connected based upon a predicted current zero-crossing. Accordingly, as depicted in FIG. 5A, the first phase and the second phase are connected when the line-to-line voltage of the first phase (e.g., first phase voltage curve 66) and the second phase (e.g., a second phase voltage curve 68) is at a maximum (e.g., 90° after a line-to-line voltage zero-crossing). Once connected, the first phase of the electric power flows into the first winding of the electric motor 24, the second phase of the electrical flows into the second winding of the electric motor 24, and the third winding of the electric motor 24 is at an internal neutral (e.g., different from line neutral), as depicted in FIG. 5B. Additionally, since the two phases are connected at a predicted current zero-crossing, the current supplied to the first winding (e.g., first winding current curve 77) and the second winding (e.g., second winding current curve 78) start at zero and gradually increase, as depicted in FIG. 5C, thereby reducing magnitude of in-rush current and/or current oscillations supplied to the first and second windings.

After the first two phases are connected, at t2, the one or more switching devices are closed to connect a third phase of the electric power to the electric motor 24. Similar to the first phase and the second phase, to minimize inrush current and/or current oscillations, the third phase is also connected based upon a predicted current zero-crossing. Accordingly, as depicted in FIG. 5A, the third phase is connected when sum of line-to-line voltage between the first phase (e.g., first phase voltage curve 66) and the third phase (e.g., third phase voltage curve 70) and the line-to-line voltage between the second phase (e.g., second phase voltage curve 68) and the third phase (e.g., third phase voltage curve 70) is at a maximum (e.g., a predicted current zero-crossing), which occurs when the line-to-line voltage between the first phase and the second phase is at a minimum and third phase is at a maximum.

It should be noted that although the third phase is depicted as being connected at the first such subsequent occurrence, the third phase may additionally or alternatively be connected at any subsequent occurrence, for example at t3. Once connected, the third phase of the electric power flows into the third winding of the electric motor 24, as depicted in FIG. 5B. Additionally, since the third phase is connected based upon a predicted current zero-crossing, the third winding current 80 gradually changes from zero, as depicted in FIG. 5C, thereby reducing magnitude of in-rush current and/or current oscillations supplied to the third winding.

Additionally, as described above, controlling the breaking (e.g., opening) of the one or more switching devices may facilitate reducing likelihood and/or magnitude of arcing, which may strain and/or wear contactor pads in the switching devices and/or other connected components. As such, the one or more switching devices may be controlled such that they break based at least in part on a current-zero crossing (e.g., within a range slightly before to at the current zero-crossing across that switching device).

Figure 6:
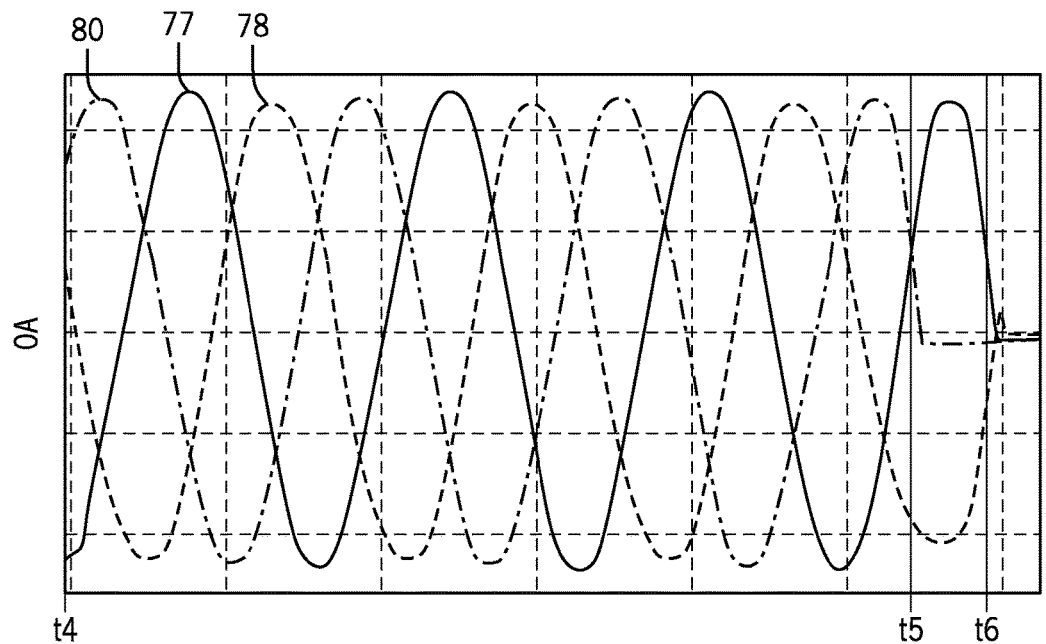
FIG. 6 is a diagrammatical representation of three-phase POW switching to disconnect power from a load, in accordance with an embodiment.

To help illustrate, opening the switching devices to disconnect three-phase electric power from an electric motor 24 is described in FIG. 6. More specifically, FIG. 6 depicts the current supplied to the windings (e.g., first winding current curve 77, second winding current curve 78, and third winding current curve 80) of the electric motor 24. As described above, the waveform depicted in FIG. 6 may be determined by control and monitoring circuitry 18 based on measurements collected by the sensors 22.

As depicted, prior to t4, electric power is connected to the electric motor 24. In other words, each of the switching devices is closed. At t5, one or more of the switching devices is opened to disconnect the third phase of the electric power from the electric motor 24. As described above, to minimize arcing, the third phase disconnected is based at least in part on a current zero-crossing in the third phase of electric power. Accordingly, as depicted, the third phase is disconnected when the current supplied to the third winding (e.g., third winding current curve 80) is approximately zero. Once disconnected, the current supplied to the second winding current the first winding current adjust to the removal of the third phase.

After the third phase is disconnected, the one or more of the switching devices are opened to disconnect the other two phases (e.g., the first phase and the second phase) of electric power to the electric motor 24 at t6. Similar to disconnecting the third phase, to minimize arcing, the first phase is disconnected based at least in part on a current zero-crossing in the first phase of electric power and the second phase is disconnected based at least in part on a current zero-crossing in the second phase of electric power. Accordingly, as depicted, the first phase and the second phase are disconnected when current supplied to the second winding (e.g., second winding current curve 78) and the first winding (e.g., first winding current curve 77) are approximately zero. Once disconnected, the electric power supplied to the electric motor 24 begins to decrease. It should be noted that although the first phase and the second phase are depicted as being disconnected at the first subsequent current zero-crossing, the first and second phase may additionally or alternatively be disconnected at any subsequent current zero-crossings.

Single-Pole, Single Current-Carrying Path Switching Device

FIGS. 7-24 depict a presently contemplated arrangement for providing a single-pole, single current-carrying path switching device. The device may be used in single-phase applications, or very usefully in multi phase (e.g., three-phase) circuits. It may be used alone or to form modular devices and assemblies such as for specific purposes as described below. Moreover, it may be designed for use in POW power application, and in such applications, synergies may be realized that allow for very compact and efficient designs due, as least in part, to the reduced operator demands, reduced arcing, and improved electromagnetic effects during the application of current through the device.

It should be noted that various embodiments of the single-pole switching devices may be used in single current-carrying path applications and also in multi current-carrying path applications. That is, references to single-pole switching devices throughout the disclosure may refer to single-pole, single current carrying path switching devices, single-pole, multiple current carrying path switching devices, or some combination thereof. In some embodiments, a single-pole, multiple current-carrying path switching device may allow for the repurposing of certain devices as modular three-phase circuits. For example, a single-pole, multiple current-carrying path may refer to a switching device with three current-carrying paths that have been interconnected to provide a single phase of power. Additionally, in some embodiments, three single-pole, single current-carrying path switching devices may each be configured to provide a separate phase of power (e.g., three-phase) and can be independently and/or simultaneously controlled in various beneficial configurations, as described in detail below. It should be understood, that the single-pole switching devices may be modularly configured to provide any number of power phases.

Figure 7:
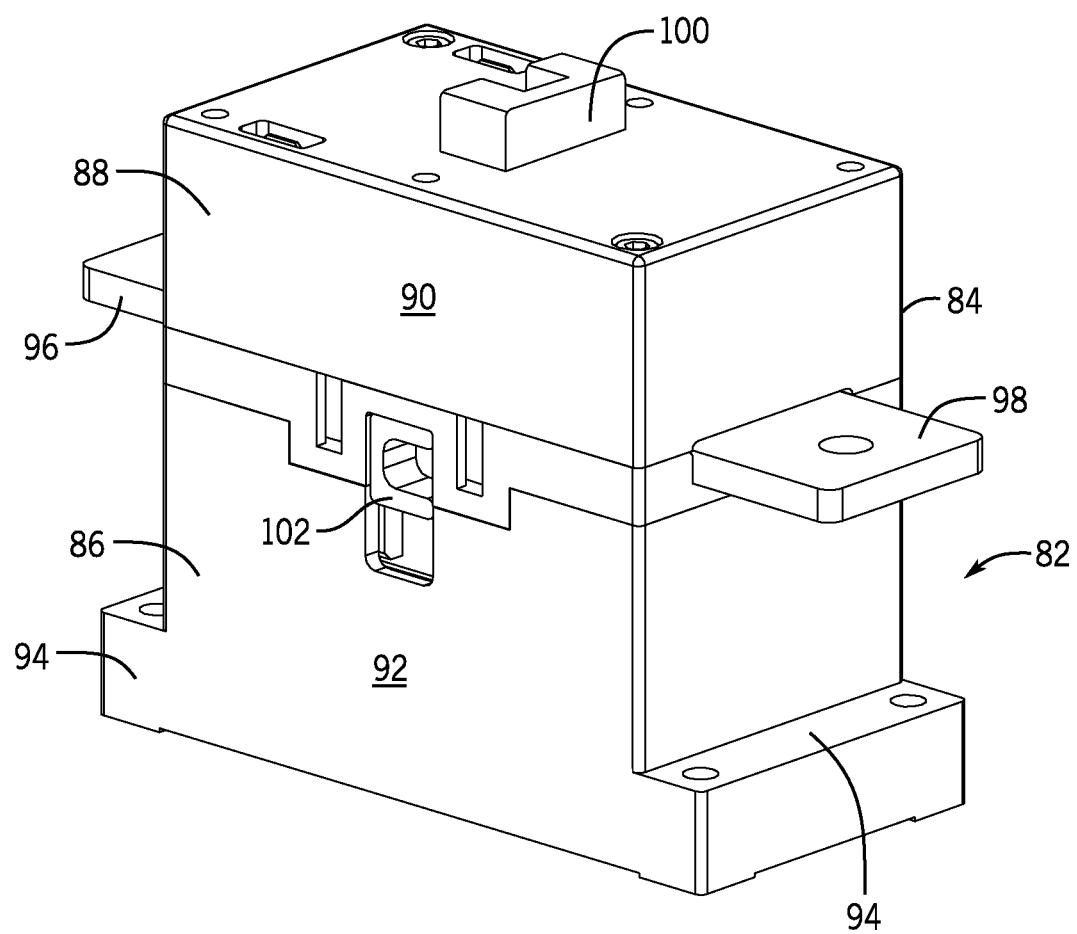
FIG. 7 is a perspective view of a single-pole, single current-carrying path switching device, in accordance with an embodiment.

FIG. 7 illustrates a switching device 82 designed for use in certain of the applications described in the present disclosure. In the embodiment illustrated, a switching device is a single-pole, single current-carrying path device in the form of a contactor 84. The contactor 84 generally includes an operator section 86 and a contact section 88. As described more fully below, the operator section includes components that enable energization and de-energization of the contactor to complete and interrupt a single current-carrying path through the device. The section 88 includes components that are stationary and other components that are moved by energization and de-energization of the operator section to complete and interrupt the single-carrying path. In the illustrated embodiment, the upper conductive section has an upper housing 90, while the operator section has a lower housing 92. The housings fit together to form a single unitary housing body. In the illustrated embodiment flanges 94 extend from the lower housing allowing the device to be mounted in operation. Other mounting arrangements may certainly be envisaged. A line-side conductor 96 extends from the device to enable connection to a source of power. A corresponding load-side conductor 98 extends from an opposite side to enable the device to be coupled to a load. In other embodiments, conductors may exit the housing 90 and 92 in other manners. In this illustrated embodiment the device also includes an upper or top-side auxiliary actuator 100 and a side mount auxiliary actuator 102.

Figure 8:
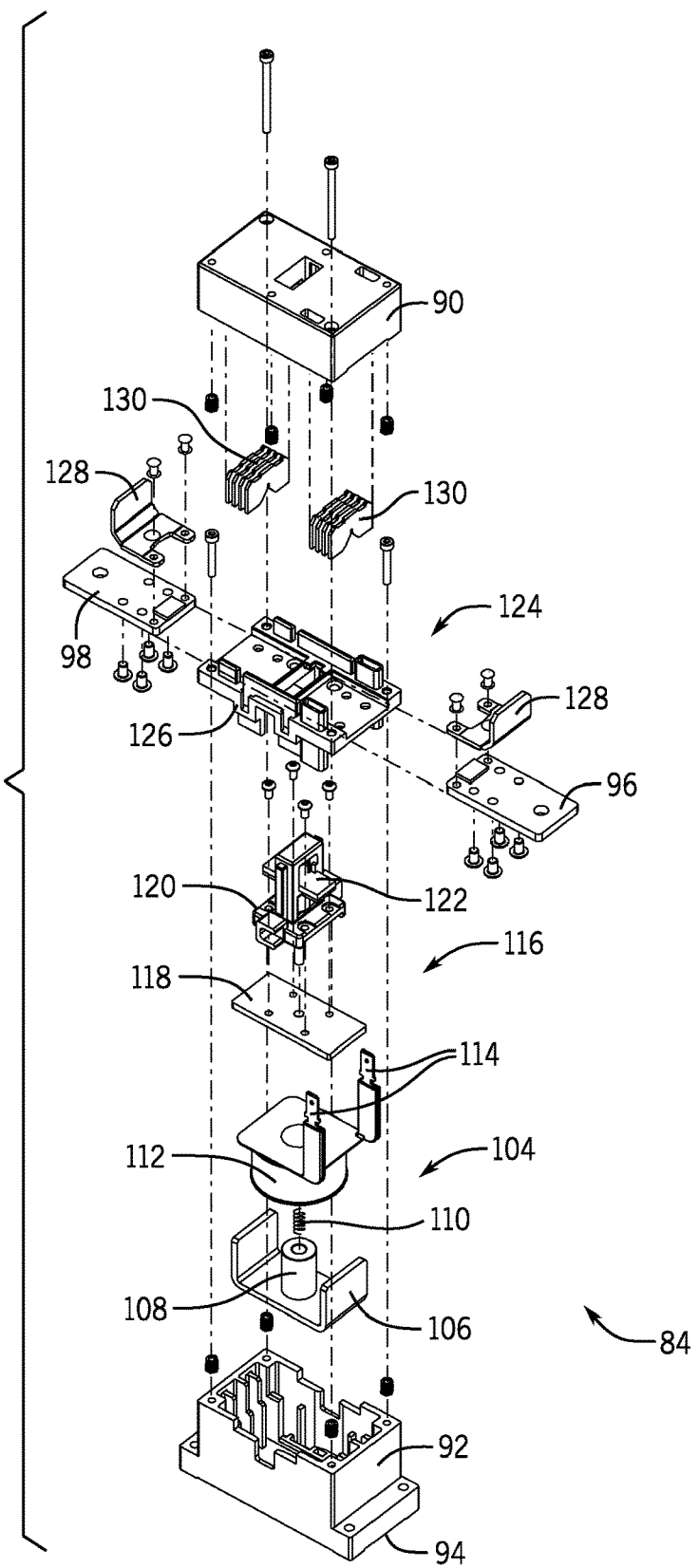
FIG. 8 is a perspective exploded view of the device of FIG. 7, in accordance with an embodiment.

FIG. 8 illustrates certain of the mechanical, electrical and operational components of the contactor in an exploded view. As shown, the operator section is mounted in the lower housing 92 and includes an operator designated generally by reference numeral 104 which itself is a collection of components including a magnetic core comprised of a yoke 106 and a central core section 108. A return spring 110 is mounted through the central core section 108 as described more fully below for biasing movable contacts towards an open position. An operator coil 112 is mounted around the core section 108 and between upturned portions of the yoke 106. As will be appreciated by those skilled in the art, the coil 112 will typically be mounted on a bobbin and is formed of multiple turns of magnet wire, such as copper. The operator includes leads 114, which in this embodiment extend upwardly to enable connection to the operator when the components are assembled in the device. As will also be appreciated by those skilled in the art, the core, including the yoke and central core section, along with the coil 112 form an electromagnet which, when energized, attracts one or more parts of the movable contact assembly described below, to shift the device between an open position and a closed position.

A movable contact assembly 116 similarly includes a number of components assembled as a sub-assembly over the operator. In the embodiment illustrated in FIG. 8, the movable assembly includes an armature 118 that is made of a metal or material that can be attracted by flux generated by energization of the operator. The armature is attached to a carrier 120 which typically is made of a non-conductive material, such as plastic or fiberglass, or any other suitable electrically insulating material. A conductor assembly 122 is mounted in the carrier and is moved upwardly and downwardly by movement of the carrier under the influence of electromagnetic flux that draws the armature downwardly, and, when the fluxes are removed, the entire assembly may be moved upwardly under the influence of the return spring 110 mentioned above.

The device further includes a stationary contact assembly 124. In the illustrated embodiment, this contact assembly is formed of multiple hardware components, including a mounting assembly 126 that is fitted between the lower housing 92 and the upper housing 90. This mounting assembly will typically be made of an electrically non-conductive material, and it includes various features for allowing the mounting of the line and load-side conductors 96 and 98. It may be noted that the structure illustrated in FIG. 8 has been rotated 180 degrees as compared to that of FIG. 7. Each conductor includes a contact pad that comes into contact with a corresponding contact pad of the movable contact assembly when the device is closed or "made". Moreover, turnbacks 128 are provided on each conductor and may be screwed or riveted into place, or attached by any other suitable method, and at least partially span the contact pad of the corresponding conductor. In the final assembly, these turnbacks are fitted adjacent to a series of splitter plates or shunts 130 on either side. As described more fully below, when the device makes or breaks, any arcing that occurs can be driven to the turnbacks and splitter plates where the arc is divided into several smaller arcs and ionized particles and hot gasses are cooled and routed toward the exterior device.

Figure 9:
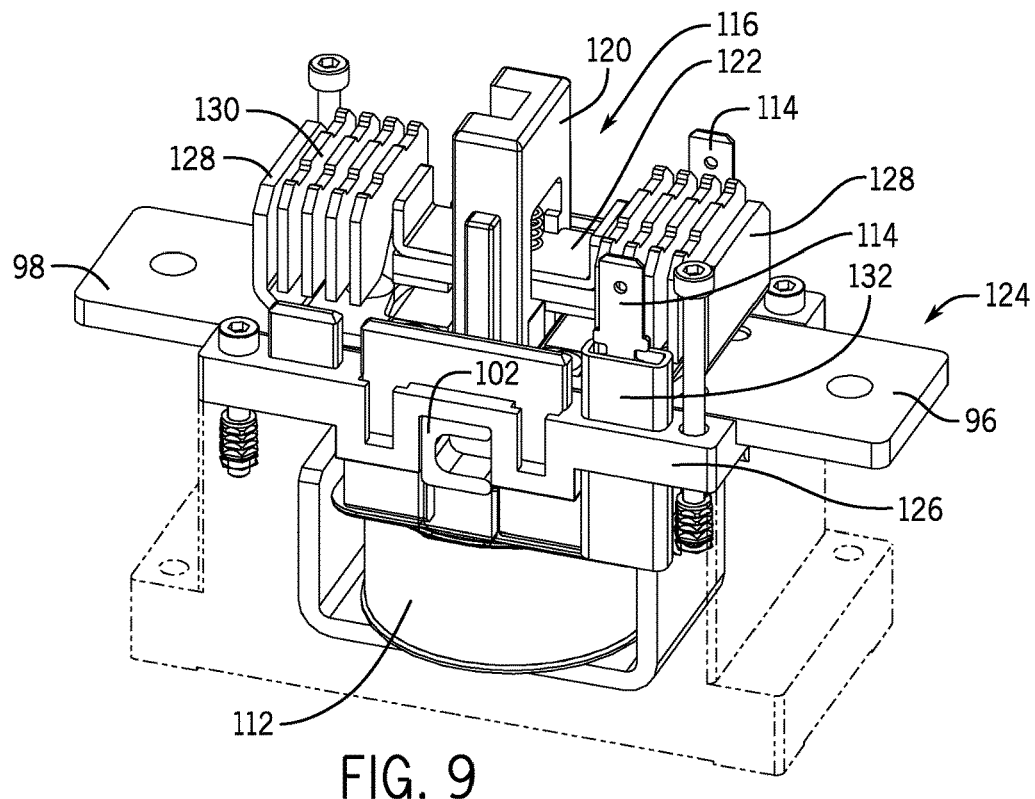
FIG. 9 is a top perspective view of certain of the internal components and assemblies of the single-pole, single current-carrying path switching device, in accordance with an embodiment.
Figure 10:
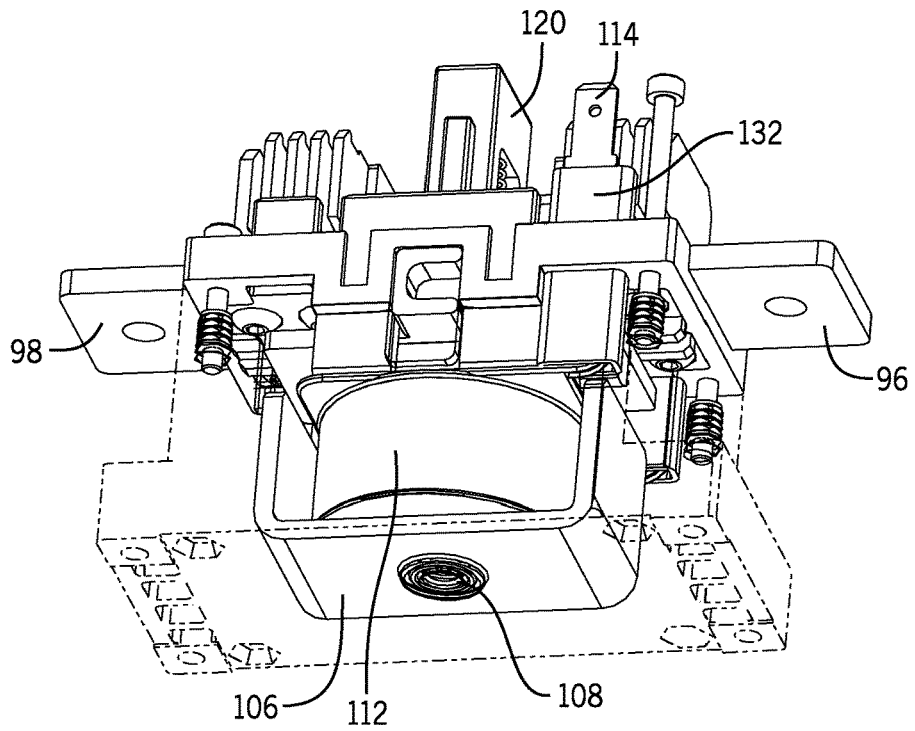
FIG. 10 is a bottom perspective view of the internal components and assemblies of the device, in accordance with an embodiment.

FIGS. 9 and 10 illustrate the same device assembled in top and bottom perspective views, with certain of the components removed, including certain housing sections to illustrate the interior components and their interior connection. In particular, as shown in FIG. 9, the coil 112 of the operator is positioned in a lower location, although in practice the device may be mounted in various orientations. The mounting assembly 126 holding the line and load-side conductors is fitted above the operator coil and the movable contact assembly 116 is position above the mounting assembly such that contact pads of movable contacts within this assembly are positioned in facing relation to corresponding contact pads on the conductors. More detail regarding the various components of these assemblies is provided below. As can also be seen in FIGS. 9 and 10, guides 132 may be formed, such as in the mounting assembly 126 for receiving the terminals of the operator coil. In this illustrated embodiment the terminals extend upwardly and are formed so that plug-in connections can be made to the operator coil. As will be appreciated by those skilled in the art, in operation, a signal that energizes the operator coil is provided by way of the terminals, and typical signals may include alternating current (A/C) or direct current (DC) signals, such as 24 or 48 vDC signals. Although AC signals may be provided for the operator coil, in some applications, such as POW energization strategies, predictability in times of closure and opening are provided by DC signals. In some alternative embodiments the terminals, or leads for the operator coil may be caused to exit other locations in device, such as through the lower housing. Such applications may provide for plug-in mounting of the contactor or any similar switching device such that contacts are made for at least the operator by simply mounting the device on a suitable base. In some arrangements it may also be suitable to allow for power, both line and load, to be made through such a base.

Figure 11:
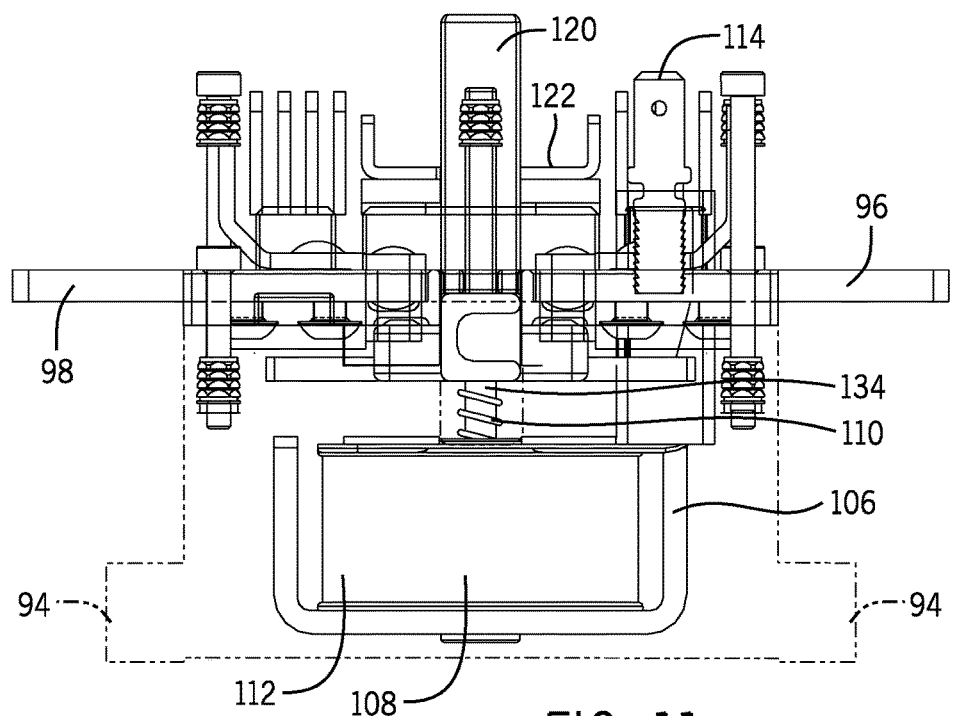
FIG. 11 is a side view of the internal components and assemblies of the device, in accordance with an embodiment.
Figure 12:
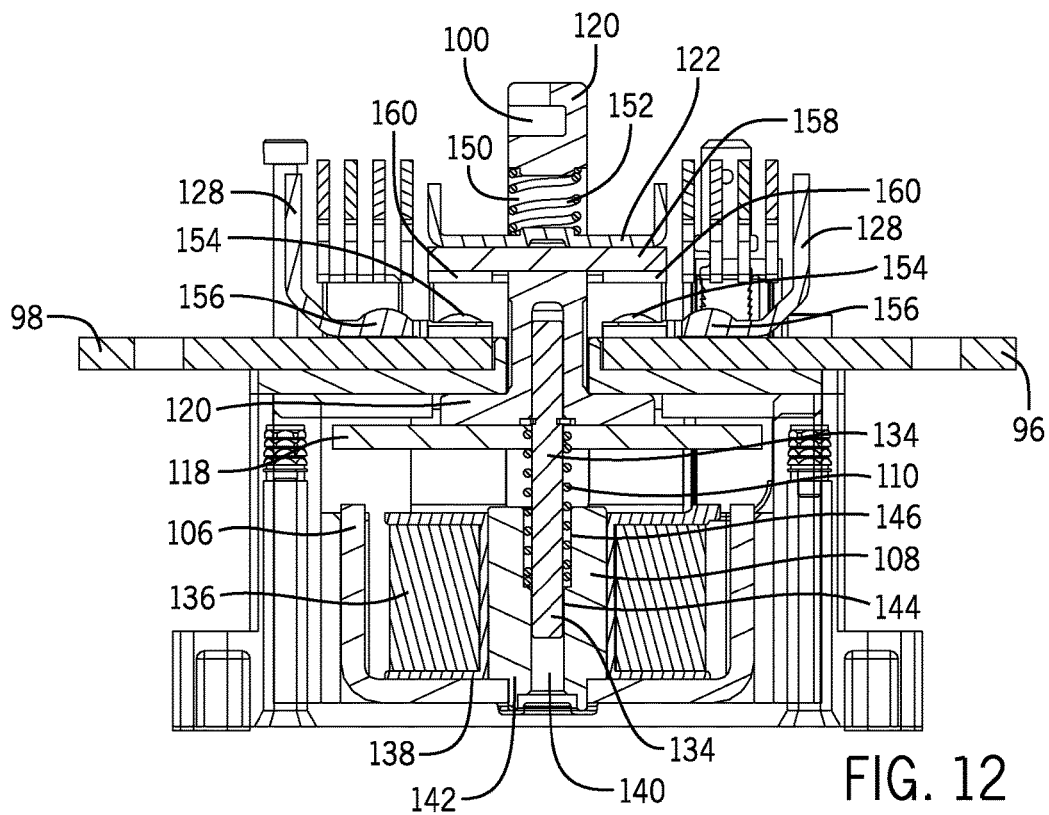
FIG. 12 is a partially sectioned side view of the internal components and assemblies of the device in an open position, in accordance with an embodiment.

FIGS. 11 and 12 provide additional detail of the currently contemplated single-pole, single current-carrying path switching device. As shown in FIG. 11, the operator coil 112 is disposed within the yoke 106 such that the yoke channels flux generated by operator coil when energized. In this arrangement, the return spring 110 is provided around an alignment pin 134 that is fixed to and moves with the movable contact assembly, and specifically in this arrangement is mounted to the carrier. FIG. 11 illustrates the foregoing components in a de-energized or open position of the device. In this position, the movable contact assembly is distanced from the stationary contacts of the conductors so that current-carrying path through the device is interrupted. The device is thus electrically open.

FIG. 12 illustrates the same components, in a view in which certain of them have been shown in section to illustrate their inter-relationship and operation. Here again, the device is shown in an electrically open position that will exist when the operator is de-energized prior to making or after breaking. As shown in FIG. 12, in the de-energized position, the entire movable contact assembly is held in a raised position by the return spring 110. Here again, the device may be oriented differently so that the terms "raised" or "lowered" or similar terms are intended as only given the orientation shown in the figures. In this position, the armature 118 is separated from the operator assembly, in particularly from the yoke 108 and the core 108. The carrier 120 holds the conductor assembly 122 spaced from the contact pads of the line and load-side conductors 96 and 98. The assembly is illustrated as including guides 132 (see FIGS. 9 and 10) through edge the terminals 114 may be routed.

In the currently contemplated embodiment, to reduce size and weight but to provide an excellent working structure, a guide or alignment pin 134 is provided in the movable assembly. The pin may be secured in place by any suitable means, such as a clip or retaining ring in the carrier. The pin is recessed within the carrier to provide the desired degree of perpendicularly and alignment with the other components of the movable structure. The operator assembly, on the other hand, comprises one or more core windings 136 which are made of a series of electrically insulated conductive wire, such as copper. The wires typically wound on a bobbin 138 which is placed between the yoke 106 and the core section 108. The core assembly is typically formed as a separate component which is assembled with the other elements of the other elements of the operator during manufacture. In the illustrated embodiment, the core section 108 is formed as a cylindrical structure having a central aperture 140 for receiving the alignment pin 134. An extension 142 of this core section is affixed to a lower opening in the yoke 106, such as by staking, threading, or any suitable means. The aperture 140 comprises at least two sections, including a central alignment section 144 that is dimensioned to fit relatively snuggly with the alignment pin, but to allow for easy movement of the alignment pin therein, providing the desired alignment function. An upper recess 146 is somewhat enlarged in forms of shoulder within the core section to receive the return sprig 110 and to form a foundation against which the return spring bears during operation. In the depicted embodiment, the return spring 110 is provided in a convenient location, but may be provided in other locations in other embodiments.

The upper portion of the carrier 120 includes a window 150 in which the conductor assembly 122 is positioned. The window is contoured to receive and to hold in place a movable conductor biasing spring 152 that enables some movement of the conductor assembly 122 as it comes into contact with the line and load-side conductors 196 and 198. As will be appreciated by those skilled in the art, in the illustrated embodiment, the conductor assembly 122 includes a turnback element, a conductive bridge or spanner, and contact pads affixed to this spanner. The spanner will typically be made of a highly conductive material, such as copper, and the contact pads will be made of a conductive material that is nevertheless resistant to arcing that may occur, such as silver, silver/tin oxide, silver nickel alloys, and so forth.

The line and load-side conductors 96 and 98 may be mounted to the mounting assembly 126 in any suitable manner, such as by screws or rivets 154. As can be best seen in the exploded view of FIG. 8, contact pads of the line and load-side conductors are positioned to come into contact with the contact pads of the movable conductor assembly when the device is closed or "made". The turnbacks 128 fit around this contact pad and are themselves are secured by fasteners. One or more insulative elements, such as synthetic membranes may be placed between the turnbacks 128 and the conductors 96 and 98 when desired. In the illustrated embodiment bumps 156 are formed on the turnbacks to promote migration of any arcs that are formed during operation of the device.

Figure 13:
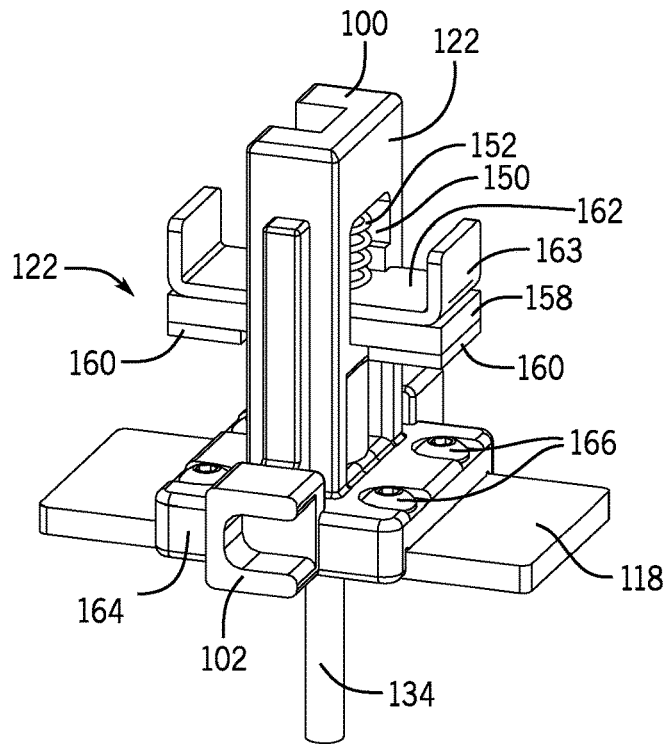
FIG. 13 is a top perspective view of a movable contact structure for the device, in accordance with an embodiment.

The elements of the movable contact assembly are illustrated in greater detail in FIG. 13. Here again, the conductor assembly 122 may include an upper auxiliary actuator 100, where desired. A side auxiliary actuator 102 may also be included. The assembly itself is formed around the conductor 158 which forms the bridge for the structure. Contact pads 160 are affixed to a lower side of this conductor and come into contact with the stationary contact pads of the line and low-side conductors when the device is closed or energized. The carrier assembly 122 itself also includes a base 164 to which the armature 118 is secured by appropriate fasteners 166. Again, the alignment pin 134 extends downwardly from the base 164 of the carrier.

Figure 14:
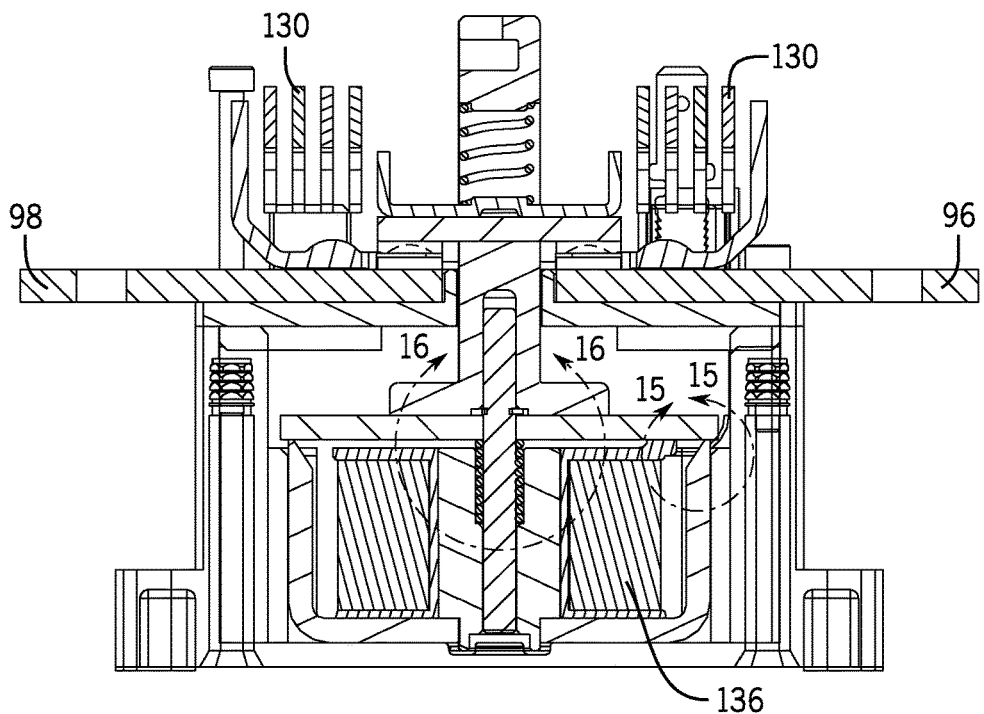
FIG. 14 is a partially sectioned side view of the internal components and assemblies of the device in an open position, in accordance with an embodiment.

Additionally, a turnback 162 is formed in a metallic element that rests adjacent to the conductive span 158. In the illustrated embodiment the turnback 162 also contacts the conductor biasing spring 152 to hold the movable conductors in a lower position in the window 150. In some embodiments, the turnback 162 may shape the magnetic field during opening by providing an alternate path for the current. More specifically, the arc may be attached up onto a face 163 of the turnback 162 and stay there during the arcing event. In this manner, the arcing experienced by the contactor pads 160 may be reduced, thereby enabling the ionized atmosphere around the contact pads 160 to regain their dielectric strength FIG. 14 illustrates the foregoing structure in the energized or shifted position. This position corresponds to energization of the operator coil, typically by application of a DC voltage. So long as the coil is energized, the coil generates a flux that is channeled by the yoke 106 and core 108 of the operator assembly, drawing the armature toward the operator assembly, shifting the entire movable contact assembly downwardly. Thus, in FIG. 14 the armature 118 is illustrated in a downward position adjacent to the yoke 106. The alignment pin has guided the movable assembly in its motion, and protrudes further into the alignment portion 144 of the aperture in the core section 108. The return spring is shown compressed. The movable contacts, hidden here behind the fasteners of the turnbacks in the stationary contact assembly are in contact to complete a current carrying path through the device. In the presently contemplated embodiment, a single current carrying path is defined through the device that includes the line-side conductor 96, the load-side conductor 98, the contact pads of these conductors, the movable contact pads of the movable contact assembly, and the conductive spanner of the movable contact assembly. The device is thus a single-pole device that is suitable for passing current of a single phase of AC power (or DC power).

Figure 15:
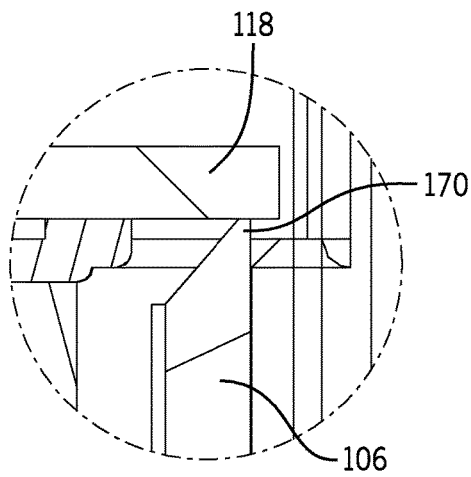
FIG. 15 is a detailed view of one aspect of the device structure, in accordance with an embodiment.
Figure 16:
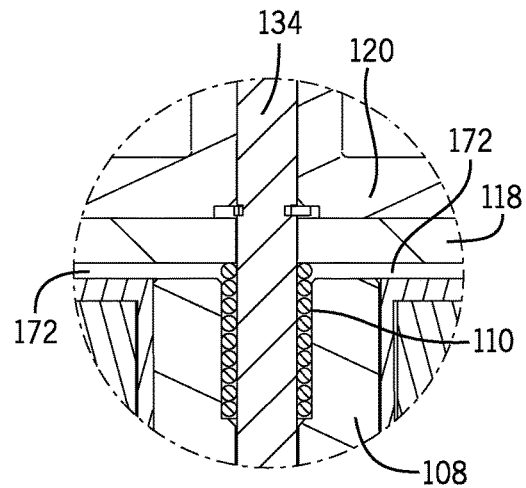
FIG. 16 is a detailed view of a further aspect of the device structure, in accordance with an embodiment.

Certain presently contemplated details of this assembly are illustrated in FIGS. 15 and 16. As shown in FIG. 15, to promote saturation of the yoke 106, upper ends of the yoke may have a reduced dimension 170 in a region where they come into contact with or are close to the armature 118 when shifted. Such saturation may facilitate holding of the movable assembly in the shifted position while reducing required holding current in the coil. As shown in FIG. 16, moreover, a gap 172 may be formed between the upper surface of the central core section 108 of the operator assembly and the armature 118. Such gaps may be formed by air spacing, insulating elements, or by any similar means. Such gaps may aid in avoiding residual flux in the armature 118, yoke 106 and/or core 108 that may otherwise preclude or slow the separation or movement of the movable assembly upon de-energization of the operator coil.

Figure 17A:
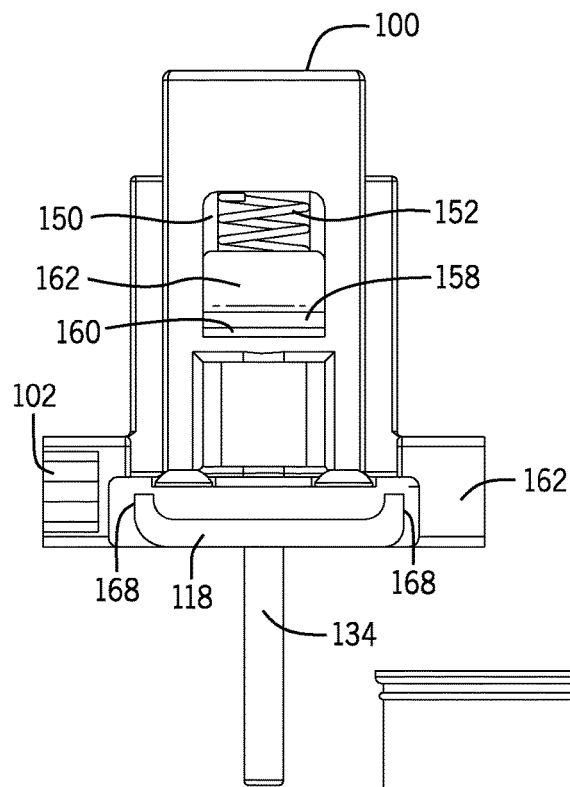
FIG. 17A is a detailed view of an optional armature arrangement of the device structure, in accordance with an embodiment.

FIG. 17A illustrates a presently contemplated alternative configuration in which current may be sensed by the effects of the current on signals through the operator coil itself. That is, before the device is shifted or energized to make or close the device, no current should flow between the line and low-side conductors. Once the device is shifted, however, current may flow through the single current-carrying path as described herein. When current does flow, various mechanisms may be envisaged for sensing the current, including separate current sensors, which may be internal or external to the switching device. It is presently contemplated, however, that certain elements of the structure may themselves permit sensing of the main current through the single current-carrying path. Such sensing may, for example, be performed by monitoring current through the operator coil described below. The current to the operator coil may be perturbed in detectable ways by current through the single current-carrying path. Such perturbations may be evaluated by the coil control circuitry and used as an indication of the main current through the device. In the illustration of FIG. 17A, the armature 118 may provide sufficient coupling of flux generated by the main current through the device with current through the operator coil to enable such sensing. Where enhanced sensing is desired, it is possible to design the armature 118 to promote the sensing, such as by the inclusion of wings 168 or other structures that tend to enhance the uptake of flux through the armature that may be generated by the current through the main current-carrying path.

Figure 17B:
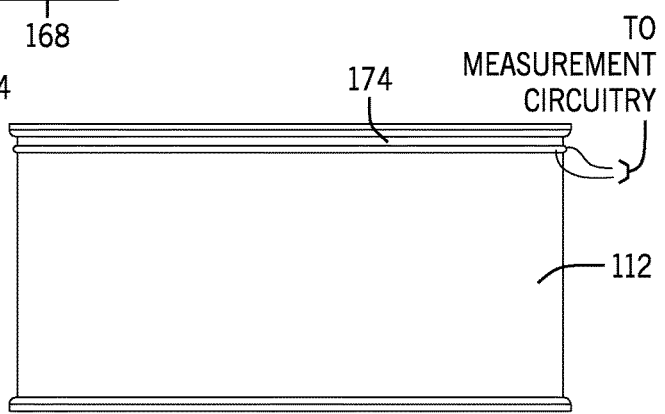
FIG. 17B is a diagrammatical representation of a similar device with a dedicated sensing winding or coil, in accordance with an embodiment.

An alternative or complimentary arrangement for sensing current is illustrated in FIG. 17B. In this arrangement, one or more sense windings 174 are provided on the operator coil 112. The sense winding may be made of a similar or different material, and will typically not require more than one or a few turns. Where desired, a secondary groove may be provided in the bobbin discussed above to receive the sense winding. The sense winding, where provided, will have lead as illustrated in FIG. 17B that will be coupled to measurement circuitry used to detect current through the main current-carrying path of the device.

Figure 18:
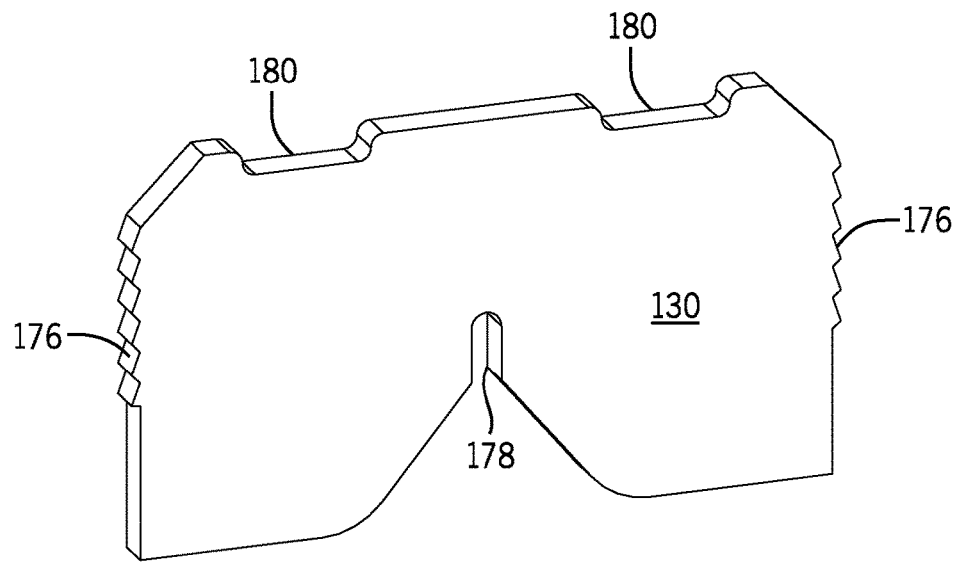
FIG. 18 is a perspective view of a splitter plate for the device, in accordance with an embodiment.
Figure 19:
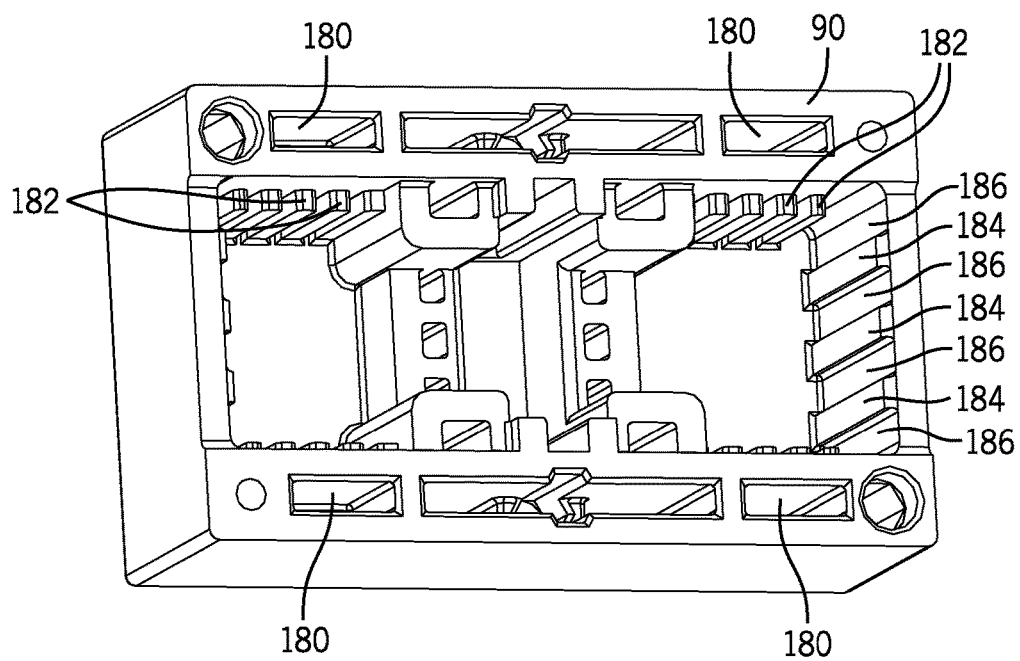
FIG. 19 is a perspective view of an internal construction of the device housing to help channel and cool gases, in accordance with an embodiment.

The contactor illustrated in the figures also includes integral structures for routing plasma and hot gasses and facilitating their migration out of the device where desired. As illustrated in FIGS. 18 and 19, these might include features of the splitter plates 130 and the upper housing. As shown in FIG. 18, for example, a current design for the splitter plates 130 includes stake ridges that allow the plates to be pressed into place within the upper housing and held into place, preventing their withdrawal. A lower recess 178 is formed in each plate, and upper recesses 180 are formed that enable the passage of plasma and hot gasses during opening and closing of the device. As best illustrated in FIG. 19, the upper housing may include alignment features, such as recesses 180 that may also enable the passage of operator coil leads, where such designs are used. Within the upper housing, plate guides 182 may be formed that receive the splitter plates therebetween, and hold the splitter plates in spaced relation with one another. On ends of the interior surface of the upper housing, gas guides 184 may be formed that are separated from one another by grooves 186. These may be placed in general alignment with the recesses 180 formed in the splitter plates. Gasses may thus be channeled upwardly around the movable contact assembly, through the upper recesses 180, which form passage ways with the upper interior wall of the upper housing, and then downwardly through the grooves 186. The gasses may exit gaps formed between line and load-side conductors and the upper housing. In the illustrated embodiment, the upper housing (and where desired the lower housing and even the mounting assembly for the stationary contact assembly) may be bilaterally symmetrical so that its orientation is arbitrary, greatly facilitating assembly of the device. Such innovations may also facilitate ease of manufacturing and reduced number of different parts.

Figure 20:
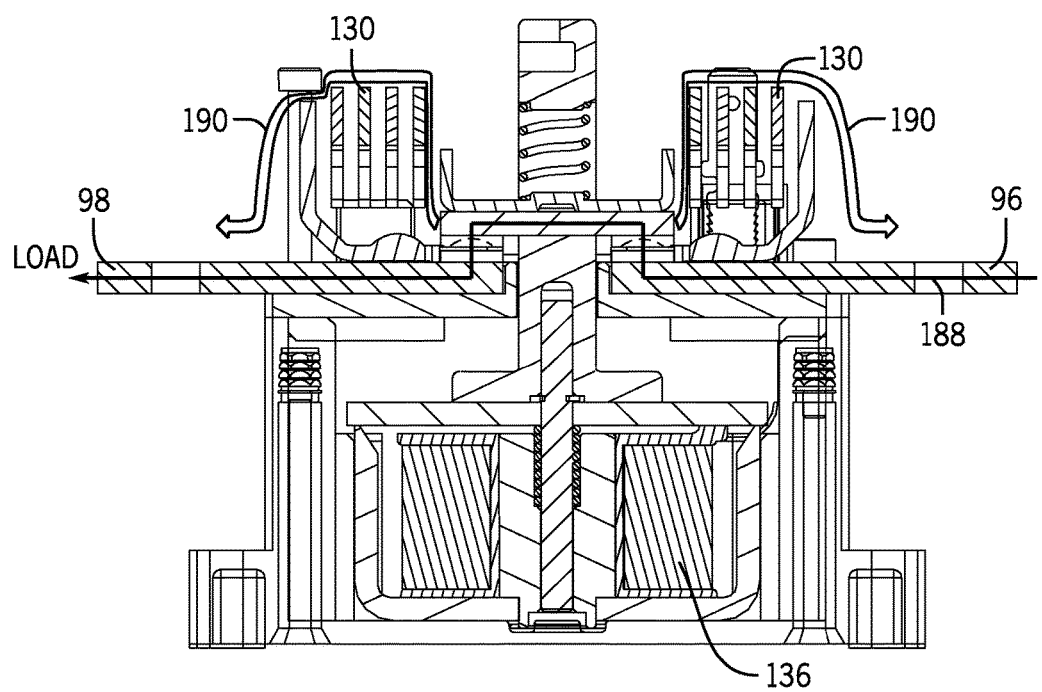
FIG. 20 is a partially sectional view representing the channeling of gases during operation of the device, in accordance with an embodiment.

FIG. 20 illustrates a cross-sectional view of the single current-carrying path switching device. More specifically, when the switching device is closed (e.g., core windings 136 are energize), as indicated by arrow 188 in FIG. 20, a single current-carrying path is established through the device when closed, allowing for single-pole operation. As discussed in greater detail below, the device may be made much smaller physically than previous devices of the same type. This is particularly true owing to the mechanical design of the components. The design around a single-pole strategy rather than a three-phase strategy, and so forth. The device may be particular reduced in size and mass by the use of POW switching strategies which greatly reduce arcing and wear within the device. As also noted elsewhere in the present discussion, where the switching devices used for three-phase applications, and POW switching strategies are employed, adjusting order and/or timing of opening/closing switching devices may greatly prolong the life of the device while allowing for reduced size and mass. The reduction in size and mass affectively also reduces the cost of the individual components, particularly the relatively expensive conductive materials used. Further, smaller devices may also reduce the electrical enclosure used to house these components and, thus, reduce the amount of space within a factory or facility occupied by such components.

On the other hand, when the switching device opens from the closed position plasma and/or gasses may be generated. Accordingly, as indicated by arrow 190, the plasma and/or gasses are routed upwardly through passageways and the splitter plates 130 and then downwardly through grooves in the upper housing 90. In fact, such routing facilitates interruption of current through the device by the action of the splitter plates 130, and also significantly cools plasma and gasses as they are routed through the device and exit.

The single-pole, single current-carrying path device described above may be used in a variety of applications and ways. For example, the device may be energized by controlled DC currents as described elsewhere in the present disclosure. Such control facilitate carefully timed switching, such as for POW switching strategies. The device may be used for single-phase switching or multi-phase switching, such as in three-phase systems. The reduced size, weight and mass of the device discussed above greatly facilitate the assembly of the device in various ways, promoting a modular approach to a system design. As discussed below, such modularity may enable the construction of a wide range of complex devices that have heretofore been designed with three-phase contactors, relays and other switches, complex wiring, complex assembly, and so forth.

Figure 21:
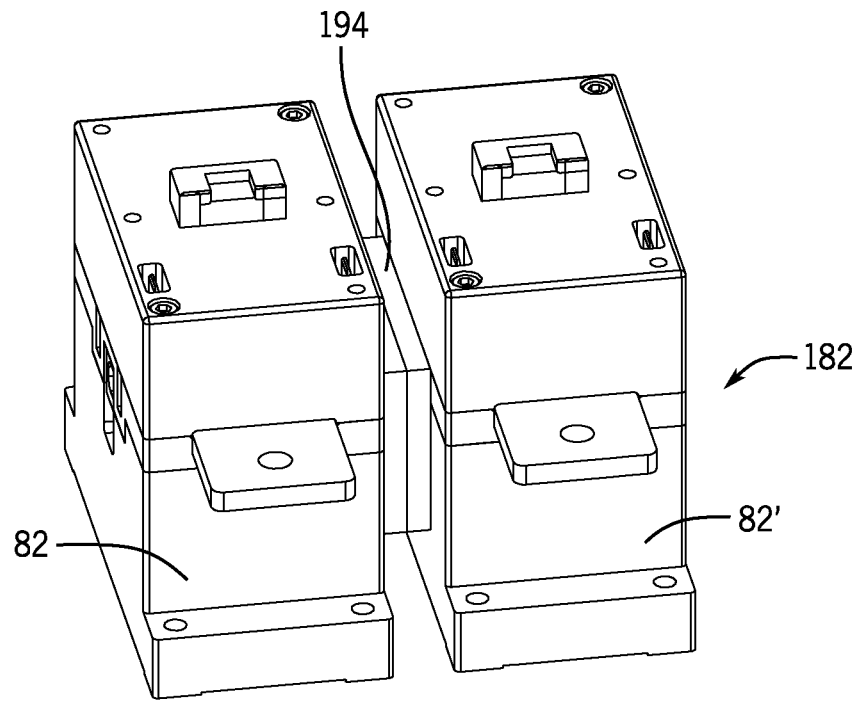
FIG. 21 is a top view of a pair of single-pole switching devices joined by a mechanical interlock, in accordance with an embodiment.
Figure 22:
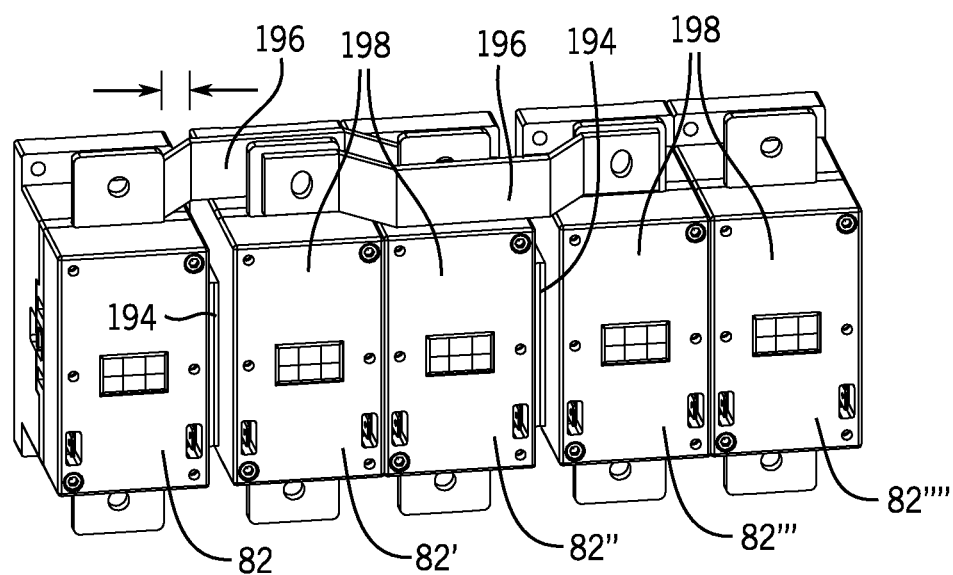
FIG. 22 is a perspective view of a system assembled with multiple single-pole switching devices with electrical interconnects, in accordance with an embodiment.

One mechanism for enabling the interconnection of the devices may be based around the use of mechanical interlocks that are positioned between mated devices. FIGS. 21-24 illustrate the use such interlocks. In the illustration of FIG. 21, two switching devices 82 and 82' are shown positioned side-by-side with an assembly 192. The assembly includes an interlock 194 that is positioned between, secured to and that interfaces with the side auxiliary actuators of the devices as described above. As shown in FIG. 22, various assemblies of this type may be envisaged. In the more complex assembly of FIG. 22, a number of switching devices are positioned side-by-side, with interlocks 194 being placed between certain devices that should not be switched or energized at the same time. Owing to the particular construction and design of the devices it has been found that reduced distances may be allowed while nevertheless respecting requirements of electrical codes. Where desired, to define the desired circuitry, one or more conjunctive jumpers 196 may be routed between line and/or load-side conductors as generally shown in FIG. 22. Where desired, insulated materials may be placed between such jumpers to enable definition of complex circuitry that includes the current-carrying paths defined by the modular devices. Pairs 198 of the devices may be positioned side-by-side, while other pairs are positioned side-by-side with the interlocks 194 provided therebetween.

Figure 23:
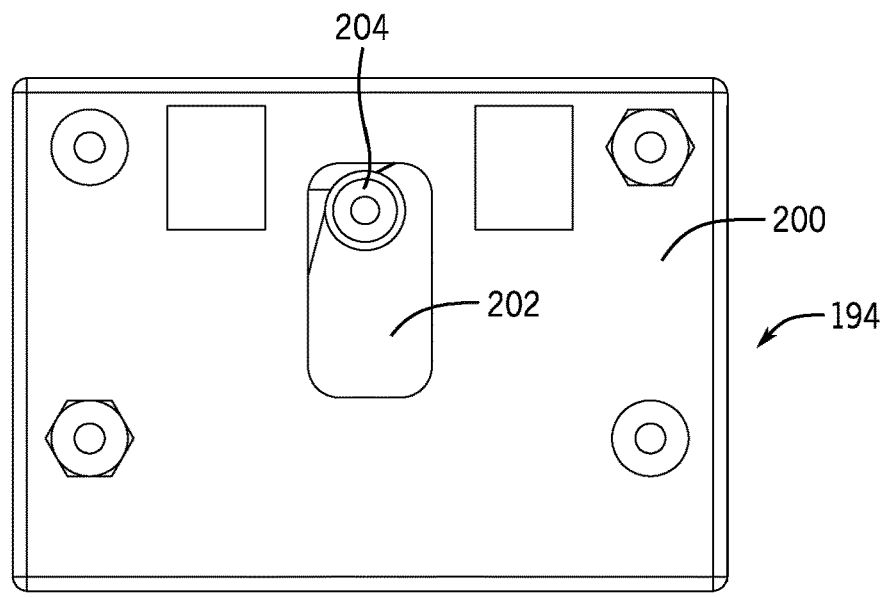
FIG. 23 is a perspective view of a mechanical interlock that may be used in the assemblies, in accordance with an embodiment.
Figure 24:
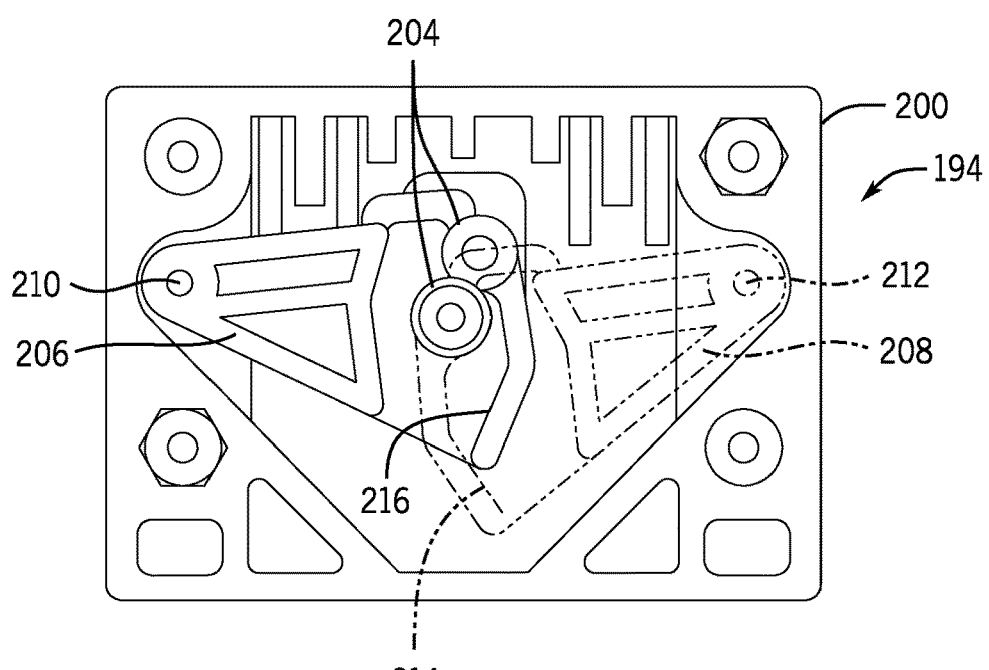
FIG. 24 is an exploded view of the mechanical interlock, in accordance with an embodiment.

Again, the interlocks may enable mechanical control of the modular switching devices, and in particular prevent two switching devices from being closed at the same time. As will be appreciated by those skilled in the art, many power circuits require that such mutual energization may be avoided, and the interlocks enable a simple mechanism to maintain the current-carrying path open through one device while it is closed through one another. A currently contemplated design for the interlock as illustrated in FIGS. 23 and 24. The interlock may include a housing 200 that is generally symmetrical about a vertical center line allowing for reduction in parts because only a front and a back of the housing are required. The housing may be structured to be easily mounted between adjacent module switching devices. The housing may include a window opening 202 on both sides through which an actuating element 204 is accessible. The element 204 interfaces mechanically with the side auxiliary actuators of the switching devices described above (see, e.g., FIG. 7). As best illustrated in FIG. 24. A current design for the interlock includes self-similar lever arms 206 and 208 that are mounted pivotally within the housing. Pivot pins 210 and 212 enable pivotal movement of the lever arms 206 and 208. These may be integrally formed with the housing, or may be defined by separate components (e.g., roll pins) inserted in the housing. Each lever arm carries a respective actuating element 204, with one element extending on one side of the structure and the other element extending on an opposite side. Each lever arm includes an integral cam arrangement 214 and 216 that contact one another to prevent one of the lever arms from moving to a downward position when the other lever arm is already in a downward position. Thus, when connected to the side auxiliary actuators of two modular switching devices that are mounted side-by-side, only one of the actuating elements 204 is allowed to a lower position at a time. When the energized and shifted switching device is de-energized and shifted to an open position then, interference between the integral cams is eliminated and one or the other device is then free to shift to its energized or closed position. Many advantages may flow from the interlock arrangement illustrated, particularly the simplicity of the structure, the reduction in the number of parts, the ability to fabricate the parts from easily-molded materials (typically non-conductive plastics) and the ease of manufacture. In the illustrated embodiment, as noted above, the housing may comprise two self-similar housing shelves, while the lever arms 206 and 208 may also be identical, as may the actuating elements 204.

Operation of a Single-Pole Switching Device

Figure 25:
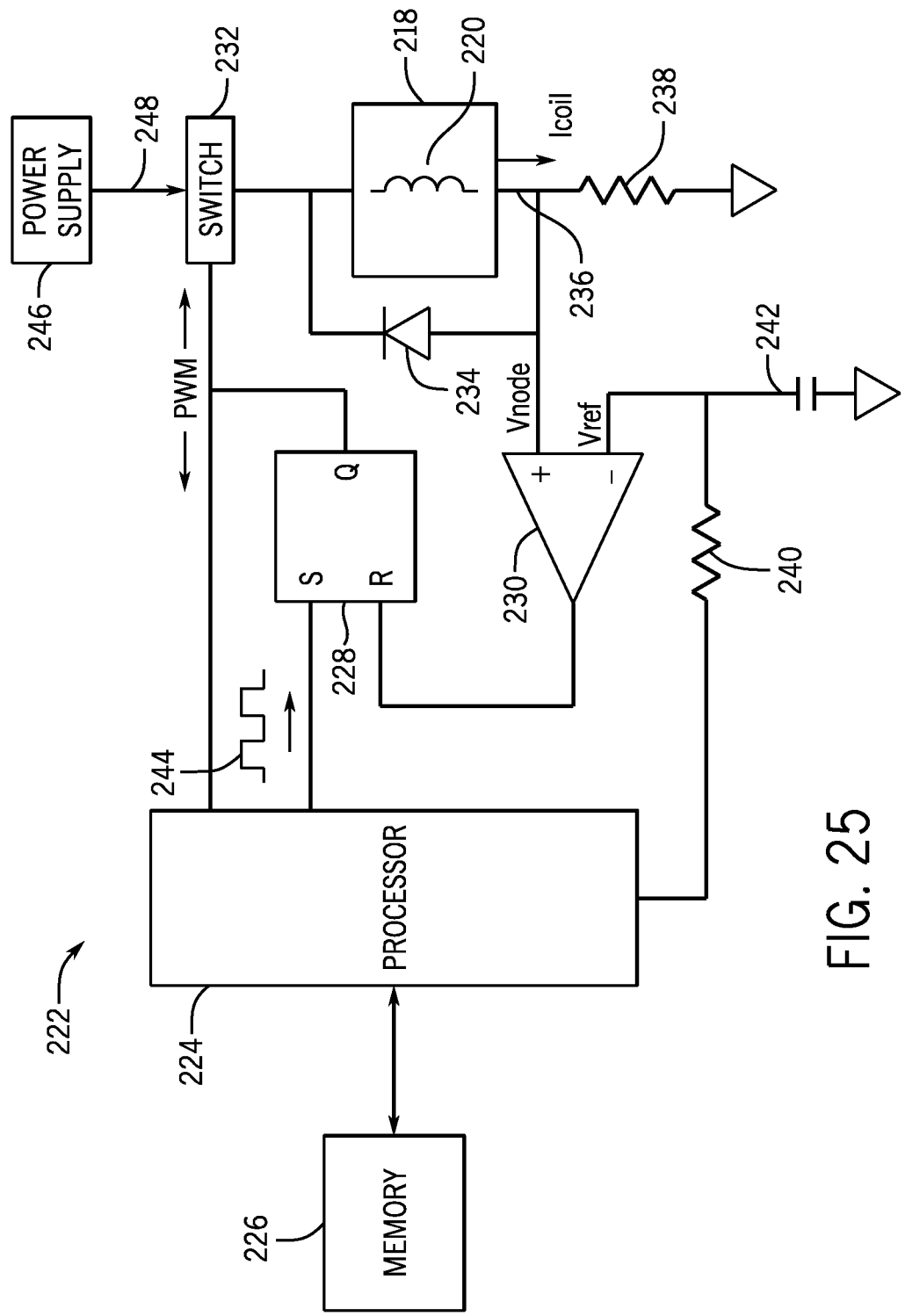
FIG. 25 is a circuit diagram of an operating coil driver circuitry for use with the single-pole switching device, in accordance with an embodiment.

Referring to FIG. 25, based on the above described switching device (e.g., single-pole, single current-carrying path switching device), designated in this figure by reference numeral 218, operation (e.g., opening and closing) of the switching device 218 is based on controlling electric power supplied to the operating coil 220. To control operation of the single-pole, single current-carrying path switching device 218, as well as any other switching device with an operating coil, an operating coil driver circuitry 222 may be utilized. To simplify discussion, the operating coil driver circuitry 222 will be described in relation to the single-pole, single current-carrying path switching device 218 described above. As depicted, the operating coil driver circuitry 222 includes a processor 224, memory 226, an SR flip-flop 228, a comparator 230, a switch 232, and a flyback diode 234. More specifically, as will be described in more detail below, the memory 226 may be a tangible non-transitory medium that stores computer-readable instructions that when executed perform various processes described. Accordingly, in some embodiments, the processor 224 and memory 226 may be included in the automation controller 44 or control and monitoring circuitry 18. It should be noted that although the SR flip-flop 228 and the comparator 230 are described as discrete hardware components, in other embodiments, they may be implemented by the processor 224 as computer readable instructions.

As will be described in more detail below, the operating coil driver circuitry 222 controls operation of the switching device 218 by controlling the current in the operating coil (i.e., Icoil). In the depicted embodiment, the operating coil current may be determined by measuring the voltage at node 236 (i.e., Vnode). More specifically, since the operating coil current flows through resistor 238 to ground, the operating coil current is equal to the voltage at node 236 divided by the resistance of the resistor 238. As such, the resistor 238 is generally referred to as a current measuring resistor. In other words, the voltage at node 236 may be used as a proxy for the operating coil current.

Additionally, as depicted, the node voltage is applied to the non-inverting terminal of the comparator 230 and compared to a reference voltage (i.e., Vref), which is applied to the inverting terminal of the comparator 230. More specifically, the processor 224 outputs a voltage that is smoothed into the DC reference voltage by resistor 240 and capacitor 242, which corresponds with the voltage expected to be measured at node 236 when the target (e.g., desired) operating coil current flows through resistor 238. In other embodiments, the processor 224 may include a digital-to-analog (DAC), thereby obviating the resistor 240 and the capacitor 242. In this manner, the reference voltage may be equal to the target operating coil current multiplied by the resistance of resistor 238.

Accordingly, when the node voltage is higher than the reference voltage, the output of the comparator 230 is high indicating that the operating coil current is higher than the target. On the other hand, when the node voltage is lower than the reference voltage, the output of the comparator 230 is low indicating that the operating coil current is lower than the target. In other words, the processor 224 may indicate the target operating coil current with the reference voltage.

The result of the comparison performed by the comparator 230 is applied to the R terminal of the SR flip-flop 228. At the S terminal of the SR flip-flop 228, the processor applies a trigger signal 244, which periodically goes high to set the SR flip-flop 228. Based on the result of the voltage comparison and the trigger signal 244, the SR flip-flop 228 outputs a pulse-width-modulated (PWM) signal to the switch 232 and the processor 224. More specifically, the PWM signal is low when the input from the comparator 230 is high, thereby instructing the switch to turn off and disconnect electric power from the operating coil 220. On the other hand, the PWM signal goes high when the input from comparator 230 is low and the trigger signal 244 is high, thereby instructing the switch 232 to turn on and supply electric power from the power supply 246 to the operating coil 220.

In this manner, the trigger signal 244 is input to the SR flip-flop 228 to facilitate generating the PWM signal by periodically attempting to turn on the switch 232. In some embodiments the frequency of the trigger signal 244 may be based at least in part on desired resolution, how quickly current decays in the coil 220, and/or line frequency of the power supply 246. For example, when the line frequency is 60 Hz, the trigger signal may have a frequency of 21.6 kHz (i.e., 1/(60*360)) to achieve a one electrical degree resolution.

Based on the PWM signal, the switch 232 selectively connects or disconnects the operating coil 220 from electric power supplied by the power supply 246 to a DC bus 248. More specifically, the power supply 246 may output DC electric power to the DC bus 248 based on an external AC or DC power source, such as power source 12. In some embodiments, the power supply 246 may store some electric power to decouple the operating coil control circuitry 222 from the power source. For example, decoupling may reduce the effect of variations in the power source, such as a brown out, on the operation of the operating coil control circuitry 222.

As described above, when the PWM signal is high, the switch 232 connects the operating coil 220 to the DC bus 248 to supply electric power to the operating coil 220. On the other hand, when the PWM signal is low, the switch 232 disconnects the operating coil 220 from the DC bus 248 to remove electric power from the operating coil 220. In this manner, the PWM signal may control the duration the electric power is connected and, thus, the operating coil voltage.

More specifically, the operating coil voltage may be equal to the DC bus voltage when the switch 232 is on and equal to voltage across the flyback diode 234 when the switch 232 is off. As such, the average operating coil voltage (i.e., voltage drop across the operating coil 220) may approximately equal to the DC bus voltage times the PWM signal duty cycle. Since the operating coil current is directly related to the operating coil voltage, the operating coil current may also be controlled by adjusting the duty cycle of the PWM signal. For example, when duty cycle is increased, the operating coil current increases and, when the duty cycle is decreased, the operating coil current decreases.

Accordingly, aside from providing the reference voltage and the trigger signal 244, the operating coil current may be adjusted to the target coil current relatively independent from the processor 224. For example, when the operating coil current is lower than the target, the SR flip-flop 228 outputs the PWM signal to instruct the switch 232 to connect electric power from the power supply 34 to the operating coil 220. On the other hand, when the comparator 230 determines that the operating coil current is higher than the target, the SR flip-flop 228 outputs the PWM signal to instruct the switch 232 to disconnect the power supply 246 from the operating coil 220.

In this manner, the operating coil current may be regulated relatively independent from the processor 224. Nevertheless, the processor 224 may still receive the PWM signal from the SR flip-flop 228. As will be described in more detail below, the PWM signal may enable the processor 224 to determine when the switching device 218 makes or breaks, as well as other diagnostic information.

As described above, the operating coil driver circuitry 222 may control operation of the switching device 218 by controlling the operating coil current. For example, to make (i.e., close) the switching device 218, the operating coil driver circuitry 222 may supply electric power to the operating coil 220, which magnetizes the operating coil 220. The magnetized operating coil 220 then attracts the armature 118, one embodiment of which is depicted in FIG. 8, to close the switching device 218. To help illustrate, a profile of the operating coil current 250 used to make the switching device 218 is shown in FIGS. 26A and 26B, which is a zoomed in view of FIG. 26A.

Figure 26A:
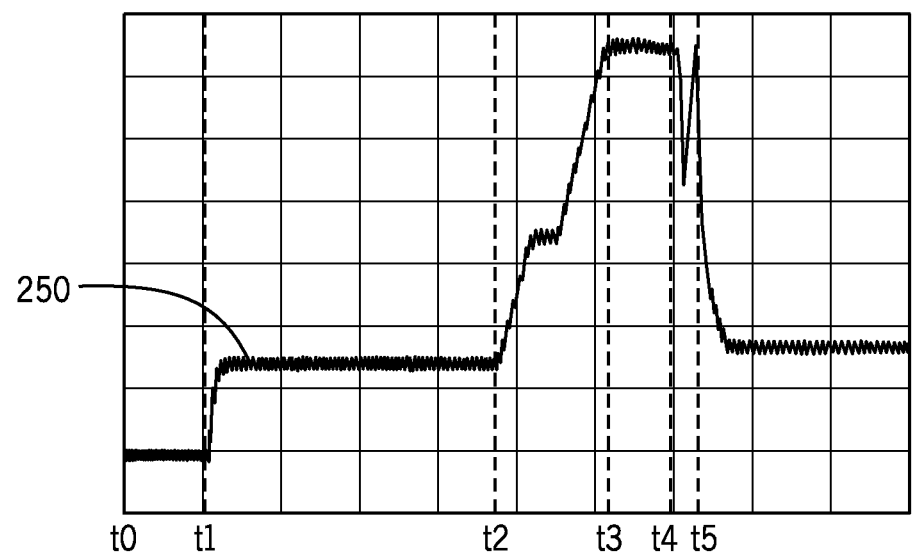
FIGS. 26A and 26B are a diagrammatical representations of coil current waveforms for closing of the device, in accordance with an embodiment.
Figure 26B:
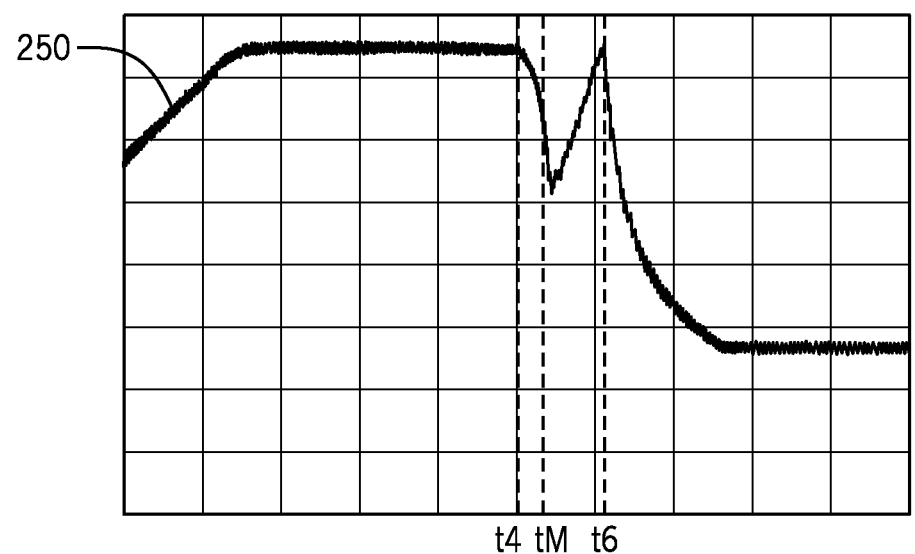

As depicted in FIG. 26A, between t0 and t1, current is not supplied to the operating coil 220. At t1, a small amount of current insufficient to close the switching device 218 is supplied to the operating coil 220. More specifically, as will be described in more detail below, the small amount of current may be utilized to measure the temperature (e.g., actual or relative temperature) of the operating coil 220. Accordingly, the operating coil current 250 between t1 and t2 is generally referred to herein as the "measurement current." Moreover, the measurement current may also serve to "precharge" the magnetic flux in the operating coil 220, thereby reducing amount of current increase to close the switching device. In this manner, repeatability and/or timing of closing the switching device 218 may be further improved.

Between t2 to t3, the operating coil current 250 is ramped up from the measurement current to a level sufficient to close the switching device 218. Accordingly, the operating coil current 250 between t3 and t4 is generally referred to herein as the "pull-in current." It should be noted that as in the depicted embodiment, the current is partially ramped up to an intermediate current level between the measurement current and the pull-in current. In some embodiments, the operating coil driver circuitry 222 may ramp the current to the intermediate current level to further precharge the magnetic flux in the operating coil 220, thereby reducing amount of current increase to close the switching device. Additionally or alternatively, the current may be directly ramped up from the measurement current to the pull-in current.

Upon ramping the operating coil current 250 up to the pull-in current, the armature 118 may begin to move. As the armature 118 moves, the impedance of the operating coil 220 increases. More specifically, the armature 118 may behave as both a position variable inductor and as a linear motor and, thus, affect inductance (e.g., impedance) of the operating coil 220 when in motion. Accordingly, to maintain the operating coil current 250 at the target level (e.g., pull-in current), the operating coil driver circuitry 222 may increase the amount of electric power supplied to the operating coil 220. As described above, this may include increasing the duty cycle of the PWM signal.

By design, at t4, the impedance of the operating coil 220 has increased to a point where the electric power supplied by the power supply 246 is no longer able to maintain the operating coil current 250 at the pull-in current. As depicted, the operating coil current 250 sharply drops. After the switching device 218 makes, the impedance of the operating coil 220 returns to normal, thereby enabling the operating coil current 250 to return to the pull-in current. More specifically, when the armature 118 stops moving (e.g., when it hits the yoke 106) inductance generated by movement of the armature may dissipate. Accordingly, as depicted, the operating coil current 250 returns to the pull-in current at t5, which produces a "V" between t4 and t5.

In fact, as will be described in more detail below, the profile of the operating coil current 250 (e.g., duration between t4 and t5) may be used as an indication of armature 118 position and, thus, when the switching device 218 makes. More specifically, at some time between t4 and t5, for example at tM, the switching device 218 makes. The drop in the operating coil current 250 between t4 and t5 is more clearly depicted in FIG. 26B.

As depicted, after t5, the operating coil current 250 is reduced to a current level sufficient to hold the switching device 218 closed. As such, the operating coil current 250 after t5 is generally referred to herein as the "hold-in current." In some embodiments, the operating coil current 250 may be reduced to the hold-in current to reduce the power consumption of the switching device 218 and/or ohmic heating of the operating coil 220.

Figure 27:
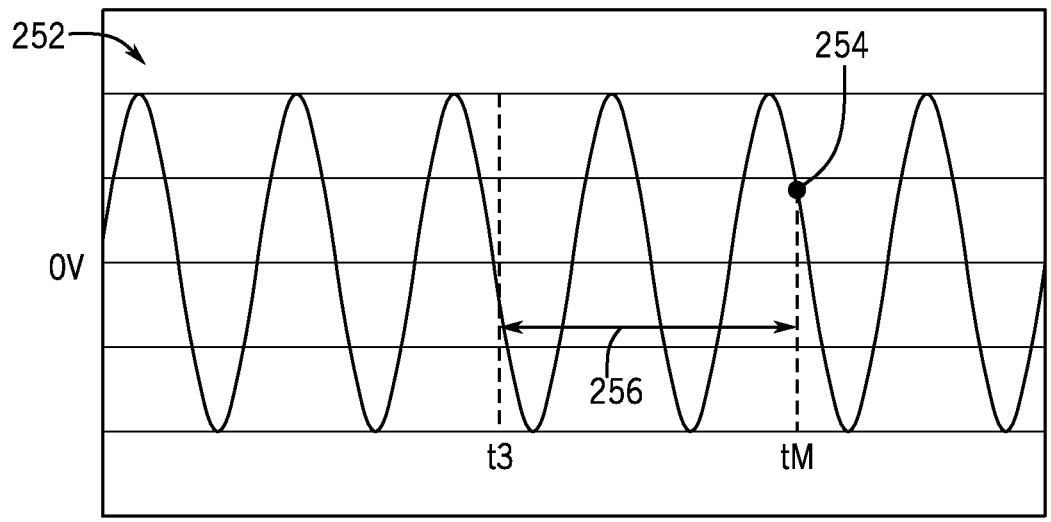
FIG. 27 is a voltage waveform illustrating timing considerations for closing the device, in accordance with an embodiment.

Based on the above description, the make time of the switching device 218 is generally not instantaneous. As used herein, the "make time" is generally intended to describe the time between when pull-in current is applied and when the switching device 218 makes. For example, there is a slight delay between when pull-in current is applied at t3 and when the switching device 218 actually makes at tM. Accordingly, the operating coil driver circuitry 222 may take into account the non-instantaneous nature of the switching device 218 to improve control of the switching device 218, for example, to facilitate making the switching device 218 at a specific point on the electric power waveform. To help illustrate, FIG. 27 depicts a source voltage waveform 252 of one phase of electric power supplied to the switching device 218 from the power source 12.

As described above, to reduce magnitude of inrush current and/or current oscillation, the switching device 218 may be closed based upon a predicted current zero-crossing (e.g., a point on source waveform 252 within a range from slightly before to slightly after the predicted current zero-crossing). As described above, the predicted current zero-crossing may occur at a line-to-line voltage maximum (e.g., 90° after a line-to-line voltage zero crossing or 60° after a line-to-neutral voltage zero crossing). For example, in the depicted embodiment, the switching device 218 is desired to make at point 254 (e.g., a line-to-line voltage maximum). As described above, the switching device 218 may be closed by setting the operating coil current 250 to the pull-in current to attract the armature 118. Accordingly, since the switching device 218 generally does not make instantaneously, the operating coil current 250 may be set to the pull-in current at an earlier time to make the switching device 218 at a tM that corresponds with the point 254.

More specifically, the operating coil current 250 may be controlled based at least in part on the expected make time of the switching device 218. Based on the above described example, the operating coil current 250 is set to the pull-in current at t3 to make the switching device 218 at tM. In other words, the expected make time 256 of the switching device is the difference between t3 and tM. The operating coil current 250 may then be controlled based at least in part on the expected make time 256 of the switching device 218 (e.g., difference between t3 and tM).

Figure 28:
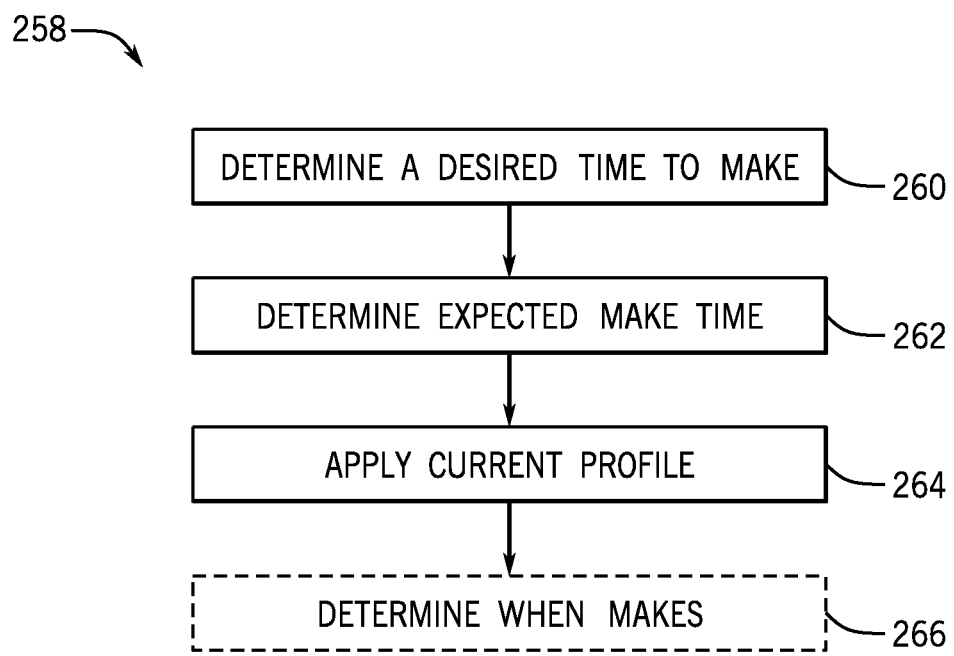
FIG. 28 is a block diagram of logic for timing closing of the device, in accordance with an embodiment.

One embodiment of a process 258 that may be used to make the switching device 218 at a specific point on an electric power waveform is shown in FIG. 28. The process 258 may be implemented via computer-readable instructions stored in the tangible non-transitory memory 226, 20, 46, and/or other memories and executed via processor 224, 19, 45, and/or other control circuitry. Generally, the process 258 includes determining a desired time to make the switching device 218 (process block 260), determining an expected make time of the switching device 218 (process block 262), and applying the current profile to make the switching device 218 at the desired time (process block 264). Additionally, the process 258 optionally includes determining when the switching device 218 makes (process block 266).

In some embodiments, the processor 224 may determine the desired time to make the switching device 218 (process block 260). As described above, the switching device 218 may be closed a specific point on the electric power waveform to minimize in-rush current, current transients, current oscillations and/or torque oscillations. Accordingly, in some embodiments, the processor 224 may determine that the specific point corresponds to a predicted current zero-crossing and/or a line-to-line voltage maximum. The processor 224 may then determine the time associated with the specific point.

As can be appreciated, each step in process 258 is generally not instantaneous. Accordingly, the desired time to make the switching device 218 may be selected to provide sufficient time to complete process 258. In other words, the desired time to make may not always correspond with the first subsequent predicted current zero-crossing. Additionally, in some embodiments, a user may instruct the operating coil driver circuitry 222 to close the switching device 218 as soon as possible independent of the electric power waveform and the processor 224 may determine the desired time to make accordingly.

The processor 224 may then determine the expected make time 256 of the switching device 218 (process block 262). The make time of the switching device 218 may be affected by various operational parameters, such as temperature. As will be described in more detail below, the temperature (e.g., actual temperature or relative temperature) may be determined via impedance of the operating coil 220 or other methods, such as a temperature sensor. Accordingly, the processor 224 may determine the various operational parameters, for example via sensors 22 or the measurement current, to determine the expected make time 256 of the switching device 218.

More specifically, in some embodiments, the processor 224 may input the operational parameters into a make time look-up-table (LUT) that relates the determined operational parameters to an expected make time 256. For example, when a specific temperature is input to the make time LUT, the LUT may output an expected make time 256. Although the described embodiments describe the used of look-up tables (LUTs), in other embodiments, the same results may be achieved by calculations performed by the processor 224 using various algorithms or a combination of algorithms and LUTs. Additionally, since the make time LUT, may be determined during normal operations, the processor 224 may adjust for any other known operational parameters that may affect the expected make time 256, such as a filtering delay, device wear, and/or other environmental conditions.

In some embodiments, the make time LUT may be based on empirical tests, such as past make times. For example, in some embodiments, a manufacturer may conduct tests on the particular switching device 218 or a comparable switching device 218 to determine the make time of the switching device 218 under the various operational parameters and populate the make time LUT accordingly. Additionally, when the switching device 218 is put into commission, the switching device 218 may run a testing sequence to determine when the switching device 218 makes under the various sets of operational parameters to calibrate the make time LUT.

Since the techniques described herein are based on previous operations, it is emphasized that the single-pole, single current-carrying path switching device 218 described above is designed to have highly repeatable and, thus, highly predictable operation. As such, the make time LUT enables the processor 224 to determine, with a reasonable certainty, the make time of the switching device 218 based on the make time of the switching device 218 previously under similar parameters. Nevertheless, it should be appreciated that the techniques may also be used for other types of switching devices, such as a multi-pole switching device.

Based on the expected make time, the current profile may be applied to the switching device 218 to make the switching device 218 at the determined time (process block 264). For example, the current profile may set the operating coil current 250 to the pull-in current. More specifically, the processor 224 may determine when to apply the current profile to the switching device 218 to make at the desired time. In some embodiments, the processor 224 may determine a specific time to apply the current profile by subtracting the expected make time 256 from the desired time to make. For example, subtracting the expected make time 256 from tM (e.g., desired time to make) results in t3 (e.g., the specific time to apply the current profile). Accordingly, as described above, the current profile is applied to the switching device 218 at t3.

Additionally, as described above, the operating coil current 250 may be ramped up to an intermediate level before the pull-in current. Accordingly, in such embodiments, the processor 224 may determine when to ramp up to the intermediate level. For example, the processor 224 may determine a specific time to ramp up to the intermediate level by subtracting a ramp up period (e.g., time between t2 and t3) from t3.

After the current profile is applied, the processor 224 may optionally determine when the switching device 218 makes (process block 266). More specifically, determining when the switching device 218 makes may enable determining the actual make time of the switching device 218.

As described above, the make time LUT may be based at least in part on past make operations. However, the make time of the switching device 218 may gradually change over time. For example, as the switching device 218 ages, the force provided by the spring 110 that resists closing the switching device 218 may gradually decrease, which may gradually reduce the make time of the switching device 218. Additionally, as contact material wears away, the distance the switching device 218 moves to close may increase and/or debris may building up causing friction, which may gradually increase the make time of the switching device 218.

Accordingly, determining the actual make time may facilitate calibrating and/or updating the make time LUT to better account for operational changes in the switching device. In fact, as will be described in more detail below, keeping track of the actual make times may facilitate performing diagnostics on the switching device 218. For example, if the make time of the switching device 218 is different than expected, the processor 224 may identify that the switching device 218 may be obstructed in some way or suffering from some other anomalous condition.

In some embodiments, the processor 224 may utilize the PWM signal to determine when the switching device 218 makes. More specifically, as described above, the PWM signal output by the SR flip-flop 228 is fed back to the processor 224. Based on the duty cycle of the PWM signal, the processor 224 may determine duration of the drop in the operating coil current (e.g., duration between t4 and t5), which may be directly related to when the switching device 218 makes.

Figure 29:
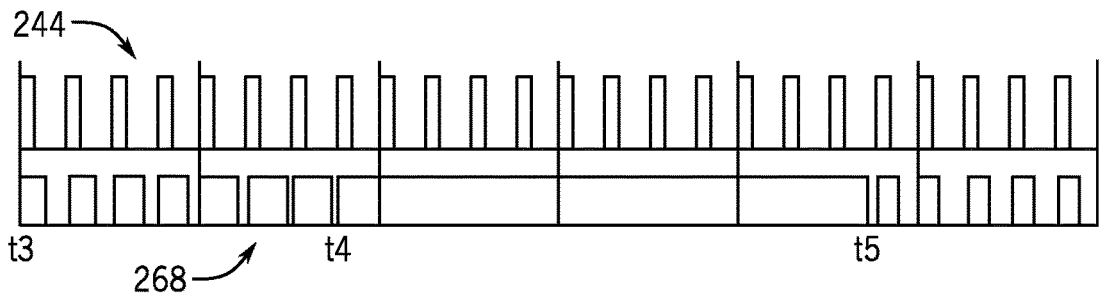
FIG. 29 is a PWM waveform for determining closing the device, in accordance with an embodiment.

To help illustrate, FIG. 29 depicts the trigger signal 244 output by the processor 224 and the PWM signal 268 input to the processor 224. As described above, the trigger signal 244 is input to the SR flip-flop 228 to facilitate generating the PWM signal 268 by periodically attempting to set the SR flip-flop 228 (e.g., make the PWM signal 268 high). More specifically, when comparator 230 determines that the operating coil current 250 is lower than the target and the trigger signal 244 is high, the SR flop-lop 228 outputs a high PWM signal 268 instructing the switch to turn on, thereby supply electric power from the power supply 246 to the operating coil 220. On the other hand, when the comparator 230 determines that the operating coil 250 is not lower than the target, the SR flop-lop 228 outputs a low PWM signal 268 instructing the switch to turn off, thereby disconnecting electric power from the operating coil 220. In other words, the PWM signal 268 may turn on the switch 232 and the switch 232 may remain on until the comparator 230 determines that the operating coil current 250 is greater than the reference voltage (i.e., Vref). At that point, the comparator 230 may reset the SR flip-flop 282, thereby turning off the switch 232.

As described above, between t3 and t4, the operating coil current 250 is set at the pull-in current. Accordingly, in the depicted embodiment, supplying electric power to the operating coil 220 based on the PWM signal 268 depicted between t3 and t4 may maintain the operating coil current 250 at the pull-in current. Additionally, as described above, after the armature 118 begins to move, the impedance of the operating coil 220 begins to increase. Accordingly, as depicted, the duty cycle of the PWM signal 268 gradually increases between t3 and t4 to compensate for the impedance increase and maintain the operating coil current 250 at the pull-in current.

In other words, the SR flip-flop 228 may continue to increase the duty cycle of the PWM signal 268 in an attempt to maintain the operating coil current 250 at the pull-in current. Accordingly, the sharp drop in operating coil current 250 between t4 and t5, described above, indicates that even the maximum electric power output by the power supply 246 is insufficient to maintain the operating coil current 250 at the pull-in current. Thus, as depicted, the duty cycle of the PWM signal 268 is increased to 100% between t4 and t5. As such, the processor 224 may determine the duration between t4 and t5 by determining duration the PWM signal 268 is at 100% duty cycle.

Accordingly, as will be described in more detail below, the power supply 246, the magnitude of the pull-in current, and/or the coil design may be determined to produce the sharp operating coil drop between t4 and t5. It should be noted that 100% duty cycle is merely intended to be illustrative. In other embodiments, the processor 224 may determine the make time and/or when the switching device makes by determining duration duty cycle of the PWM signal 268 is at another predetermined level.

Figure 30:
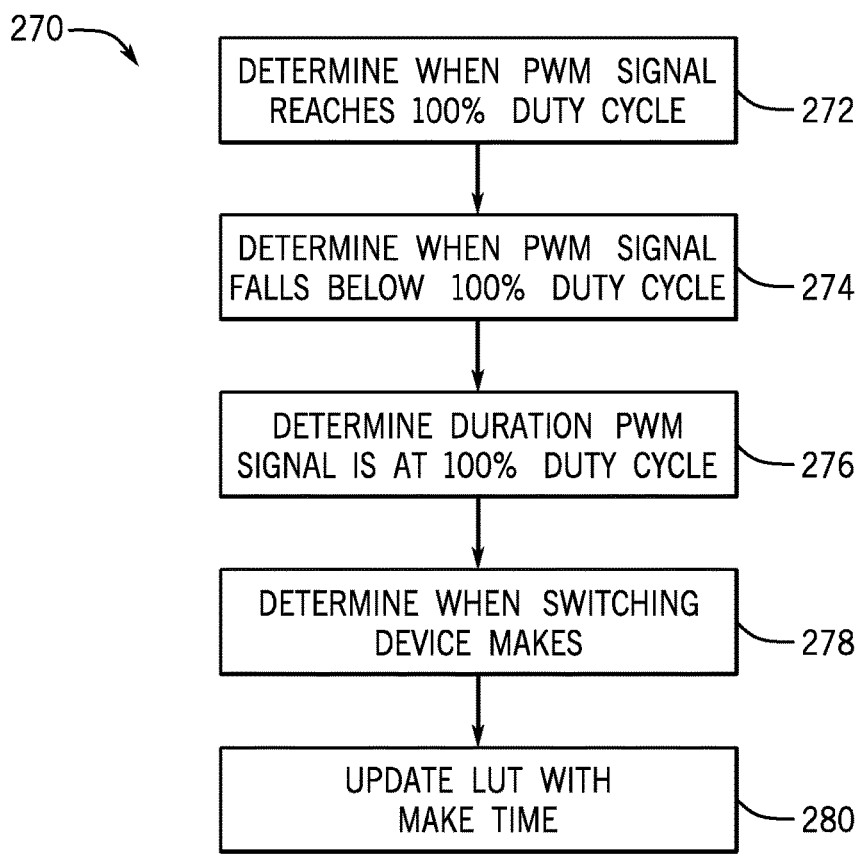
FIG. 30 is a block diagram of logic for closing the device, in accordance with an embodiment.

As described above, the duration between t4 and t5 (e.g., when the PWM signal 268 is at 100% duty cycle) may be utilized to determine when the switching device 218 makes. One embodiment of a process 270 to determine when the switching device 218 makes is shown in FIG. 30. The process 270 may be implemented via computer-readable instructions stored in the tangible non-transitory memory 226, 20, 46 and/or other memories and executed via processor 224, 19, 45 and/or other control circuitry. Generally, the process 270 includes determining when the PWM signal reaches 100% duty cycle (process block 272), determining when the PWM signal duty cycle falls below 100% (process block 274), determining the duration the PWM signal is at 100% duty cycle (process block 276), determining when the switching device makes (process block 278), and updating the LUT with the determined make time (process block 280).

In some embodiments, the processor 224 may determine when the duty cycle of the PWM signal 268 reaches 100% (process block 272). As described above, the duty cycle reaching 100% may indicate that the maximum amount of electric power is being supplied to the operating coil 220, which corresponds with when the operating coil current 250 begins to drop (e.g., at t4). Additionally, the processor 224 may determine when the duty cycle of the PWM signal 268 falls below 100% (process block 274). As described above, the duty cycle falling below 100% may indicate that the armature 119 is no longer moving and the switching device 218 is closed, which correspond with when the operating coil current 250 returns to the pull-in current (e.g., at t5). Accordingly, based on when the duty cycle reaches 100% and when the duty cycle falls below 100%, the processor 224 may determine the duration the duty cycle of the PWM signal 268 remains at 100%, which may indicate duration of the drop in the operating coil current 250 (e.g., duration between t4 and t5) (process block 276).

Based on the duration the duty cycle is at 100%, the processor 224 may determine when the switching device 218 makes (process block 278). More specifically, a relationship between tM and the duration between t4 and t5 may be defined based on empirical testing (e.g., historical data). In some embodiments, the historical data may define that tM occurs at a certain percentage between t4 and t5. For example, the historical data may define that tM occurs at a time 30% between t4 and t5. In fact, in some embodiments, the switching device 218 may be periodically recalibrated to determine the relationship between tM and the duration between t4 and t5, for example, using a high speed camera and/or current sensors.

Similar to the make time LUT, a manufacturer of the switching device 218 may conduct tests on the particular switching device 218 or a comparable switching device 218 to determine when tM occurs in relation to the duration of t4 to t5. Additionally, it is again emphasized that the single-pole, single current-carrying path switching device 218 described above is designed to have a highly repeatable and, thus, highly predictable, operation. In other words, the defined relationship between tM and the duration of t4 to t5 enables the processor 224 to determine, with a reasonable certainty, when the switching device 218 makes.

Additionally or alternatively, when the switching device 218 makes may be verified by measuring when current begins to flow through the switching device 218. For example, a sensor 22 may be placed between the switching device 218 and the load to feed back a signal indicating that a current is flowing. Thus, the processor 224 or other control circuitry may verify when the switching device 218 makes. Other techniques, such as high speed cameras, auxiliary contacts, optical or magnetic position sensors, and/or flux detectors, may also be used to verify when the switching device 218 makes.

Furthermore, in some embodiments, the instant the switching device 218 closes may be determined based at least in part on other characteristics the operating coil current 250, such as an inflection in the current waveform. More specifically, when the switching device 218 closes, the biasing spring 152 may be added to the load seen by the armature 118 (e.g., magnetic system), thereby causing the armature 118 to slow down and causing an inflection in the operating coil current 250. In some embodiments, the verification may be performed at a later time and used to calibrate the make time LUT.

The processor 224 may then update the make time LUT with the determined make time (process block 280). More specifically, the processor 224 may determine the make time based on the time difference between when the pull-in current is applied (e.g., at t3) and when the switching device makes (e.g., at tM). As described above, updating the make time LUT with the determined make time may enable the operating coil driver circuitry 222 to compensate for operational changes in the switching device 218 as well as perform diagnostics on the switching device 218.

In addition to controlling the make operation of the switching device 218, the operating coil driver circuitry 222 may be used to control the break (i.e., open) operation of the switching device 218. For example, to break the switching device 218, the operating coil driver circuitry 222 may reduce electric power to the operating coil 220, which reduces the magnetic force generated by the operating coil 220 to hold the switching device 218 closed. Accordingly, the spring 110 may overcome the magnetic force generated by the operating coil 220 and open the switching device 218. To help illustrate, the operating coil current 250 and the target operating coil current 282 to break the switching device 218 are shown in FIG. 31.

Figure 31:
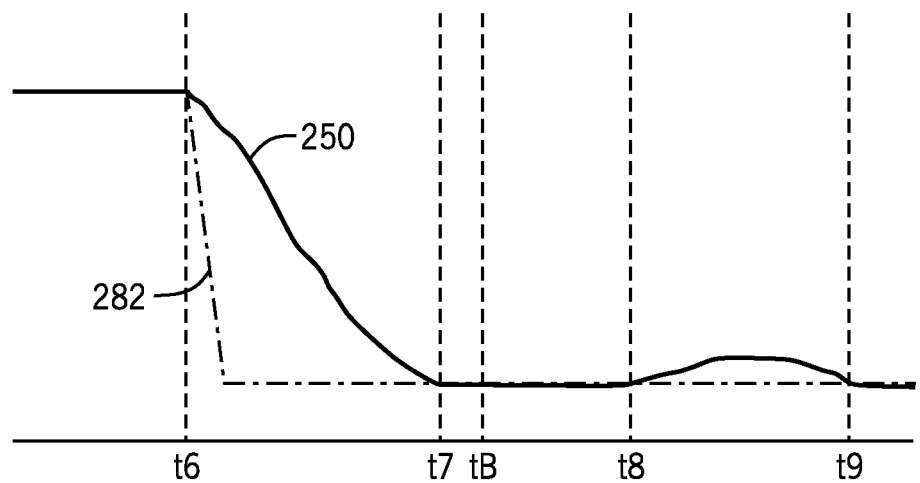
FIG. 31 is a diagrammatical representations of coil control waveforms for opening of the device, in accordance with an embodiment.

As depicted in FIG. 31, before t6, the operating coil current 250 is generally set at the target operating coil current 282. More specifically, as described above, the operating coil driver circuitry 222 may adjust the operating coil current 250 by connecting and disconnecting electric power supplied from the power supply 246 from the operating coil 220. In some embodiments, the operating coil current 250 may be set at the hold-in current.

At t6, the target operating coil current 282 is reduced to a level insufficient to hold the switching device 218 closed. As will be described in more detail below, the target operating coil current 282 after t6 may be utilized to determine when the switching device 218 breaks. Accordingly, the target operating coil current after t6 is generally referred to herein as the "break current." Initially when the target operating coil current is reduced to the break current at t6, the operating coil current 250 is higher than the target and electric power is disconnected from the operating coil 220. More specifically, as depicted, the operating coil current 250 gradually decreases as the operating coil 220 dissipates energy stored in its magnetic field via the flyback diode 234. In other embodiments, the flyback diode 234 may be connected between resistor 238 and ground. Additionally, in other embodiments, the flyback diode 234 may be replaced with an active device, such as a field effect transistor (FET).

As the operating coil current 250 continues to decrease, the magnetic force produced by the operating coil 220 will no longer be sufficient to hold the switching device 218 closed, thereby causing the switching device 218 to begins to move (e.g., open). Additionally, the collapse of the magnetic field collapses may generate (e.g., induce) a current in the operating coil 220 due to back electromotive force (EMF). More specifically, the back EMF may be caused by the line of flux being dragged along the armature 118 and the coil windings 112 as the switching device 218 opens. Accordingly, when the switching device 218 breaks may be determined by detecting when the current is generated in the operating coil 220.

As described above, the operating coil current 250 may gradually decrease as the operating coil 220 dissipates the energy stored in its magnetic field. In other words, if electric power is not reconnected to the operating coil 220, the generated current may be determined by identifying the minimum in the operating coil current 250. As depicted, the operating coil current 250 is maintained at the target operating coil current 282 between t7 and t8. Accordingly, the minimum operating coil current 250 is at some time between t7 and t8. In other words, the switching device 218 breaks at some time between t7 and t8, for example at tB. Thus, similar to determining when the switching device 218 makes the duration between t7 and t8 may be used with historical data and/or design attributes of the switching device 218 to determine when the switching device 218 breaks (e.g., at tB).

As depicted, at t8, the generated current in the operating coil 220 causes the operating coil current 250 to increase above the target operating coil current 282 (e.g., break current). In other words, even though the power supply 246 is disconnected from the operating coil 220, the operating coil current 250 rises above the target operating coil current 282. Accordingly, to facilitate determining the duration between t7 and t8, the break current is set slightly below the current induced in the operating coil 220 by the movement of the armature 118. Additionally, as depicted, after t9, the operating coil current 250 is maintained at the break current.

Figure 32:
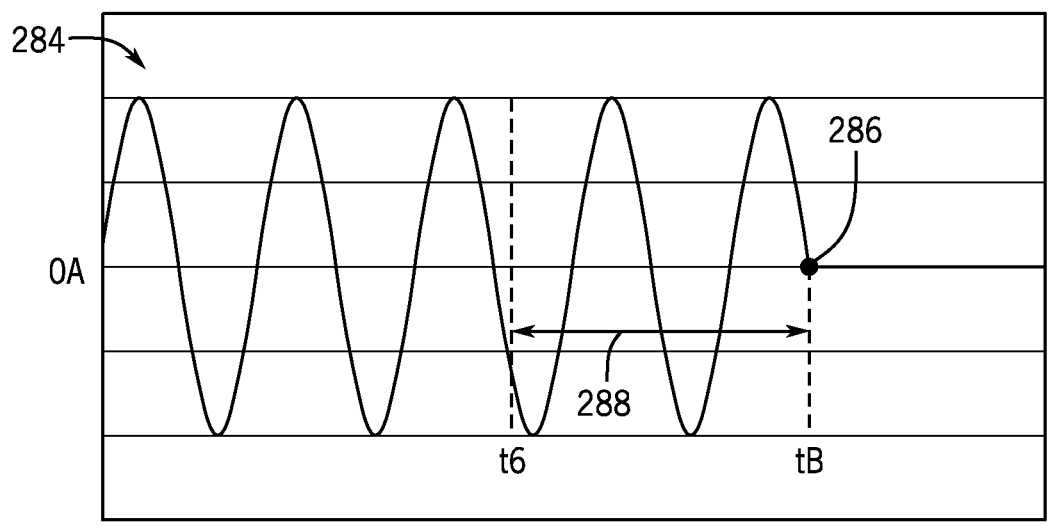
FIG. 32 is a voltage or current waveform illustrating timing considerations for opening the device, in accordance with an embodiment.

Similar to the make time, based on the above description, the break time of the switching device 218 is generally not instantaneous. In other words, there is a slight delay between when the target operating coil current 282 is reduced to the break current (e.g., at t6) and when the switching device 218 actually breaks (e.g., at tB). As used herein, the "break time" is generally intended to describe that time period. Accordingly, the operating coil driver circuitry 222 may take into account the non-instantaneous nature of the switching device 218 to improve control of the switching device 218, for example, to break the switching device 218 at a specific point on the electric power waveform. To help illustrate, FIG. 32 depicts a switching device current waveform 284 of electric power conducted by the switching device 218.

As described above, to reduce electrical arcing, the switching device 218 may be opened based upon a current zero-crossing (e.g., a point on the switching device current waveform 284 within a range from slightly before to the current zero-crossing). For example, in the depicted embodiment, the switching device 218 is desired to break at a current zero-crossing at point 286. As described above, the switching device 218 may be opened by setting the operating coil current 250 to the break current to enable the spring 110 to overpower the magnetic force generated by the operating coil 220. Accordingly, since the switching device 218 generally does not break instantaneously, the operating coil current 250 may be set to the break current at an earlier time to break the switching device 218 at tB, which corresponds with the point 286.

More specifically, the operating coil current 250 may be controlled based at least in part on the expected break time of the switching device 218. Based on the above described example, the target operating coil current 282 is set to the break current at t6 to break the switching device 218 at tB. In other words, the expected break time 288 of the switching device is the difference between t6 and tB.

Figure 33:
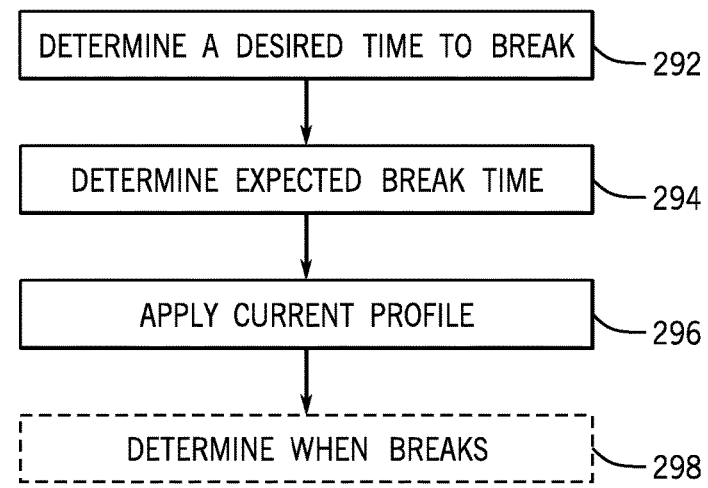
FIG. 33 is a block diagram of logic for timing opening of the device, in accordance with an embodiment.

One embodiment of a process 290 that may be used to break the switching device 218 at a specific point on an electric power waveform is shown in FIG. 33. The process 290 may be implemented via computer-readable instructions stored in the tangible non-transitory memory 226, 20, 46 and/or other memories and executed via processor 224, 19, 45 and/or other control circuitry. Generally, the process 290 includes determining a desired time to break the switching device 218 (process block 292), determining an expected break time of the switching device 218 (process block 294), and applying the current profile to break the switching device 218 at the desired time (process block 296). Additionally, the process 290 optionally includes determining when the switching device 218 breaks (process block 298).

In some embodiments, the processor 224 may determine the desired time to break the switching device (process block 292). As described above, the switching device 218 may be opened based on a current-zero crossing of the conducted electric power. Additionally, the processor 224 may determine the time associated with the specific point. Accordingly, in some embodiments, the processor 224 may determine the desired time to break the switching device 218 based on a subsequent current zero-crossing.

As can be appreciated, each step in process 290 may generally be non-instantaneous. Accordingly, in some embodiments, the desired time to break the switching device 218 may be selected to provide sufficient time to complete process 290. In other words, the desired time may not always correspond with the first subsequent zero-crossing. In other embodiments, it may be desired to break the switching device 218 as soon as possible independent of the electric power waveform and the processor 224 may determine the desired time to break accordingly.

The processor 224 may then determine the expected break time 288 of the switching device 218 (process block 294). Similar to the make time, the break time of the switching device 218 may be affected by various operational parameters, such as temperature, wear, fatigue, and/or debris. As will be described in more detail below, the temperature (e.g., actual temperature or relative temperature) may be determined via impedance of the operating coil 220 or other methods, such as a temperature sensor. Accordingly, the processor 224 may determine the various operational parameters, for example via sensors 22 or the hold-in current, to determine the expected make time 256 of the switching device 218.

More specifically, the processor 224 may input the operational parameters into a break time look-up-table (LUT) that relates the determined operational parameters to an expected break time 288. For example, when a specific temperature is input to the break time LUT, the LUT may output an expected break time 288. Additionally, the processor 224 may adjust for any other known offsets that may affect the expected break time 288, such as a filtering delay. Although the described embodiments describe the used of look-up tables (LUTs), in other embodiments, the same results may be achieved by calculations performed by the processor 224 using various algorithms or a combination of algorithms and LUTs. Additionally, since the break time LUT, may be determined during normal operations, the processor 224 may adjust for any other known operational parameters that may affect the expected make time 256, such as a filtering delay, device wear, and/or other environmental conditions.

Similar to the make time LUT, the break time LUT used to determine expected break time may be based on empirical tests, such as past break times. For example, in some embodiments, a manufacturer may conduct tests on the particular switching device 218 or a comparable switching device 218 to determine the break time of the switching device 218 under the various operational parameters and populate the break time LUT accordingly. Additionally, when the switching device 218 is put into commission, the switching device 218 may run a testing sequence to determine when the switching device 218 breaks under the present parameters and calibrate the break time LUT.

Since the techniques described herein are based on previous operations, it is again emphasized that the single-pole, single current-carrying path switching device 218 described above is designed having a highly repeatable and thus highly predictable operation. In other words, the break time LUT enables the processor 224 to determine, with a reasonable certainty, the break time of the switching device 218 based on the break time of the switching device 218 previously under similar parameters. Nevertheless, it should be appreciated that the techniques may also be used for other types of switching devices, such as a multi-pole switching device.

Based on the expected break time, the current profile may be applied to the switching device 218 to break the switching device 218 at a determined time (process block 296). More specifically, the processor 224 may determine when to apply the current profile to the switching device 218 to break at the desired time. In some embodiments, the processor 224 may determine a specific time to apply the current profile by subtracting the expected break time 288 from the desired time to make. For example, subtracting the expected break time 288 from tB (e.g., desired time to make) results in t6 (e.g., the specific time to apply the current profile). Accordingly, as described above, the target operating coil current 282 is set at the hold-in current (e.g., current profile) at t6. It should be noted that it may be desirable to break the switching device 218 slightly before the current zero-crossing to minimize the chances of breaking after the zero-crossing.

After the current profile is applied, the processor 224 may optionally determine when the switching device 218 breaks (process block 298). More specifically, determining when the switching device 218 makes may enable determining the actual make time of the switching device 218.

As described above, the break time LUT may be based at least in part on past break operations. However, the break time of the switching device 218 may gradually change over time. For example, as the switching device 218 ages, the force provided by the spring 110 that opens the switching device 218 may gradually decrease, which may gradually increase the break time of the switching device 218. Additionally, as contact material wears away, the distance the switching device 218 moves to open may increase and/or debris may build up causing friction, which may gradually increase the break time of the switching device 218.

Accordingly, determining the actual break time may facilitate calibrating and/or updating the break time LUT to better account for operational changes in the switching device. In fact, as will be described in more detail below, keeping track of the actual break times may facilitate performing diagnostics on the switching device 218. For example, if the break time of the switching device 218 is different than expected, the processor 224 may identify that the switching device 218 may be obstructed in some way or suffering from some other anomalous condition.

In some embodiments, the processor 224 may utilize the PWM signal to determine when the switching device 218 makes. More specifically, as described above, the PWM signal output by the SR flip-flop 228 is fed back to the processor 224. Based on the duty cycle of the PWM signal, the processor 224 may determine in duration the operating coil current is below the break current (e.g., duration between t4 and t5), which may be directly related to when the switching device 218 breaks.

Figure 34A:
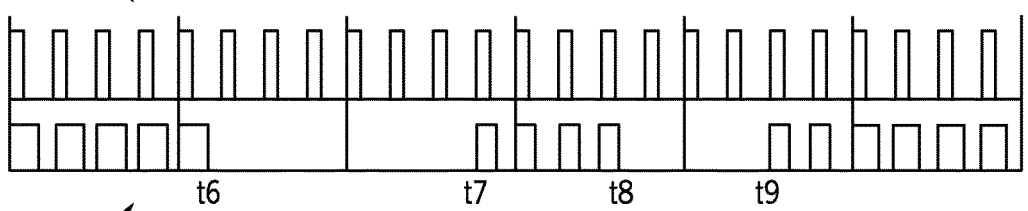
FIGS. 34A and 34B are a PWM waveform for determining opening the device, in accordance with an embodiment.
Figure 34B:
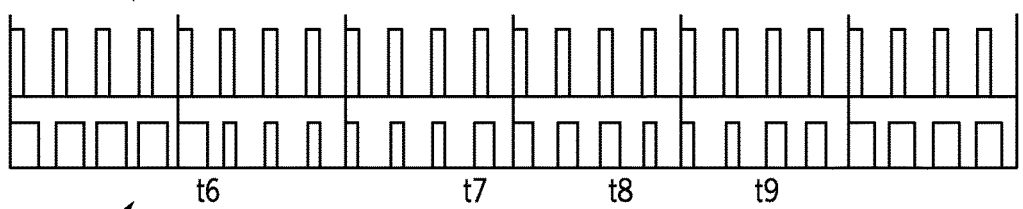

To help illustrate, FIGS. 34A and 34B depicts the trigger signal 244 output by the processor 224 and the PWM signal input 268 to the processor 224. More specifically, FIG. 34A depicts the PWM signal 268 output by a standard SR flip-flop and FIG. 34B depicts the PWM signal 268 output by an SR flip-flop that is set each time the S terminal goes high.

As described above, the trigger signal 244 is input to the SR flip-flop 228 to facilitate generating the PWM signal 268 by periodically attempting to set the SR flip-flop 228 (e.g., make the PWM signal 268 high). More specifically, when comparator 230 determines that the operating coil current 250 is lower than the target and the trigger signal 244 is high, the SR flop-lop 228 outputs a high PWM signal 268 instructing the switch to turn on, thereby supply electric power from the power supply 246 to the operating coil 220. On the other hand, when the comparator 230 determines that the operating coil current 250 is not lower than the target, the SR flop-lop 228 outputs a low PWM signal 268 instructing the switch to turn off, thereby disconnecting electric power from the operating coil 220. In other words, the trigger signal 244 may turn on the switch 232 and the switch 232 may remain on until the comparator 230 determines that the operating coil current 250 is greater than the reference voltage (i.e., Vref). At that point, the comparator 230 may reset the SR flip-flop 282, thereby turning off the switch 232.

As described above, between t6 and t7, the operating coil current 250 is higher than the target operating coil current 282. Thus, the comparator 230 will input a high signal to the R terminal of the SR flip-flop 228. In other words, in a standard SR flip-flop, the PWM signal 268 will be low regardless of the input at the S terminal. Accordingly, as depicted, duty cycle of the PWM signal 268 between t6 and t7 is 0%. In other words, the power supply 246 is disconnected from the operating coil 220 as the energy stored in the operating coil 220 is gradually dissipated.

Additionally, as described above, the SR flip-flop 228 may increase the duty cycle of the PWM signal 268 to maintain the operating coil current 250 at the target operating coil current 282. Thus, when the operating coil current 250 begins to drop below the target operating coil current 282 between t7 and t8, electric power is supplied to the operating coil 220 to maintain the operating coil current 250 at the target operating coil current 282. Accordingly, in the depicted embodiment, the PWM signal 268 has a non-zero duty cycle to maintain the operating coil current 250 at the break current. As such, the process 224 may determine the duration between t7 and t8 by determining the duration the PWM is at a non-zero duty cycle.

Furthermore, as described above, when the armature 118 begins to move, a current is generated in the operating coil 220, which causes the operating coil current 250 to rise above the target operating coil current 282 between t8 and t9. Since the operating coil current 250 is higher than the target operating coil current 282, electric power is disconnected from the operating coil 220. Accordingly, as depicted, the duty cycle of the PWM signal 268 between t8 and t9 is 0%.

Additionally, as described above, after t9, the generated current decreases below the target operating coil current 282 and the operating coil current 250 is maintained at the target operating coil current 282 by connecting and disconnecting electric power. Accordingly, in the depicted embodiment, the PWM signal 268 has a non-zero duty cycle after t9 to maintain the operating coil current 250 at the break current. Thus, it may be determined that the armature 118 is no longer moving when the duty cycle again goes non-zero (e.g., at t9).

The embodiment of the PWM signal 268 shown in FIG. 34B is similar to the one shown in FIG. 34A with the distinction that the SR flip-flop 228 used to generate the PWM signal 268 shown in FIG. 34B goes high whenever the input to the S terminal goes high. In other words, as depicted, between t6 and t7, since the operating coil current 250 is higher than the target operating coil current 282, the duty cycle of the PWM signal 268 is at its minimum. In some embodiments, the minimum duty cycle may be equal to the duty cycle of the trigger signal 244. Accordingly, the duration between t7 and t8 may be determined by the duration the duty cycle of the PWM signal 268 is above its minimum.

In fact, since minimum duty cycle is non-zero, the PWM signal 268 may instruct the switch 232 to turn on for at least the duty cycle of the trigger 244. As such, a minimum amount of electric power may be supplied to the operating coil 220. In some embodiments, supplying a positive minimum amount of electric power to the operating coil 220 may facilitate stabilizing oscillations in the operating coil current 250, thereby providing a more accurate determination of the duration the operating coil current 250 is below the break current.

Similarly, as depicted, between t8 and t9, since the operating coil current 250 is higher than the operating current target 282 due to the current generated by the movement of armature 118, the duty cycle of the signal 268 is again at its minimum. More specifically, the duty cycle of the PWM signal 268 may again be equal to the duty cycle of the trigger signal 244. Accordingly, it may be determined that the armature 118 is no longer moving when the duty cycle of the PWM signal 268 increases above its minimum (e.g. after t9).

Although either embodiment of the SR flip-flop 228 may be utilized. To simplify the following discussion, the embodiment shown in FIG. 34A will be utilized. It should be noted that one of ordinary skill in art will be able to easily convert between looking for a minimum duty cycle, a 0% duty cycle, and another predetermined duty cycle.

Figure 35:
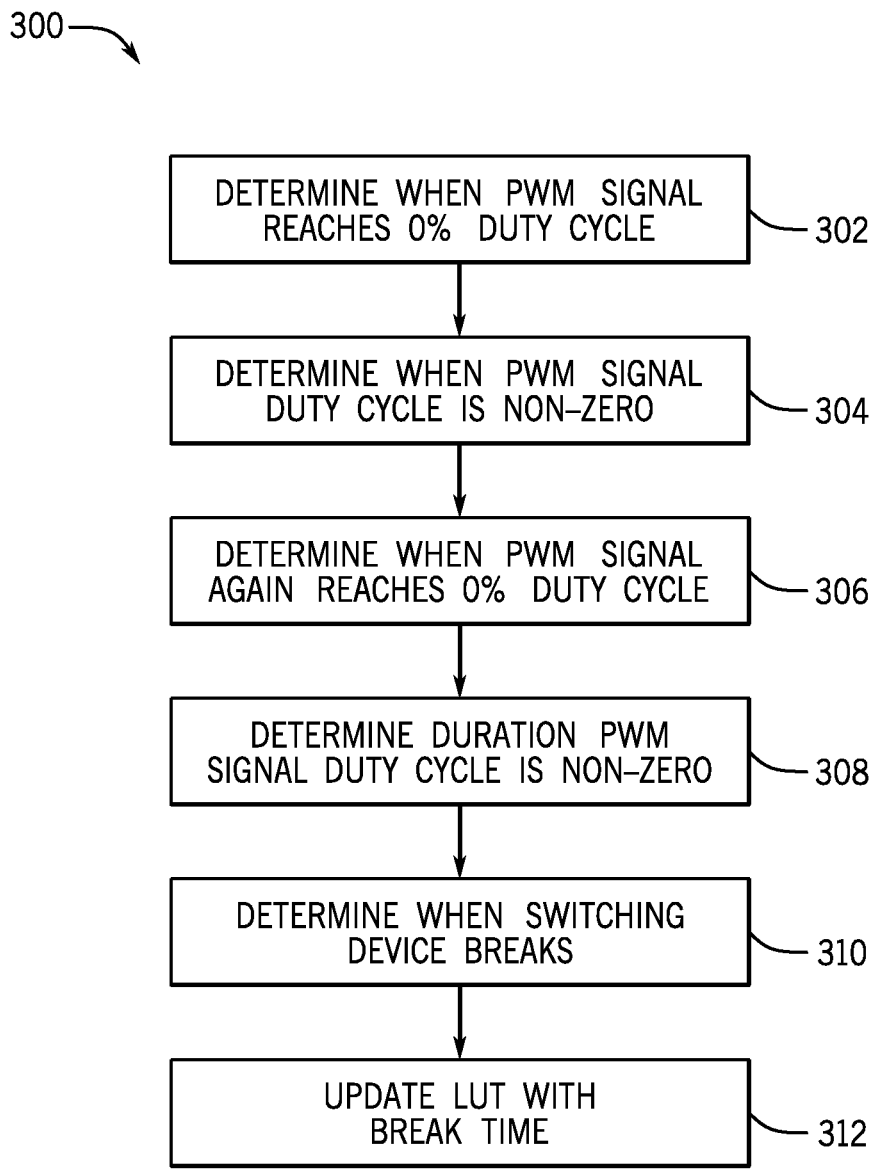
FIG. 35 is a block diagram of logic for determining opening the device, in accordance with an embodiment.

As described above, the duration between t7 and t8 (e.g., when the PWM signal 268 is non-zero) may be utilized to determine when the switching device breaks. One embodiment of a process 300 is shown in FIG. 35. The process 300 may be implemented via computer-readable instructions stored in the tangible non-transitory memory 226, 20, 46 and executed via processor 224, 19, 45 and/or other control circuitry. Generally, the process 300 includes determining when the PWM signal reaches 0% duty cycle (process block 302), determine when the PWM signal duty cycle is non-zero (process block 304), determining when the PWM signal again reaches 0% duty cycle (process block 306), determining duration the PWM signal duty cycle is non-zero (process block 308), determining when the switching device breaks (process block 310), and updating the LUT with the determined break time (process block 312).

In some embodiments, the processor 224 may determine when the duty cycle of the PWM signal 268 reaches 0% (process block 302). As described above, the duty cycle falling to 0% (e.g., minimum level) may indicate that the operating coil 220 is dissipating energy stored in its magnetic field, but still above the break current. In other words, the armature 118 has not begun to move because the minimum of the operating coil current 250 has not yet been reached.

Additionally, the processor 224 may determine when the duty cycle of the PWM signal 268 is non-zero (process block 304). As described above, the duty cycle increasing to non-zero (e.g., above minimum level) may indicate that electric power is being supplied to the operating coil 220, which corresponds with when the operating coil current 250 begins to fall below the target operating coil current 282 (e.g., at t7). Furthermore, the processor 224 may determine when the duty cycle of the PWM signal 268 again goes to 0% (process block 306). As described above, the duty cycle again falling to 0% (e.g., minimum level) may indicate that the operating coil current 250 is higher than the target operating coil current 282 due to the induced current in the operating coil 220 (e.g., at t8). In other words, at this point, the armature 118 is in motion and, thus, the switching device 218 has opened at some time between t7 and t8. Accordingly, based on when the duty cycle is non-zero and when the duty cycle again goes to 0%, the processor 224 may determine the duration the duty cycle of the PWM signal 268 is non-zero, which may indicate the operating coil current 250 is below the break current (e.g., duration between t7 and t8) (process block 308).

Based on the duration the PWM signal is non-zero, the processor 224 may determine when the switching device 218 breaks (process block 310). More specifically, a relationship between tB and the duration between t7 and t8 may be defined based on empirical testing (e.g., historical data). In some embodiments, the historical data may define that tB occurs at a certain percentage between t7 and t8. For example, the historical data may define that tB occurs at 45% between t7 and t8. In fact, in some embodiments, the switching device 218 may be periodically recalibrated to determine the relationship between tB and the duration between t7 and t8, for example, using a high speed camera and/or current sensors.

Similar to the break time LUT, a manufacturer of the switching device 218 may conduct tests on the particular switching device 218 or a comparable switching device 218 to determine when tB occurs in relation to the duration between t7 to t8. Additionally, it is again emphasized that the single-pole, single current-carrying path switching device 218 described above is designed having a highly repeatable and thus highly predictable operation. In other words, the defined relationship between tB and the duration of t7 to t8 enables the processor 224 to determine, with a reasonable certainty, when the switching device 218 breaks.

Additionally or alternatively, when the switching device 218 breaks may be verified by measuring when current ceases to flow through the switching device 218. For example, a sensor 22 may be placed between the switching device 218 and load to feed back a signal indicating that a current has stopped flowing. Thus, the processor 224 or other control circuitry may verify when the switching device 218 breaks. Other techniques, such as a high speed camera, may also be used to verify when the switching device 218 breaks. In some embodiments, the verification may be performed at a later time and used to calibrate the break time LUT.

The processor 224 may then update the break time LUT with the determined break time (process block 312). More specifically, the processor 224 may determine the break time based on the time difference between when the target operating coil current 282 is set at the break current (e.g., at t6) and when the switching device breaks (e.g., at tB). As described above, updating the break time LUT with the determined break time may enable the operating coil driver circuitry 222 to compensate for operational changes in the switching device 218 as well as perform diagnostics on the switching device 218.

Figure 36:
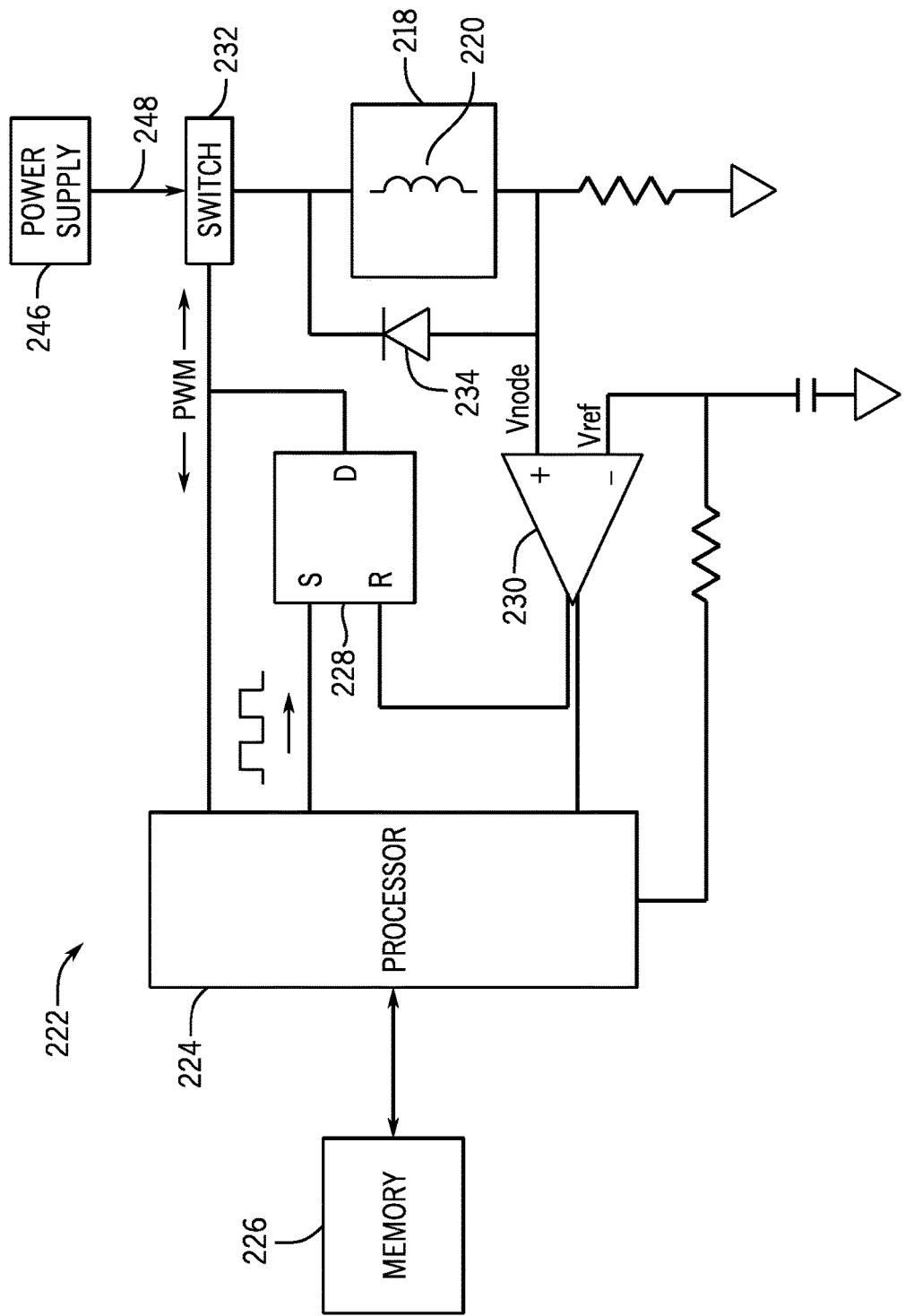
FIG. 36 is a diagrammatical representation of an alternate embodiment of an operator coil driving circuit, in accordance with an embodiment.

In addition to utilizing the PWM signal 268, in some embodiments, the processor 224 may determine when the switching device makes or breaks based directly on the output of the comparator 230. More specifically, in such embodiments, the output of comparator 230 may be input to the processor 224, as depicted in FIG. 36.

As such, the processor 224 may determine whether the operating coil current 250 is higher or lower than a target level based on the output of the comparator 230. As described above, the processor 224 may output a reference voltage (e.g., Vref) that corresponds with the target operating coil current 282. Accordingly, the processor 224 may determine when the operating coil current 250 is below the target operating coil current 282 when the output of the comparator 230 is low. On the other hand, the processor 224 may determine when the operating coil current 250 is above the target operating coil current 282 when the output of the comparator 230 is high. In fact, the processor 224 may adjust the trigger signal 224 to better handle oscillations in the operating coil current 250, for example, by adjusting the duty cycle to adjust minimum amount of electric power be supplied to the operating coil 220.

In fact, such an embodiment of the operating coil driver circuitry 222 may enable electric power to be completely disconnected during a break operation. More specifically, since the processor 224 may determine when the operating coil current 250 falls below the break current (e.g., duration between t7 and t8) directly from the comparator 230, the operating coil driver circuitry 222 may allow the operating coil current 250 to dissipate naturally. In other words, the duty cycle of the PWM signal 268 may be set to 0% to disconnect electric power from the operating coil 220. For example, the processor 224 may cease the trigger signal 244 input to the S terminal of the SR flip-flop 228, which causes the PWM signal 268 to remain low and disconnects the power supply 246. In some embodiments, disconnecting the power supply 246 may reduce the power consumption of the operating coil driver circuitry 222. Similarly, the operating driver circuitry 222 may also enable the processor 224 to determine when the operating coil current 250 falls below the pull-in current (e.g., duration between t4 and t5) directly from the comparator 230.

Figure 37:
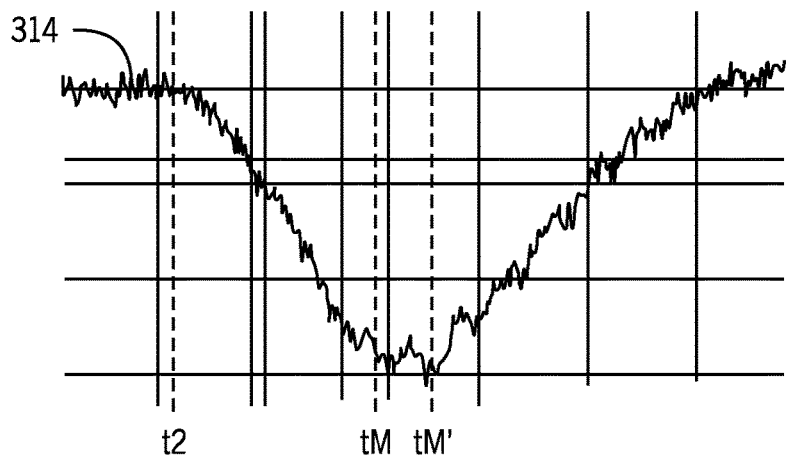
FIG. 37 is a diagrammatical representation of a power scenario during switching of the device, in accordance with an embodiment.

As described above, to facilitate determining when the switching device 218 makes, the operating coil current 250 drops because the power supply 246 is no longer sufficient to maintain the operating coil current 250 at the pull-in current due to the impedance increase in the operating coil 220. More specifically, as the operating coil 220 draws electric power from the DC bus 248, the voltage on the DC bus 248 (e.g., bus voltage) may begin to droop because electric power is being drawn from the power supply 246 faster than it is being replenished by the power source 12. To help illustrate, FIG. 37 depicts the bus voltage 314 during a make operation.

As described above, the operating coil current 250 begins to be ramped up to the pull-in current at t2. As such, the electric power drawn by the operating coil 220 increases to maintain the operating coil current 250 at the target current (e.g., pull-in current). However, as depicted, the bus voltage 314 begins to sag at t2. The bus voltage 314 continues to sag until some time after the switching device 218 makes at tM. In other words, the power supply 246 may set the bus voltage 314 such that it is sufficient to maintain the operating coil current 250 at the pull-in current without sagging.

Based on the techniques described herein, when the switching device 218 makes may be determined based on the duration of the operating coil current 250 drop (e.g., duration between t4 and t5). Thus, it is important to clearly define when the PWM signal 268 is at 100% duty cycle. However, the bus voltage 314 may affect this determination because the bus voltage 314 affects the electric power supplied to the operating coil 220 to make the switching device 218. Additionally, as the switching device 218 makes, the impedance of the operating coil 220 may increase. In other words, a higher the bus voltage 314 may enable more electric power to be supplied, thereby decreasing the make time and increasing rate of impedance change. On the other hand, a lower bus voltage may enable less electric power to be supplied, thereby increasing the make time and decreasing the rate of impedance change.

Accordingly, the bus voltage 314 may be adjusted so that sufficient electric power may be supplied to operating coil 220 make the switching device 218 while also causing a drop form the 100% duty cycle. Additionally, the bus voltage 314 may be adjusted to control the duration and/or aggressiveness of the drop in operating coil current 250. For example, when the bus voltage 314 is higher, the drop in operating current may be narrower shallower. On the other hand, when the bus voltage 314 is lower, the drop in the operating current may be later, wider, and deeper.

Thus, duration of the operating coil current drop may be adjusted to enable the duration the PWM signal 268 is at 100% duty cycle to be easily detected. For example, by reducing the bus voltage 314, the duration of the current drop may be increased. Additionally, the aggressiveness of the drop may be adjusted to ensure that the duration of the operating coil current drop corresponds with the duration the PWM signal 268 is at 100% duty cycle. More specifically, when the slope of the operating coil current 250 entering or exiting the drop is less aggressive, the possibility of the PWM signal duty cycle dropping below 100% while the operating coil current 250 is still in the drop increases. Such stray pulses may make determining the duration of the current drop more difficult because it is unclear at what instant the operating coil 250 enters or exits the drop. Accordingly, for example, the bus voltage 314 may be increased to increase the aggressiveness of the operating coil current drop.

Additionally, the magnitude of the pull-in current that the operating coil driver circuitry 222 attempts to maintain the operating coil current 250 may also affect the drop in the operating coil current 250. More specifically, when the pull-in current is higher, the electric power supplied is higher, thereby decreasing the make time while increasing the power consumption of the switching device 218. In other words, a higher pull-in current may increase rate of impedance change and, thus, cause a more dramatic drop in the bus voltage 314. On the other hand, when the pull-in current is lower, the electric power supplied may be lower, thereby increasing the make time while decreasing power consumption of the switching device 218. In other words, a lower pull-in current may decrease rate of impedance change and, thus, cause a less dramatic drop in the bus voltage 314.

Accordingly, an optimal balance between the bus voltage 314 and the pull-in current may be determined to improve detection of when the switching device 218 makes. Moreover, the optimal balance may further be adjusted when multiple switching devices 218 make. For example, as described above, a first switching device 218 may connect a first phase of electric power and a second switching device 218 may connect a second phase of electric power to an electrical motor 24 at a first time (e.g., based upon a predicted current zero-crossing). A third switching device 218 may then connect a third phase of electric power at to the electrical motor 24 at a second time. To help illustrate, the first and the second switching device 218 may close at tM and the third switching device 218 may close at tM', as depicted in FIG. 33.

As depicted, the bus voltage 314 at tM may differ from the bus voltage at tM'. As described above, the bus voltage 314 during a make operation may affect the operating coil current 250 drop used to detect when the switching device 218 makes. Such effects may be compounded with regard to the third switching device 218 because the effects of the first and second switching device 218 are integrated through to tM'. For example, as depicted, the electric power drawn by the first and second switching devices 218 to make at tM sags the bus voltage 314. After tM, the third switching device 218 continues to draw electric power and may sag the bus voltage 314 even further. In other words, the third switching device 218 may utilize a lower bus voltage 314 than the first and second switching device 218.

Accordingly, in addition to adjusting the bus voltage, the pull-in current for each switching device 218 may be individually adjusted. In other words, an optimal balance between the bus voltage 314 and the pull-in currents may be determined to improve detection of when each of the switching devices 218 makes. Additionally, when switching devices 218 are closed sequentially, the timing of the make operation may be adjusted. For example, the third switching device 218 may be closed at a later time to enable the bus voltage 314 to recover as the power supply 246 replenishes the DC bus 248. In other words, the bus voltage 314 used to make the third switching device 218 may be controlled by adjusting when the third switching device 218 makes.

Figure 38:
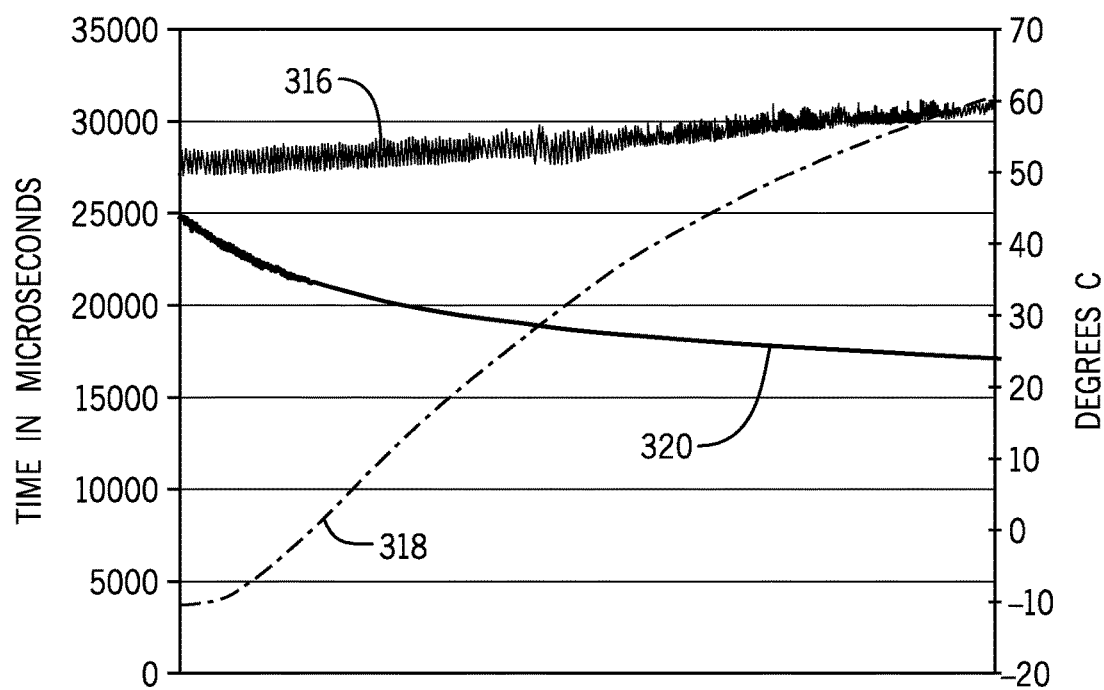
FIG. 38 is a coil operation to temperature relationship, in accordance with an embodiment.

As described above, the temperature of the switching device 218 may affect the make time and/or break time of the switching device 218. To help illustrate, FIG. 38 is a plot that depicts the make time 316 versus temperature 318. As depicted, the make time 316 of the switching device 218 increases as the temperature 318 increases. In some embodiments, the make time may change by approximately 50 microseconds per degree Celsius. The break time of the switching device 218 may similarly also be affected by temperature. Accordingly, the temperature of the switching device 218 may be determined before each make operation and break operation to facilitate determining when to apply a current profile (e.g., make current or break current) that enables the switching device 218 to make or break at a desired time.

Additionally, the plot depicts an impedance index 320 versus temperature 222. More specifically, the impedance index 320 may represent the inverse of a measured impedance of the operating coil. Since the resistance of a conductor generally increases with temperature and the operating coil 220 is simply a long conductive wire, the impedance of the operating coil 220 may also increase with temperature. Accordingly, as depicted the impedance index 320 (e.g., inverse of measured impedance) varies inversely with temperature.

Figure 39:
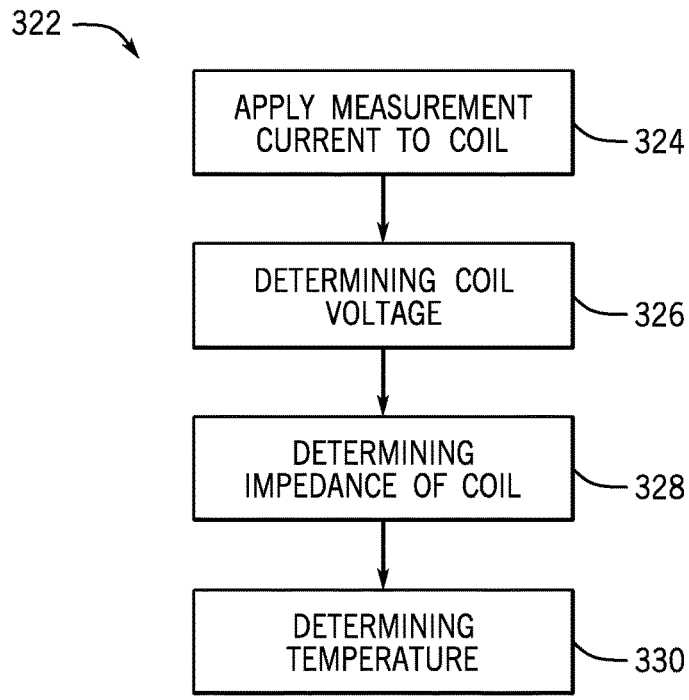
FIG. 39 is a block diagram of logic for temperature detection (e.g., relative) and adaptation, in accordance with an embodiment.

As such, the impedance of the operating coil 220 may be utilized to determine the temperature 318 of the switching device 218. For example, FIG. 39 depicts a process 322 for determining the temperature of the switching device 218 during a make operation. The process 322 may be implemented via computer-readable instructions stored in the tangible non-transitory memory 226, 20, 46 and/or other memories and executed via processor 224, 19, 45 and/or other control circuitry. Generally, process 322 includes applying the measurement current to the operating coil (process block 324), determining voltage across operating coil (process block 326), determining impedance of the operating coil (process block 328), and determining temperature of the switching device (process block 330). Process 322 may be performed before each make operation to facilitate determining the expected make time of the switching device 218 based on temperature, as described above.

In some embodiments, the processor 224 may instruct the operating coil driver circuitry 222 to supply the measurement current to the operating coil 220 (process block 324). More specifically, the processor 224 may output a reference voltage (e.g., Vref) that corresponds with the measurement current. Based at least on the comparison of the node voltage and the reference voltage, the SR flip-flop 228 outputs a PWM signal 268 that instructs the switch 232 to supply the measurement current to the operating coil 220 by selectively connecting and disconnecting electric power from the DC bus 248. Accordingly, the processor 224 may determine the operating coil voltage by multiplying the bus voltage 314 with the duty cycle of the PWM signal 268 (process block 326).

Based on the operating coil voltage, the processor 224 may determine the impedance of the operating coil 220 (process block 328). More specifically, since the operating coil voltage and the operating coil current (e.g., measurement current) are known, the processor 224 may determine the operating coil impedance by dividing the operating coil voltage by the measurement current and, thus, the impedance index 320.

Based on the operating coil impedance, the processor 224 may then determine the switching device temperature 318 (process block 330). As described above, the operating coil impedance directly relates to its temperature 318. Accordingly, the processor 224 may determine the temperature 318 based on that relationship. More specifically, in some embodiments, the relationship between temperature 318 and impedance may be defined by a manufacturer. For example, the manufacture may define a temperature look-up-table (LUT) that takes the impedance index 320 (e.g., inverse of operating coil impedance) input and outputs a temperature 318. Additionally or alternatively, in other embodiments, it may be unnecessary to determine the exact temperature of the switching device 218. Instead, it may be sufficient to use the operating coil impedance 320 or the operating coil voltage with the operating coil current as a proxy for temperature. In other words, the operating coil impedance 320 or the operating coil voltage with the operating coil current may be used as inputs to the make time LUT.

Figure 40:
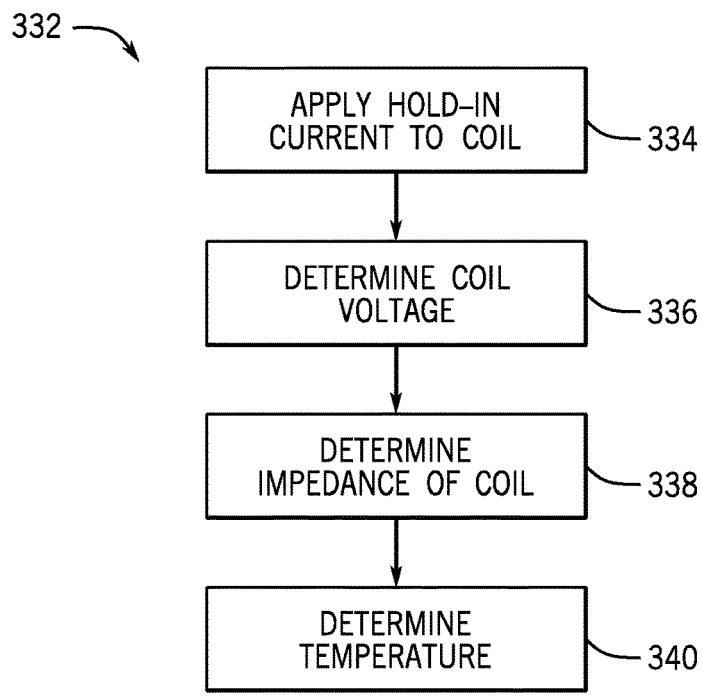
FIG. 40 is a similar block diagram of logic for monitoring temperature during operation, in accordance with an embodiment.

Furthermore, as described above, the break operation may also be affected by the temperature of the switching device 218. Accordingly, FIG. 40 depicts one embodiment of a process 332 for determining the temperature of the switching device 218 during a break operation. The process 332 may be implemented via computer-readable instructions stored in the tangible non-transitory memory 226, 20, 46 and/or other memories and executed via processor 224, 19, 45 and/or other control circuitry. Generally, the process 332 includes applying the hold-in current to the operating coil (process block 334), determining voltage across the operating coil (process block 336), determining impedance of the operating coil (process block 338), and determining temperature of the switching device (process block 340). Process 332 may be performed before each break operation to facilitate determining the expected break time of the switching device 218 based on temperature, as described above.

In some embodiments, the processor 224 may instruct the operating coil driver circuitry 222 to supply the hold-in current to the operating coil 220 (process block 334). More specifically, similar to process block 324, the processor 224 may output a reference voltage (e.g., Vref) that corresponds with the hold-in current. Based at least on the comparison of the node voltage and the reference voltage, the SR flip-flop 228 outputs a PWM signal 268 that instructs the switch 232 to supply the hold-in current to the operating coil 220 by selectively connecting and disconnecting electric power from the DC bus 248. Accordingly, similar to process block 326, the processor 224 may determine the operating coil voltage by multiplying the bus voltage 314 with the duty cycle of the PWM signal 268 (process block 336).

Similar to process block 328, the processor 224 may determine the impedance of the operating coil 220 based on the operating coil voltage (process block 338). More specifically, since the operating coil voltage and the operating coil current (e.g., hold-in current) are known, the processor 224 may determine the operating coil impedance by dividing the operating coil voltage by the hold-in current and, thus, the impedance index 320.

Similar to process block 330, the processor 224 may then determine the switching device temperature 318 based on the operating coil impedance (process block 340). As described above, the operating coil impedance directly relates to its temperature. Accordingly, the processor 224 may determine the temperature 318 based on that relationship, which may be defined a manufacturer. Additionally or alternatively, in some embodiments, it may be sufficient to use the operating coil impedance or the operating coil voltage with operating coil current as a proxy for temperature. In other words, the impedance index 320 (e.g., inverse of operating coil impedance) or the operating coil voltage with the operating coil current may be used as inputs to the break time LUT.

Figures 41A, 41B:
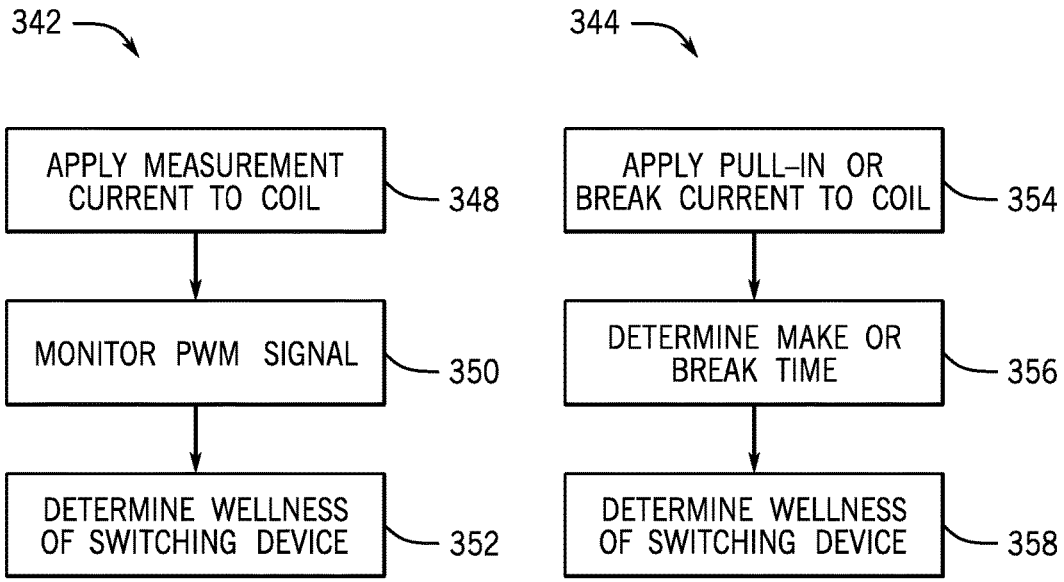
FIGS. 41A-41D are block diagrams of logic for determining wellness of a component, load and/or system based upon monitoring of operator coil parameters, in accordance with an embodiment.
Figures 41C, 41D:
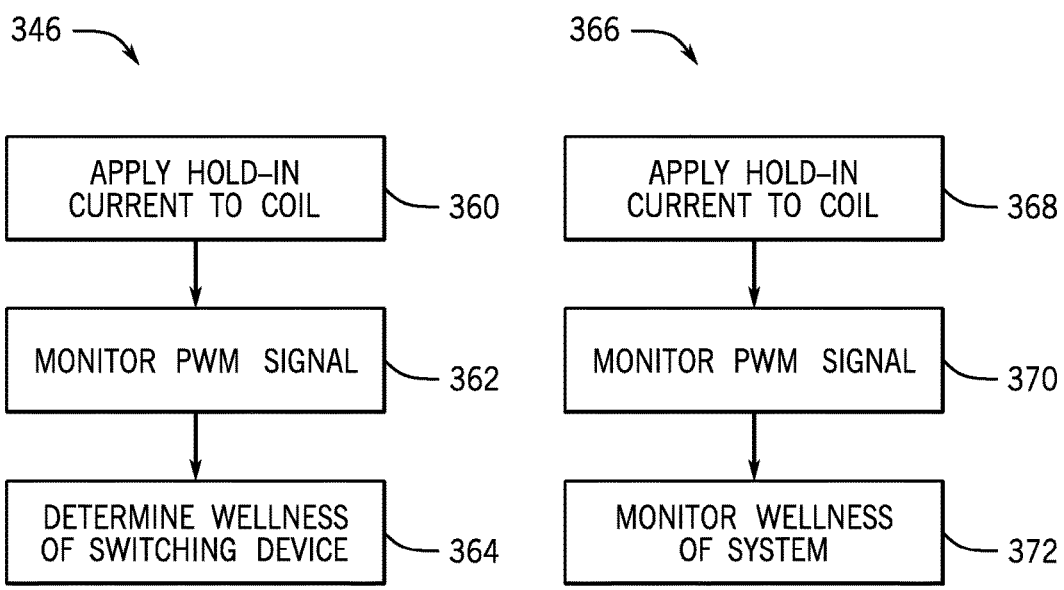
Figure 42A:
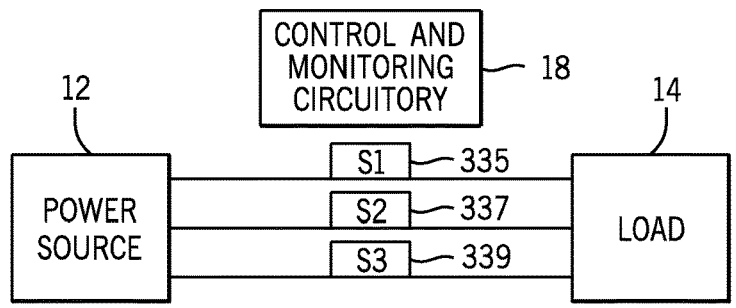
FIGS. 42A-42D is a block diagram of logic for the sequential switching of single pole switching devices, in accordance with an embodiment.
Figure 42B:
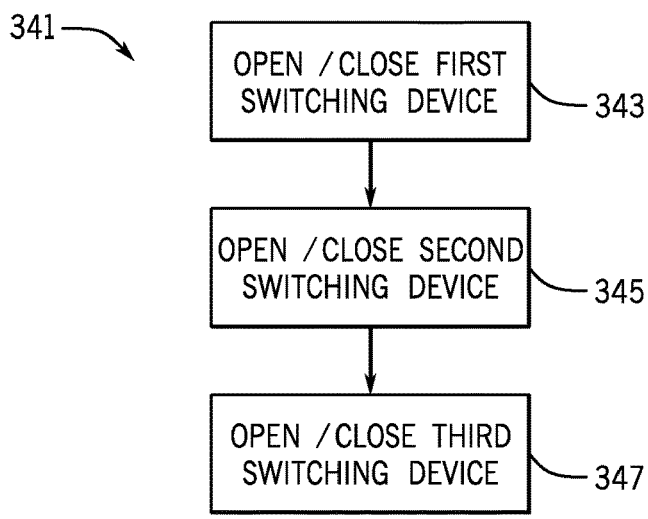
Figures 42C, 42D:
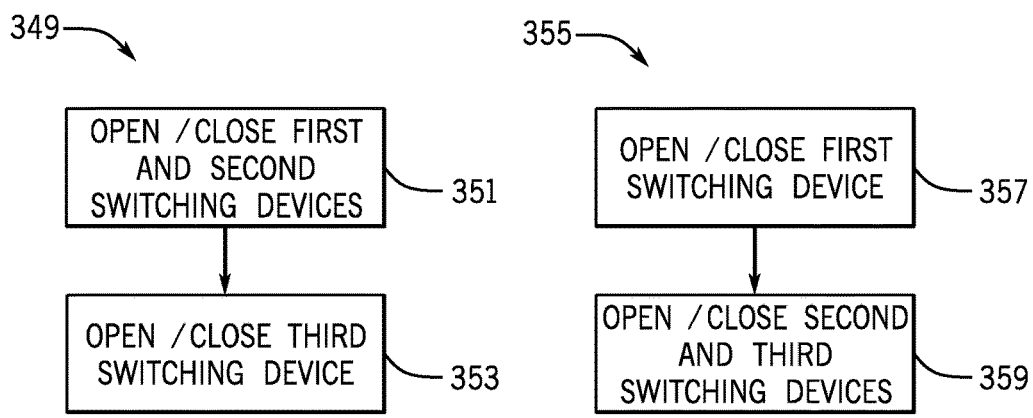

Accordingly, based on the techniques described above, the processor 224 may use the PWM signal 268 to determine operational parameters of the switching device 218, such as when the switching device 218 makes, when the switching device 218 breaks, and/or the temperature of the switching device 218. Additionally, other diagnostic information may also be determined. For example, FIGS. 41A-C depict embodiments of determining wellness of the switching device 218. More specifically, FIG. 41A depicts one embodiment of a process 342 for determining wellness of the switching device 218 with the measurement current, FIG. 41B depicts one embodiment of a process 344 for determining wellness of the switching device 218 during a make or break operation, and FIG. 41C depicts one embodiment of a process 346 for determining wellness of the switching device 218 with the hold-in current. The processes 342-346 may be implemented via computer-readable instructions stored in the tangible non-transitory memory 226, 20, 46 and/or other memories executed via processor 224, 19, 45 and/or other control circuitry.

As shown in FIG. 41A, process 342 generally includes applying the measurement current to the operating coil (process block 348), monitoring the PWM signal (process block 350), and determining wellness of the switching device (process block 352). More specifically, as described above, the processor 224 may determine the switching device temperature 318 using the measurement current. Accordingly, the processor 224 may detect when excessive temperatures (e.g., out of specification) are present.

Additionally, in some embodiments, the processor 224 may detect whether a short circuit or an open circuit condition exits in the operating coil 220. For example, if the PWM signal duty cycle jumps to 100%, the processor 224 may determine that an open circuit condition is present. On the other hand, if the PWM signal duty cycle is much lower than expected, the processor 224 may determine that a short circuit condition is present. Furthermore, the measurement current may also monitor temperature changes in the switching device 218. For example, if the PWM signal duty cycle begins to increase, the processor 224 may determine that the temperature 318 is increasing. On the other hand, if the PWM signal duty cycle begins to decrease, the processor 224 may determine that the temperature is decreasing.

As shown in FIG. 41B, process 344 generally includes applying the pull-in or break current to the operating coil (process block 354), determining the make or break time of the switching device (process block 356), and determining wellness of the switching device (process block 358). More specifically, as described above, the processor 224 may determine the expected make time and/or break time of the switching device 218. Additionally, the processor 224 may determine the actual make time or break time. Accordingly, the processor 224 may detect when a faulty condition is present in the switching device 218. For example, if the determined make time is much shorter than expected, the processor 224 may determine that the armature 118 is obstructed and not closing from a fully open position. On the other hand, if the determined make time is much longer than expected, the processor 224 may determine that the armature 118 is obstructed from closing smoothly.

Additionally, the processor 224 may look at the trend of make times or break times. More specifically, the trend may indicate the gradual aging of the switching device 218. For example, the processor 224 may estimate the age of the switching device (e.g., amount of life left) based on how much the make time or break time of the switching device 218 has changed. Furthermore, as depicted in FIG. 38, the make time 316 trend is generally linear with regard to temperature 318. Accordingly, if the relationship begins to deviate from the expected or historical norm, the processor 224 may determine specific changes to the switching device 218. For example, if the make time varies unpredictably, the processor 224 may determine that environmental conditions, such as vibrations for surround machinery, are affecting the make times.

As shown in FIG. 41C, process 346 generally includes applying the hold-in current to the operating coil (process block 360), monitoring the PWM signal (process block 362), and determining wellness of the switching device (process block 364). More specifically, as described above, the processor 224 may determine the switching device temperature 318 using the hold-in current. Accordingly, the processor 224 may detect when excessive temperatures (e.g., out of specification) are present. Additionally, since the hold-in current may be applied to the operating coil 220 for an extended period of time, the processor 224 may also monitor temperature changes in the switching device 218. For example, if the PWM signal duty cycle begins to increase, the processor 224 may determine that the temperature 318 is increasing. On the other hand, if the PWM signal duty cycle begins to decrease, the processor 224 may determine that the temperature is decreasing. Furthermore, in some embodiments, if the PWM duty cycle is excessively varying, the processor 224 may determine that the armature 118 is chattering (e.g., not still).

Since the hold-in current is generally applied to the operating coil 220 for an extended period, the hold-in current may additionally be utilized to monitor wellness of the system 10 that includes the switching device 218. For example, one embodiment of a process 366 for monitoring the wellness of the system is shown in FIG. 41D. Generally, the process 366 includes applying the hold-in current to the operating coil (process block 368), monitoring the PWM signal (process block 370), and monitoring wellness of the system (process block 372). In other words, the processor 224 may monitor the PWM signal 268 to monitor the wellness of the system.

More specifically, electric power carried by the switching device 218 generates a magnetic field, which may act on the operating coil 220. For example, in some embodiments, the magnetic field may induce a positive voltage in the operating coil 220, which enables the voltage supplied by the power source 246 to be reduced while still maintaining the hold-in current. As such, the PWM duty cycle may decrease. On the other hand, the magnetic field may induce a negative voltage in the operating coil 220, which causes the power source 246 to supply larger amount of voltage to maintain the hold-in current. As such, the PWM duty cycle may increase.

Additionally, when the switching device 218 is closed, conducted electric power may cause the stationary contactor assembly 124 to exert a force on the movable contactor assembly 116. In fact, under excessive current, the stationary contact assembly 124 may exert sufficient force on the movable contactor assembly 116 to cause armature 118 movement. As described above, movement may change impedance of the operating coil 220. Accordingly, to maintain the operating coil current 250 at its target, the duty cycle of the PWM signal may adjust to compensate for the change in impedance. In this manner, the PWM duty cycle may facilitate detecting excessive current conditions.

The PWM signal may also facilitate determining other characteristics of the source electric power and/or the load. For example, since the electric power carried may be AC, the polarity and magnitude of the current may continuously change. As such, since the magnitude and polarity of the induced voltage depends on the magnitude and polarity of current being conducted, the processor 224 may determine the phase of the current being conducted by the switching device 218 based at least in part on the changes in the PWM duty cycle. Thus, in some embodiments, since current will be largely cyclical, the processor 224 may determine when current zero-crossings will occur.

Based on the phase of the electric power, the processor 224 may also determine the type of load the electric power is being supplied to. Generally, when electric power is supplied to an inductive load, the current and the voltage will be out of phase. On the other hand, when electric power is supplied to a resistive load, the current and voltage will be in phase. As such, the processor 224 may determine whether the electric power is being supplied to an inductive load or a resistive load by comparing the phase of the current to phase of the voltage, for example, determined using sensors 22.

Phase Sequential Switching

As described above, one or more switching devices may be used to connect or disconnect electric power from a load 18, such as an electric motor 24. In some embodiments, to improve control over the connection/disconnection of electric power, the switching devices may be single pole switching devices, such as the single pole, single current carrying path switching devices 218. For example, three single pole switching devices may be used in a direct on-line configuration with each single pole switching device used to connect/disconnect one phase of electric power. In fact, since they are single pole switching devices, the switching devices be independently controlled, thereby enabling various closing and/or opening sequences.

To help illustrate, a three phase direct on-line configuration is described in 42A. As depicted, a first single pole switching device 335 may control supply of a first phase (e.g., phase A) of electric power from the power source 12 to the load 14, a second switching device 337 may control supply of a second phase (e.g., phase B) of electric power from the power source 12 to the load 14, and a third single pole switching device 339 may control supply of a third phase (e.g., phase C) of electric power from the power source 12 to the load 14. As such, the single pole switching devices 335, 337, and 339 may be opened/closed in various sequences.

For example, in some embodiments, the single pole switching devices 335, 337, and 339 may be controlled to sequentially open/close. One embodiment of a process 341 for sequentially opening/closing the single pole switching devices is described in 42B. Generally, the process 341 includes opening/closing a first switching device (process block 343), opening/closing a second switching device (process block 345), and opening/closing a third switching device (process block 347). In some embodiments, process 341 may be implemented via computer-readable instructions stored in a non-transitory article of manufacture (e.g., the memory 226, 20, 46 and/or other memories) and executed via processor 224, 19, 45 and/or other control circuitry.

Accordingly, at a first time, control circuitry 18 may instruct the first single pole switching device 335 to open or close (process block 343). In this manner, the first phase of electric power may be connected or disconnected at the first time. Additionally, at a second time, the control circuitry 18 may instruct the second single pole switching device 337 to open or close (process block 345). In this manner, the second phase of electric power may be connect or disconnected at the second time. Furthermore, at a third time, the control circuitry 18 may instruct the third single pole switching device 339 to open or close (process block 347). In this manner, the third phase of electric power may be connected or disconnected at the third time. As such, the single pole switching devices 335, 337, and 339 may be controlled to sequentially connect/disconnect each phase of electric power from the power source 12 to the load 14.

In other embodiments, the single pole switching devices 335, 337, and 339 may be controlled to open/close two and then open/close one or open/close one and then open/close two. One embodiment of a process 349 for opening/closing two and then opening/closing one is described in 42C. Generally, the process 349 includes opening/closing a first switching device and a second switching device (process block 351) and opening/closing a third switching device (process block 343). In some embodiments, process 349 may be implemented via computer-readable instructions stored in a non-transitory article of manufacture (e.g., the memory 226, 20, 46 and/or other memories) and executed via processor 224, 19, 45 and/or other control circuitry.

Accordingly, at a first time, control circuitry 18 may instruct the first single pole switching device 335 and the second single pole switching device 337 to open or close (process block 351). In this manner, the first phase and the second phase of electric power may be connected or disconnected at the first time. Additionally, at a second time, the control circuitry 18 may instruct the third single pole switching device 339 to open or close (process block 35.). In this manner, the third phase of electric power may be connect or disconnected at the second time. As such, the single pole switching devices 335, 337, and 339 may be controlled to connect/disconnect electric power from the power source 12 to the load 14 by opening/closing two and then one.

In further embodiments, the single pole switching devices 335, 337, and 339 may be controlled to open/close one and then open/close two. One embodiment of a process 355 for opening/closing one and then opening/closing two is described in 42D. Generally, the process 355 includes opening/closing a first switching device (process block 357) and opening/closing a second switching device and a third switching device (process block 359). In some embodiments, process 355 may be implemented via computer-readable instructions stored in a non-transitory article of manufacture (e.g., the memory 226, 20, 46 and/or other memories) and executed via processor 224, 19, 45 and/or other control circuitry.

Accordingly, at a first time, control circuitry 18 may instruct the first single pole switching device 335 to open or close (process block 357). In this manner, the first phase of electric power may be connected or disconnected at the first time. Additionally, at a second time, the control circuitry 18 may instruct the second single pole switching device 339 and the third single pole switching device 339 to open or close (process block 35). In this manner, the second phase and the third phase of electric power may be connect or disconnected at the second time. As such, the single pole switching devices 335, 337, and 339 may be controlled to connect/disconnect electric power from the power source 12 to the load 14 by opening/closing one and then two.

Moreover, since the single pole switching devices 335, 337, and 339 may be independently controlled, this may enable adjusting the open/close sequence based on various desired. For example, this may be particularly useful to implement point-on-wave (POW) techniques. More specifically, when connecting electric power, control circuitry 18 may utilize a close two then one sequence, thereby reducing magnitude of in-rush current and/or current oscillations. On the other hand, when disconnecting electric power, the control circuitry 18 may utilize an open one then two sequence, thereby reducing likelihood and/or magnitude of arcing.

In addition to connecting/disconnecting electric power direct on-line, the one or more switching devices (e.g., single-pole, single current-carrying path switching devices) may be used in a wye-delta starter, which provides electric power to the electric motor 24. Generally, the wye-delta starter may start the electric motors 24 by connecting the windings in a wye (e.g., star) configuration in order to limit the amount of voltage supplied to the windings, thereby limiting in rush current to the motor 24 and/or torque produced by the motor 24. Subsequently, the wye-delta starter may connect the windings in the electric motor 24 in a delta configuration after the motor 24 is started to increase the voltage supplied to the windings, thereby increasing the torque produced by the motor. In other words, a wye-delta starter may ease starting of the electric motor 24 by gradually increasing supplied electric power, thereby gradually increasing produced torque.

In some instances, opening and closing the switching devices to transition the electric motor 24 between the various configurations may discharge electric power (e.g., arcing), cause negative torque in the electric motor 24, cause current spikes that could trip upstream devices, cause current oscillations, or the like. As can be appreciated, such events may reduce the lifespan of the switching devices, the electric motor 24, the load, and/or other connected equipment.

As such, it would be beneficial to reduce likelihood and/or magnitude of such events when transitioning between the various configurations. As will be described in more detail below, one embodiment described herein may reduce these effects by transition between the wye configuration and the delta configuration using single-pole switching devices, such as the single pole, single current path switching devices 218 described above. More specifically, using single-pole switching devices may enable relatively independently controlling opening and/or closing, for example, in a sequential manner. In other words, each of the windings of the motor 24 may not simultaneously transition from a wye configuration to delta configuration or vice versa.

To help illustrate, a process for sequential starting of a motor 24 using a 5-pole wye-delta starter 374 is described in reference to FIGS. 43A-H. To simplify the following discussion, the wye-delta starter 374 is described as using five single pole switching devices, such as the single-pole, single current-carrying path switching devices 218 described above. However, any other suitable switching device may additionally or alternatively be used in the techniques described herein. For example, in some embodiments, a multi pole, multi-current carrying path switching device (e.g., three-pole contactor) with off-set poles may be used.

It should be further noted that point-on-wave (POW) techniques may or may not be utilized in the embodiments described below. As described above, when POW techniques are utilized, sensors 22 may monitor (e.g., measure) the characteristics (e.g., voltage or current) of the electric power supplied to the electric motor 24. The characteristics may be communicated to the control and monitoring circuitry 18 to enable determining the timing for making and/or breaking the switching devices at a specific point on the electric power waveform.

More specifically, when POW techniques are utilized, a reference point may be selected on a waveform and the timings for energizing the coils and opening/closing switching devices may be calculated. Commands may be sent to timers and the like based on the calculated timings. Once the reference point is hit, the sequence may begin and the timers may trigger the switching devices to open or close when the calculated times are encountered (e.g., after a configurable amount of electrical degrees and/or based a predicted current zero-crossing). In this manner, when POW techniques are utilized, the wye-delta starter 374 may progress through each step in a two-step start and a wye-delta phase sequential transition based at least in part on current zero-crossings and/or predicted current zero-crossing. On the other hand, when POW techniques are not utilized, the wye-delta starter 374 may progress through each step in the two-step start and the wye-delta phase sequential transition one at a time, for example, after a brief time delay (e.g., milliseconds).

In some embodiments, continuous current flow may be provided to the motor 24 during the transition from wye to delta (e.g., "closed transition") by supplying current to at least one winding during the transition. More specifically, supplying current to at least one winding may facilitate maintaining a relationship between the rotor field and the line electric power. In this manner, when subsequent windings are connect to the line electric power, in rush current may be reduced, which may obviate transition resistors.

As depicted, the 5-pole wye-delta starter 374 includes five switching devices 376, 378, 380, 382, and 384 used to selectively connect three motor windings 386, 388, and 390 to a three-phase power source (e.g., mains lines 392, 394, and 396 each carrying a single phase of power). In some embodiments, the first wye switching device 376 and the second wye switching device 378 may have the same operational characteristics. Additionally, the first delta switching device 380, the second delta switching device 382, and the third delta switching device 384 may have the same operational characteristics. For example, in some embodiments, the delta switching device 380, 382, and 384 may be single-pole, single current carrying path switching devices 218 and the wye switching devices 376 and 378 may be power electronic switching devices, such as silicon-controlled rectifiers (SCRs), insulated-gate bipolar transistors (IGBTs), or power field-effect transistors (FETs), or other bidirectional devices.

In the depicted embodiment, dashed lines are used to indicate non-conducting pathways and solid lines are used to indicate conducting pathways. As such, FIG. 43A describes when each of the switching devices 376, 378, 380, 382, and 384 is open, thereby disconnecting the electric power from the windings 386, 388, and 390. The wye-delta starter 374 may then transition to a wye configuration using a two-step start sequence, as described in FIGS. 43B and 43C. From the wye configuration, the wye-delta starter 374 may then transition to a delta configuration using phase sequential switching, as described in FIGS. 43D-H.

As described above, FIGS. 43B and 43C describe transitioning the electric motor 24 to a wye configuration using a two-step process. More specifically, as shown in FIG. 43B, the second wye switching device 378 may be closed to provide power to the motor windings 388 and 390. In some embodiments, the second wye switching device 378 may be closed based at least in part on a predicted current zero-crossing to reduce magnitude of in rush current and current oscillations. Additionally, as shown in FIG. 43B, the first wye switching device 376 may be closed to provide three-phase power to the motor windings 386, 388, and 390. In some embodiments, the first wye switching device 376 may be closed after a delay to reduce magnitude of current and/or torque oscillations, for example, based on a predicted current zero-crossing. In this manner, the wye-delta starter may run the electric motor 24 in the wye configuration.

After the electric motor 24 is running in the wye configuration, current flowing through windings 386, 388, and 390 may be balanced. As described above, the electric motor 24 may be started in the wye configuration so that the electric motor 24 produces a reduced amount of torque and consumes less power. In other words, as will be described in more detail below, starting in the wye configuration enables the electric motor 24 to be gradually started.

The wye-delta starter 374 may then transition to running the electric motor 24 in a delta configuration to increase torque output (e.g., ramp up the motor 24). In some embodiments, the transition to the delta configuration may initiate after connecting in the wye configuration, for example, to enable the electric motor 24 to reach steady state and/or reduce magnitude of torque adjustments.

More specifically, the wye-delta starter 374 may begin transition from the wye configuration to the delta configuration by opening the first wye switching device 376, as shown in FIG. 43D. As a result, electric power is only supplied to motor windings 388 and 390, which stops the stator field. More specifically, as shown in FIG. 43E, the first delta switching device 380 may be closed, thereby connecting first winding 386 in the delta configuration (e.g., line 392 to line 394) while windings 388 and 390 remain connect in the wye configuration. As a result, the stator field may be reintroduced, thereby producing a positive torque. In fact, in some embodiments, the closure of first delta switching device 380 may be delayed to enable any arcing produced from the opening first wye switching device 376 to dissipate and/or mute adjustment between the stator field and the rotor field, for example, to reduce magnitude of current and/or torque oscillations.

Additionally, as depicted in FIG. 43F, the second wye switching device 378 may be opened such that only the first winding 386 continues to receive power. In some embodiments, the opening of the second wye switching device 378 may occur based on (e.g., at or ahead of) a current zero-crossing in order to reduce likelihood and/or magnitude of arcing.

Furthermore, the second delta switching device 382 may be closed after the opening of the second wye switching device 378, thereby providing power to second winding 388 as depicted in FIG. 43G. More specifically, when the second wye switching device 378 is open, the stator field stops rotating and while the speed strength of the rotor field gradually diminishes. Thus, waiting too long to close second delta switching device 382 may increase inrush current and/or cause the rotor field to pass the stator field, thereby producing a whipsaw effect of braking torque as the stator and rotor fields try to sync.

Accordingly, in some embodiments, the closure timing of second delta switching device 382 may be a short delay (e.g., a few milliseconds or a configurable number of electrical degrees) after second wye switching device 378 opens to reduce the likelihood of the rotor field passing the stator field. For example, the second delta switching device 382 may close based upon where a predicted current zero-crossing. Additionally, the closure timing of second delta switching device 382 may enable any arcing resulting from the opening of second wye switching device 378 to be extinguished before closing. For example, in some embodiments, second delta switching device 382 may be closed two hundred forty electrical degrees after the first delta switching device 380 closure.

As depicted in FIG. 43H, the third delta switching device 384 may be closed. In some embodiments, the third delta switching device 384 may close based upon a predicted current-zero crossing. Once the third delta switching device 384 is closed, three-phase power is supplied to the three motor windings 386, 388, and 390 via the closed switching devices 380, 382, and 384 in the delta configuration. As such, the motor 24 may accelerate to full torque capabilities in the delta configuration.

Although each switching device 376, 378, 380, 382, and 384 is described as sequentially opening or closing, in other embodiments one or more of the switching devices may open or close substantially simultaneous. For example, in some embodiments, switching devices 382 and 384 may be closed substantially simultaneously. In this manner, an interim torque levels may be removed and the motor may accelerate to full load faster.

Figure 44A:
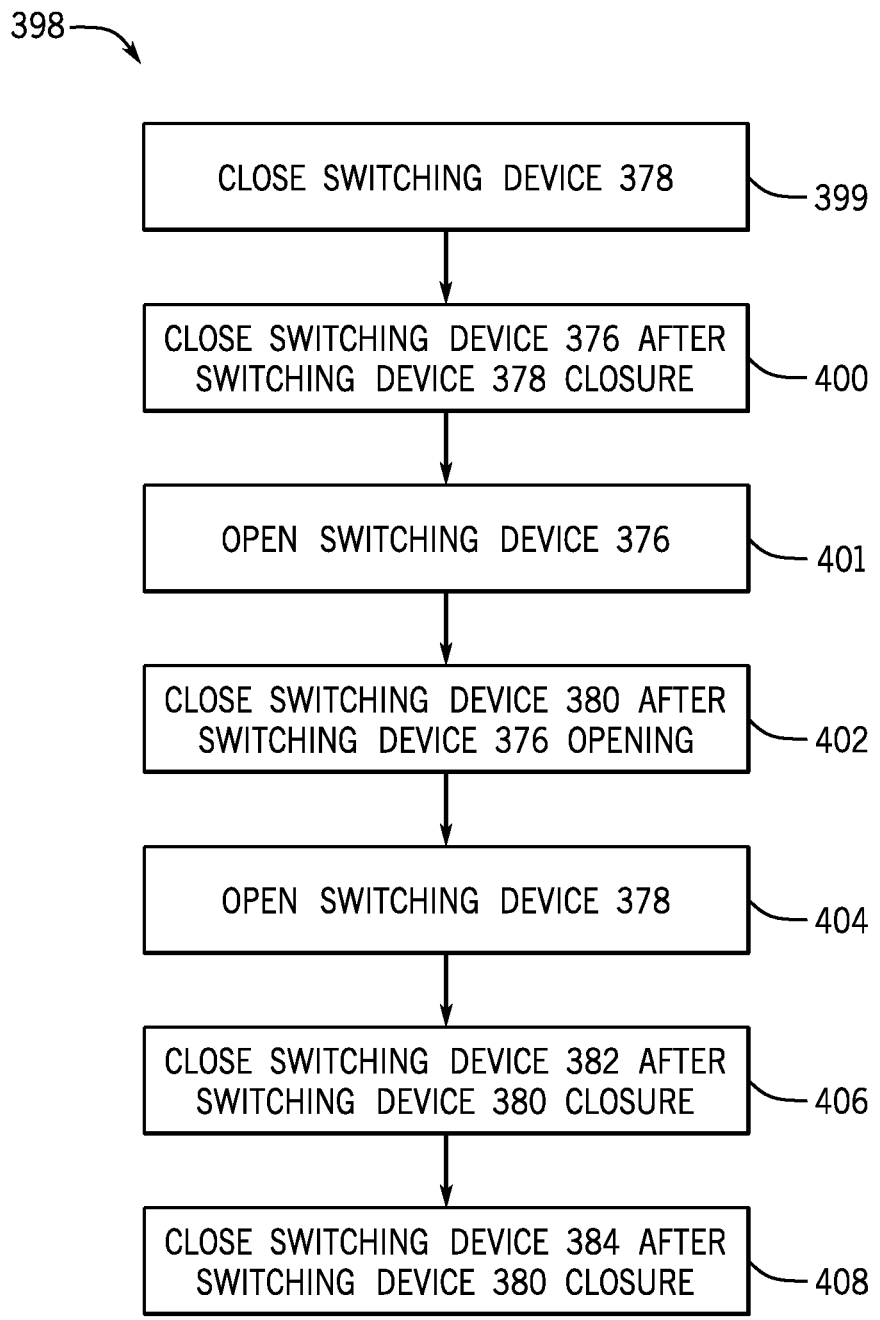
FIG. 44A is a block diagram of logic for the phase sequential wye-delta switching, in accordance with an embodiment.

One embodiment of a process 398 for controlling the wye-delta starter 374 to transition an electric motor 24 from an open configuration to a wye configuration and to a delta configuration is described in FIG. 44A. Generally, the process 398 includes closing a second wye switching device 378 (process block 399) and closing a first wye switching device 376 after closing first wye switching device 376 (process block 400) to run the electric motor 24 in the wye configuration. Additionally, the process 398 includes opening the first wye switching device 376 (process block 401), closing a first delta switching device 380 after the first wye switching device 376 opens (process block 402), opening the second wye switching device 378 (process block 404), closing a second delta switching device 382 after the first delta switching device 380 closes (process block 406), and closing a third delta switching device 384 after the first delta switching device 380 closes (process block 408) to run the electric motor 24 in the delta configuration. In some embodiments, process 398 may be implemented via computer-readable instructions stored in a non-transitory article of manufacture (e.g., the memory 226, 20, 46 and/or other memories) and executed via processor 224, 19, 45 and/or other control circuitry.

In some embodiments, process 398 may begin when the wye-delta starter 374 is in the open configuration, thereby disconnecting electrical power from the electric motor 24 (e.g., FIG. 43A). To connect the electric motor 24 in the wye-configuration, control circuitry 18 may instruct the second wye switching device 378 to close (process block 399) and the first wye switching device 376 to close after closure of the second wye switching device 378 (process block 400). In some embodiments, the control circuitry 18 may instruct the wye switching devices 376 and 378 to close based at least in part on a predicted current zero-crossing and/or at a configurable number of electrical degrees apart from each other. For example, the control circuitry 18 may instruct second wye switching device 378 to close at a line-to-line voltage maximum (e.g., a predicted current zero-crossing) and the first wye switching device 376 to close sixty electrical degrees later (e.g., a predicted current zero-crossing), thereby reducing magnitude of in-rush current and/or current oscillations.

From the wye configuration, control circuitry 18 may instruct the first wye switching device 376 to open (process block 401). In some embodiments, the control circuitry 18 may instruct the first wye switching device 376 to open based at least in part on a current zero-crossing (e.g. at or before a current zero-crossing), which may reduce arcing and extend the life of the first wye switching device 376, the electric motor 24, the load, and/or other connected electrical components.

After first wye switching device 376 is opened, control circuitry 18 may instruct the first delta switching device 380 to close (process block 402). In some embodiments, the control circuitry 18 may instruct the first delta switching device 380 to close based at least in part on a predicted current zero-crossing and/or at a configurable number of electrical degrees after the first switching device 376 opens. For example, in some embodiments, the control circuitry 18 may instruct first delta switching device 380 to close thirty electrical degrees (e.g., a predicted current zero-crossing) after first wye switching device 376 is opened.

Control circuitry 18 may then instruct second wye switching device 378 to open (process block 404). In some embodiments, the control circuitry 18 may instruct second wye switching device 378 to open based at least in part on a next subsequent current zero-crossing, thereby reducing likelihood and/or magnitude of arcing and current spikes.

Additionally, after first delta switching device 380 is closed, the control circuitry 18 may instruct second delta switching device 382 to close (process block 406) and third delta switching device 384 to close (process block 408). In some embodiments, the control circuitry 18 may instruct second delta switching device 382 and third delta switching device 384 to close based at least in part on a predicted current zero-crossing and/or at a configurable number of electrical degrees after the first wye switching device 376 opened. For example, the control circuitry 18 may instruct second delta switching device 382 to close a two hundred forty electrical degrees (e.g., a predicted current zero-crossing) after the first delta switching device 380 closure and instruct third delta switching device 384 to close four hundred twenty electrical degrees (e.g., a predicted current zero-crossing) after the first delta switching device 380 closure.

In some embodiments, it may be desirable to close the second delta switching device 382 quickly because the stator field may stall after the second wye switching device 378 opens. As such, waiting an extended period before closing second delta switching device 382 may result in the rotor field to passing the stator field, which may lead to torque oscillations (e.g., a whipsaw effect) as the fields try to sync and/or current spikes in the motor 24.

In this manner, the control circuitry 18 may instruct the wye-delta starter 374 to gradually transition an electric motor 24 from the open configuration to the wye-configuration and to the delta-configuration. In other words, the wye-delta starter 374 may be controlled to gradually adjust speed and/or or torque of the motor 24 by sequentially opening/closing the switching devices 376-384.

Additionally, it should be noted that the described electrical degrees are merely intended to be illustrative. In fact, in some embodiments, the number of electrical degrees may be dynamically adjusted by the control circuitry 18 and/or firmware of the switching devices based at least in part on supplied electrical power, application (e.g., load), environmental factors (e.g., dust, condition of switching devices and/or load, etc.), and so forth. For example, as described above, the timing of opening/closing a switching device may be adjusted to reduce likelihood of arcing, magnitude of arcing, magnitude of current oscillations, magnitude of torque oscillations, magnitude of in-rush current, likelihood of current spikes, magnitude of current spikes, or any combination thereof. Additionally, in some embodiments, the timings may be adjusted based at least in part on the type of application the electric motor 24 is used in. For example, when driving a chiller, long delays may not be acceptable because and, thus, the adjusted to be shorter. Further, the timings may be adjusted based at least in part on the power factor of the AC electric power system.

To facilitate, the timings may be adjusted by multiples of thirty electrical degrees (e.g., thirty, sixty, ninety, etc.), multiples of one hundred eighty electrical degrees (e.g., one hundred eighty, three hundred sixty), multiples of three hundred sixty degrees, multiples of seven hundred twenty degrees, or so forth. In fact, delaying the timings may enable electric power to stabilize, thereby reducing magnitude of current oscillations and/or current spikes. More specifically, a lower magnitude of current oscillation and/or current spikes may improve adjustments between the stator field and the rotor field. As such, in some embodiments, the timing of each subsequent opening/closing may be based at least in part on when electric power supplied to the windings 386, 388, and 390 stabilize.

Figure 44B:
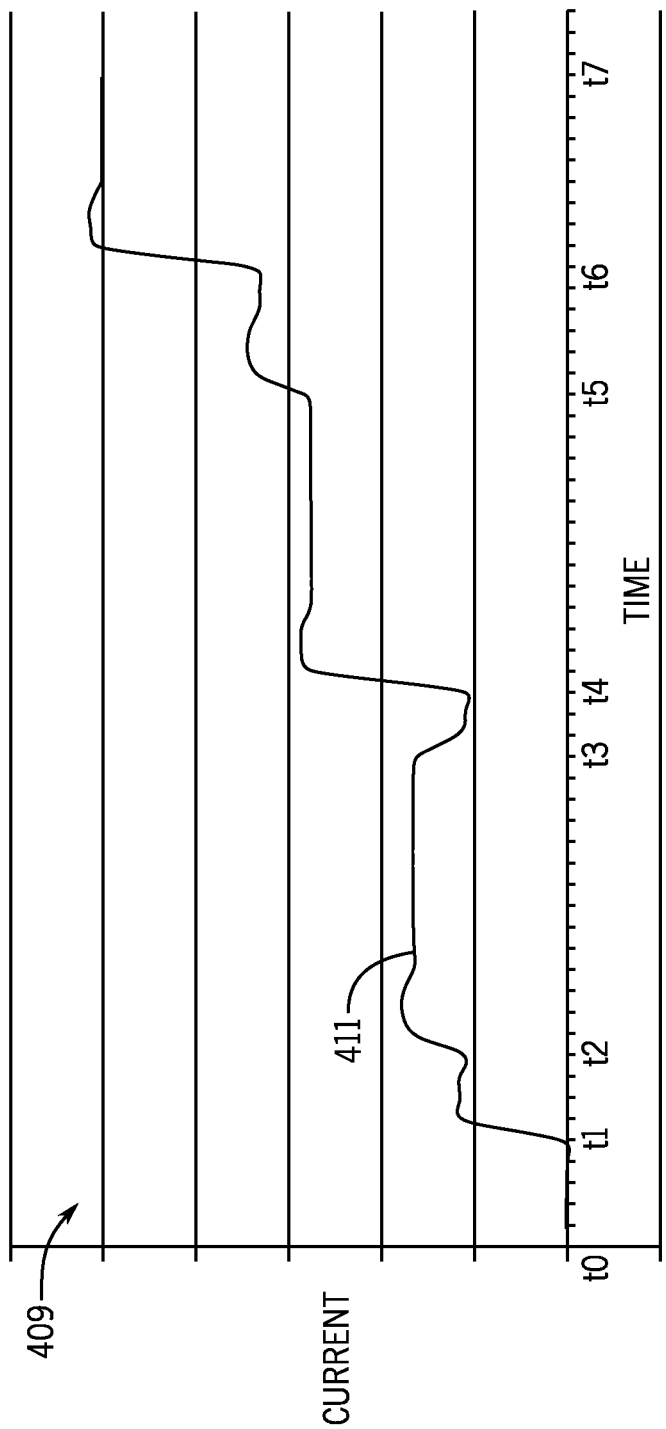
FIG. 44B is plot of current in windings of an electric motor during phase sequential wye-delta switching, in accordance with an embodiment.

To help illustrate, a plot 409 of magnitude of current supplied to the electric motor 24 is described in FIG. 44B. More specifically, the plot 409 includes a current curve 411 that describes magnitude of current supplied to windings 386, 388, and 390 in the electric motor between t0 when motor 24 is connect in an open configuration (e.g., FIG. 43A) to t7 when the motor 24 is connected in a delta configuration (e.g., FIG. 43H).

As described by the current curve 411, the magnitude of current supplied to the electric motor 24 is zero between t0 and t1. Thus, between t0 and t1, the wye-delta starter 374 may be in the configuration described in FIG. 43A, thereby disconnecting electric power from the windings 386, 388, and 390. Additionally, the magnitude of current supplied to the electric motor 24 increases at t1 and reaches a steady state before t2. Thus, between t1 and t2, the wye-delta starter 374 may be in the configuration described in FIG. 43B, thereby connecting electric power to windings 388 and 390 in the wye configuration. Furthermore, the magnitude of current supplied to the electric motor 24 again increases at t2 and reach a steady state before t3. Thus, between t2 and t3, the wye-delta starter 374 may be in the configuration described in FIG. 43C, thereby connecting electric power to each of the windings 386, 388, and 390 in the wye configuration.

As described by the current curve 411, the magnitude of the current supplied to the electric motor 24 may decrease at t3 and reach a steady state before t4. Thus, between t3 and t4, the wye-delta starter 374 may be in the configuration described in FIG. 43D, thereby connecting electric power to windings 388 and 390 in the wye configuration. Additionally, the magnitude of the current supplied to the electric motor 24 may increase at t4 and reach a steady state before t5. Thus, between t4 and t5, the wye-delta starter 374 may be in the configuration described in FIG. 43E, thereby connecting electric power to windings 388 and 390 in the wye configuration and first winding 386 in the delta configuration.

Furthermore, the magnitude of the current supplied to the electric motor 24 may be again increased at t5 and reach a steady state before t6. In some embodiments, between t5 and t6, the wye-delta starter 374 may operate such that, at a first time, the second winding 388 is connected in the wye configuration, first winding 386 is connected in a delta configuration, and third winding 390 is connected in both the wye and the delta configuration and, at a second time, the second winding 388 remains connected in the wye configuration and windings 386 and 388 are connected in the delta configuration. In other embodiments, between t5 and t6, the wye delta starter 384 may operate such that, at a first time, the first winding 386 is connected in the delta configuration (e.g., FIG. 43F) and, at a second time, windings 386 and 388 are connected in the delta configuration (e.g., FIG. 43G).

As described by the current curve 411, the magnitude of the current supplied to the electric motor 24 may increase at t6 and reach a steady state before t7. Thus, between t6 and t7, the wye-delta starter 374 may be in the configuration described in FIG. 43H, thereby connecting electric power to windings 386, 388 and 390 in the delta configuration. Thus, in the described embodiment, the timing of opening/closing of the switching devices 376-384 may be determined such that subsequent opening/closing is performed after the electric motor 24 stabilizes (e.g., magnitude of current reaches a steady state), thereby reducing magnitude of current spikes, current oscillations, and/or torque oscillations produced by sequential switching.

Moreover, in some embodiments, POW techniques may also be utilized to improve sequential switching of the wye-delta starter 374. As described above, when POW techniques are utilized, the wye-delta starter 374 may progress through each step in the sequential switching based at least in part on current zero-crossings and/or predicted current zero-crossings. To help illustrate, current and voltage waveforms of the power source 12 and the windings 386, 388, and 390 are described.

Since connecting the windings 386, 388, and 390 in a wye configuration is essentially connecting three phase electric power, the current and voltage waveforms describing transitioning from disconnected to the wye configuration are described in relation to FIGS. 5A-5C between t0 and t2. In this context, FIG. 5A illustrates the voltage of three-phase electric power (e.g., a first phase voltage curve 66, a second phase voltage curve 68, and a third phase voltage curve 70) provided by a power source 12. FIG. 5B illustrates the line to neutral voltage supplied to each terminal (e.g., first terminal voltage curve 72, second terminal voltage curve 74, and third terminal voltage curve 76) of the electric motor 24. FIG. 5C illustrates line current supplied to each winding (e.g., first winding current curve 77, second winding current curve 78, and third winding current curve 80) of the electric motor 24.

As described above, between t0 and t1, the switching devices 376-384 are open and electric power is not connected to the electric motor 24. At t1, the second wye switching device 378 is closed to connect a first phase (e.g., phase A) and a second phase (e.g., phase B) of the electric power to the second winding 388 and the third winding 390 in the wye configuration. To reduce magnitude of in-rush current and/or current oscillations, the wye-delta starter 374 may close the second wye switching device 278 based at least in part on a predicted current zero-crossing (e.g., within a range from slightly before to slightly after the predicted current zero-crossing).

As described above, a predicted current zero-crossing may correspond with a line-to-line voltage maximum (e.g., 90° after a voltage zero-crossing). With regard to FIG. 5A, the predicted current zero-crossing occurs approximately when the line-to-line voltage between the second phase (e.g., second phase voltage curve 68) and the third phase (e.g., third phase voltage curve 70) is at a maximum. Accordingly, by closing the second wye switching device 278 at t1, electric power is connected to the second winding 388 and the third winding 390 at approximately the predicted current zero-crossing. In fact, as depicted in FIG. 5C, since electric power is connected based at least in part on a predicted current zero-crossing, the current supplied to the second winding 388 (e.g., second winding current curve 79) and the third winding 390 (e.g., second winding current curve 80) start at zero and gradually change, thereby reducing magnitude of in-rush current and/or current oscillation.

After second wye switching device 378 is closed, first wye switching device 376 is closed at t2 to supply the third phase (e.g., phase C) of the electric power to the first winding 386 in the wye configuration. To reduce magnitude of in-rush current and/or current oscillations, the wye-delta starter 374 may connect electric power to the first winding 386 based at least in part on a predicted current zero-crossing. With regard to FIG. 5A, the predicted current zero-crossing occurs when the sum of line-to-line voltage between the first phase (e.g., first phase voltage curve 66) and the third phase (e.g., third phase voltage curve 70) and the line-to-line voltage between the first phase (e.g., second phase voltage curve 66) and the second phase (e.g., third phase voltage curve 68) is at a maximum. Accordingly, by closing the first wye switching device 376 at t2, electric power is connected to the first winding 386 at approximately the predicted current zero-crossing. In fact, as depicted in FIG. 5C, since the electric power connected based at least in part on a predicted current zero-crossing, the current supplied to the first winding 386 (e.g., first winding current curve 78) starts at zero and gradually change, thereby rotating the electric motor 24 and reducing magnitude of in-rush current and/or current oscillation.

Figure 45A:
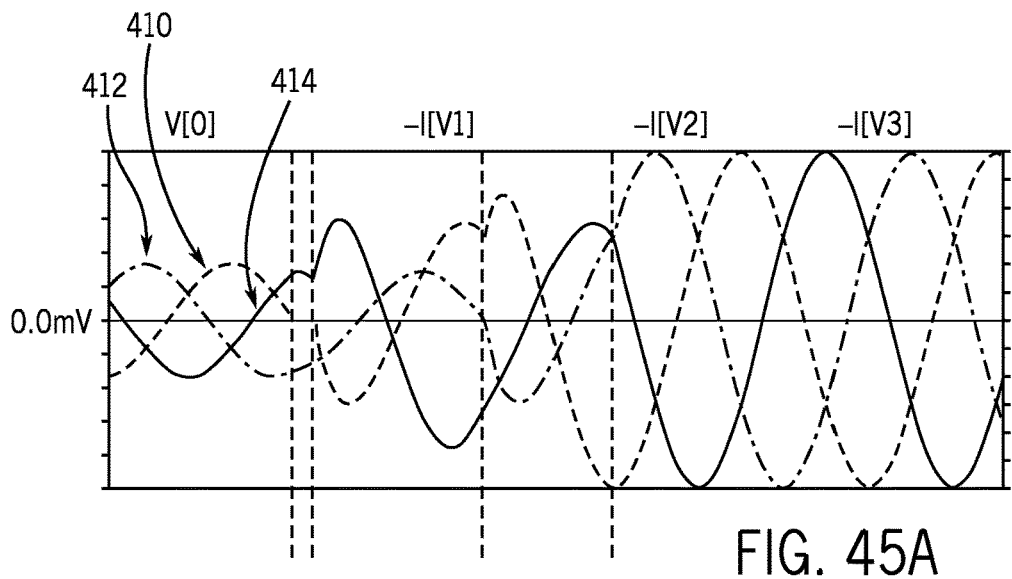
FIGS. 45A-45C is a set of current and voltage waveforms for the phase sequential wye-delta switching, in accordance with an embodiment.
Figure 45B:
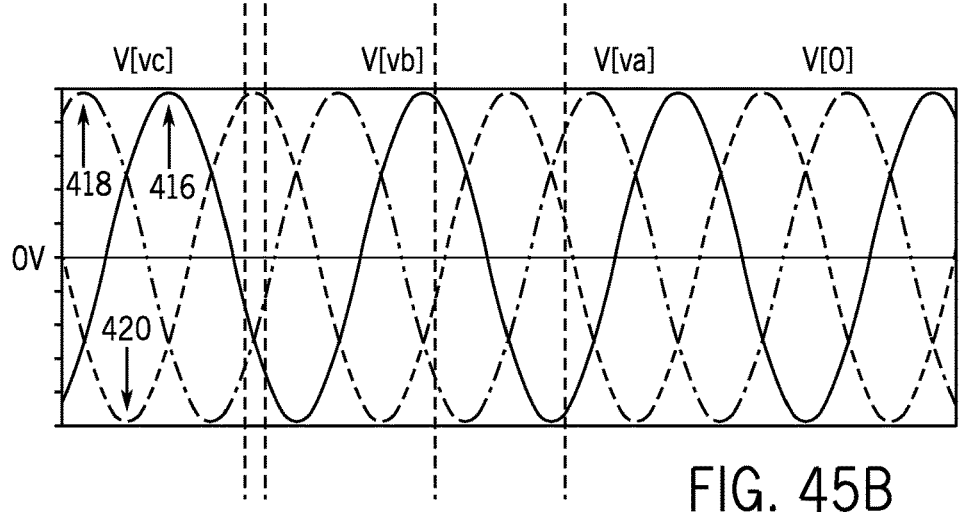
Figure 45C:
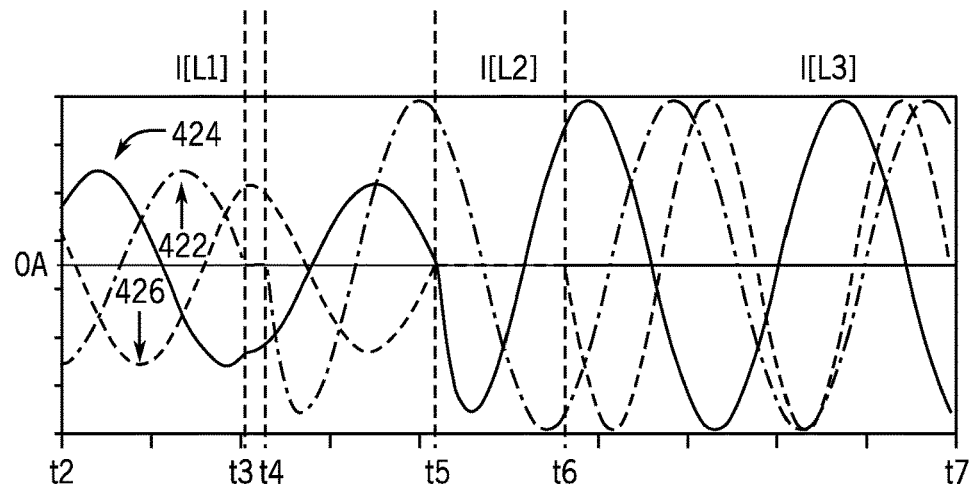

To further illustrate, FIGS. 45A-C depicts current and voltage waveforms for transitioning from the wye configuration to the delta configuration. Specifically, FIG. 45A illustrates the line to neutral voltage supplied to each terminal (first terminal voltage curve 414, second terminal voltage curve 412, and third terminal voltage curve 416) of the electric motor 24. Additionally, 45B illustrates the voltage of three-phase electric power (e.g., a first phase voltage curve 420, a second phase voltage curve 418, and a third phase voltage curve 422) provided by a power source 12. FIG. 45C illustrates line current supplied to each winding (e.g., first winding current curve 422, second winding current curve 424, and third winding current curve 426) of the electric motor 24.

As described above, the first wye switching device 376 is opened at t3 to disconnect electric power from the first winding 386. To reduce the likelihood and/or magnitude of arcing, the wye-delta starter 374 may open the first wye switching device 376 based at least in part of a current zero-crossing (e.g., at or slightly before the current zero-crossing). With regard to FIG. 45C, the current zero-crossing occurs when current supplied to the first winding 386 (e.g., first winding current curve 422) is zero. Accordingly, by opening the first wye switching device 376 at t3, electric power is disconnected from the first winding 386 at approximately the current zero-crossing.

After the first wye switching device 376 is opened, first delta switching device 380 may be closed at t4 to connect electric power to the first winding 386 in the delta configuration. To reduce magnitude of in-rush current and/or current oscillations, the wye-delta starter 374 may close the first delta switching device 380 based at least in part on a predicted current zero-crossing (e.g., within a range from slightly before to slightly after the predicted current zero-crossing). With regard to FIG. 45B, the predicted current zero-crossing occurs halfway between t3 and t4 when the sum of line-to-line voltage between the first phase (e.g., first phase voltage curve 420) and the third phase (e.g., third phase voltage curve 416) and the line-to-line voltage between the first phase (e.g., second phase voltage curve 420) and the second phase (e.g., second phase voltage curve 418) is at a maximum. Accordingly, by closing the first wye switching device 376 at t4, the first wye switching device 376 is closed slightly after the predicted current zero-crossing. Nevertheless, as depicted in FIG. 45C, since electric power is connected based at least in part on the predicted current zero-crossing, the current supplied to the first winding 386 (e.g., first winding current 422) starts at zero and gradually changes, thereby reducing magnitude of in-rush current and/or current oscillation.

Furthermore, at t4, the electric motor windings 386-390 are connected in a mixed wye-delta configuration. Accordingly, as depicted in FIG. 45C, the current supplied to the windings (e.g., first winding current curve 422, second winding current curve 424, and third winding current curve 426) is unbalanced, which may cause the winding (e.g., 388 and 390) connected in wye and the winding (e.g., 386) connected in delta to produce varying magnetic fields. In other words, the electric motor 24 may be unbalanced while still producing a positive torque.

After first delta switching device 380 is closed, second wye switching device 378 may be opened and second delta switching device 382 may be closed at t5 to connect the second winding 388 in the delta configuration. To reduce the likelihood and/or magnitude of arcing, the wye-delta starter 374 may open the second wye switching device 378 based at least in part of a current zero-crossing. With regard to FIG. 45C, the current zero crossing occurs when current supplied to the second winding 388 (e.g., second winding current curve 424) and the third winding 390 (e.g., third winding current curve 426) are zero. Accordingly, by opening the second wye switching device 378 at t5, the second and third windings 388 and 390 are disconnected approximately at the current zero-crossing.

Additionally, to reduce magnitude of in-rush current and/or current oscillations, the wye-delta starter 374 may close the second delta switching device 382 based at least in part on a predicted current zero-crossing. With regard to FIG. 45B, the predicted current zero-crossing occurs at a line-to-line voltage maximum between the first phase (e.g., first phase voltage curve 420) and the second phase (e.g., second phase voltage curve 418). Accordingly, by closing the second delta switching device 382 at approximately t5, electric power is connect to the second winding 388 at approximately the predicted current zero-crossing. In fact, as depicted in FIG. 45C, since electric power is connected based at least in part on the predicted current zero-crossing, the current supplied to the second winding 388 (e.g., second winding current 424) starts at zero and gradually changes, thereby reducing magnitude of in-rush current and/or current oscillation.

After first delta switching device 380 is closed, the third delta switching device 384 is may be close at t6. To reduce magnitude of in-rush current and/or current oscillations, the wye-delta starter 374 may close the third delta switching device 384 based at least in part on a predicted current zero-crossing. With regard to FIG. 45B, the predicted current zero-crossing occurs when the sum of line-to-line voltage between the first phase (e.g., first phase voltage curve 420) and the third phase (e.g., third phase voltage curve 416) and the line-to-line voltage between the third phase (e.g., third phase voltage curve 416) and the second phase (e.g., second phase voltage curve 418) is at a maximum. Accordingly, by closing the third delta switching device 384 at t6, electric power is connect to the third winding 390 at approximately the predicted current zero-crossing. In fact, as depicted in FIG. 45C, since electric power is connected based at least in part on the predicted current zero-crossing, the current supplied to the third winding 390 (e.g., third winding current 426) starts at zero and gradually changes, thereby reducing magnitude of in-rush current and/or current oscillation.

Thus, in the described embodiment, the timing of opening/closing of the switching devices 376-384 may be determined such based at least in part on current zero-crossings and/or predicted current zero-crossings. As discussed above, this may facilitate reducing in-rush current and/or current oscillations when a switching device is closed and reduce likelihood and/or magnitude of arcing when a switching device is open. In this manner, the wye-delta starter 374 may utilize sequential switching to gradually adjust speed and/or torque of the electric motor 24, particularly during startup.

In fact, the timing of the sequential switching may also be determined based on a balance between desired ramp up duration, strain on the motor 24, and/or strain on the load 14. For example, in some embodiments, to reduce ramp up duration, the wye-delta starter 374 may adjust configuration of the first wye switching device 376-382 as soon as magnitude of the supplied current stabilizes. Additionally, to reduce strain on the motor 24, the wye-delta starter 374 may remain at each configuration a differing duration. For example, duration that the electric motor 24 is run a wye configuration (e.g., between t2 and t3) may be longer than duration that the electric motor 24 is run in a mixed wye-delta configuration (e.g., between t3 and t4). In some embodiments, duration that the electric motor 24 is run in a first mixed wye-delta configuration (e.g., between t4 and t5) may be longer than duration that the electric motor 24 is run in a second mixed wye-delta configuration (e.g., between t3 and t4).

Once in the delta configuration, the wye-delta starter 374 may enable the electric motor 24 to utilize maximum (e.g., 100%) torque and/or maximum (e.g., 100%) speed capabilities. In other words, the torque and/or speed capabilities of the electric motor 24 may be increased when running in the delta configuration as compared to running in the wye configuration. However, power consumption by the electric motor 24 may also be increased. As such, in certain scenarios, it may be beneficial for the wye-delta starter 374 to transition the motor 24 from the delta configuration back to the wye configuration, thereby reducing power consumption.

Figure 46:
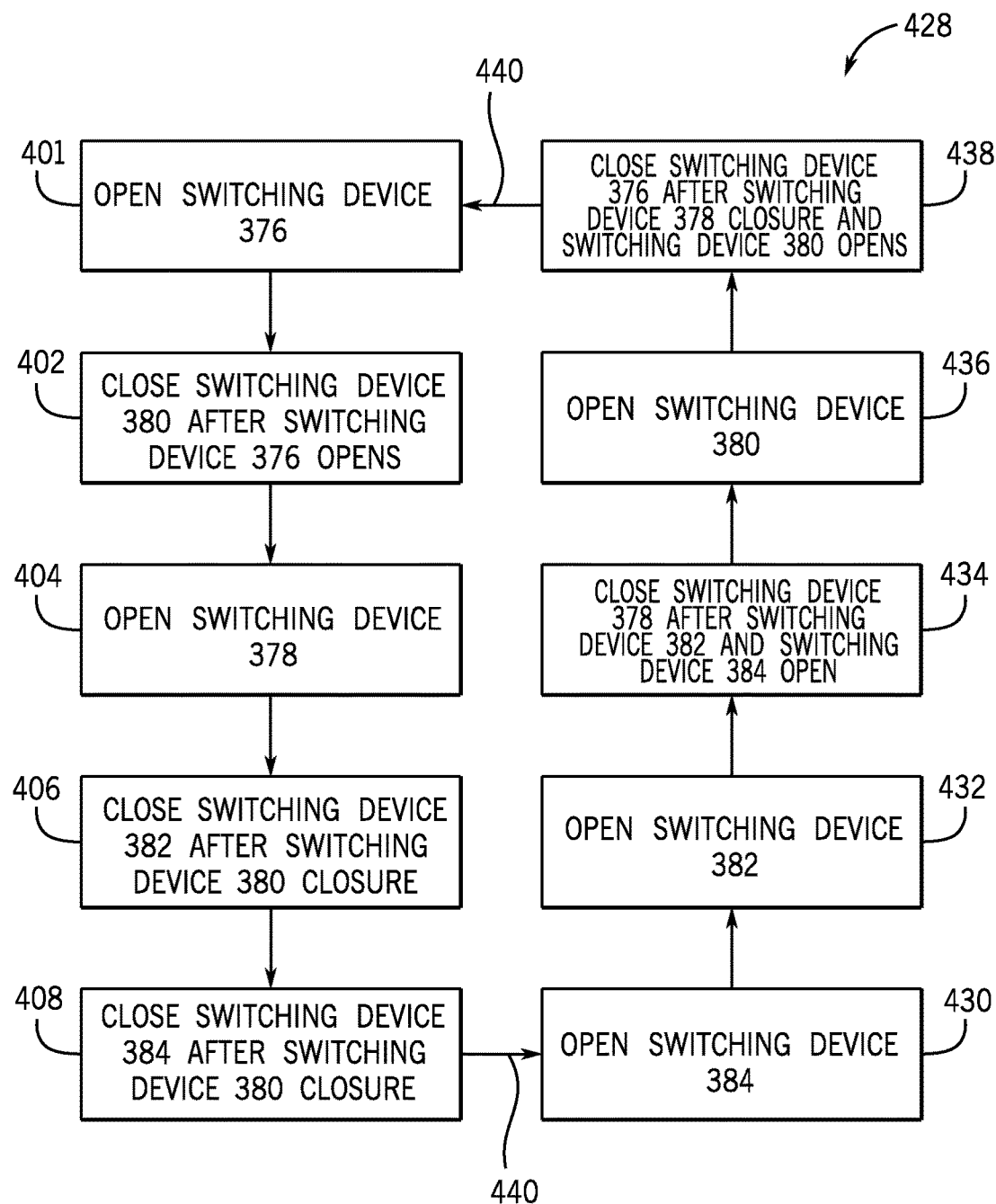
FIG. 46 is a block diagram of logic for switching between wye and delta configurations during operation of a motor, in accordance with an embodiment.

One embodiment of a process 428 that describes the transition between wye to delta and vice versa is shown in FIG. 46. Generally, the process 428 includes the same steps 401-408 shown in FIG. 44A to phase sequentially switch from wye to delta. To transition from delta to wye, the process 428 includes opening the third delta switching device 384 (process block 430), opening the second delta switching device 382 (process block 432), closing the second wye switching device 378 after the second delta switching device 382 opens (process block 434), opening the first delta switching device 380 (process block 436), and closing the first wye switching device 376 after the second wye switching device 378 closes (process block 438). In some embodiments, the process 428 may be implemented via computer-readable instructions stored in a tangible non-transitory article of manufacture (e.g., the memory 226, 20, 46 and/or other memories) and executed via processor 224, 19, 45 and/or other control circuitry.

As previously noted, when POW techniques are not utilized the wye-delta starter may progress through each step in the sequential switching after a brief time delay (e.g., milliseconds) or substantially simultaneously. On the other hand, when POW techniques are utilized the wye-delta starter may progress through each step in the wye two-step start and phase sequential wye-delta switching after a configurable number of electrical degrees and/or based at least in part on current zero-crossings.

Turning now to the process 428, the phase sequential wye-delta switching process blocks (process blocks 401, 402, 404, 406, and 408) described above with reference to FIG. 44A are reproduced in order to aid in understanding how the techniques enable sequentially switching back and forth between wye and delta as desired. As such, the detailed description of each process block in the phase sequential wye-delta switching in FIG. 44A is incorporated here by reference.

Thus, at process block 408, the electric motor 24 is running in a delta configuration. From the delta configuration, control circuitry 18 may instruct third delta switching device 384 to open (process block 430) and instruct second delta switching device 382 to open (process block 432). In some embodiments, the control circuitry 18 may instruct third delta switching device 384 and second delta switching device 382 to open based at least in part on current zero-crossings (e.g., slightly before or at the current zero-crossings) to reduce likelihood and/or magnitude of arcing. Additionally or alternatively, the control circuitry 18 may instruct the third delta switching device 384 to open at any time while the electric motor 24 is running in the delta configuration. For example, in some embodiments, third delta switching device 384 may be opened first and second delta switching device 382 opened subsequently. In other embodiments, both of the switching devices 382 and 384 may be opened simultaneously. After both the switching devices 382 and 384 are opened, the electric power is only connect to the first winding 386 connected in the delta configuration.

After switching devices 382 and 384 are opened, the control circuitry 18 may instruct the second wye switching device 378 to close (process block 434). In some embodiments, the control circuitry 18 may instruct second wye switching device 378 to based at least in part on a predicted current zero-crossing after the wye switching devices are opened. Once second wye switching device 378 is closed, the motor may be running in a mixed wye-delta configuration with first winding 386 in connected in the delta configuration and windings 388 and 390 connected in the wye configuration. As a result, as discussed above, the winding currents may be unbalanced.

Then, control circuitry 18 may instruct the first delta switching device 380 to open (process block 436). In some embodiments, the control circuitry 18 may instruct first delta switching device 380 to open based at least in part on a current zero-crossing (e.g., slightly before or at the current zero-crossing) to reduce magnitude and/or likelihood of arcing. Opening the first delta switching device 380 may remove power from the first winding 386. As such, at this point, windings 388 and 390 may be supplied power in the wye configuration.

Additionally, after first delta switching device 378 is opened, control circuitry 18 may instruct first wye switching device 376 to close (process block 438). In some embodiments, the control circuitry 18 may instruct first wye switching device 376 to close based at least in part on a predicted current zero-crossing. Once the first wye switching device 376 closes, the electric motor 24 may be running in the wye configuration. As a result, the current in windings 386, 388, and 390 may be balanced and the amount of power consumed and torque produced may be reduced.

It should be noted that once the electric motor 24 is running in the wye configuration, the process 428 enables phase sequentially switching back to delta configuration by returning to process block 401. In this manner, the wye-delta starter 374 may transition running the electric motor 24 in either configuration (e.g., wye or delta) as desired (represented by arrows 440).

In the above described embodiments, the five switching device are utilized in the wye-delta starter 374. As such, the above wye-delta starter 374 may be referred to herein as a 5-pole wye-delta starter. However, in other embodiments, it may be possible to increase amount of control over electric power supplied to the electric motor 24 by increasing number of switching devices utilized in the wye-delta starter. For example, in some embodiments, six switching devices may be utilized. Thus, such a wye-delta starter may be referred to herein as a 6-pole wye-delta starter. As will be described in more detail below, a 6-pole wye-delta starter may further extend the life span of the switching devices by enabling the switching devices to take turns when switching.

To help illustrate, a 6-pole wye-delta starter 442 is described in FIGS. 47A-G. To simplify the following discussion, the wye-delta starter 442 is described as using single pole switching devices, such as the single-pole, single current-carrying path switching devices 218 described above. However, any other suitable switching device may additionally or alternatively be used in the techniques described herein. For example, in some embodiments, a multi-pole, multi-current carrying path switching device (e.g., three-pole contactor) with off-set poles may be used.

As with the 5-pole wye-delta starter 374, is defined by the circuit diagrams 442 FIGS. 47A-G. It should be further noted that point-on-wave (POW) techniques may or may not be utilized in the embodiments described below. As described above, when POW techniques are utilized, sensors 22 may monitor (e.g., measure) the characteristics (e.g., voltage or current) of the electric power supplied to the electric motor 24. The characteristics may be communicated to the control and monitoring circuitry 18 to enable determining the timing for making and/or breaking the switching devices at a specific point on the electric power waveform.

As depicted, the 6-pole wye-delta starter 442 includes six switching devices 444, 446, 448, 450, 452, and 454 used to selectively connect three motor windings 456, 458, and 460 to a three-phase power source (e.g., mains lines 462, 464, and 466 each carrying a single phase of power). In some embodiments, the first wye switching device 444, the second wye switching device 446, and the third wye switching device 448 may have the same operational characteristics. Additionally, the first delta switching device 450, the second delta switching device 452, and the third delta switching device 454 may have the same operational characteristics. For example, in some embodiments, the first delta switching device 450, 452, and 454 may be single-pole, single current carrying path switching devices 218 and the wye switching devices 444, 446, and 448 may be power electronic switching devices, such as silicon-controlled rectifiers (SCRs), insulated-gate bipolar transistors (IGBTs), power field-effect transistors (FETs), and/or other bidirectional devices.

In the depicted embodiment, dashed lines are used to indicate non-conducting pathways and solid lines are used to indicate conducting pathways. As such, FIG. 47A describes when each of the switching devices 444, 446, 448, 450, 452, and 454 is open, thereby disconnecting the electric power from the windings 456, 458, and 460. The wye-delta starter 442 may then transition to a wye configuration using a two-step start sequence, as described in FIGS. 47B and 47C. From the wye configuration, the wye-delta starter 442 may then transition to a delta configuration using phase sequential switching, as described in FIGS. 47D-H.

The steps in the phase sequential wye-delta transition using 6-pole wye-delta starter 442 is essentially the same as the 5-pole wye-delta starter 374, which is shown in FIGS. 43A-G. However, the 6-pole wye-delta starter utilizes three wye switching devices (444, 446, and 448), as opposed to two. As such, the order in which the wye switching devices are closed in the wye two-step start and the order in which the wye switching devices are opened in the phase sequential wye-delta switching may change. In particular, regarding the wye two-step start, in order to provide current to the windings using three wye switching devices, one of the steps may close two wye switching devices simultaneously, and the other step may close the third switching device. For example, as depicted in FIG. 47B, the switching devices 446 and 448 may close simultaneously to connect windings 458 and 460 from line 464 to line 466. Subsequently, as depicted in FIG. 47C, the first wye switching device 444 may close, thereby connecting the windings 454, 456, and 458 in the wye configuration.

Once the electric motor 24 is running in wye configuration, the phase sequential switching to delta may initiate. As with the 5-pole wye-delta starter 374, one of the wye switching devices 444 may be opened as shown in FIG. 47D. Next, as shown in FIG. 47E, the first delta switching device 450 may be closed to connect the first winding 456 in the delta configuration. After switching device 450 closes, the motor 24 may be running in a mixed wye-delta configuration with first winding 456 connected in delta and windings 458 and 460 connected in wye. Then, as shown in FIG. 47F, the remaining two closed wye switching devices 446 and 448 may be opened, for example, sequentially or simultaneously. Subsequently, switching devices 452 and 454 may be closed either one after the other, as shown in FIGS. 47F and 47G, or simultaneously.

It should be noted that utilizing three wye switching devices (444, 446, and 448) may enable wear balancing by keeping track of which switching device(s) opened first. In some embodiments, the first switching device that opens may experience a larger amount of wear compared to the subsequently opened switching devices. As such, the switching device that opens first may be rotated during subsequent sequential wye-delta transitions to even out the wear on the switching devices and lengthen the lifespan of the switching devices. In other embodiments, the order that the wye switching devices opens may be determined by statistically by randomizing the order, which may obviate persistent memory.

For example, in the depicted embodiment shown in FIGS. 47D-F, the first wye switching device 444 may be opened first to disconnect electric power from the first winding 456. In certain embodiments, control and monitoring circuitry 18 connected to the wye-delta starter may record that the first wye switching device 444 opened first. Then, the next time phase sequential wye-delta switching is initiated, the control and monitoring circuitry 18 may determine that the first wye switching device 444 opened first previously and, thus, instruct the second wye switching device 446 or the third wye switching device 448 to open first. For example, since switching device 444 opened first previously, the control and monitoring system 18 may instruct the second wye switching to open first in a subsequent wye to delta transition.

Similar wear balancing may be performed when phase sequentially switching from the delta configuration back to the wye configuration. For example, in some embodiments, the first delta switching device 450 may be opened first to disconnect electric power from the first winding 456. In certain embodiments, control and monitoring circuitry 18 connected to the wye-delta starter may record that the first delta switching device 450 opened first. Then, the next time phase sequential wye-delta switching is initiated, the control and monitoring circuitry 18 may determine that the first delta switching device 450 opened first previously and, thus, instruct the second delta switching device 452 or the third delta switching device 454 to open first. For example, since switching device 450 opened first previously, the control and monitoring system 18 may instruct the second delta switching device 452 to open first in a subsequent delta to wye transition.

Figure 48:
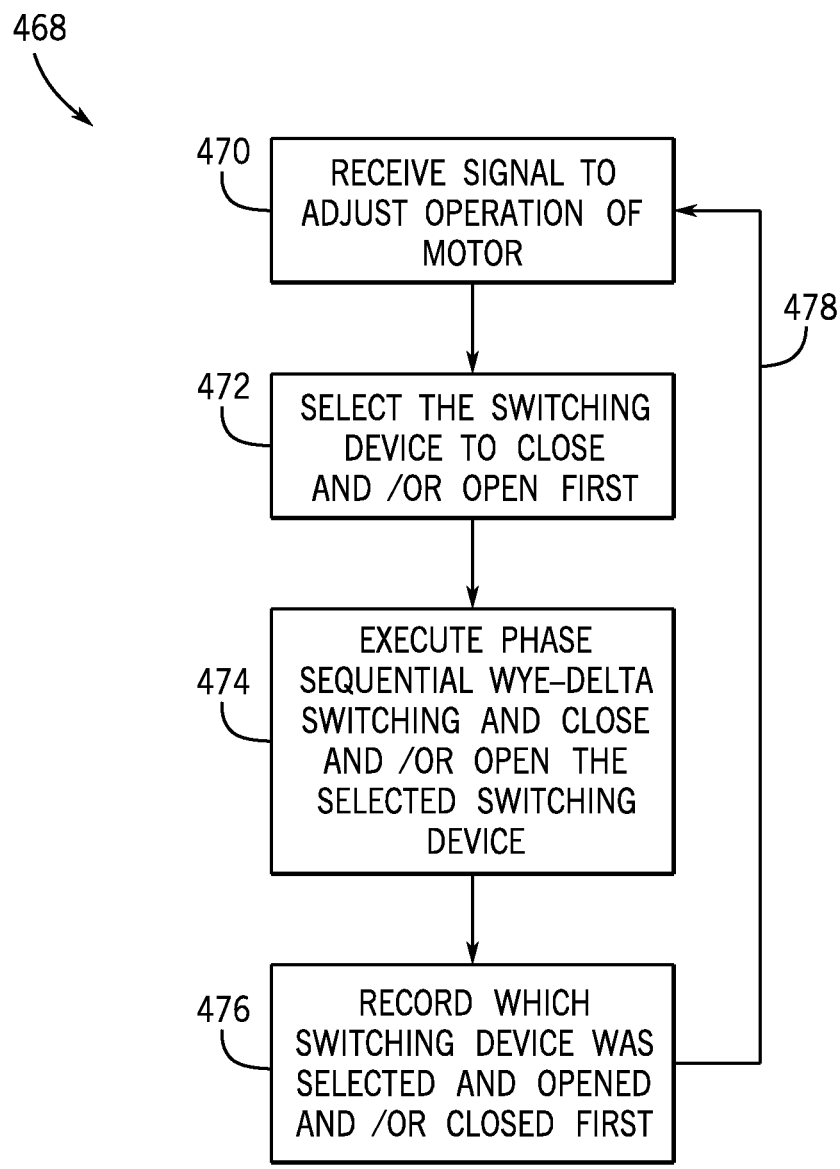
FIG. 48 is a block diagram of logic for wye-delta motor starting over a series of starts, in accordance with an embodiment.

With the foregoing in mind, FIG. 48 depicts an embodiment of a process 468 for wye-delta motor starting over a series of starts. Generally, the process 468 includes receiving a signal to start the motor (process block 470), selecting the switching device to close and/or open first (process block 472), executing phase sequential wye-delta switching and close and/or open the selected switching device (process block 474), and recording which switching device was selected and opened and/or closed first (process block 476). In some embodiments, process 468 may be implemented via computer-readable instructions stored in the tangible, non-transitory memory 226, 20, 46 and/or other memories and executed via processor 224, 19, 45 and/or other control circuitry.

The process 468 may enable wear balancing for various configuration of switching devices performing various switching operations. However, to help illustrate, the process 468 is described in relation to transition from the wye configuration to the delta configuration using the 6-pole wye-delta starter 442. For example, the control and monitoring circuitry 18 may receive a signal to transition from the wye configuration to the delta configuration (process block 470). As described above, the wye delta starter 442 may transition from the wye configuration to the delta configuration by first opening a wye switching device 444, 446, or 448.

Accordingly, the control and monitoring circuitry 18 may select one of the wye switching devices 444, 446, and 448 to open first (process block 472). As described above, the control and monitoring circuitry 18 may select which wye switching device to open first based at least in part on previous open operations. For example, when the first wye switching device 444 was opened first in a previous operating, the control and monitoring system 18 may select the second wye switching device 446 or the third wye switching device 448 to open first. Additionally, if this is the first time switching operating, the control and monitoring circuitry 18 may select one of the wye switching devices 444, 446, or 448 as a default.

The control and monitoring circuitry 18 may instruct the selected wye switching device to open (process block 474). Additionally, the control and monitoring circuitry 18 may instruct the remaining switching devices to open or close to perform the transition from the wye configuration to the delta configuration.

Furthermore, the control and monitoring circuitry 18 may keep a record of the selected wye switching device to facilitate determining which switching device to select in subsequent switching operations (process block 476). In some embodiments, the switching device that opened first may be stored in memory 226, 20, or 46. In this manner, when another signal to transition from the wye configuration to the delta configuration is received, the control and monitoring circuitry 18 may retrieve the switching order used in the previous operation (arrow 478).

Based at least in part on the previous switching order, the control and monitoring circuitry 18 may select a different wye switching device 444, 446, or 448 to open first (process block 472). Subsequently, the control and monitoring circuitry 18 may instruct the selected wye switching device to open (process block 472) and the remaining switching devices to open or close to perform the transition from the wye configuration to the delta configuration.

Figure 49A:
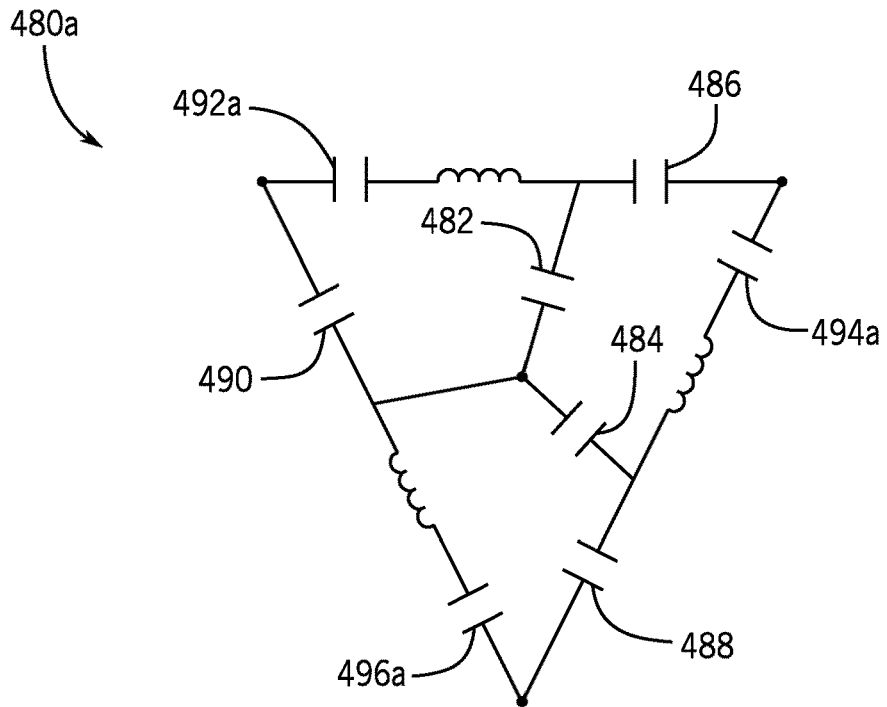
FIGS. 49A-49D are circuit diagrams for 8 and 9 pole wye-delta switching arrangements, in accordance with an embodiment.
Figure 49B:
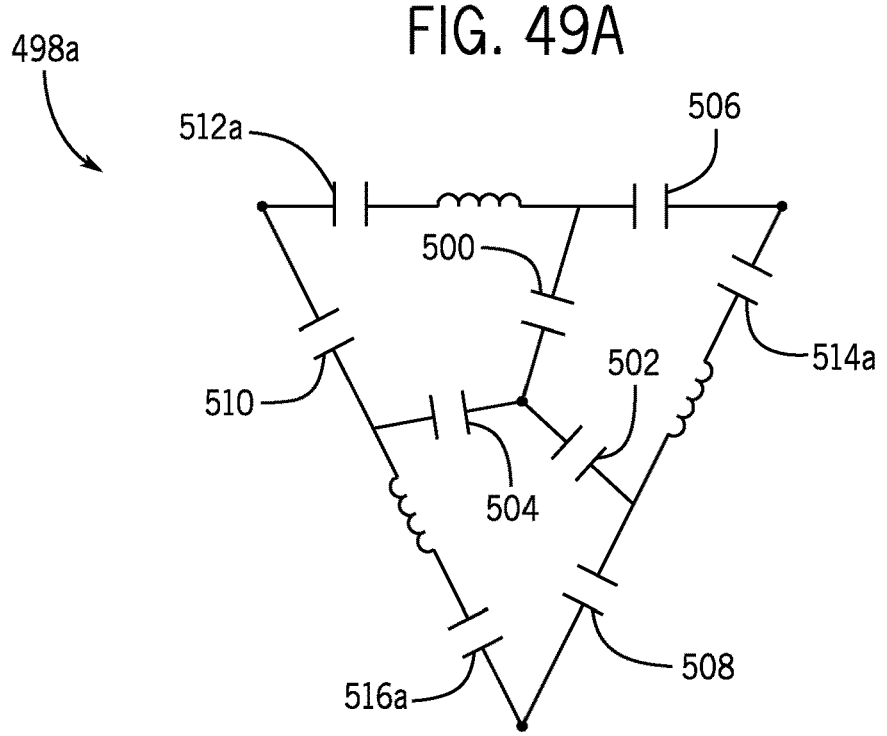

Moreover, the techniques described herein may be extended to other wye-delta configurations. For example, FIGS. 49A and 49B depict circuit diagrams for 8 and 9 pole wye-delta switching arrangements, respectively. In particular, the circuit diagram 480*a* depicted in FIG. 49A includes two wye switching devices 482 and 484 and three delta switching devices 486, 488, and 490, and three mains switching devices 492*a*, 494*a*, and 496*a*. Likewise, the 9-pole wye-delta starter circuit diagram 498*a* depicted in FIG. 49B includes three wye switching devices 500, 502, and 504, the delta switching devices 506, 508, and 510, and three mains switching devices 512*a*, 514*a*, and 516*a*. As shown in the depicted embodiments, the mains switching devices 492*a*, 494*a*, 496*a*, 512*a*, 514*a*, and 516*a* are inside the delta configuration. More specifically, the mains switching devices 492*a*, 494*a*, 496*a*, 512*a*, 514*a*, and 516*a* may be utilized as disconnect switches to isolate the windings from the mains power when desired.

Figure 49D:
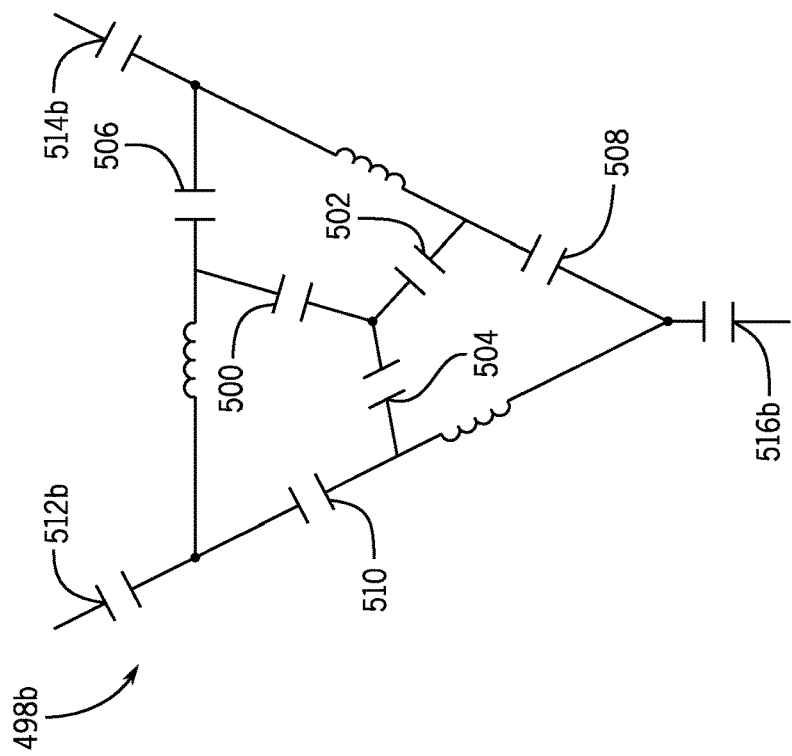
Figure 49C:
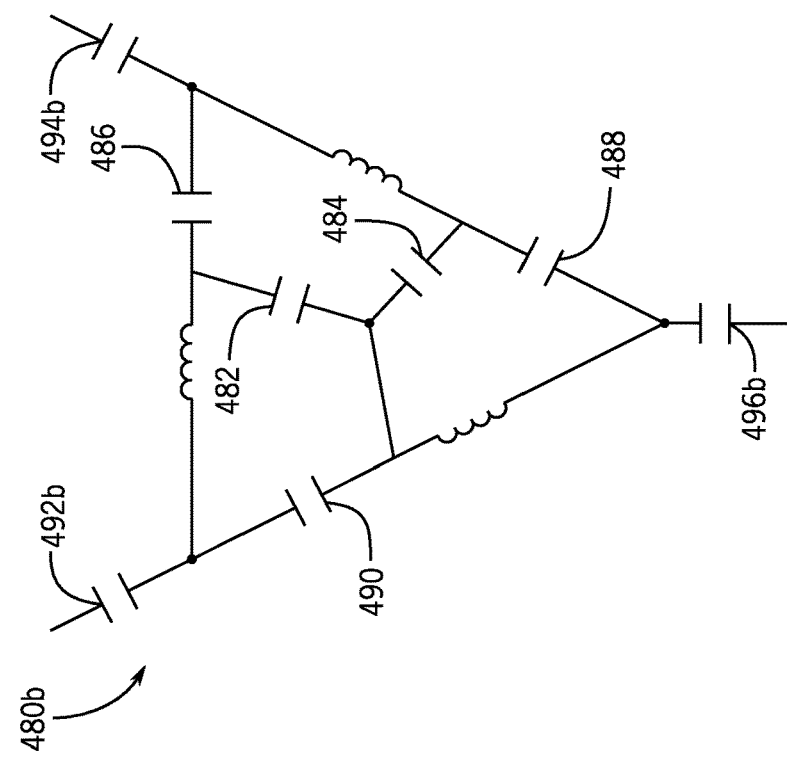

Other embodiments of the 8 and 9 pole wye-delta switching arrangements are shown in FIGS. 49C and 49D, respectively. In particular, the circuit diagram 480*b* depicted in FIG. 49C includes two wye switching devices 482 and 484 and three delta switching devices 486, 488, and 490, and three mains switching devices 492*b*, 494*b*, and 496*b*. Likewise, the 9-pole wye-delta starter circuit diagram 498*b* depicted in FIG. 49D includes three wye switching devices 500, 502, and 504, the delta switching devices 506, 508, and 510, and three mains switching devices 512*b*, 514*b*, and 516*b*. As shown in the depicted embodiments, the mains switching devices 492*b*, 494*b*, 496*a*, 512*b*, 514*b*, and 516*b* are outside the delta configuration. The mains switching devices 492*b*, 494*b*, 496*a*, 512*b*, 514*b*, and 516*b* may be used as disconnect switches to isolate the electric motor 24 from the mains power.

Similar to the 5 and 6 pole wye-delta switching arrangements discussed above, the 8 and 9 pole wye-delta switching arrangements may perform the wye two-step start and the phase sequential wye-delta switching, except that, before running through the openings and closings, the mains switching devices may be closed to provide power to the windings. In addition, the 8 and 9 single-pole switching arrangements may or may not utilize POW techniques to execute the wye two-step start and the phase sequential wye-delta sequencing. Also, the physical layout of the various wye-delta switching arrangements may be highly configurable due to the modularity enabled by utilizing single-pole switching devices, which will be discussed in further detail below.

Motor Torque-Based Phase Sequential Switching

As noted above, a wye-delta starter (e.g., a 5-pole wye-delta starter 374 or a 6-pole wye-delta starter 442) may supply electric power to an electric motor 24 to run the motor 24 in a wye configuration or a delta configuration. In should be noted that a 5-pole wye-delta starter 374 may be a special case of a 6-pole wye-delta starter 442. As such, techniques applicable to a 5-pole wye-delta starter 374 may be easily adaptable to a 6-pole wye-delta starter 44.

In some instances, when the electric motor 24 is run in wye, the electric motor 24 may use less electric power to produce a first (e.g., lower) torque level, and when the electric motor 24 is run in delta, the electric motor 24 may use more electric power to produce a second (e.g., higher) torque level. In other words, supplying electric power to the electric motor 24 using a wye-delta starter 374 enables at least two operating modes (e.g., less power consumption lower torque and more power consumption higher torque).

However, there may be instances when it is desirable to operate the motor 24 somewhere between the two operating modes. For example, it may be desirable to produce more torque than produced when operating in wye, but consume less electric power than consumed when operating in delta. In contrast, it may be desirable to produce less torque than produced when operating in delta, but consume more power than consumed when operating in wye. Thus, the wye-delta starter may sequentially traverse through mixed wye-delta configurations to increase or decrease the torque level and/or power consumption as desired.

Figure 50G:
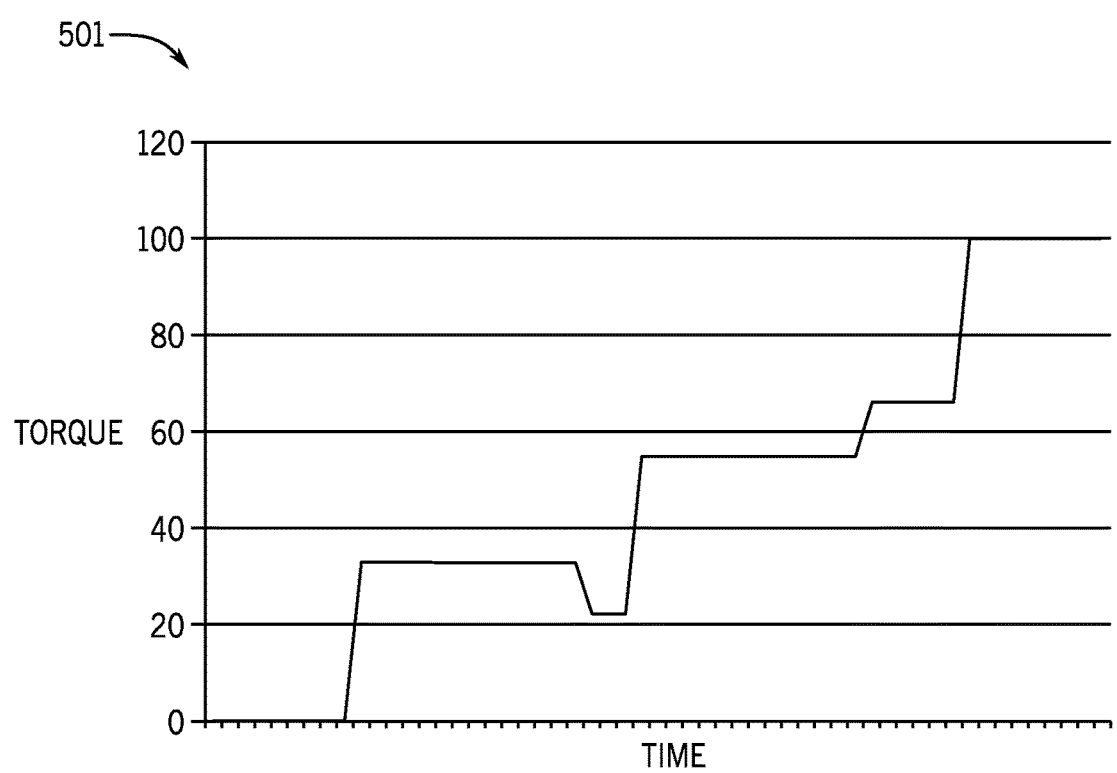
FIG. 50G is a plot of torque produced by an electric motor during phase sequential wye-delta switching, in accordance with an embodiment.

To help illustrate, FIGS. 50A-F describes configurations (e.g., open/close switching devices) of a 5-pole wye-delta starter 374 long with corresponding torque levels produced by the electric motor 24. Turning to FIG. 50A, when the second wye switching device 378 is closed, the wye-delta starter 374 may provide two phases of electric power to the motor windings 388 and 390. However, merely supplying two phases of electric power may be insufficient to rotate the electric motor 24 because the resultant field cannot initiate rotation. As such, the electric motor 24 may produce 0% of the motor's potential maximum torque level (e.g., in the delta configuration) and consume minimal electric power.

As shown in FIG. 50B, when first wye switching device 376 and second wye switching device 378 are closed, the wye-delta starter 374 may provide three-phase power to the motor windings 386, 388, and 390. More specifically, in this configuration, the wye-delta starter 374 may supply electric power to the electric motor 24 in a wye configuration. As such, the motor 24 may produces less than or equal to 33% of the motor's potential maximum torque level (e.g., in the delta configuration). Additionally, in some embodiments, the power consumption of the electric motor 24 may be less than or equal to 33% of the maximum power consumption (e.g., in the delta configuration).

As shown in FIG. 50C, when first wye switching device 376 is opened and second wye switching device 378 remains closed, the wye-delta starter 374 may again provide two phases of electric power to the motor windings 388 and 390 in a wye configuration. However, when the motor 24 has already begun rotating, the two phases of electric power may be sufficient to maintain rotation of the motor 24. As such, in this configuration, the motor 24 may produce less than or equal to 22% of the maximum torque level and power consumption may drop to less than or equal to 22% of maximum power consumption.

As shown in FIG. 50D, when first delta switching device 380 is closed and second wye switching device 378 remains closed, the wye-delta starter 374 may provide three-phase electric power to the motor 24. More specifically, the motor 24 may run in a mixed wye-delta configuration with windings 388 and 390 connected in wye and first winding 386 connected in delta. As a result, the current waveforms may be unbalanced. Nevertheless, in this configuration, the motor 24 may produce torque less than or equal to 55% of the maximum torque level and the power consumption may increases to less than or equal to 55% of the maximum power consumption.

As shown in FIG. 50E, when third delta switching device 384 is closed and switching devices 380 and 378 remain closed, the wye-delta starter 374 may remain providing three-phase electric power to the motor 24. More specifically, the motor 24 may continue running in a mixed wye-delta configuration with first winding 386 connected in delta, second winding 388 connected in wye, and third winding 390 connected in both delta and wye. As such, in this configuration, the motor 24 may produce less than or equal to 66% of the maximum torque level and power consumption may increase to less than or equal to 66% of the maximum power consumption.

As shown in FIG. 50F, when second wye switching device 378 is open, switching devices 380, 382, and 384 remain closed, the wye-delta starter may provide three-phase electric power to the motor 24 in a delta configuration. As such, in this configuration, the motor 24 may produce less than or equal to 100% of the maximum torque level and power consumption may increase to less than or equal to 100% of the maximum power consumption. It should be noted that throughout the phase sequential wye-delta switching steps, the torque is in the same direction (e.g., positive).

Thus, as described above, the wye-delta starter 374 may facilitate reducing strain on the motor 24 and/or a connected load 18 by gradually adjusting torque, particularly when starting up the motor 24. To help illustrate, a plot 518 of torque produced when starting up a motor 24 using sequential switching of a wye-delta starter is described in FIG. 50G. More specifically, a motor torque curve 519 describes torque produced by the motor 24 between t0 and t7. In the depicted embodiment, the wye-delta starter 374 may be disconnected between t0 and t1, in the configuration described in FIG. 50A between t1 and t2, in the configuration described in FIG. 50B between t2 and t3, in the configuration described in FIG. 50C between t3 and t4, in the configuration described in FIG. 50D between t4 and t5, in the configuration described in FIG. 50E between t5 and t6, and in the configuration described in FIG. 50F between t6 and t7.

Thus, as described by the motor torque curve 519, the motor 24 may produce 0% of the motor's potential maximum torque level between t0 and t1 since electric power is not supplied to the windings 386, 388, and 390. The motor 24 may continue producing 0% of the motor's potential maximum torque level between t1 and t2. More specifically, as described above, two phases of electric power are supplied to windings 388 and 390 in a wye configuration. However, the two phases may be insufficient to initiate rotation of the motor 24.

As described by the motor torque curve 519, the motor 24 may begin rotating and producing torque between t2 and t3. More specifically, as described above, in this configuration the windings 386, 388, and 390 may be connected in the wye configuration, thereby enabling the motor 24 to produce less than or equal to 33% of the maximum torque level. In some embodiments, connecting the windings 386, 388, and 390 in wye may be a stable configuration. As such, the wye-delta starter 374 may remain in this configuration for extended durations of time.

Additionally, as described by the motor torque curve 519, the motor 24 may continue rotating but produce a reduced amount of torque between t3 and t4. More specifically, as described above, in this configuration the windings 388 and 390 may remain connected in the wye configuration. However, since the motor 24 is already in rotation, the two phases of electric power supplied to windings 388 and 390 are sufficient to maintain the rotation. In some embodiments, the rotation of the motor 24 may begin to slow when run in this configuration for an extended period. As such, the wye-delta starter 374 may remain in this configuration for a shorter duration.

Furthermore, as described by the motor torque curve 519, the motor 24 increase produced torque between t4 and t5. More specifically, as described above, in this configuration windings 388 and 390 may remain connected in wye and first winding 386 may be connected in delta, thereby enabling the motor 24 to produce less than or equal to 55% of the maximum torque level. In some embodiments, since electric power is supplied to teach of the windings 386, 388, and 390, this mixed wye-delta configuration may be a stable. As such, the wye-delta starter 374 may remain in this configuration for extended durations of time.

As described by the motor torque curve 519, the motor 24 may again increase produced torque between t5 and t6. More specifically, as described above, in this configuration windings 388 may remain connected in wye, first winding 386 may remain connected in delta, and third winding 390 may be connected in both wye and delta, thereby enabling the motor 24 to produce less than or equal to 66% of the maximum torque level. In some embodiments, since electric power is supplied to teach of the windings 386, 388, and 390, this mixed wye-delta configuration may be a stable. As such, the wye-delta starter 374 may remain in this configuration for extended durations of time.

Additionally, as described by the motor torque curve 519, the motor 24 may again increase produced torque between t6 and t7. More specifically, as described above, in this configuration windings 386, 388, and 390 may each be connected delta, thereby enabling the motor 24 to produce less than or equal to 100% of the maximum torque level. In some embodiments, connecting the windings 386, 388, and 390 in delta may be a stable configuration. As such, the wye-delta starter 374 may remain in this configuration for extended durations of time.

Thus, in the above described example, the wye-delta starter 374 may utilize at least four intermediate torque levels to gradually ramp up the motor 24. In fact, a number configurations used to produce the intermediate torque levels may be stable. As such, in addition to merely ramping up the motor 24, the wye-delta starter 374 may operate the motor 24 at multiple torque controlled configurations. For example, when less than or equal to 55% of the maximum torque is desired, the wye-delta starter 374 may close second wye switching device 378 and first delta switching device 380.

As described above, power consumption of the motor 24 may correlate with configuration of the wye-delta starter 374. For example, power consumption may be greater when the connected in a delta configuration than when connected in a wye configuration. As such, when desired torque of the motor 24 capable of being produced by a lower stable configuration, the wye-delta starter 374 may transition to a lower stable state, thereby reducing power consumption.

In other words, the steps described above regarding phase sequential wye-delta switching may be reversed (e.g., transition from delta to an intermediate configuration) in order to reduce the amount of torque produced and power consumed by the motor. That is, by reversing the phase sequential wye-delta steps described, the torque and power consumption may be stepped down. For example, while the motor is running in delta configuration, the second delta switching device 382 may open and the second wye switching device 378 may close. Accordingly, the motor may be running in a mixed wye-delta configuration and the torque may reduce to less than or equal to 66% of the maximum torque level and power consumption may reduce to less than or equal to 66% of the maximum power consumption. Similarly, the wye-delta starter 374 may transition to any of the intermediate configurations (e.g., stable and less stable intermediate configurations) to achieve the desired torque production and power consumption.

Moreover, the stepwise motor torque and power consumption progressive wye-delta phase sequential switching described above provides various benefits to different applications. For example, a water pump may use the disclosed techniques to slowly increase torque when switching from wye to delta, thereby slowly increasing the amount of water delivered to pipes, as opposed to turning the pump on full bore immediately and blasting water through the pipes. This may increase the lifespan of the pipes. In addition, it may be desirable to put certain loads in a power save mode but still keep the motor running. Thus, if the motor 24 is running in delta, it can reverse the sequential steps, as mentioned above, and ramp down the amount of power consumed until a desired amount is reached. As may be appreciated, the techniques disclosed herein enable configuring the amount of torque produced and power consumed by the motor 24 as desired by utilizing single-pole devices (e.g., single-pole, single current-carrying path switching devices 218) in a phase sequentially transition.

As such, the configuration of the motor starter (e.g., which switching devices are open and which switching devices are closed) may be based on a desired output torque level or a desired power consumption. As such, one embodiment of a process 520 for determining configuration of the switching devices in the motor starter based on a desired torque level is shown in FIG. 51A. Generally, process 520 includes selecting a desired torque level (process block 522), determining a configuration of the motor starter based on the desired torque level (process block 524), and setting the configuration (process block 526). In some embodiments, the process 520 may be implemented via computer-readable instructions stored in a non-transitory article of manufacture (e.g., the memory 226, 20, 46 and/or other memories) and executed via processor 224, 19, 45 and/or other control circuitry.

Accordingly, control circuitry 18 may determine the desired torque level to be produced by the motor 24 (process block 522). More specifically, in some embodiments, the desired torque level may be input to the control circuitry 18 by a user. In other embodiments, the desired torque level may be pre-configured in the control circuitry 18. For example, certain loads may be started and the amount of torque produced may be incrementally increased by the control circuitry 18 over a period of time in order to gradually ramp up to 100% torque produced in delta. Alternatively, it may be desirable to reduce the amount of torque a load is producing if it has been running for a certain period of time, and, thus, the control and monitoring circuitry 18 may select a reduced torque level to produce.

In any embodiment, after the desired torque is determined, the control and monitoring circuitry 18 may determine the configuration to apply based upon the desired torque level (process block 524). As described above with reference to FIGS. 50A-F, each step of the phase sequential switching may produce a different amount of torque. For example, when the motor is running in a wye configuration supplying three-phase power to all three windings, less than or equal to 33% torque may be produced (FIG. 50B). When the motor is running in a mixed wye-delta configuration where two windings are in wye and one winding is in delta, less than or equal to 55% torque may be produced (FIG.

50D). Also, when one winding is in delta, one winding is in wye, and one winding is in both wye and delta, less than or equal to 66% torque may be produced (FIG. 50E), and when the motor is running in delta, less than or equal to 100% torque may be produced (FIG. 50F). Thus, the control and monitoring circuitry 18 may select the configuration that achieves the desired torque level.

In alternative embodiments, if the desired torque is not exactly one of the possible options, the control and monitoring circuitry may determine which configuration most closely achieves the desired torque. For example, the control and monitoring circuitry 18 may round the torque up or down based on which available torque values are provided by the different configurations. More specifically, if a user desires the electric motor 24 to produce 40% torque and the two closest available torque options are 33% and 55% torque production, the control and monitoring circuitry 18 may round down to 33% because it is closer to 40% than 55%. As a result, the control and monitoring circuitry 18 may select the wye configuration depicted in FIG. 50B to apply to achieve the torque closest to the desired 40% torque. Additionally or alternatively, the control and monitoring circuitry 18 may round up to 55% torque to ensure that sufficient torque is provided.

In further embodiments, the control and monitoring circuitry 18 may periodically alternate between any two torque states to achieve the desired (e.g., intermediate) torque level. More specifically, the duration at each of the two torque states may adjust the resulting torque level. For example, to produce a torque level of 60.5%, the control and monitoring circuitry 18 may operate the wye-delta starter 374 in a first mixed wye-delta configuration that produces 55% torque with a 50% duty cycle and a second mixed wye-delta configuration that produce 66% torque with a 50% duty cycle. In this manner, various intermediate torque levels may be produced, which may be particularly useful for high inertia loads like long conveyer lines and long sections of pipe (e.g., a water hammer).

Once the configuration is determined, the control and monitoring circuitry 18 may set the selected configuration by instructing the switching devices to open or close to implement the determined configuration (process block 526). It should be noted that in some embodiments, determined configuration may be implemented with POW techniques. As described above, utilizing POW techniques may prolong the life span of the switching devices.

It should be further noted that, in some embodiments, the switching devices may be opened or closed in accordance with the phase sequential wye-delta switching. In other words, the control unit 18 may determine the state (e.g., open or closed) of each of the switching device and sequentially instruct each of the switching devices to open, close, or maintain its current state. To help illustrate, if 55% torque level is selected and the motor is started, the control and monitoring circuitry 18 may sequentially open and close the switching device, in accordance with the phase sequential switching, to set the motor in the mixed wye-delta configuration that achieves 55% torque level. Likewise, if the motor is running in delta (e.g., 100% torque) and a lower torque is selected, the control and monitoring circuitry 18 may determine and set a different configuration by reverse the steps in the phase sequential wye-delta switching. Additionally or alternatively, once the configuration is determined, the control circuitry 18 may instruct the switching devices to implement the configuration in any order, for example, simultaneously.

Similarly, one embodiment of a process 530 for determining configuration of the switching devices in the motor starter based on a desired power consumption is shown in FIG. 51B. Generally, process 530 includes selecting a desired power consumption (process block 532), determining a configuration of the motor starter based on the desired power consumption (process block 534), and setting the configuration (process block 536). In some embodiments, the process 530 may be implemented via computer-readable instructions stored in a non-transitory article of manufacture (e.g., the memory 226, 20, 46 and/or other memories) and executed via processor 224, 19, 45 and/or other control circuitry.

As can be appreciated, process 530 includes many of the same processing steps as process 520. Specifically, the control circuitry 18 may determine a desired power consumption (process block 532). In some embodiments, the control and monitoring circuitry 18 may select the power consumption level based upon the type of load, pre-configured power modes (e.g., power save mode), power consumption schedules, and so forth. For example, the control circuitry 18 may determine amount of power consumption based on the amount of power available. In other words, if the control and monitoring circuitry 18 determine that a high amount of power is available, the control and monitoring circuitry 18 may determine that the maximum power consumption may be utilized. On the other hand, if the control and monitoring circuitry 18 determine that a low amount of power is available, the control and monitoring circuitry 18 may determine that a power consumption less than the maximum should be utilized.

As described with reference to FIGS. 50A-F, each varying configuration in the wye-delta starter may result in different power consumptions. Thus, the control and monitoring circuitry 18 may determine the motor configuration based upon the desired power consumption level (process block 534). That is, the control and monitoring circuit 18 may select the configuration (e.g., wye, mixed wye-delta, delta, etc.) that consumes the desired amount of power. The control and monitoring circuitry 18 may then instruct the switching devices to implement the determined configuration.

Based on the above, the described techniques enables running a wye-delta motor starter with varying torque levels and varying power consumptions simply by opening and closing switching devices in the motor starter.

Operator-Initiated Point-on-Wave Switching

As used in the various operations described herein, switching device 218 may be used to selectively connect and/or disconnect electric power from a load 14. For example, in a close operation, switching devices 218 may be used to connect three-phase electric power to an electric motor 24 in a manner that reduces electric arcing. More specifically, as described above, two phases may be connected at a first time in coordination with a predicted current zero-crossing and the third phase may be connected based upon a subsequent predicted current zero-crossing. In other words, the switching device 218 may close at specific points on the electric power waveform.

In some embodiments, the various operations may be initiated by an operator. For example, an operator may instruct the switchgear 16 to connect electric power to the load 14 via a human-machine interface on the control and monitoring circuitry 18. Accordingly, the operator instruction may be received at any suitable time during operation via the network 21. In other words, different operator instructions may be received independent of the electric power to be connected or disconnected from the load. Thus, to perform the operator initiated operation at specific points on the electric power waveform, the control and monitoring circuitry 18 may take into account the unpredictable nature of when an operator instruction is received.

Figure 52:
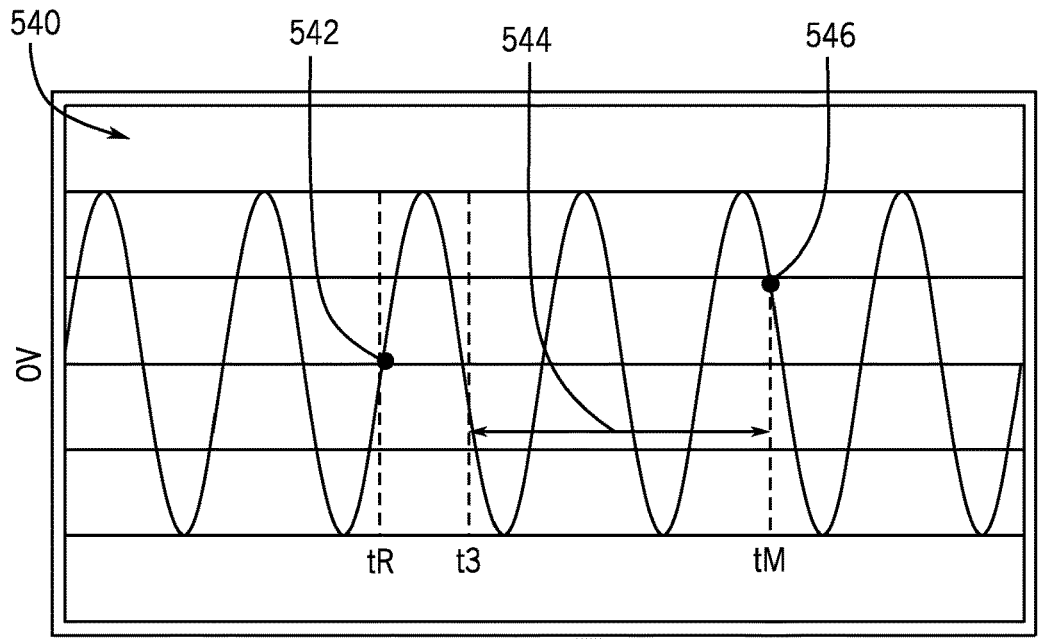
FIG. 52 is a voltage or current waveform illustrating timing considerations for POW switching based upon an operator-received initiation command, in accordance with an embodiment.

To help illustrate, FIG. 52 depicts a source voltage waveform 540 of one phase of electric power supplied by the power source 12 during an operator-initiated make operation. As described above, an operator instruction to make may be received independent from the source voltage 540. In other words, in the depicted embodiment, the operator instruction may be received at some time before tR. To account for the unpredictable timing of receiving the operator instruction, a reference point 542 in the future may be selected. In the depicted embodiment, the reference point 542 corresponds to a voltage zero-crossing (e.g., a predicted current zero-crossing) at tR. In other embodiments, any suitable reference point may be used.

From the reference point 542, the close operation may be performed. More specifically, as described above, the processor 224 may determine the expected make time 544 of the switching device 218. The processor 224 may determine a specific point 546 that is at least the expected make time later than the reference point 542 to enable the switching device 218 to close at the specific point 546. Additionally, the processor 224 may determine when to apply the current profile (e.g., pull-in current) to the operating coil 220 to make at the desired point 546 and instruct the operating current to apply the current profile at the determined time.

Figure 53:
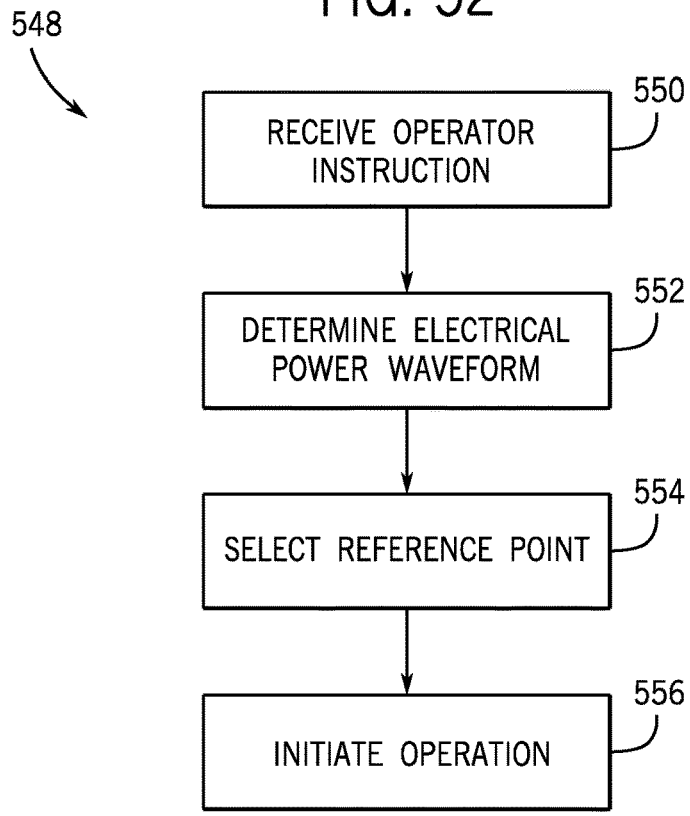
FIG. 53 is a block diagram of logic for operator-initiated POW switching, such as for starting a polyphase motor, in accordance with an embodiment.

More generally, a process 548 for performing an operator-initiated operation is shown in FIG. 53. The process 548 may be implemented via computer-readable instructions stored in the tangible non-transitory memory 226, 20, 46 and/or other memories and executed via processor 224, 19, 45 and/or other control circuitry. Generally, the process 548 includes receiving an operator instruction (process block 550), determining the electric power waveform (process block 552), selecting a reference point (process block 554), and initiating the operation (process block 556).

In some embodiments, the control and monitoring circuitry 18 may receive the operator instruction via a human-machine interface, such as a keyboard or a push button, at any suitable time during operation (process block 550). More specifically, the operator instruction may contain an instruction to perform a specific operation. For example, the operator may instruct the wye-delta starter 374 to transition from wye to delta. Accordingly, the control and monitoring circuitry 18 may determine what operation to perform based on the operator instruction.

Additionally, as described above, the operation may be carried out by making and/or breaking switching devices 218 at specific points on the electric power waveform. Accordingly, the control and monitoring circuitry 18 may determine the electric power waveforms based on sensor measurement feedback (process block 552). More specifically, the control and monitoring circuitry 18 may determine particular electric power waveforms based on the operation that will be performed. For example, when the operation is a make operation, the control and monitoring circuitry 18 may determine the source voltage waveform. Additionally, when the operation is a break operation, the control and monitoring circuitry 18 may determine the current voltage waveform.

It should be noted that although the depicted embodiment depicts that the electric power waveform is determined in response to the operator instruction, additionally or alternatively, the control and monitoring circuitry 18 may continuously determine the electric power waveforms. In other words, the electric power waveforms may be determined regardless of whether an operator instruction is received. For example, the control and monitoring circuitry 18 may determine the source voltage waveform and the source current waveform throughout operation. In some embodiments, continuously determining the electric power waveforms may enable diagnostics on the source 12, the switching device 218, the load 14, or any combination thereof.

On the electric power waveform, the control and monitoring circuitry 18 may then select a reference point 542 in the future (process block 554). As described above, the reference point may be used to account for the unpredictable timing of the operator instruction. Accordingly, in some embodiments, the reference point 542 may be selected based on repeatable criteria to enable the operation to be initiated from a predictable starting point. For example, the reference point 542 may be selected from the future voltage zero-crossings on the electric power waveform.

From the reference point, the control and monitoring circuitry 18 may initiate the operation (process block 556). More specifically, the control and monitoring circuitry 18 may determine which switching device 218, and more specifically which operating coil driver circuitry 222, will be used to carry out the operation. Additionally, the control and monitoring circuitry 18 may determine the desired make times and/or desired break times for each switching device 218. As described above, the desired make times and desired break times may be specific points on the electric power waveform. In other words, the control and monitoring circuitry 18 may coordinate the switching of the various switching device 218 at specific points on a wave to perform the operation. As described herein, examples of the operation may include closing switching devices 218, opening switching devices 218, transitioning from wye to delta, transitioning from delta to wye, setting a specific torque or power level, reversing an electric motor 24, or bypassing a load, such as a motor drive.

It should be noted that there are certain asymmetrical edge conditions that may be taken into consideration when attempting to break ahead of a current zero-cross and/or when setting the electrical degree separations of making and breaking the switching devices. For example, if the selected reference point or amount of electrical degrees actually causes an opening to occur after a current zero-crossing there may be penalizing consequences. In fact, missing a current zero-crossing mark when breaking may increase arcing because a half line cycle of increasing current is applied during the opening in the switching device and the stronger arc may prevent the switching device from opening. Thus, it may be desirable to miss the mark short of the current zero-crossing and open when the current is going downward on a half cycle to the current zero-cross, as opposed to missing the mark after the current zero-crossing.

Additionally or alternatively, the control and monitoring circuitry 18 may determine whether to perform process 548 based on the importance of the operator instruction. For example, although the switching device 218 may break at specific points on a wave to reduce electric arcing, it may be desirable to remove electric power from the load 14 as soon as possible. In other words, the control and monitoring circuitry 18 may determine the importance of the operator instruction and weigh the importance against the consequences of performing the operation at any point on the wave.

Synchronous Re-Closure

As described above, one or more switching devices 218 may be used to connect and/or disconnect electric power from an electric motor 24. For example, electric power may be connected to rotate the electric motor 24. Once the electric motor 24 is spinning, electric power may be disconnected from the electric motor 24 for various reasons. Even though electric power is removed, the momentum of the electric motor 24 and any load actuated by the motor (e.g., a fan 47, a conveyer belt 48, or a pump 50) may keep rotating the electric motor 24 while friction begins to slow the electric motor 24. As the electric motor 24 continues to rotate, a back electromotive force (EMF) is generated. In other words, the electric motor 24 acts as a generator to produce a voltage (e.g., back EMF) with a changing frequency.

To restart the electric motor 24, electric power may be reconnected to the electric motor 24. In some embodiments, it may be desirable to restart the electric motor 24 as soon as possible. For example, if an electric motor 24 in a chiller 54 completely stops, the gas and liquid refrigerant in the chiller 54 may become displaced. Thus, to restart the electric motor 24 may take an inconvenient period of time. Accordingly, electric power may be reconnected while the electric motor 24 is still rotating. As described above, the electric motor 24 generates a back EMF with a changing frequency commensurate with it rotational frequency while it is rotating. However, since the frequency is changing, the back EMF and the electric power to be reconnected to electric motor 24 may be out of phase. In some embodiments, when electric power is reconnected while the electric power is lagging behind the back EMF, negative torque may be generated in the electric motor 24, which may decrease the lifespan of the motor and/or a connected load or result in surge currents that trip protection circuitry.

Accordingly, one embodiment of the present disclosure describes a method for synchronously re-closing (i.e., reconnecting) electric power to an electric motor 24. More specifically, the method includes starting a counter when either the source electric power or the back EMF crosses zero volts (i.e., voltage zero-crossings) and stopping the counter at the next subsequent voltage zero-crossing. Additionally, the method includes monitoring the counter value trend to determine whether the source electric power or the back EMF is leading. Furthermore, the method includes reconnecting the source electric power while it is leading the back EMF based at least in part on the counter value trend. More specifically, the source electric power may be reconnected at or after a local minimum in the counter value trend. In other words, the local minimum in the counter value trend may indicate when the source electric power switches from lagging to leading the back EMF. Thus, reconnecting at or after a local minimum facilitates reconnecting the source electric power when it is leading the back EMF, which reduces the chances of producing negative torque when re-closing. Additionally, it may be beneficial to begin using the counter to monitor voltage zero-crossings as soon as the electric motor is disconnected to reduce the likelihood of the electric power and the EMF from being 180° out of phase when re-closing.

Figure 54:
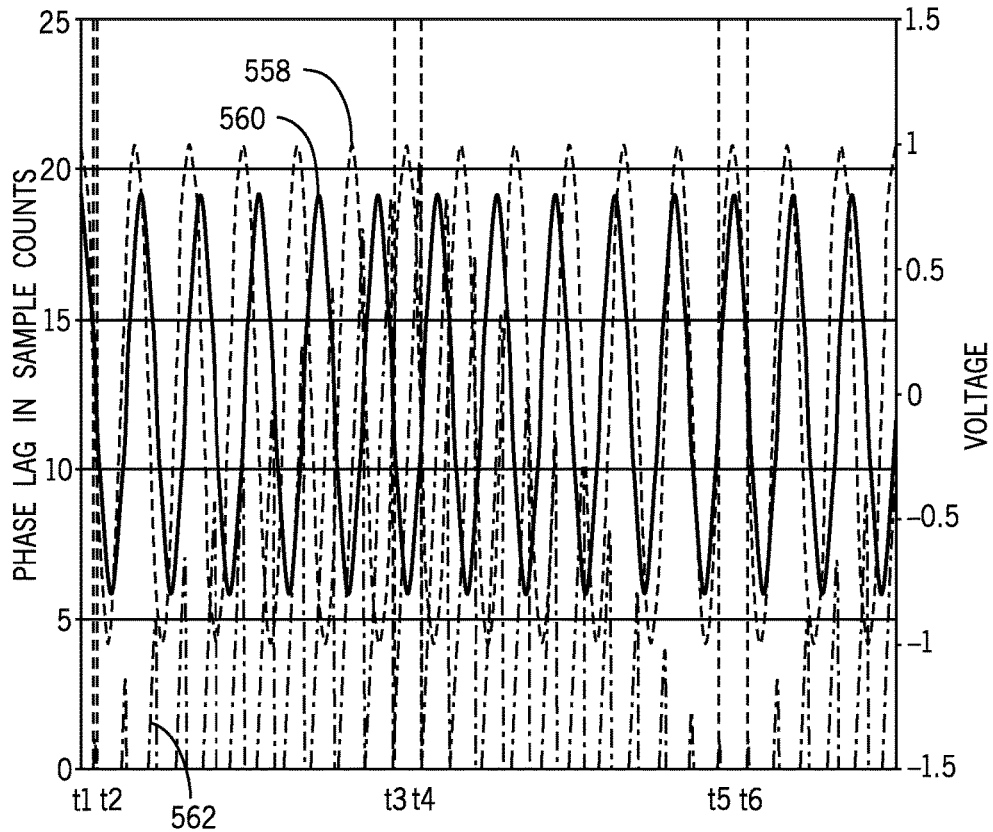
FIG. 54 is a waveform for a motor drive signal and a motor back EMF signal illustrating timing of the signals during deceleration (or acceleration) of the motor for re-applying drive signals, in accordance with an embodiment.

To help illustrate, FIG. 54 is a plot that depicts the source electric power voltage waveform 558 and the back EMF voltage waveform 560 for one phase. As can be appreciated, the waveforms for the other two phases of three-phase electric power will be offset by 120 degrees. In some embodiments, the waveforms may be determined based on measurements gathered by sensors 22 that monitor voltage at the power source 12 and sensors 22 that monitor voltage at the electric motor 24. Additionally, FIG. 54 depicts the counter value 562.

As depicted, the source voltage 558 and the back EMF voltage 560 have different frequencies. Thus, over time, the source voltage 558 and the back EMF voltage 560 will drift into and out of phase from one another. For example, at t1, the source voltage 558 is leading the back EMF voltage 560. As the phases drift past each other, at t4, the source voltage 558 transitions from leading to lagging behind the back EMF voltage 560. As used herein, "leading" is generally intended to describe when one waveform is between 0 to 180 degrees ahead of a subsequent waveform, and "lagging" is generally intended to describe when one waveform is between 0 to 180 degrees behind a preceding waveform.

Thus, to facilitate reconnecting the source electric power when the source voltage 558 is leading the back EMF voltage 560, the control and monitoring circuitry 18 (e.g., processor 224) may determine when the source voltage 558 transitions from lagging to leading. In some embodiments, the control and monitoring circuitry 18 may utilize a counter, such as a free running counter (FRC) included in the processor 224, to facilitate keeping track of the transitions.

More specifically, the counter may be started at either a source voltage 558 zero-crossing or a back EMF voltage 560 zero-crossing. The counter may continue counting until a subsequent voltage zero-crossing is reached. For example, the source voltage 558 zero-crossing at t1 starts the counter. As the counter runs, the counter value 562 continues to increase. The counter stops at the next subsequent voltage zero-crossing, which is the back EMF voltage 560 zero crossing at t2. After t2, the counter value 562 is reset. Thus, the counter value 562 may be used to indicate the time difference between adjacent voltage zero-crossings. In other words, the counter value 562 at t2 indicates the lead the source voltage 558 has over the back EMF voltage 560 (e.g., time difference between t1 and t2). Since the frequency of the source voltage 558 is higher than the back EMF voltage 560, the source voltage's lead over the back EMF voltage 560 continues to increase. Accordingly, as depicted, the trend of the counter value 562 is increasing when the source voltage 558 is leading.

It is noted that the counter may stop at any subsequent voltage zero-crossing. For example, the source voltage 558 zero-crossing at t3 starts the counter and the counter value 562 increases until the subsequent source voltage 558 zero-crossing at t4. In other words, the counter is started and stopped by the same voltage waveform. Thus, the counter value 562 at t4 is at a maximum and corresponds with half the period of the source voltage 558 (e.g., 180 degrees). In other words, the source voltage 558 is ahead of the back EMF voltage 560 by more than 180 degrees. Thus, based on the definitions above, the source voltage 558 has transitioned to lagging behind the back EMF voltage 560. In other words, a local maximum of the counter value 562 trend indicates the transition of the source voltage 558 from leading to lagging behind the back EMF voltage 560.

Accordingly, after t4, the source voltage 558 is lagging behind the back EMF voltage 560. As described above, the frequency of the source voltage 558 is higher than the back EMF voltage 560. In other words, the source voltage 558 lag behind the back EMF voltage 560 continues to decrease. Accordingly, as depicted, the trend of the counter value 562 is decreasing when the source voltage 558 is lagging.

As the amount of lag continues to decrease, the source voltage 558 eventually overtakes the back EMF voltage 560 and transitions to leading the back EMF voltage 560. Similar to the transition from leading to lagging, the transition from lagging to leading may be based on the counter value 562 trend. For example, minimum amount of lag occurs at t5.

Accordingly, as depicted, a first minimum counter value 562 occurs at t5. Thus, the source voltage 558 will shortly thereafter transition to leading the back EMF voltage 560. Additionally, as depicted, a second minimum counter value 562 occurs at t6 because the source voltage 558 has transitioned to slightly leading the back EMF voltage 560. In other words, a local minimum of the counter value 562 trend indicates the transition of the source voltage 558 from lagging to leading the back EMF voltage 560.

Figure 55:
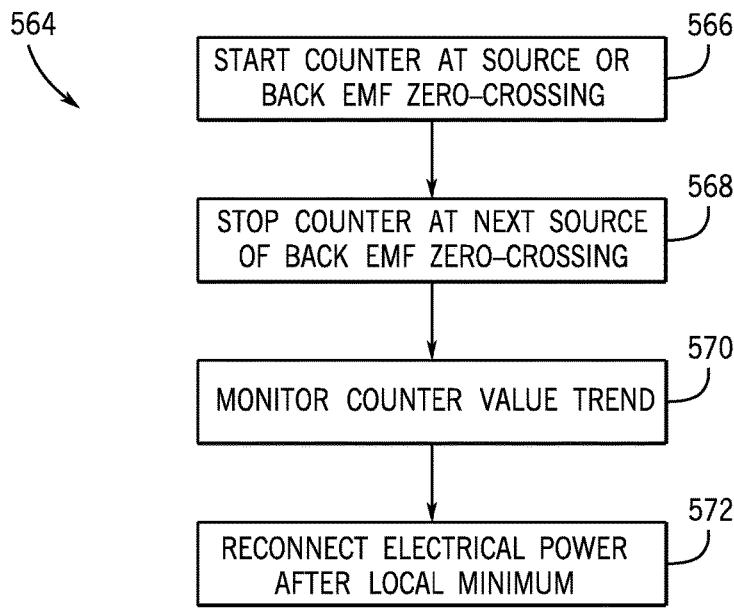
FIG. 55 is a block diagram of logic for synchronously reclosing a switching circuit for re-applying drive signals to a motor, in accordance with an embodiment.

Accordingly, the electric power may be reconnected to the electric motor 24 when the source voltage 558 is leading the back EMF voltage 560 based at least in part on the counter value 562. One embodiment of a process 564 for reconnecting electric power to the electric motor 24 is shown in FIG. 55. Generally, the process 564 includes starting a counter at a source voltage zero-crossing or a back EMF voltage zero-crossing (process block 566), stopping the counter at the next source voltage zero-crossing or back EMF voltage zero-crossing (process block 568), monitoring the counter value trend (process block 570), and reconnecting electric power after a local minimum in the counter value trend (process block 572).

In some embodiments, the processor 224 included in the operating coil driver circuitry 222 may be used to execute the process 564. As described above, the counter used may be included in the processor 224. Accordingly, the processor 224 may start the counter when it detects a source voltage 558 zero-crossing or a back EMF voltage 560 zero-crossing (process block 566). Additionally, the processor 224 may stop the counter when it detects a next subsequent source voltage 558 zero-crossing or a back EMF voltage 560 zero-crossing (process block 568). To facilitate detecting the voltage zero-crossings, sensors 22 that monitor voltage at the power source 12 and/or the electric motor 24 may feedback measurements to enable the processor 224 to determine the source voltage 558 and the back EMF voltage 560.

Additionally the processor 224 may monitor the trend of the counter value 562 (process block 570). More specifically, the processor 224 may store the counter value 562 each time the counter stops, for example in memory 226. Additionally, the processor 224 may store a time corresponding with when each counter value 562 was stopped. Thus, the processor 224 may determine the trend of the counter value 562 by looking at the previously stored counter values 562. For example, in chronological order, a first counter value, a second counter value, and a third counter value may be stored. Thus, when the second counter value is less than the first counter value and the third counter value, the processor 224 may determine that a local minimum occurs at the time corresponding with the second counter value. On the other hand, when the second counter value is higher than the first counter value and the third counter value, the processor 224 may determine that a local maximum occurs at the time corresponding with the second counter value.

Based on the counter value 562 trend, electric power may be reconnected after a local minimum (process block 572). As discussed above, the processor 224 may determine when a local minimum occurs. Accordingly, once the local minimum is detected, the processor 224 may reconnect electric power to the electric motor 24. In some embodiments, the processor 224 may instruct the operating coil driver circuitry 222 to re-close the switching device 218, which may include setting the operating coil current 250 to the pull-in current. More specifically, once it is determined that the source voltage 558 is leading, the processor 224 may execute process 258 to re-close the switching device 218 at a desired time to make, for example, based upon a predicted current zero-crossing, as described above. Additionally or alternatively, other means for reconnecting the electric power may be used, such as insulated-gate bipolar transistors.

As described above, when the trend of the counter values 562 is increasing, the source voltage 558 is leading the back EMF voltage 560. Thus, if the switching device 218 is closed between t1 to t4, electric power will be reconnected while the source voltage 558 is leading the back EMF voltage 560. However, the amount the source voltage 558 leads the back EMF voltage 560 may affect the increase in positive torque generated in the electric motor 24 when electric power is reconnected. Accordingly, to limit the positive torque produced, a threshold counter value may be used. For example, if trend is increasing (e.g., after a local minimum) and the counter value 562 is less than the threshold value, the switching device 218 may be closed. On the other hand, if counter value 562 is greater than the threshold value, the switching device 218 may wait for a subsequent local minimum to close.

Additionally, as discussed in previous sections, the make operation of the switching device 218 is generally not instantaneous. In other words, the source voltage 558 may be leading the back EMF voltage 560 by a larger amount than when the local minimum was detected. In most embodiments, the amount of torque generated when the source voltage 558 leads the back EMF voltage 560 by between 0-90 degrees will not negatively affect the electric motor 24. Accordingly, the threshold counter value may be reduced to account for the delay.

Nevertheless, in some embodiments, the processor 224 may predict when a local minimum in the counter value 562 will occur. More specifically, the processor 224 may predict the next local minimum based on the load actuated by the electric motor 24. For example, when the electric motor 24 is actuating a pump 50, the electric motor 24 may slow according to a square log curve. Thus, the processor 224 may determine how the frequency of the back EMF voltage 560 generated by the motor will change, which then may be used to predict when the next local minimum will occur.

In fact, in some embodiments, the processor 224 may determine the type of load the electric motor 24 is actuating based at least in part on where the local minimums occur. For example, when the occurrence of the local minimums quickly decreases, the processor 224 may determine that the frequency of the back EMF voltage 560 is quickly decreasing. As such, the processor 224 may determine the relative magnitude of the inertia of a load.

As can be appreciated, the techniques described above may be utilized for reconnecting multiple phases of electric power. For example, process 564 may be executed with regard to each phase independently. Additionally or alternatively, since each phase of the source voltage 558 and the back EMF voltage 560 will be proportionally offset (e.g., by 120 degrees) from one another, the counter may be utilized on a single phase. More specifically, when the processor 224 determines that one phase of the source voltage 558 is leading the back EMF voltage 560, the other phases of the source voltage 558 will also be leading. Thus, in some embodiments, each phase may be connected substantially simultaneously. Accordingly, this may be useful in an open non-sequential wye-delta starter. For example, after the wye connections open, the electric motor 24 will continue rotating. To close the delta connections, the processor 224 may determine when the source voltage 558 is leading the back EMF voltage 560 by examining a single phase.

Switch-Based Detection of Motor Conditions

Utilizing the single-pole switching devices (e.g., single-pole, single current-carrying path switching devices 218 described above) may enable increasing the amount of control over the electric power supplied to the electric motor 24. For example, the single-pole switching devices may enable independently controlling each phase of supplied three-phase power, which may enable detection of faults (e.g., a phase-to-ground short or a phase-to-phase short) while minimizing duration of the faulty condition and amount of energy present during the faulty condition. As will be described in detail herein, in some embodiments, faults (e.g., a short circuit) may be detected by applying a very brief, low voltage pulse (e.g., lower than the line voltage) to the motor 24 at a point on the sinusoidal waveform coordinated with a voltage zero-crossing. The pulse may be applied for a minimal time sufficient for fault detection. Thus, if a short circuit exists, the energy remains relatively small due to the low voltage and short duration. As a result, the fault may be cleared without tripping any connected circuit breakers, and be detrimental to the electric motor 24 and its windings may be reduced.

Examples of faulty motor conditions that may be detected using the disclosed techniques include a phase-to-ground short, a phase-to-phase short, and a phase-to-phase open circuit, among others. A phase-to-ground short may occur when the insulation to ground has deteriorated and current flows into the ground, for example, in a winding of a motor. A phase-to-phase short may occur when phases come into contact without any load or resistance, such as when wires have been connected improperly (e.g., two phases wired together), an external object has been laid across the wires, two motor windings are shorted, and so forth. Additionally, a phase-to-phase open circuit may occur when windings in a motor are disconnected or otherwise open circuited.

To determine whether such faults exist, a technique referred to as "sniffing," herein, may be employed. Generally, as will be described in more detail below, sniffing may be defined as momentarily connecting a phase of electrical power to test for a phase-to-ground short and/or momentarily connecting two phases of electrical power to test for phase-to-phase faults. Depending on the load being started, these techniques may be performed before each start or may be performed intermittently over a plurality of starts or during commissioning of a new or revised installation.

The benefits of using the techniques before starting may extend the lifespan of a load (e.g., electric motor 24) by supply power to the load advantageous for protection circuitry to handle potential fault currents. In fact, in some embodiments, different trip behavior may be used during the sniffing process. For example, the protection circuitry may use a higher protection scheme (e.g., more sensitive) when sniffing and return to a normal protection scheme thereafter. In this manner, any results of a possible fault detection during sniffing may be more effectively mitigated by the protection circuitry.

Figure 56A:
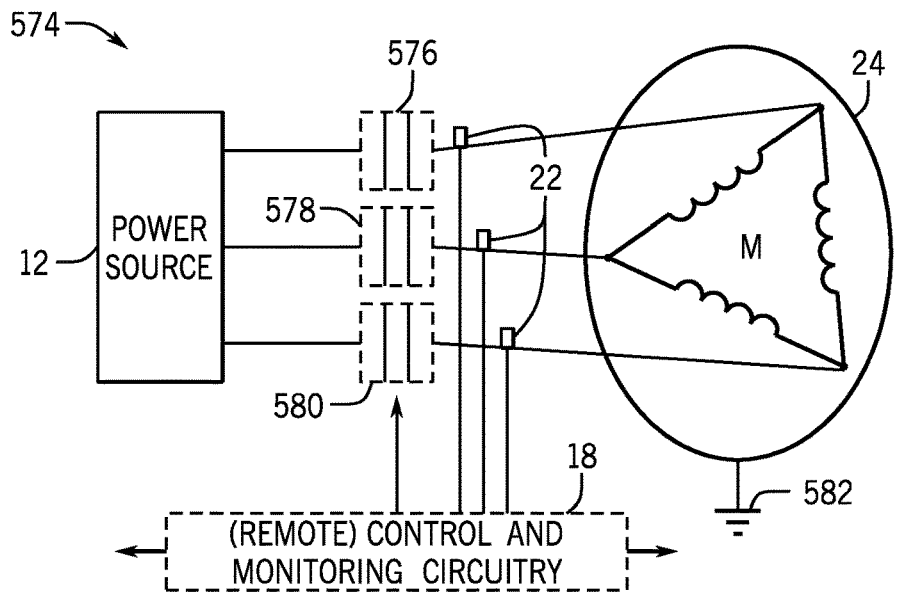
FIGS. 56A and 56B is a diagrammatical representation of circuitry for detecting motor conditions utilizing single-pole switching devices and a corresponding timing diagram, respectively, in accordance with an embodiment.

With the foregoing in mind, FIG. 56A is a diagrammatical representation of circuitry for detecting motor conditions utilizing single-pole switching devices and a corresponding timing diagram, respectively. Although single-pole, single current-carrying path switching devices are described, any other type of switching device, such as a three-phase offset pole switching device, may be used.

As depicted in the motor system 574, a power source 12 provides three-phase electric power to an electric motor 24 via three single-pole switching devices (576, 578, and 580), one for each phase. It should be noted that the single-pole switching devices may include the single-pole, single current path switching devices described above (e.g., contactors, relays, etc.). Additionally or alternatively, single-pole, multiple current-carrying path switching devices may be used. Each phase may be connected to a separate winding on the motor 24 via separate motor terminal. Further, the electric motor 24 may be connected to the ground 582.

In some embodiments, the operation (e.g., opening or closing) of the single-pole switching devices may be controlled by control and monitoring circuitry 18. In other words, the control and monitoring circuitry 18 may instruct the single-pole switching devices (576, 578, and 580) to connect or disconnect electric power. Additionally, as depicted, the control and monitoring circuitry 18 may be remote from the single-pole switching devices (576, 578, and 580). In other words, the control and monitoring circuitry 18 may be communicatively coupled to the single-pole switching devices (576, 578, and 580) via a network 21. In some embodiments, the network 21 may utilize various communication protocols such as DeviceNet, Profibus, or Ethernet. The network 21 may also communicatively couple the control and monitoring circuitry 18 to other parts of the system 574, such as other control circuitry or a human-machine-interface (not depicted). Additionally or alternatively, the control and monitoring circuitry 18 may be included in the single-pole switching devices (576, 578, and 580) or directly coupled to the single-pole switching devices, for example, via a serial cable.

Furthermore, as depicted, the electric power output from the single-pole switching devices (576, 578, and 580) may be monitored by sensors 22. More specifically, the sensors 22 may monitor (e.g., measure) the characteristics (e.g., voltage or current) of the electric power. Accordingly, the sensors 22 may include voltage sensors and current sensors. Additionally, the characteristics of the electric power measured by the sensors 22 may be communicated to the control and monitoring circuitry 18 to generate waveforms (e.g., voltage waveforms or current waveforms) that depict the electric power. The waveforms generated based on the sensors 22 monitoring the electric power output from the single-pole switching devices (576, 578, and 580) and supplied to the motor 24 may be used in a feedback loop to, for example, monitor conditions of the motor 24.

For example, the sensors 22 may sense whether current is flowing when any of the single-pole switching devices (576, 578, and 580) close and report this information to the control and monitoring circuitry 18. If current is flowing, the control and monitoring circuitry 18 may then determine how much current is flowing by generating a graph that analyzes change in current (di) versus change in time (dt), which may be referred to as the "di/dt slope." In some embodiments, the control and monitoring circuitry 18 may look at the change in voltage (dv) versus change in time (dt) to determine the current. As will be explained in detail below, sensing whether current is flowing and determining the change in the current (e.g., di/dt slope) may enable detecting whether a phase-to-ground short or phase-to-phase fault is present.

Turning now to the operation of the sniffing process, which may be utilized in some embodiments to detect phase-to-ground faults, the control and monitoring circuitry 18 may utilize POW techniques to determine a desired point on the waveform to close ahead of a voltage zero-crossing. That is, each phase output by the power source 12, the control and monitoring circuitry 18 may analyze the phase voltage to determine when it will cross zero on the voltage waveform and pick a desired point to close a few electrical degrees before that zero-crossing. Then, the control and monitoring circuitry 18 may apply a very brief, low line voltage pulse (e.g., lower than the line voltage) to the motor 24 by closing the switching device at the desired point on the wave and quickly (e.g., milliseconds) opening the single-pole switching device. One reason to close a few electrical degrees ahead of a voltage zero-crossing (e.g., on the downward slope of a positive half cycle on the AC waveform) is so that the energy remains small if a short circuit exists due to the low voltage and short duration of the closure. If there is any current (e.g., not zero) sensed by the sensors 22, then a phase-to-ground fault may be present because the ground has closed the circuit and current is flowing. However, if there is zero current sensed by the sensors 22, then there may not be a phase-to-ground fault present.

This process may be utilized to test each phase independently. For example, the control and monitoring circuitry 18 may determine a desired point on the phase A waveform to close ahead of a voltage zero-crossing and then send a signal to the single-pole switching device 576 to close accordingly. Very quickly thereafter (e.g., a few milliseconds), the single-pole switching device 576 may be instructed to open by the control and monitoring circuitry 18 and the control and monitoring circuit 18 may be notified if current is sensed by the sensor 22. If a current is sensed, this may indicate that a phase-to-ground short is present in the motor system 574. More specifically, if any current (e.g., not zero) is sensed by the sensors a short may be present in a winding of the motor 24 that receives phase A or an interconnect that carries phase A to the motor 24.

Additionally, the control and monitoring circuitry 18 may determine a desired point on the phase B waveform to close ahead of a voltage zero-crossing and then sending a signal to the single-pole switching device 578 to close accordingly. Very quickly thereafter (e.g., a few milliseconds), the single-pole switching device 578 may be instructed to open by the control and monitoring circuitry 18 and the control and monitoring circuit 18 may be notified if current is sensed by the sensor 22. More specifically, if any current (e.g., not zero) is sensed by the sensors a short may be present in a winding of the motor 24 that receives phase B or an interconnect that carries phase B to the motor 24.

Furthermore, the control and monitoring circuitry 18 determine a desired point on the phase C waveform to close ahead of a voltage zero-crossing and then sending a signal to the single-pole switching device 580 to close accordingly. Very quickly thereafter (e.g., a few milliseconds), the single-pole switching device 580 may be instructed to open by the control and monitoring circuitry 18 and the control and monitoring circuit 18 may be notified if current is sensed by the sensor 22. More specifically, if any current (e.g., not zero) is sensed by the sensors a short may be present in a winding of the motor 24 that receives phase C or an interconnect that carries phase C to the motor 24. Additionally, if a phase-to-ground fault is detected, it may be desirable to delay starting the motor so that the fault may be remedied and detriment to the motor, load, and/or power circuit may be inhibited.

Figure 56B:
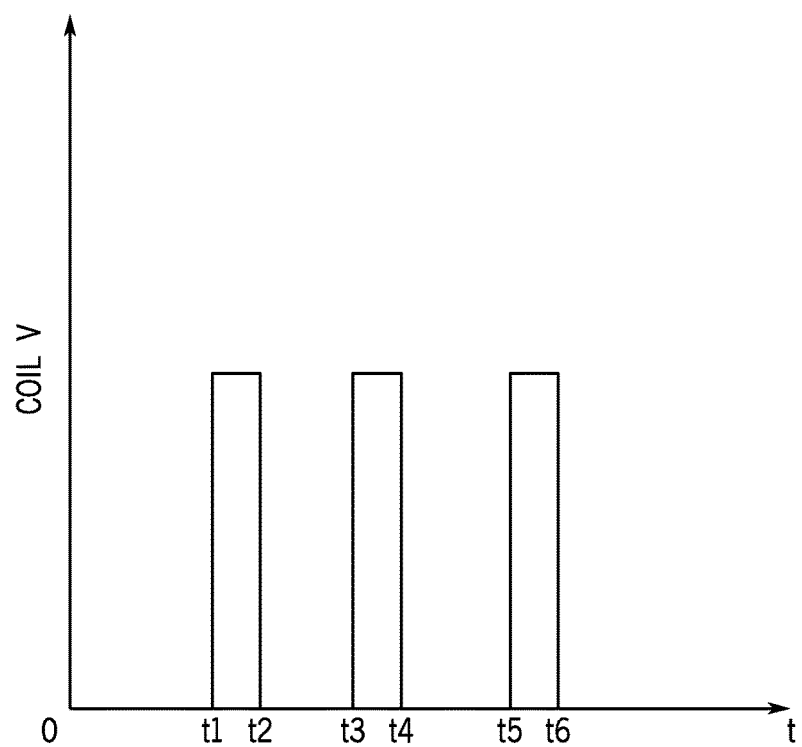

To help illustrate, the duration of each switching device closing and opening, FIG. 56B presents a timing diagram of the operations. As depicted, the y-axis represents the voltage applied to the coil, and the x-axis represents the amount of time in milliseconds. The graph shows all three phases being briefly pulsed and tested consecutively. A first phase-to-ground fault detection begins by closing the single-pole switching device 576 at t1 and opening the single-pole switching device 576 at t2. As may be seen, the elapsed time that the single-pole switching device 576 remained closed between t1 and t2 is very brief (e.g., a few milliseconds). In other words, the switching device 576 is pulsed to detect phase-to-ground shorts related to phase A.

Similarly, a second phase-to-ground fault detection begins by closing the single-pole switching device 578 at t3 and opening the single-pole switching device 578 at t4, which is a few milliseconds after at t3. As such, the switching device 578 is pulse to detect phase-to-ground shorts related to phase B. Additionally, a third phase-to-ground fault detection begins by closing the single-pole switching device 580 at t5 and opening the single-pole switching device 580 at t6, which is a few milliseconds after t5. As such, the switching device 580 is pulsed to detect phase-to-ground shorts related to phase C.

As described above, a low amount of voltage applied briefly to the motor system 574 during the phase-to-ground testing because the switching devices 576-580 are closed near a voltage zero-crossing for each phase. Accordingly, low voltage and brief duration may reduce likelihood of circuit breakers tripping, as well as reduce detriments to the motor and its windings in the instance that a phase-to ground short is present.

Additionally, as described above, the sniffing process may also be utilized to detect phase-to-phase shorts utilizing the system 574 in FIG. 56A. For example, the control and monitoring circuitry 18 may close and open a single-pole switching device that supplies a first phase of electric power and a single-pole switching device that supplies a second phase of electric power one after the other such that there is a brief overlap between when single-pole switching devices are closed. More specifically, the switching devices may be pulsed when at a phase-to-phase predicted current zero-crossing. In some embodiments, a phase-to-phase predicted current zero-crossing may occur phase-to-phase voltage is at a maximum. In some embodiments, the single pole switching devices arranged in a delta configuration of a wye-delta motor starter may be used to detect for phase-to-phase shorts.

Based on the current measured by the sensors 22, the control and monitoring circuitry 18 may determine if a phase-to-phase fault is present. More specifically, if no current is sensed, a phase-to-phase open circuit may be present in the motor system 574 and require maintenance. On the other hand, if a current is sensed, the control and monitoring circuitry 18 may determine and analyze the change in the current (e.g., di/dt slope). More specifically, a nearly vertical (e.g., rapidly increasing) di/dt slope may indicate that a phase-to-phase short is present. In some embodiments, the phase-to-phase short may be caused by the interconnects being in contact without a load or the windings are shorted. When a phase-to-phase short is present, the motor windings may be inspected to check the wiring before starting. If the di/dt slope is changing over time or has some angle to it, the control and monitoring circuitry 18 may determine that there is no phase-to-phase fault present.

This process may be repeated for each phase-to-phase combination. For example, the phase A and phase B single-pole switching devices may be controlled as described above to determine whether a phase-to-phase fault is present. Next, the phase B and phase C single-pole switching devices may be controlled as described above to determine whether a phase-to-phase fault is present. Last, the phase A and phase C single-pole switching devices may be controlled as described above to determine whether a phase-to-phase fault is present.

In some embodiments, the above described sniffing process may be utilized to test for phase-to-ground and phase-to-phase faults in systems with any number of phases. For example, in a system that is receiving single phase electric power, phase-to-ground short testing may be performed by briefly pulsing the switching device closed and opened and measuring for current. In addition, in a system receiving two phase electric power, phase-to-ground testing may be performed for both phases by briefly pulsing the respective switching devices closed and measuring for current. Further, phase-to-phase short testing may be performed by briefly overlapping the closures of the switching devices providing the two phase power and analyzing the di/dt slope.

Figure 57:
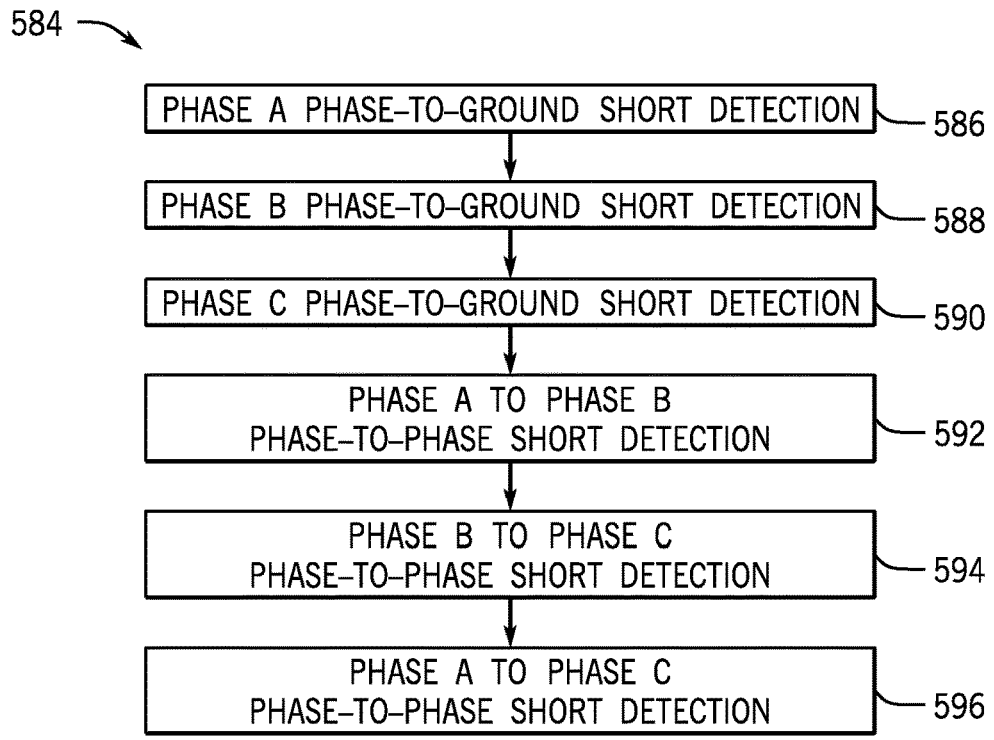
FIG. 57 is a block diagram of logic for detecting motor conditions, in accordance with an embodiment.

Further, the above described sniffing process using single-pole switching devices and POW techniques for both phase-to-ground and phase-to-phase short detection may be combined into a thorough detection sequence that may be executed prior to starting the electric motor 24. One embodiment of a process 584 for the sniffing process is shown in FIG. 57, which is a block diagram of logic for detecting motor conditions. The process 584 may be implemented via computer-readable instructions stored in a non-transitory article of manufacture (e.g., the memory 226, 20, 46 and/or other memories) and executed via processor 224, 19, 45 and/or other control circuitry. It should be noted that the depicted sequence of the process 584 is not meant to be limiting, and is for illustrative purposes. Indeed, any one of the process blocks may be rearranged and performed in different order than the depicted embodiment.

In some embodiments, the sequence 584 may begin by testing for phase-to-ground shorts; however, in other embodiments, the sequence 584 may begin by testing for phase-to-phase faults. As such, phase A may be analyzed for a phase-to-ground short by closing the single-pole switching device 576 at a desired point on the waveform ahead of a voltage zero-crossing, opening the single-pole switching device 576 after a few milliseconds, and measuring for current (process block 586). Next, in process block 588, the control and monitoring circuitry 18 may perform sniffing on phase B to detect whether a phase-to-ground short exists (process block 588). That is, the single-pole switching device 578 may be briefly pulsed closed ahead of a voltage zero-crossing. Then, the single-pole switching device 578 may be opened after a few milliseconds, and the current may be measured to determine whether current is flowing to the ground. In process block 590, the control and monitoring circuitry 18 may perform sniffing on phase C to detect whether a phase-to-ground short exists (process block 590).

If there is current sensed by the sensors 22 for any one of the phases, a phase-to-ground short may be present, and a user may determine how much current is present and decide whether to start the load (e.g., electric motor 24) or not. If there is no current sensed for any of the phases during the phase-to-ground detection, or the user decides to proceed with starting, the sequence 584 may move to testing for phase-to-phase faults.

To test for phase-to-phase faults, the control and monitoring circuitry 18 may utilize sniffing to detect whether there is a phase A to phase B fault present (process block 592). Additionally, the control and monitoring circuitry 18 may utilize sniffing to detect whether there is a phase B to phase C fault present (process block 594) and utilize sniffing to detect whether there is a phase A to phase C fault present (process block 596). More specifically, if the di/dt slope indicates a phase-to-phase fault is present, the user may decide to delay starting until the condition is remedied. The combined sequence of phase-to-ground short detecting process blocks 586-590 and the phase-to-phase short detecting process blocks 592-596 may be executed as desired prior to starting a load (e.g., electric motor 24), such as each time before the load starts or on a periodic basis.

As previously mentioned, the benefits of performing the sequence 584, or a combination thereof, may reduce undesirable maintenance conditions of the electric motor 24 and its windings and inhibit tripping any connected devices through the use of single-pole switching devices and POW techniques to detect faults using near minimal energy.

Figure 58A:
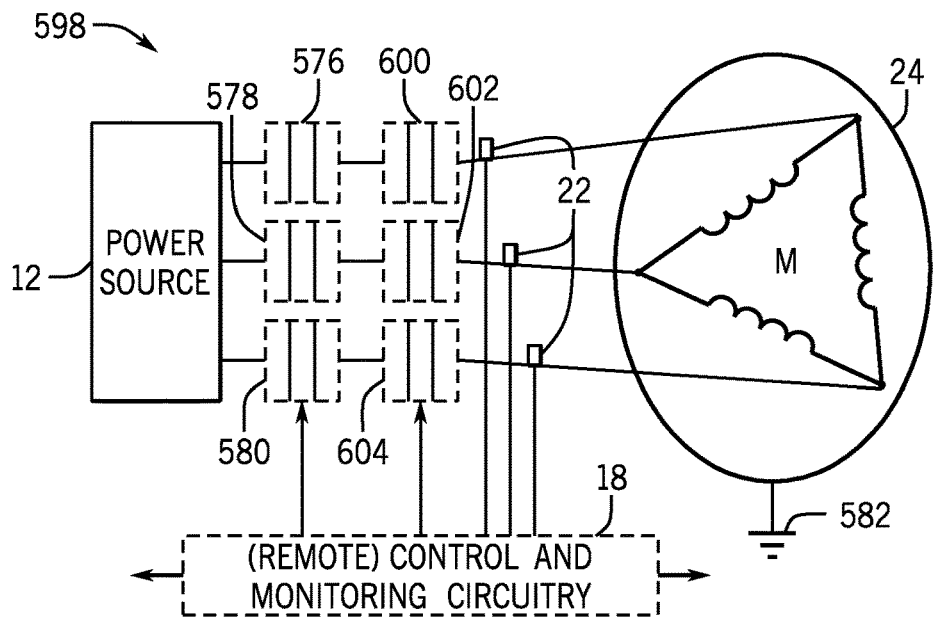
FIGS. 58A and 58B is a diagrammatical representation of alternative circuitry for detecting motor conditions utilizing multiple single-pole switching devices and a corresponding timing diagram, respectively, in accordance with an embodiment.

In an alternative embodiment, sniffing may be performed two single-pole switching devices in series to detect phase-to-ground shorts and/or phase-to-phase faults. It should be noted that the single-pole switching devices may include the single-pole, single current-carrying path switching devices 218. Additionally or alternatively, in some embodiments, single-pole, multiple current-carrying path switching devices may be used. The benefits of using two single-pole switching devices in series is that it may enable a smaller more accurate time window at which electric power is provided to the electric motor 24. FIG. 58A displays an embodiment of a motor system 598 that utilizes two single-pole switching devices in series (576 & 600, 578 & 602, 580 & 604). More specifically, each pair of switching devices is used to supply a single phase of electric power from the power source 12 to the electric motor 24. Additionally, the electric motor 24 may be connected to ground 584.

As such, FIG. 58A is almost identical to FIG. 56A except for the addition of the second set of single-pole switching devices 600, 602, and 604. In some embodiments, the second set of single-pole switching devices 600, 602, and may form a controllable disconnect switch. It should be noted that the disclosed techniques are not limited to two switching devices. Indeed, any number of single-pole switching devices may be utilized. The two single-pole switching devices in series may detect faults by briefly overlapping the closures so as to momentarily allow closing of the circuit. Then, any current that is sensed by sensors 22 may be measured and analyzed by control and monitoring circuitry 18. For example, a phase-to-ground short may be detected if any current is detected by the sensors 22 when the circuit is briefly closed. Also, a phase-to-phase short may be detected if the di/dt slope is nearly vertical after syncing the overlapping closure of the two single-pole switching devices in series for two phases.

Beginning with phase-to-ground short detection, it may be useful to walk through how each pair of single-pole switching devices is utilized. Specifically, with regards to phase A, the control and monitoring circuitry 18 may utilize POW techniques to pick a desired point on the sinusoidal waveform to close the first single-pole switching device 576 in the series ahead of a voltage zero-crossing and another desired point to close the second single-pole switching device 600 ahead of the voltage zero-crossing so that both single-pole switching devices' closures overlap for some brief period of time (e.g., a couple milliseconds) prior to the voltage zero-crossing. Further, the control and monitoring circuitry 18 may also pick a desired point to open the single-pole switching devices 576 ahead of the voltage zero-crossing and another point to open the single-pole switching device 600. Then, the control and monitoring circuitry 18 may pulse the single-pole switching devices 576 and 600 closed and opened based upon the desired points. In this way, the overlapping closure of both single-pole switching devices may be controlled so that the closure is opened before the voltage crosses zero. Thus, the amount of energy present if there is a fault may be more precisely controlled when two or more single-pole switching devices in series. Also, the amount of time that the switching devices 576 and 600 are closed is minimal. As such, it should be noted that the switching devices may be opened and close anywhere on the sinusoidal waveforms due to the very brief amount of time that their closures overlap.

Accordingly, the control and monitoring circuitry 18 may determine whether a phase-to-phase fault is present based on the current sensed by the sensors 22. The above described phase-to-ground short detection process utilizing two single-pole switching devices in series may be repeated for both phase B and phase C using their respective single-pole switching devices in series (578 & 602, 580 & 604).

Figure 58B:
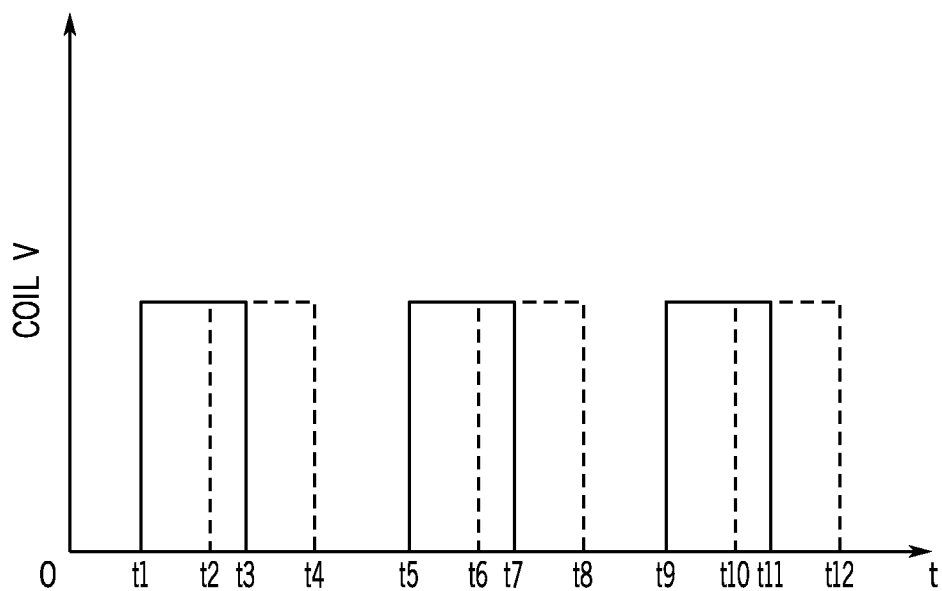

The duration of the closure overlap may be better understood with reference to FIG. 58B, which is a timing diagram of closing and opening two single-pole switching devices in series. The y-axis represents the voltage in the coil, and the x-axis represents time in milliseconds. Each solid line and respective dotted line represent a pair of single-pole switching devices in series applying voltage of a single phase to the electric motor 24. For example, the control and monitoring circuitry 18 closes the first single-pole switching device 576 at t1 and closes the second single-pole switching device 600 at t2. Additionally, the control and monitoring circuitry 18 opens the first single-pole switching device 576 at t3 and opens the second single-pole switching device 600 at t4. Accordingly, since both of the single-pole switching devices 576 and 600 are closed between t2 to t3, electric power is supplied to the electric motor 24 between t2 to t3. This timeframe or window may be referred to as the "closure overlap." The closure overlap may be only one or two milliseconds long. Indeed, closing of the single-pole switching devices 576 and 600 may be intended to enable a controlled pulse of line voltage to be applied that has insufficient energy to cause an undesirable maintenance condition to the motor and/or its windings.

It is during the closure overlap that the current is measured to detect phase-to-ground shorts. If any current is sensed by the sensors 22, there may be a phase-to-ground short present. In contrast, if no current is sensed then there may not be a phase-to-ground short present. As depicted, the timings of the closing and openings of the other pairs of single-pole switching devices in series for phase B (t5-t8) and phase C (t9-t12) may be similar. More specifically, as depicted, electric power is applied between t6-t7 and between t10-t11. In other embodiments, the phase-to-ground shorts may be tested in any desirable order. However, two phases should not be tested simultaneously because if the closure overlaps are synced current will be flowing and it may appear as though there is a phase-to-ground fault when there is not.

Figure 59:
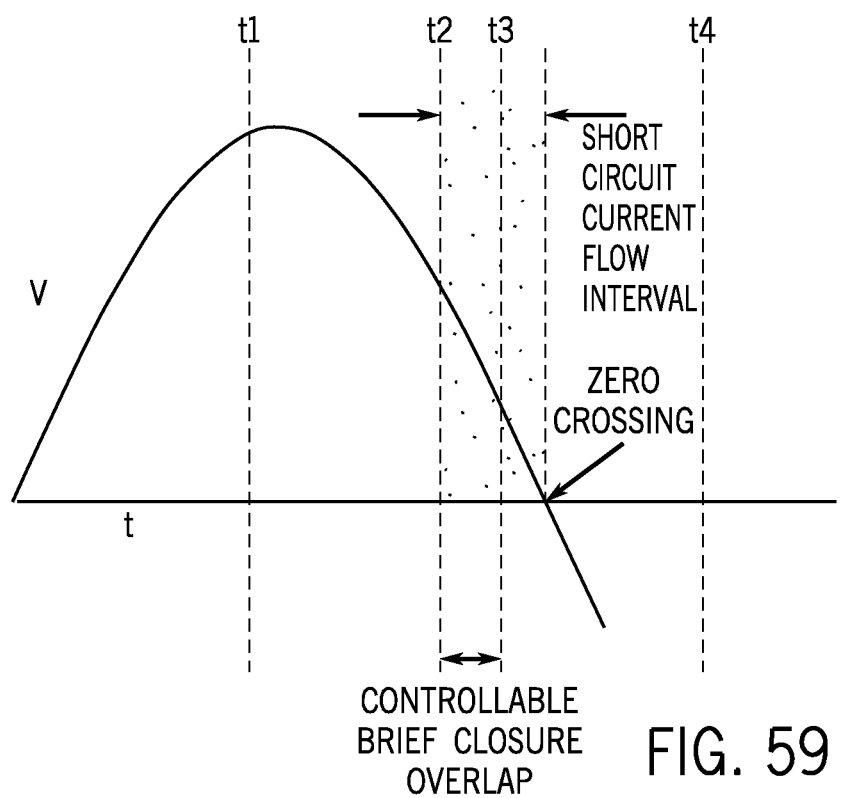
FIG. 59 is a graphical representation of timing for the motor condition detection, in accordance with an embodiment.

To further illustrate the points on the sine wave that the two single-pole switching devices in series may close and open, FIG. 59 depicts a graphical representation of timing for the motor condition detection. The graph shows the voltage sine wave for a single phase of electric power over time. For example, the sine wave may represent phase A and the timings (t1-t4) represent the same single-pole switching device closings and openings shown in FIG. 58B.

As described above, the first single-pole switching device 576 may close at t1 and open at t3. Additionally, the second single-pole switching device 600 may close at t2 and open at t4. Accordingly, electric power may be applied to the electric motor 24 between t2 and t3, which as depicted is slightly before the voltage zero crossing so that the amount of energy available if a fault is present is low. That is, as displayed, the voltage is only applied for a couple of milliseconds while it is low before zero is crossed.

Similarly, the control and monitoring circuitry 18 may also detect phase-to-phase faults utilizing the two single-pole switching devices in series. For example, in some embodiments, the control and monitoring circuitry 18 may pulse closed pairs of single-pole switching devices in series such that electric power is connected for a brief period slightly before a phase-to-phase predicted current zero-crossing. This may enable brief closing of the circuit between phases to apply a small amount of voltage for a few milliseconds so that if a fault exists, the fault may be cleared quickly without causing an undesirable maintenance condition. In addition, the brief closing of the circuit may enable the sensors 22 to sense any current that is flowing and the control and monitoring circuitry 18 to analyze the di/dt slope of the current to determine whether a phase-to-phase fault is present.

More specifically, the control and monitoring circuitry 18 may utilize the two single-pole switching devices and POW techniques to detect phase-to-phase faults between phase A to phase B, phase B to phase C, and phase A to phase C, in any order. Taking phase A to phase B short detection as an example, the control and monitoring circuitry 18 may utilize POW techniques to pick points on phase A and phase B where a phase-to-phase voltage maximum (e.g., a predicted current zero-crossing) occurs. Additionally or alternatively, the phase-to-phase current and/or voltage may be explicitly measured to determine when a current is approaching between phases. For example, the voltage may be measured between phase A and phase B, between phase B and phase C, and between phase A and phase C to determine when to perform the sniffing for phase-to-phase shorts. It is noted that the current conducted may be asymmetrical. As such, it may be possible to determine other desirable points to perform sniffing operations, for example, based at least in part on characteristics of the load.

Next, the control and monitoring circuitry 18 may determine another set of points on the phase A and phase B waveforms that are a few electrical degrees prior to the predicted current zero-crossings to ensure that a low current is applied when the circuit is closed. Then, the control and monitoring circuitry 18 may pulse close and open the pairs of single-pole switching devices for both phase A and phase B to create closure overlaps that coincide (e.g., overlap briefly) between the phases at the determined points before the predicted current zero-crossing.

That is, the control and monitoring circuitry 18 may pulse close the single-pole switching device 576 and then 600 at the desired point before the predicted current zero-crossing to apply voltage for phase A, while at nearly the same time, pulse close the single-pole switching devices 578 and then 602 at the desired point before the predicted current zero-crossing to apply voltage for phase B. Thus, both phases' pairs of single-pole switching devices may create closure overlaps that apply voltage for both phases at the same time in order to detect whether there is a phase-to-phase fault. Quickly thereafter (e.g., milliseconds), the single-pole switching device 576 supplying phase A and the single-pole switching device 578 supplying phase B may be pulsed open before the predicted current zero-crossing to break the circuit, thereby opening the closure overlap.

As such, utilizing the single-pole switching devices in series between phases in this manner may provide the benefit of generating a more accurate pulse that is more precise in both amount of current applied and the duration of current application in relation to the predicted current zero-crossing. As a result, the controlled pulse of line voltage applied may be insufficient to cause an undesirable maintenance condition and/or trip connected devices (e.g., feeder circuit breaker) if a short is present. Further, if a short is detected the electric motor 24 may not be started so that the problem may be remedied and detriments inhibited.

In some embodiments, the above described sniffing process utilizing two switching devices in series may be utilized to test for phase-to-ground and phase-to-phase faults in systems with any number of phases. For example, in a system that is receiving single phase electric power, phase-to-ground short testing may be performed by briefly overlapping the closure of the two switching devices in series and measuring for current. In addition, in a system receiving two phase electric power, phase-to-ground testing may be performed for each individual phase by briefly overlapping the closures of the switching devices in series for that particular phase and measuring for current. Further, phase-to-phase short testing may be performed for a system receiving two phase power by briefly overlapping the closures of the switching devices in series for both phases and analyzing the di/dt slope.

Accordingly, utilizing the sniffing techniques described above may enable controlling the amount and duration of electric power applied to a motor. As such, potential undesirable maintenance conditions that may occur when a fault is present may be reduced and protection circuitry may not trip if a fault is present. More specifically, in the event of a short circuit, the fault current may be much smaller than when closing at full voltage, and the very brief pulse may easily clear the fault current. Thus, expensive repairs may be reduced, equipment up time may be increased, and operator safety may be improved.

Modular System Constructions

There are multiple configurations of devices enabled to meet desired needs by leveraging the techniques described herein. Specifically, the electromechanical single-pole switching devices described above, such as the single-pole, single current-carrying path switching devices 218, provide modularity that enables highly configurable devices. Further, the mechanical interlock described above enhances device configurability by preventing a particular switching device from closing when an interlocked switching device is closed, which may inhibit shorts. One such modular device that utilizes the techniques described herein is the wye-delta starter described above. Indeed, in the embodiments described below, 5-pole, 6-pole, 8-pole, and 9-pole wye-delta starters are enabled utilizing electromechanical single-pole switching devices (e.g., single-pole, single current-carrying path switching devices) in conjunction with the mechanical interlock. It should be noted that the number of poles may correspond to the number of single-pole switching devices utilized in the configuration. In general, using the single-pole switching devices in the described wye-delta starter embodiments may result in devices having a compact size, which may save a user money due to less hardware utilized and less complex wiring, and a lower thermal footprint, which may improve ability to package such a device in a smaller electrical enclosure with a smaller factory footprint.

To help illustrate, one embodiment of a polyphase 5-pole wye-delta starter 374 is shown in FIG. 60. As depicted, the 5-pole wye-delta starter 374 includes five single-pole switching devices 376, 378, 380, 382, and 384, which may be electromechanical single-pole, single current-carrying path switching devices. Additionally or alternatively, the switching devices 376, 378, 380, 382, and 384 may include single-pole, multiple current-carrying path switching devices. Specifically, the 5-pole wye-delta starter 374 includes two wye switching devices 376 and 378 and three delta switching devices 380, 382, and 384. The switching devices are coupled to three-phase power from three mains lines 392, 394, and 396, and are further coupled to three motor windings 386, 388, and 390. An advantage provided by using the single-pole, single current-carrying path switching devices instead of switches arranged on a common switch carrier is the number of power poles may be reduced (e.g., fewer switching devices). For example, the 5-pole wye-delta switching device utilizes two wye switching devices (376 and 378) instead of three.

As depicted, the first delta switching device 380 and the first wye switching device 376 are mechanically coupled via a first interlock 608, and the second delta switching device 382 and the second wye switching device 378 are mechanically coupled via a second interlock 610. It should be noted that the first interlock 608 and second interlock 610 may be the mechanical interlock described above. As such, only one of the first delta switching device 380 and the first wye switching device 376 may be closed at a time. Similarly, only one of the second delta switching device 382 and the second wye switching device 378 may be closed at a time. In addition, operation of the wye-delta starter 374 may be controlled by the control and monitoring circuitry 18.

Additionally, as depicted, the output of first delta switching device 380 and the output of first wye switching device 376 are electrically coupled via a first interconnection 628. Similarly, the output of second delta switching device 382 and the output of second wye switching device 378 are electrically coupled via a second interconnection 624. Furthermore, the output of third delta switching device 384, the input of first wye switching device 376, and the input of first delta switching device 380 are electrically coupled via a third interconnection 620.

In the operation, the wye-delta starter 374 may receive a signal to start the motor. Using the techniques above, the wye-delta starter 374 may initially execute a wye two-step start and then phase sequential wye-delta switching. Both processes may include the control and monitoring circuitry 18 opening and/or closing specified switching devices in a sequential order so as to minimize negative torque, current spikes, and oscillation magnitudes. As such, the wye two-step start may be initiated by the second wye switching device 378 closing. Thus, a first phase of electric power (e.g., phase A) is connected from the mains line 394 to the motor second winding 388 and a second phase of electric power (e.g., phase B) may be connected from the mains line 396 to the third winding 390. During the second step of the wye two-step start, the second first wye switching device 376 closes and a third phase of electric power (e.g., phase C) is connected from the mains line 392 to the first winding 386 of the electric motor 24. Thus, when the wye switching devices 376 and 378 are the only switching devices closed in the wye-delta starter 374, the motor is running in a wye configuration.

When initiated, the wye-delta starter 374 may execute the phase sequential wye-delta switching. As such, the switching may begin by opening the first wye switching device 376. As a result of breaking first wye switching device 376, the motor windings 388 and 390 are being supplied power. Next, the first delta switching device 380 may be closed, resulting in first winding 386 being connected line 394 to line 392. Windings 388 and 390 are still connected line 394 to line 396. As a result of first delta switching device 380 closing, the windings 386, 388, and 390 are receiving three-phase unbalanced power due to the motor running in a mixed wye-delta configuration. Then, the second wye switching device 378 may be opened as the third step in the phase sequential wye-delta transition. As a result, only motor first winding 386 is receiving power and the electric motor 24 is single phasing. Further, the second delta switching device 382 may be closed after the opening of the second wye switching device 378, thereby providing power to second winding 388 in addition to 386. Last, the third delta switching device 384 may be closed in order to complete the delta configuration. Thus, three-phase power may be supplied via lines 392, 394, and 396 to the motor windings 386, 388, and 390 in a delta configuration.

As previously discussed, in some embodiments, the 5-pole wye-delta starter 374 may be implemented with single-pole, single current-carrying path switching devices 218, as depicted in FIG. 61. More specifically, as depicted, the mains line 394 is electrically coupled to input terminal 612 of the first delta switching device 380, the mains line 396 is electrically coupled to input terminal 614 of the second delta switching device 382, and the mains line 392 is electrically coupled to input terminal 616 of the third delta switching device 384.

Additionally, the output terminal 626 of the first delta switching device 380 and the output terminal of the first wye switching device 376 are electrically coupled by the first interconnect 628 (e.g., a first bus bar). Similarly, the output terminal 632 of the second delta switching device 382 and the output terminal 636 of the second wye switching device 378 are electrically coupled by the second interconnect 634 (e.g., a second bus bar). Furthermore, the input terminal 618 of the first wye switching device 376, the input terminal 622 of the second wye switching device 378, and the output terminal 624 of the third delta switching device 384 are electrically coupled by the third interconnect 620 (e.g., a third bus bar).

Thus, the first winding 386 may be electrically coupled to either output terminal 626, output terminal 630, or the first interconnect 628. Additionally, the second winding 388 may be electrically coupled to either output terminal 632, output terminal 624, or the second interconnect 634. Furthermore, the third winding 390 may be electrically coupled to either input terminal 618, input terminal 622, or output terminal 624.

Additionally, as depicted, the first delta switching device 380 and the first wye switching device 376 are mechanically coupled by the first interlock 608. Similarly, second delta switching device 382 and second wye switching device 378 are mechanically coupled by the second interlock 610. It should be noted that the first interlock 608 and second interlock 610 may be the mechanical interlock described above.

Figure 62:
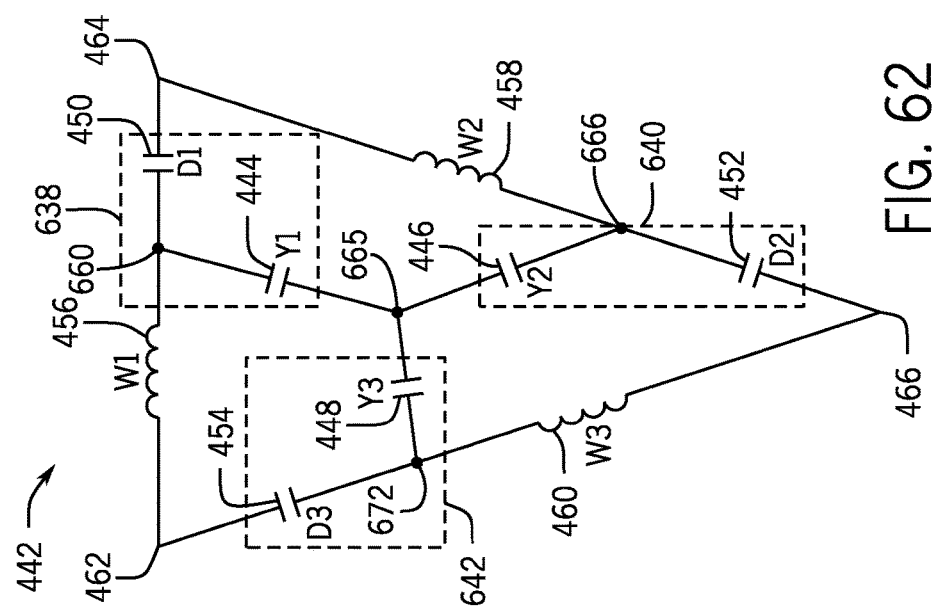
FIG. 62 is a diagrammatical representation of a circuit for a 6 pole wye-delta starter constructed of multiple single-pole switching devices interconnected with one another, in accordance with an embodiment.

In another embodiment, a polyphase 6-pole wye-delta starter 442 is enabled utilizing six switching devices, as shown in FIG. 62. As with the 5-pole wye-delta starter, the switching devices may be electromechanical single-pole, single current-carrying path switching devices independently operated by the control and monitoring circuitry 18. Additionally or alternatively, the switching devices may be single-pole, multiple current carrying path switching devices. As depicted, the configuration of the switching devices is almost identical as the 5-pole wye-delta starter except another wye switching device is included in this embodiment. Indeed, the 6-pole wye-delta starter 442 includes six switching devices 444, 446, 448, 450, 452, and 454. Specifically, the 6-pole wye-delta starter 442 includes three wye switching devices 444, 446, and 448 and three delta switching devices 450, 452, and 454.

The switching devices are coupled to three-phase power from three mains lines 462, 464, and 466, and are further coupled to three motor windings 456, 458, and 460. As discussed above, the 6-pole wye-delta starter 442 may be controlled by the control and monitoring circuitry 18 to keep track of which switching devices open and/or close first during a start and select a different switching device to open and/or close during the next start. In this way, the control and monitoring circuitry 18 may evenly distribute the number of switching operations each switching device performs, which may increase the lifespan of the switching devices.

As depicted, the first delta switching device 450 and the wye switching 444 are coupled via a first interlock 638, the second delta switching device 452 and the second wye switching device 446 are coupled via a second interlock 640, and the third delta switching device 454 and the third wye switching device 448 are coupled via a third interlock 642. It should be noted that the interlocks 638, 640, and 642 may be the mechanical interlocks described above. As such, only one of the first delta switching device 450 and the first wye switching device 444 may be closed at a time, only one of the second delta switching device 452 and the second wye switching device 446 may be closed at a time, and only one of the third delta switching device 454 and the third wye switching device 448 may be closed at a time.

Additionally, as depicted, the output of first delta switching device 450 and the output of first wye switching device 444 are electrically coupled via a first interconnection 660. Similarly, the output of second delta switching device 452 and the output of second wye switching device 446 are electrically coupled via a second interconnection 666, and the output of third delta switching device 454 and the output of third wye switching device 448 are electrically coupled via a third interconnection 672. Furthermore, the input of first wye switching device 444, the input of second wye switching device 446, and the input of third wye switching device 448 are electrically coupled via a fourth interconnection 665.

The steps in the wye two-step start and the phase sequential wye-delta switching using six switching devices are essentially the same as using five switching devices, which was described with reference to FIG. 60. However, in the circuit diagram 442 depicted in FIG. 62 there are three wye switching devices (444, 446, and 448), as opposed to two in FIG. 60. Thus, the order in which the wye switching devices are closed in the wye two-step start may change, and the order in which the wye switching devices are opened in the phase sequential wye-delta switching may change. In particular, regarding the wye two-step start, in order to provide current to the windings using three wye switching devices, one of the steps may close two wye switching devices simultaneously and the other step may close the third switching device. For example, the wye switching devices 446 and 448 may close simultaneously to connect windings 458 and 460 from line 464 to line 466. Then, in the second step, the third first wye switching device 444 may close in order to complete the wye configuration. If POW techniques are utilized, these closures may occur at desired points on the sinusoidal waveforms as determined by the control and monitoring circuitry 18.

Once the electric motor 24 is running in wye configuration and the winding current waveforms have reached steady state, the phase sequential switching to delta may initiate. Alternatively, the phase sequential switching to delta may initiate any point after the motor is set in the wye configuration. As with the phase sequential wye-delta switching utilizing a 5-pole wye-delta starter, in one embodiment, the first step in the sequence utilizing a 6-pole wye-delta starter may include opening one of the wye switching devices 444. Next, the switching device 450 may be closed to connect first winding 456 in delta. After switching device 450 closes, the motor is running in a mixed wye-delta configuration with first winding 456 in delta and windings 458 and 460 in wye. Then, the remaining two closed wye switching devices 446 and 448 may be opened simultaneously and the electric motor 24 may be single phasing (e.g., phase A) with only first winding 456 connected line 462 to line 464. The switching devices 452 and 454 may be closed following the closure of the switching device 450 either one after the other or simultaneously. As a result, the windings 456, 458, and 460 are receiving three-phase electric power and the electric motor is running in a delta configuration.

Figure 63:
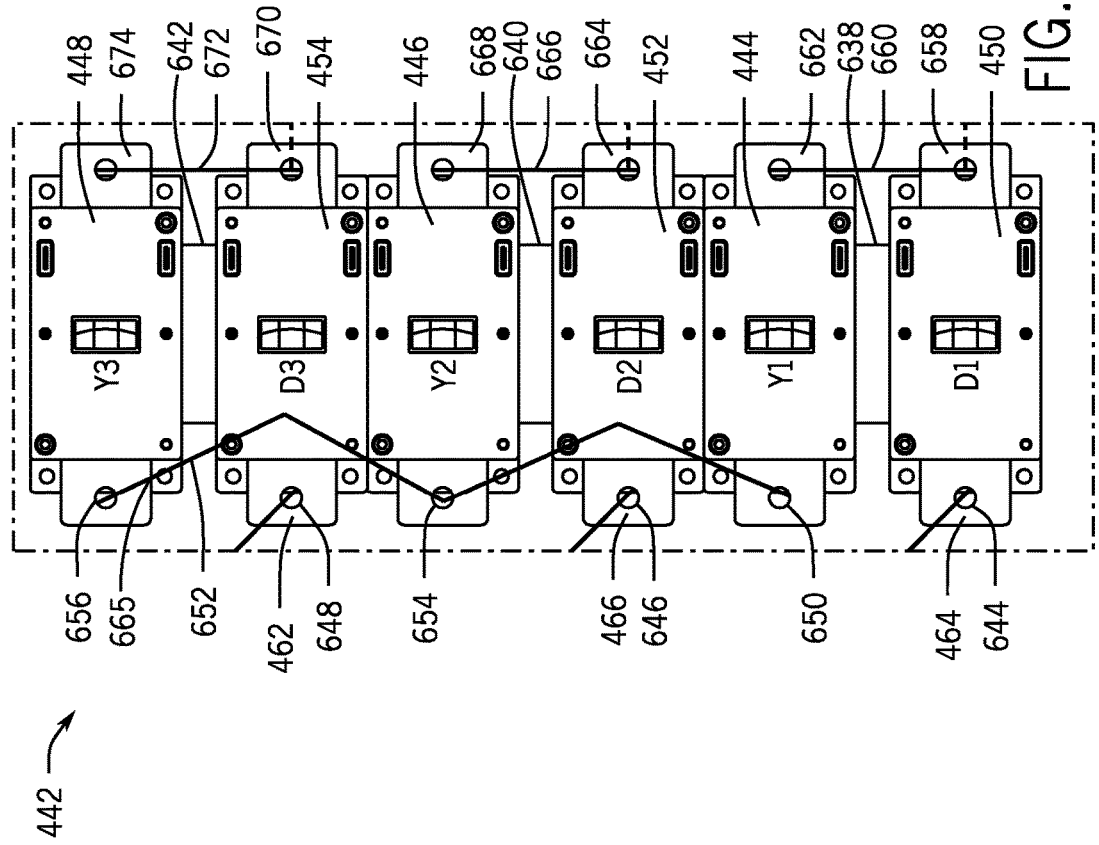
FIG. 63 is a top view of an assembly of single-pole switching devices to create the circuit of FIG. 62, in accordance with an embodiment.

As previously discussed, in some embodiments, the 6-pole wye-delta starter 442 may be implemented with single-pole, single current-carrying path switching devices 218, as depicted in FIG. 63. More specifically, as depicted, the mains line 464 is electrically coupled to input terminal 644 of first delta switching device 450, the mains line 466 is electrically coupled to input terminal 646 of second delta switching device 452, and the mains line 462 is electrically coupled to input terminal 648 of third delta switching device 454.

Additionally, the output terminal 658 of first delta switching device 450 and the output terminal 662 of the first wye switching device 444 are electrically coupled by the first interconnect 660 (e.g., a first bus bar). Similarly, the output terminal 664 of the second delta switching device 452 and the output terminal 668 of the second wye switching device 446 are electrically coupled by the second interconnect 666 (e.g., a second bus bar), and the output terminal 670 of the third delta switching device 454 and the output terminal of the third wye switching device 448 are electrically coupled by the third interconnect 672 (e.g., a third bus bar. Furthermore, the input terminal 650 of the first wye switching device 444, the input terminal 654 of the second wye switching device 446, and the input terminal 656 of the third wye switching device 448 are electrically coupled by the fourth interconnect 665 (e.g., a fourth bus bar).

Thus, the first winding 456 may be electrically coupled to either output terminal 658, output terminal 662, or the first interconnect 660. Additionally, the second winding 458 may be electrically coupled to either output terminal 664, output terminal 668, or the second interconnect 666. Furthermore, the third winding 460 may be electrically coupled to either output terminal 670, output terminal 674, or the third interconnect 672.

Additionally, as depicted, the first delta switching device 450 and the first wye switching device 444 are mechanically coupled by the first interlock 638. Similarly, the second delta switching device 452 and the second wye switching device 446 are mechanically coupled by the second interlock 640. Furthermore, the third delta switching device 454 and the third wye switching device 448 are mechanically coupled by the third interlock 642. It should be noted that the interlocks 638, 640, and 642 may each be the mechanical interlock described above.

Figure 64:
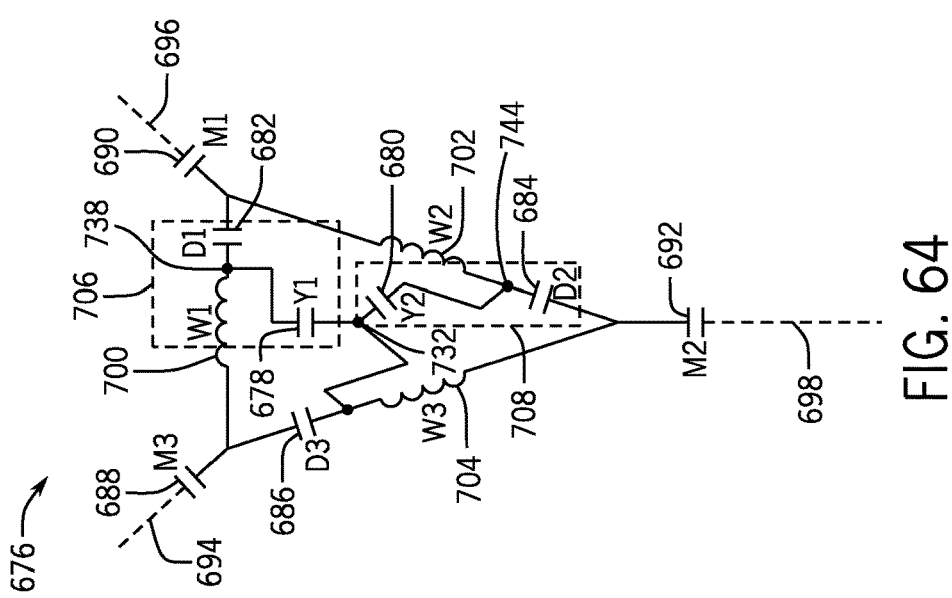
FIG. 64 is a diagrammatical representation of a circuit for an 8 pole wye-delta starter constructed of multiple single-pole switching devices interconnected with one another, in accordance with an embodiment.

In another embodiment, the polyphase 5-pole wye-delta starter may be modified to isolate the motor windings by adding three mains lines switching devices, which results in the polyphase 8-pole wye-delta starter 676 shown in FIG. 64. As with the 5-pole wye-delta starter, the switching devices may be electromechanical single-pole, single current-carrying path switching devices independently operated by the control and monitoring circuitry 18. Additionally or alternatively, the switching devices may be single-pole, multiple current carrying path switching devices. Independent operation enables making/breaking at different times and in different orders. As depicted, the configuration of the switching devices is identical to the 5-pole wye-delta starter except for the addition of three mains lines switching devices in the 8-pole wye-delta starter embodiment. The 8-pole wye-delta starter 676 includes eight switching devices 678, 680, 682, 686, 688, 690, 692, and 694.

Specifically, the 8-pole wye-delta starter 676 includes two wye switching devices 678 and 680, three delta switching devices 682, 684, and 686, and three mains lines switching devices 688, 690, and 692. The three mains lines switching devices 688, 690, and 692 are electrically coupled to three-phase power from three mains lines 694, 696, and 698 and are further coupled to three motor windings 700, 702, and 704 and the delta switching devices 682, 684, and 686. The delta switching devices 682, 684, and 686 are also electrically coupled to the wye switching devices 678 and 680 and the windings 700, 702, and 704. An advantage of utilizing the mains line switching devices 688, 690, and 692 is that they may be utilized as disconnects in order to protect the electric motor 24 from undesirable maintenance by faulty conditions or the like. Additionally, utilizing the mains lines switching devices 688, 690, and 692 may enable testing condition of the electric motor 24 before performing a start. For example, as discussed above, phase-to-ground and phase-to-phase shorts may be tested using the mains lines switching devices. Further, the mains lines switching devices may act as disconnects in case a short is present or the windings need to be isolated from the mains power.

As depicted, the first delta switching device 682 and the first wye switching device 678 are coupled via a first interlock 706, and the second delta switching device 684 and the second wye switching device 680 are coupled via a second interlock 708. It should be noted that the interlocks 706 and 708 may be the mechanical interlocks described above. As such, only one of the first delta switching device 682 and the first wye switching device 678 may be closed at a time, and only one of the second delta switching device 684 and the second wye switching device 680 may be closed at a time.

Additionally, as depicted, the output of first delta switching device 682 and the output of first wye switching device 678 are electrically coupled via a first interconnection 738. Similarly, the output of the second delta switching device 684 and the output of second wye switching device 680 are electrically coupled via a second interconnection 744. Furthermore, the input of the first wye switching device 678, the input of the second wye switching device 680, and the output of the third delta switching device 686 are electrically coupled via a third interconnection 732.

The steps in the wye two-step start and the phase sequential wye-delta switching using eight switching devices are essentially the same as using five switching devices. However, in the circuit diagram 676 depicted in FIG. 64 there are three mains lines switching devices (694, 696, and 698) that are isolating the windings (700, 702, and 704). Thus, when a signal to start the motor is received by the 8-pole wye-delta starter, the mains line switching devices (688, 690, and 692) may close prior to running the wye two-step start and the phase sequential wye-delta switching. After the mains line switching devices are closed, the wye two-step start and the phase sequential wye-delta switching may be executed the same as the 5-pole wye-delta starter.

Specifically, the wye two-step start may begin by the second wye switching device 680 closing. Thus, windings 702 and 704 may be receiving power from line 696 to line 698. During the second step of the wye two-step start the first wye switching device 678 closes and a third phase of electric power (e.g., phase C) is connected from the mains line 694 to the first winding 700 of the electric motor 24. Thus, when the wye switching devices 678 and 680 and the mains line switching devices 688, 690, and 692 are the only switching devices in the 8-pole wye-delta starter 676 that are closed, the motor is running in a wye configuration.

When initiated, the 8-pole wye-delta starter 676 may execute phase sequential wye-delta switching. As such, the transition may begin by opening the first wye switching device 678. As a result of breaking switching device 678, only motor windings 702 and 704 are being supplied power. Next, the first delta switching device 682 may be closed, resulting in first winding 700 being connected line 696 to line 694 in delta. Windings 702 and 704 are still connected line 696 to line 698 in wye. Thus, as a result of the first delta switching device 682 closing, the windings 700, 702, and 704 are receiving three-phase unbalanced power due to the motor running in a mixed wye-delta configuration. Then, the second wye switching device 680 may be opened as the third step in the phase sequential wye-delta transition. As a result, only motor first winding 700 is receiving power and the electric motor 24 is single phasing. Further, the second delta switching device 684 may be closed after the opening of the second wye switching device 680, thereby providing power to second winding 702 in addition to 700.

The third delta switching device 686 may then be closed in order to complete the delta configuration. Thus, three-phase power being may be supplied via lines 694, 696, and 698 to the motor windings 700, 702, and 704 in a delta configuration. However, if at any time the control and monitoring circuitry 18 determines that power needs to be cut off from the electric motor 24, the mains line switching devices (688, 690, and 692) may be signaled to open one at a time or all at once. If POW techniques are utilized the openings may be ahead of current zero-crossings.

Figure 65:
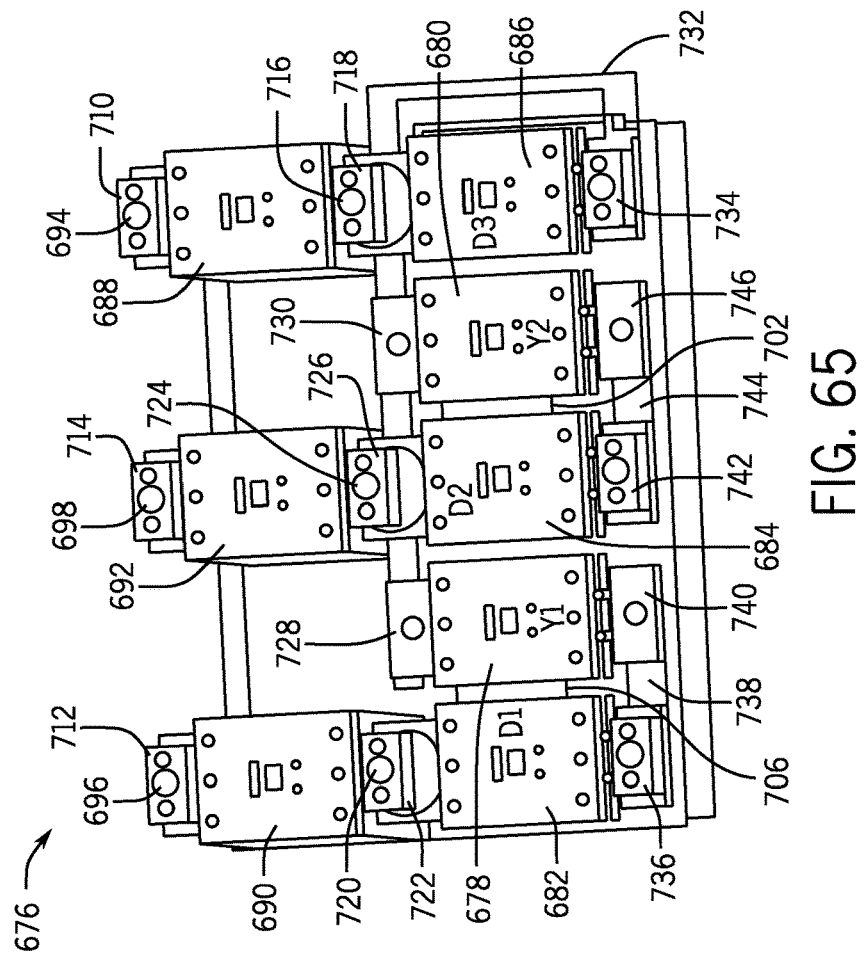
FIG. 65 is a top view of an assembly of single-pole switching devices to create the circuit of FIG. 64, in accordance with an embodiment.

In some embodiments, the 8-pole wye-delta starter 676 may be implemented with single-pole, single current-carrying path switching devices 218, as depicted in FIG. 65. More specifically, as depicted, the first mains line 696 is electrically coupled to input terminal 712 of the first mains line switching device 690, the second mains line 698 is electrically coupled to input terminal 714 of the second mains line switching device 692, and the third mains line 694 is electrically coupled to input terminal 710 of the third mains line switching device 688. The output terminal 716 of the third mains line switching device 688 is electrically coupled to the input terminal 718 of the third delta switching device 682, the output terminal 720 of the first mains line switching device 690 is electrically coupled to the input terminal 722 of the first delta switching device 682, and the output terminal 724 of the second mains line switching device 692 is electrically coupled to the input terminal 726 of the second delta switching device 684.

Additionally, the output terminal 736 of first delta switching device 682 and the output terminal 740 of the first wye switching device 678 are electrically coupled by the first interconnect 738 (e.g., a first bus bar). Similarly, the output terminal 742 of the second delta switching device 684 and the output terminal 746 of the second wye switching device 680 are electrically coupled by the second interconnect 744 (e.g., a second bus bar). Furthermore, the input terminal 728 of the first wye switching device 678, the input terminal 730 of the second wye switching device 746, and the output terminal 734 of the third delta switching device 686 are electrically coupled by the third interconnect 732 (e.g., a third bus bar).

Thus, the first winding 700 may be electrically coupled to either output terminal 736, output terminal 740, or the first interconnect 738. Additionally, the second winding 702 may be electrically coupled to either output terminal 742, output terminal 746, or the second interconnect 744. Furthermore, the third winding 704 may be electrically coupled to either output terminal 734, input terminal 728, input terminal 730, or the third interconnect 732

Additionally, as depicted, the first delta switching device 682 and the first wye switching device 678 are mechanically coupled by the first interlock 706. Similarly, the second delta switching device 684 and the second wye switching device 680 are mechanically coupled by the second interlock 702. It should be noted that the interlocks 702 and 706 may each be the mechanical interlock described above.

In another embodiment, the polyphase 6-pole wye-delta starter may be modified to isolate the motor windings by adding three mains line switching devices, which results in the polyphase 9-pole wye-delta starter 748 shown in FIG. 66. As with the 6-pole wye-delta starter, the switching devices may be electromechanical single-pole, single current-carrying path switching devices independently operated by the control and monitoring circuitry 18. Additionally or alternatively, the switching devices may include single-pole, multiple current carrying path switching devices. Independently operating the switching devices enables making/breaking at different times and in different orders. Further, the 9-pole wye-delta starter 748 may be enabled with or without POW techniques. As depicted, the configuration of the switching devices is almost identical as the 6-pole wye-delta starter except for the addition of three mains line switching devices in the 9-pole wye-delta starter embodiment. As such, the 9-pole wye-delta starter 748 includes nine switching devices 750, 752, 754, 756, 758, 760, 762, 764, and 766.

Specifically, the 9-pole wye-delta starter 748 includes three wye switching devices 750, 752, and 754, three delta switching devices 756, 758, and 760, and three mains line switching devices 762, 764, and 766. The three mains line switching devices are electrically coupled to three-phase power from three mains lines 768, 770, and 772 and are further electrically coupled to three motor windings 774, 776, and 778 and the delta switching devices 756, 758, and 760. The delta switching devices 756, 758, and 760 are also electrically coupled to the wye switching devices 750, 752, and 754 and the windings 774, 776, and 778. An advantage of utilizing the mains line switching devices 762, 764, and 766, is that they may be utilized as disconnects in order to protect the electric motor 24 from undesirable maintenance by faulty conditions or the like. By acting as a gatekeeper to the mains power, the mains line switching devices 762, 764, and 766 are able to isolate the windings 774, 776, and 778. Further, in some embodiments, the mains line switching devices 762, 764, and 766 may be utilized to test for phase-to-ground and phase-to-phase shorts before starting the motor.

As depicted, the first delta switching device 756 and the wye switching 750 are coupled via a first interlock 780, the second delta switching device 758 and the second wye switching device 752 are coupled via a second interlock 782, and the third delta switching device 760 and the third wye switching device 754 are coupled via a third interlock 784. It should be noted that the interlocks 780, 782, and 784 may be the mechanical interlocks described above. As such, only one of the first delta switching device 756 and the first wye switching device 750 may be closed at a time, only one of the second delta switching device 758 and the second wye switching device 752 may be closed at a time, and only one of the third delta switching device 760 and the third wye switching device 754 may be closed at a time.

Additionally, as depicted, the output of first delta switching device 756 and the output of first wye switching device 750 are electrically coupled via a first interconnection 826. Similarly, the output of the second delta switching device 758 and the output of second wye switching device 752 are electrically coupled via a second interconnection 832, and the output of the third delta switching device 760 and the output of the third wye switching device 754 are electrically coupled via a third interconnection 820. Furthermore, the input of the first wye switching device 750, the input of the second wye switching device 752, and the input of the third wye switching device 754 are electrically coupled via a fourth interconnection 831.

The steps in the wye two-step start and the phase sequential wye-delta switching using nine switching devices are essentially the same as using six switching devices. However, in the circuit diagram 748 depicted in FIG. 66 there are three mains line switching devices 762, 764, and 766 that are isolating the windings 774, 776, and 778. Thus, before running the wye two-step start and the phase sequential wye-delta switching, the control and monitoring circuitry 18 may send signals to close the mains line switching devices 762, 764, and 766). After the mains line switching devices are closed, the wye two-step start and the phase sequential wye-delta switching may be executed the same as the 6-pole wye-delta starter.

More specifically, the control and monitoring circuitry 18 may initiate the wye two-step start by closing the wye switching devices 754 and 752 simultaneously to connect windings 776 and 778 from line 770 to line 772. Then, in the second step of the wye two-step start, the third first wye switching device 750 may close in order to complete the wye configuration and provide power to first winding 774.

Once the electric motor 24 is running in wye configuration and the winding current waveforms have reached steady state, the phase sequential switching to delta may initiate. Alternatively, the phase sequential switching to delta may initiate any point after the motor is set in the wye configuration. In some embodiment, the first step in the sequence may include opening the wye switching devices 750. Thus, only windings 776 and 778 are connected and receiving power from line 770 to 772. Next, the switching device 756 may be closed to connect first winding 774 in delta. After switching device 756 closes, the motor is running in a mixed wye-delta configuration with first winding 774 in delta and windings 776 and 778 in wye. Then, the remaining two closed wye switching devices 752 and 754 may be opened simultaneously and the electric motor 24 may be single phasing (phase A) with only first winding 774 connected between line 768 to line 770. As a result, the windings 774, 776, and 778 may receive three-phase electric power from lines 768, 770, and 772, and the electric motor 24 is running in a delta configuration.

In some embodiments, the 9-pole wye-delta starter 676 may be implemented with single-pole, single current-carrying path switching devices 218, as depicted in FIG. 67. More specifically, as depicted, the first mains line 770 is electrically coupled to input terminal 788 of the first mains line switching device 764, the second mains line 772 is electrically coupled to input terminal 790 of the second mains line switching device 766, and the third mains line 768 is electrically coupled to input terminal 786 of the third mains line switching device 762. The output terminal 792 of the third mains line switching device 762 is electrically coupled to the input terminal 794 of the third delta switching device 760, the output terminal 798 of the first mains line switching device 764 is electrically coupled to the input terminal 800 of the first delta switching device 756, and the output terminal 804 of the second mains line switching device 766 is electrically coupled to the input terminal 806 of the second delta switching device 758.

Additionally, the output terminal 824 of first delta switching device 756 and the output terminal 828 of the first wye switching device 750 are electrically coupled by the first interconnect 828 (e.g., a first bus bar). Similarly, the output terminal 830 of the second delta switching device 758 and the output terminal 834 of the second wye switching device 752 are electrically coupled by the second interconnect 832 (e.g., a second bus bar), and the output terminal 828 of the third delta switching device 760 and the output terminal 822 of the third wye switching device 754 are electrically coupled by the third interconnect 820 (e.g., a third bus bar). Furthermore, the input terminal 814 of the first wye switching device 750, the input terminal 816 of the second wye switching device 752, and the input terminal 810 of the third wye switching device 754 are electrically coupled by the fourth interconnect 831 (e.g., a fourth bus bar).

Thus, the first winding 774 may be electrically coupled to either output terminal 824, output terminal 828, or the first interconnect 826. Additionally, the second winding 776 may be electrically coupled to either output terminal 830, output terminal 834, or the second interconnect 832. Furthermore, the third winding 704 may be electrically coupled to either output terminal 818, output terminal 822, or the third interconnect 826.

Additionally, as depicted, the first delta switching device 756 and the first wye switching device 750 are mechanically coupled by the first interlock 780. Similarly, the second delta switching device 758 and the second wye switching device 752 are mechanically coupled by the second interlock 782. Furthermore, the third delta switching device 760 and the third wye switching device 754 are mechanically coupled by the third interlock 784. It should be noted that the interlocks 780, 782, and 784 may each be the mechanical interlock described above.

Figures 68, 69:
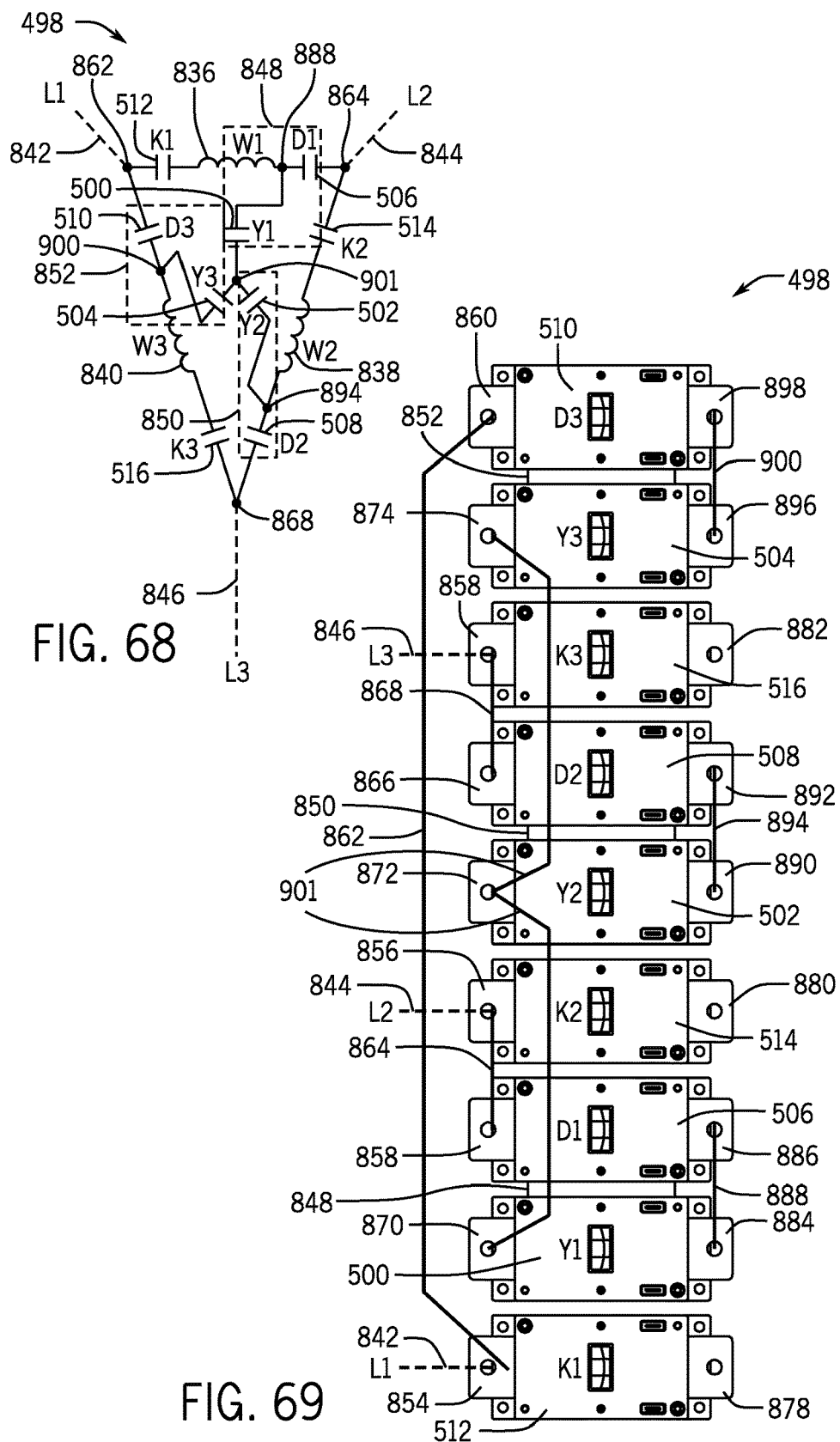
FIG. 68 is a diagrammatical representation of an circuit for an alternative 9 pole wye-delta starter constructed of multiple single-pole switching devices interconnected with one another, in accordance with an embodiment.
FIG. 69 is a top view of an assembly of single-pole switching devices to create the circuit of FIG. 68, in accordance with an embodiment.

An alternative embodiment of the 9-pole wye-delta starter 498 is depicted in FIG. 68. In this embodiment, instead of utilizing three mains line switching devices, this 9-pole wye-delta starter 498 utilizes three additional delta switching devices. Thus, the 9-pole wye-delta starter 498 includes three wye switching devices 500, 502, and 504 and six delta switching device 506, 508, 510, 512, 514, and 516. It should be noted that the switching devices may be electromechanical single-pole, single current-carrying path switching devices independently operated by the control and monitoring circuitry 18. Additionally or alternatively, the switching devices may include single-pole, multiple current-carrying path switching devices. Independently operating the switching devices enables making/breaking at different times and in different orders, among other things. Further, the 9-pole wye-delta starter 498 may be enabled with or without POW techniques. Similar to the previous embodiment of the 9-pole wye-delta starter 748, the depicted embodiment of the 9-pole wye-delta starter 498 isolates the motor windings 836, 838, and 840 from mains lines 842, 844, and 846 by utilizing the three additional delta switching devices 512, 514, and 516.

More specifically, the three mains lines 842, 844, and 846 supply three-phase power and are electrically coupled to the six delta switching devices 506, 508, 510, 512, 514, and 516. Three of the delta switching devices 512, 514, and 516 are further electrically coupled to the motor windings 836, 838, and 840, and the other three delta switching devices 506, 508, and 510 are further electrically coupled to the wye switching devices 500, 502, and 504 as well as the three motor windings 836, 838, and 840. Additionally, an advantage of utilizing the three additional delta switching devices 512, 514, and 516 to isolate the electric motor 24, is that they may be utilized as disconnects in order to protect the electric motor 24 from undesirable maintenance by faulty conditions or the like. Furthermore, in some embodiments, delta switching devices 506, 508, 510, 512, 514, and 516 may be utilized to test for phase-to-ground and phase-to-phase shorts before starting the motor.

In fact, the depicted embodiment may further improve detecting phase-to-phase shorts by reducing duration electrical power is applied during testing. More specifically, as depicted, when the first wye switching device 500 is open, the first delta switching device 506 and a first auxiliary delta switching device 512 are coupled in series with the first winding 836. Similarly, when the second wye switching device 502 is open, the second delta switching device 508 and a second auxiliary delta switching device 514 are coupled in series with the second winding 838. Furthermore, when the third wye switching device 504 is open, the third delta switching device 510 and a third auxiliary delta switching device 516 are coupled in series with the third winding 840. Thus, the opening/closing of each delta switching device and auxiliary delta switching device may be offset from one another. In this manner, duration the electric power is applied to the winding may be reduced even less than the minimum duration either of the switching devices is closed.

Additionally, as depicted, the first delta switching device 506 and the wye switching 500 are coupled via a first interlock 848, the second delta switching device 508 and the second wye switching device 502 are coupled via a second interlock 850, and the third delta switching device 510 and the third wye switching device 504 are coupled via a third interlock 852. It should be noted that the interlocks 848, 850, and 852 may be the mechanical interlocks described above. As such, only one of the first delta switching device 506 and the first wye switching device 500 may be closed at a time, only one of the second delta switching device 508 and the second wye switching device 502 may be closed at a time, and only one of the third delta switching device 510 and the third wye switching device 504 may be closed at a time.

Similar to the previously described embodiment of the 9-pole wye-delta starter 748, the output of first delta switching device 506 and the output of first wye switching device 500 are electrically coupled via a first interconnection 888. Similarly, the output of the second delta switching device 508 and the output of second wye switching device 502 are electrically coupled via a second interconnection 894, and the output of the third delta switching device 510 and the output of the third wye switching device 504 are electrically coupled via a third interconnection 900. Furthermore, the input of the first wye switching device 500, the input of the second wye switching device 502, and the input of the third wye switching device 504 are electrically coupled via a fourth interconnection 901.

Additionally, since the 9-pole wye-delta starter 498 include auxiliary delta switching devices instead of mains switching devices, the input of the first auxiliary delta switching device 512 and the third delta switching device 510 are electrically coupled via a fifth interconnection 862. Similarly, the input of the second auxiliary delta switching device 514 and the input of the first delta switching device 506 are electrically coupled via a sixth interconnection 864. Furthermore, the input of the third auxiliary switching device 516 and the input of the second delta switching device 508 are electrically coupled via a seventh interconnection 868.

The steps in the wye two-step start and the phase sequential wye-delta switching using nine switching devices are essentially the same as using six switching devices. However, in the depicted circuit diagram 498 there are three auxiliary delta switching devices (512, 514, and 516) may isolate the windings (836, 838, and 840). Thus, before running the wye two-step start and the phase sequential wye-delta switching, the control and monitoring circuitry 18 may send signals to close the auxiliary delta switching devices (512, 514, and 516). After the auxiliary delta switching devices are closed, the wye two-step start and the phase sequential wye-delta switching may be executed the same as the 6-pole wye-delta starter as discussed above with reference to the other embodiment of the 9-pole wye-delta starter FIG. 66.

In some embodiments, the 9-pole wye-delta starter 498 may be implemented with single-pole, single current-carrying path switching devices 218, as depicted in FIG. 69. More specifically, the output terminal 886 of first delta switching device 506 and the output terminal 884 of the first wye switching device 500 are electrically coupled by the first interconnect 888 (e.g., a first bus bar). Similarly, the output terminal 892 of the second delta switching device 508 and the output terminal 890 of the second wye switching device 502 are electrically coupled by the second interconnect 894 (e.g., a second bus bar). Furthermore, and the output terminal 898 of the third delta switching device 510 and the output terminal 896 of the third wye switching device 504 are electrically coupled by the third interconnect 900 (e.g., a third bus bar). Furthermore, the input terminal 870 of the first wye switching device 500, the input terminal 872 of the second wye switching device 502, and the input terminal 874 of the third wye switching device 504 are electrically coupled by the fourth interconnect 901 (e.g., a fourth bus bar).

Thus, the first winding 836 may be electrically coupled to either output terminal 884, output terminal 886, or the first interconnect 888. Additionally, the second winding 838 may be electrically coupled to either output terminal 890, output terminal 892, or the second interconnect 894. Furthermore, the third winding 840 may be electrically coupled to either output terminal 896, output terminal 898, or the third interconnect 900.

Additionally, as depicted, the input terminal 854 of the first auxiliary delta switching device 512 and the input terminal of the third delta switching device 512 are electrically coupled by the fifth interconnection 862 (e.g., a fifth bus bar). Similarly, the input terminal 856 of second auxiliary delta switching device 514 and the input terminal of the first delta switching device 506 are electrically coupled by the sixth interconnection 864 (e.g., a sixth bus bar). Furthermore, the input terminal 858 of the third auxiliary delta switching device 516 and the input terminal 866 of the second delta switching device 508 are electrically coupled by the seventh interconnection 868 (e.g., a seventh bus bar).

Thus, the first mains line 842 may be electrically coupled to either input terminal 854, input terminal 860, or the fifth interconnection 862. Additionally, the second mains line 844 may be electrically coupled to either input terminal 856, input terminal 858, or the sixth interconnection 864. Furthermore, the third mains line 846 may be electrically coupled to either input terminal 858, input terminal 866, or seventh interconnection 868.

Furthermore, as depicted, the first delta switching device 506 and the first wye switching device 500 are mechanically coupled by the first interlock 848. Similarly, the second delta switching device 508 and the second wye switching device 502 are mechanically coupled by the second interlock 850. Furthermore, the third delta switching device 510 and the third wye switching device 504 are mechanically coupled by the third interlock 852. It should be noted that the interlocks 848, 850, and 852 may each be the mechanical interlock described above.

As evidenced by the varying configurations of a 9-pole wye-delta starter, one of ordinary skill the art should appreciate that the modularity provided be single pole, single current carrying path switching device 218 enables varying advantages, such as adjusting configuration based on size constraints. For example, one arrangement may be desirable over the other depending on various factors (e.g., the enclosure constraints, location of the electric motor 24, etc.), and while either may achieve similar functions.

Figure 70:
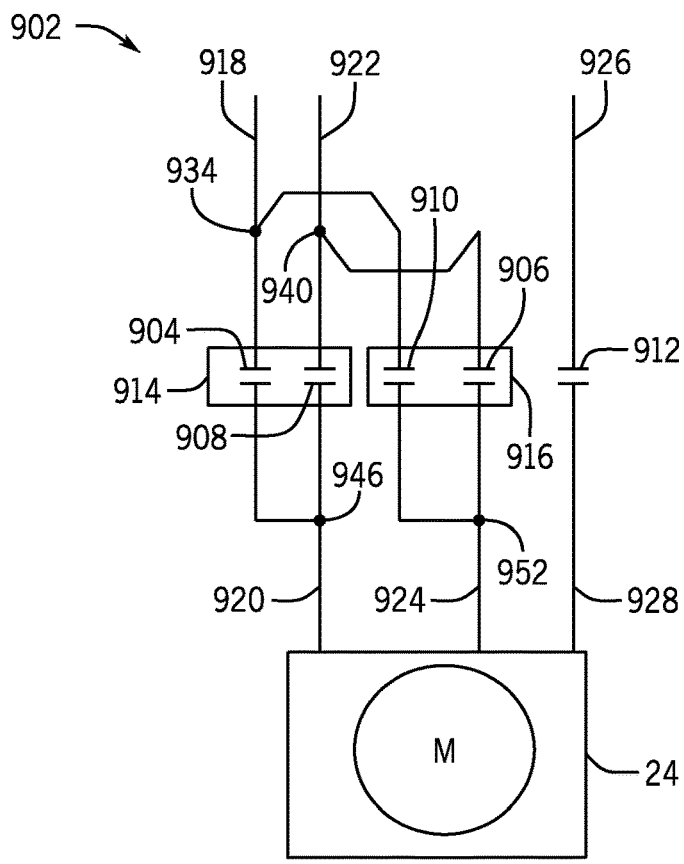
FIG. 70 is a diagrammatical representation of a circuit for a 5 pole reverser constructed of multiple single-pole switching devices interconnected with one another, in accordance with an embodiment.

In addition to the wye-delta starters, other devices may also utilize the techniques described herein, such as an electric motor reverser, a two speed motor, or a motor drive bypass. To help illustrate, one embodiment of an electric motor reverser 902, is shown in FIG. 70. As depicted, the reverser 902 includes a first forward switching device 904, a second forward switching device 906, a first reverse switching device 908, a second reverse switching device 910, and a common switching device 912. More specifically, as depicted, the input of the first forward switching device 904 and the input of the second reverse switching device 910 are electrically coupled by a first interconnect 934. Similarly, the input of the first reverse switching device 908 and the input of the second forward switching device 906 are electrically coupled by a second interconnect 940. Furthermore, the output of the first forward switching device 904 and the output of the first reverse switching device 908 are electrically coupled by a third interconnect 946. Similarly, the output of the second reverse switching device 910 and the output of the second forward switching device 906 are electrically coupled by a fourth interconnect 952.

Additionally, as depicted, the first forward switching device 904 and the first reverse switching device 908 are coupled via a first interlock 914, and the second forward switching device 906 and the second reverse switching device 910 are coupled via a second interlock 916. In other words, only one of the first forward switching device 904 and the first reverse switching device 908 may be closed at a time. Similarly, only one of the second forward switching device 906 and the second reverse switching device 910 may be closed at a time. Additionally, operation of the reverser 902 may generally be controlled by the control and monitoring circuitry 18.

In the depicted embodiment, when the first forward switching device 904 is closed, a first phase of electric power (e.g., phase A) is connected from the first mains line 918 to the first motor terminal 920 of the electric motor 24; when the second forward switching device 906 is closed, a second phase of electric power (e.g., phase B) is connected from the second mains line 922 to the second motor terminal 924 of the electric motor 24; and when the common switching device 912 is closed, a third phase of electric power (e.g., phase C) is connected from the third mains line 926 to the third motor terminal 928 of the electric motor 24. Thus, when the first forward switching device 904, the second forward switching device 906, and the common switching device 912 are closed, the motor rotates in a forward direction (e.g., first direction).

Generally, a reverser may change the rotational direction of an electric motor 24 (e.g., from forward to reverse) by disconnected electric power and reconnecting the electric power with two of the phases switched. Accordingly, in some embodiments, to reverse the electric motor, the control and monitoring circuitry 18 may break the first forward switching device 904, the second forward switching device 906, and the common switching device 912. For example, the second forward switching device 906 may be opened based upon a first current zero-crossing, and the first forward switching device 904 and the common switching device 912 may be opened based upon a subsequent zero-crossing. Additionally or alternatively, POW techniques are not used and the switching devices may be opened after a brief delay.

Then, the first reverse switching device 908, second reverse switching device 910, and the common switching device 912 may be closed. For example, the second reverse switching device 910 and the common switching device 912 may be closed based upon a first predicted current zero-crossing (e.g., maximum line-to-line voltage), and the first reverse switching device 908 may be closed based upon a subsequent predicted current zero-crossing. More specifically, when the first reverse switching device 908 is closed, the second phase of electric power (e.g., phase B) is connected from the second mains line 922 to the first motor terminal 920; when the second reverse switching device 910 is closed, the first phase of electric power (e.g., phase A) is connected from the first mains line 918 to the second motor terminal 924, and when the common switching device 912 is closed, the third phase of electric power (e.g., phase C) is connected from the third mains line 926 to the third motor terminal 928. Thus, when the first reverse switching device 908, the second reverse switching device 910, and the common switching device 912 are closed, the motor rotates in the reverse direction (e.g., opposite direction).

In some embodiments, since the common switching device 912 simply disconnects and reconnects the same phase of electric power (e.g., phase C) to the same motor terminal (e.g., third motor terminal) of the electric motor, the common switching device 912 may remain closed during the reverse operation. In such embodiments, even though the common switching device 912 remains closed, the common switching device 912 may still be included to disconnect the third phase of electric power from the electric motor 24. Additionally or alternatively, in other embodiments, the common switching device 912 may be removed entirely.

In either embodiment where the one phase of electric power remains connected during the reverse operation, the control and monitoring circuitry 18 may break the first forward switching device 904 and the second forward switching device 906. For example, the second forward switching device 906 may be opened based upon a first current zero-crossing and the first forward switching device 904 may be opened based upon a subsequent current zero-crossing. Then the control and monitoring circuitry may make the first reverse switching device 908 and the second reverse switching device 910. For example, the second reverse switching device 910 may be closed based upon a first predicted current zero-crossing and the first reverse switching device 908 may be closed based upon a subsequent predicted current zero-crossing.

Figure 71:
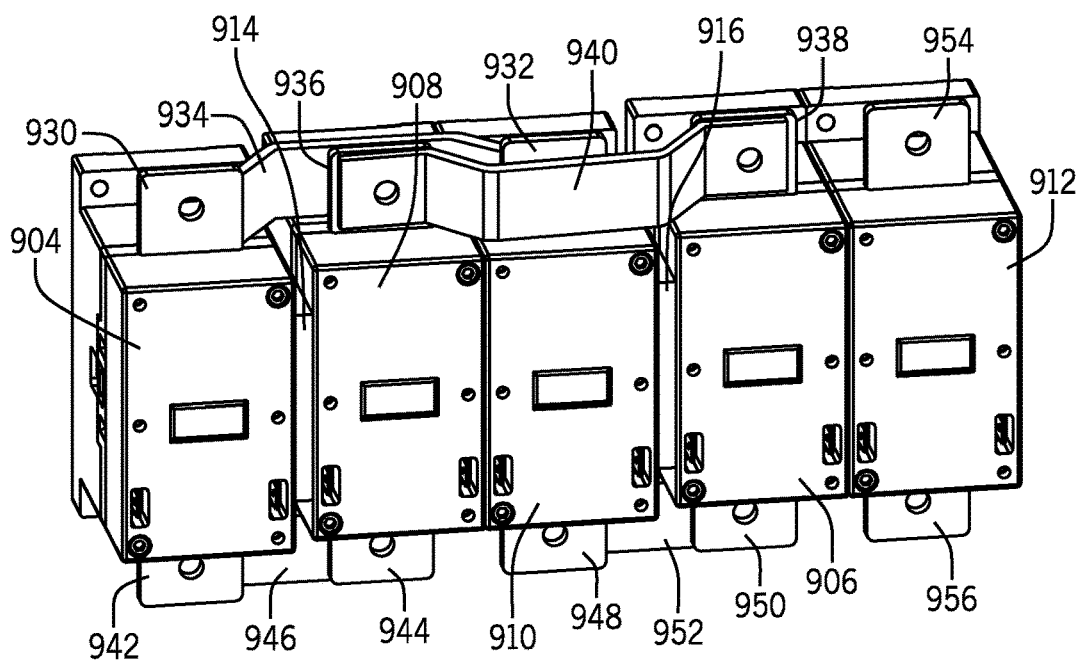
FIG. 71 is a top view of an assembly of single-pole switching devices to create the circuit of FIG. 70, in accordance with an embodiment.

In some of the embodiments of the reverser 902 described above, each switching device may be controlled independently. For example, as described above, the first forward switching device 904 and the second forward switching device 906 may make/break at different times and in different orders. Accordingly, to improve the control over each switching device, the reverser 902 may be implemented with single-pole switching devices (e.g., single-pole, single current-carrying path switching devices 218), as depicted in FIG. 71.

To implement the reverser 902, as depicted, the input terminal 930 of the first forward switching device 904 and the input terminal 932 of the second reverse switching device 910 are electrically coupled via the first interconnection 934 (e.g., a first bus bar). Thus, the first mains line 918 may be connected to either input terminal 930, input terminal 932, or the first interconnection 934. Additionally, as depicted, the input terminal 936 of the first reverse switching device 908 and the input terminal 938 of the second forward switching device 906 are electrically coupled via the second interconnection 940 (e.g., a second bus bar). Thus, the second mains line 922 may be connected to either input terminal 936 or 938.

On the output side, the output terminal 942 of the first forward switching device 904 and the output terminal 944 of the first reverse switching device 908 are electrically coupled via the third interconnect 946 (e.g., a third bus bar). Thus, the first motor terminal 920 may be connected to either output terminal 942, output terminal 944, or the third interconnect 946. Additionally, as depicted, the output terminal 948 of the second reverse switching device 910 and the output terminal 950 of the second forward switching device 906 are electrically coupled via the fourth interconnect 952 (e.g., a fourth bus bar). Thus, the second motor terminal 924 may be connected to either output terminal 948, output terminal 950, or the fourth interconnect 952.

Furthermore, in the depicted embodiment, the input terminal 954 of the common switching device 912 may be connected to the third mains line 926 and the output terminal 956 of the common switching device 912 may be connected to the third motor terminal 928. As described above, the reverser 902 may be implemented with or without the common switching device 912. Thus, the modular nature of the single-pole path switching devices 218 (e.g., single-pole, single current-carrying path switching devices) enables each implementation to be individually configured. For example, in a first configuration, the reverser 902 may include the common switching device 912, but in a second configuration, the reverser 902 may exclude the common switching device 912. Even though the common switching device 912 is excluded in the second configuration, the configuration of the remaining switching devices (e.g., 904-910) will largely remain the same.

Figure 72:
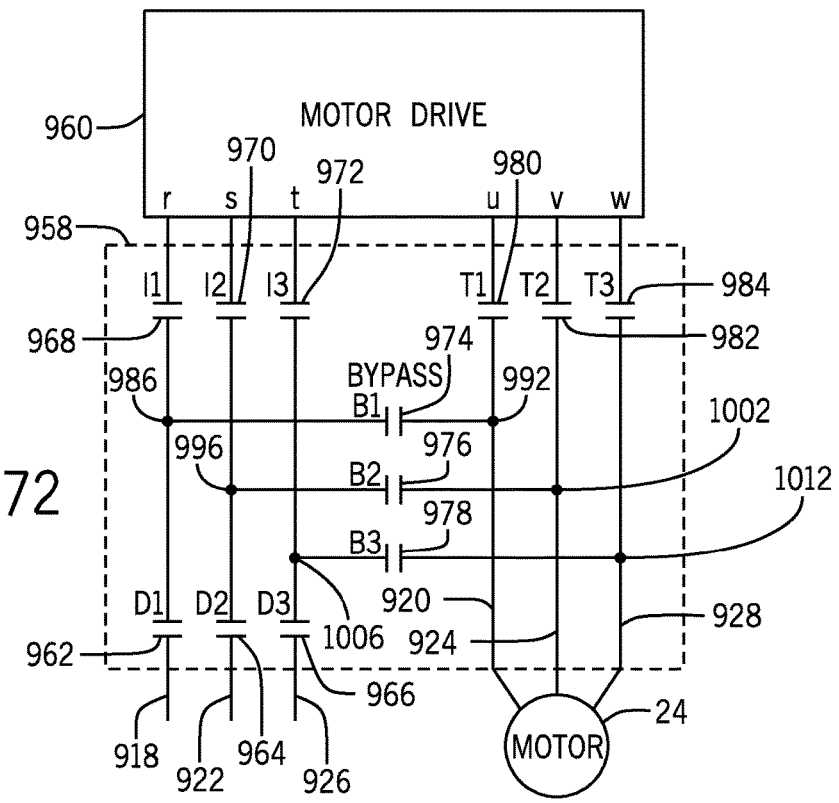
FIG. 72 is a diagrammatical representation of a circuit for a motor drive bypass constructed of multiple single-pole switching devices interconnected with one another, in accordance with an embodiment.

Similar to the motor reverser 902, a two speed motor may be implemented using five single pole, single current carrying path switching devices 218. As described above, a motor drive bypass may also utilize the techniques described herein. To help illustrate, one embodiment of a motor drive bypass 958 that may be utilized to bypass the motor drive 960, is shown in FIG. 72. In some embodiments, the motor drive 960 may be a soft starter, across the line starter, variable frequency drive, or the like.

As depicted, the motor drive bypass 958 includes a first mains disconnect 962, a second mains disconnect 964, a third mains disconnect 966, a first input disconnect 968, a second input disconnect 970, a third input disconnect 972, a first bypass switching device 974, a second bypass switching device 976, a third bypass switching device 978, a first output disconnect 980, a second output disconnect 982, and a third output disconnect 984 (e.g., switching devices). More specifically, the output of the first mains disconnect 962, the input of the first input disconnect 968, and the input of the first bypass switching device 974 are electrically coupled by a first interconnect 986. Similarly, the output of the second mains disconnect 964, the input of the second input disconnect 970, and the input of the second bypass switching device 976 are electrically coupled by a second interconnect 996. Furthermore, the output of the third mains disconnect 926, the input of the third input disconnect 972, and the input of the third bypass switching device 978 are electrically coupled by a third interconnect 1006.

Additionally, as depicted, the output of the first bypass switching device 974 and the output of the first output disconnect 980 are electrically coupled by a fourth interconnect 992. Similarly, the output of the second bypass switching device 976 and the output of the second output disconnect 982 are electrically coupled by a fifth interconnect 1002. Furthermore, the output of the third bypass switching device 978 and the output of the third output disconnect 984 are electrically coupled by a sixth interconnect 1012.

Operation of the motor drive bypass 958 may generally be controlled by the control and monitoring circuitry 18. Generally, when the disconnects are closed and the bypass switching devices 974-978 are open, the motor drive 960 receives three-phase electric power and outputs three-phase electric power. For example, in the depicted embodiment, the r input of the motor drive 960 receives a first phase of electric power (e.g., phase A) from the first mains line 918, the s input of the motor drive 960 receives a second phase of electric power (e.g., phase B) from the second mains line 922, and the t input of the motor drive 960 receives a third phase of electric power (e.g., phase C) from the third mains line 926. Additionally, the u output of the motor drive 960 outputs the first phase of electric power to the first motor terminal 920, the v output of the motor drive 960 outputs the second phase of electric power to the second motor terminal 924, and the w output of the motor drive 960 outputs the third phase of electric power to the third motor terminal 928. It should be noted that other motor or load controlling devices may be used.

Accordingly, control and monitoring circuitry 18 may utilize the mains disconnects 962-966 to selectively connect and disconnect electric power from both the motor driver 960 and the electric motor 24. More specifically, when the first mains disconnect 962 is opened, the first phase of electric power is disconnected; when the second mains disconnect 964 is opened, the second phase of electric power is disconnected; and when the third mains disconnect 966 is opened, the third phase of electric power is disconnected. For example, the second mains disconnect 964 may be opened based upon a first current zero-crossing, and the first mains disconnect 962 and the third mains disconnect 966 may be opened based upon a subsequent current zero-crossing. However, in some embodiments, POW techniques may not be used and the switching devices may be closed and opened in any desired manner. In some embodiments, the mains disconnects 962-966 may be optionally excluded because the electric power may be selectively connected and disconnected from both the motor drive 960 and the electric motor 24, for example, by the input disconnects 966-970.

Instead of completely disconnecting electric power to the electric motor 24, at times, it may be desirable to disconnect electric power from the motor drive 960 but continue supplying power to the electric motor 24, for example, to reduce power consumption or to perform maintenance on the motor drive 960. Accordingly, the bypass switching devices 974-978 may be closed to bypass the motor drive 960.

More specifically, control and monitoring circuitry 18 may open the input disconnects 968-972 and the output disconnects 980-984 to disconnect electric power from the motor drive 960. In some embodiments, the input disconnects 968-972 may be opened substantially simultaneously. In other embodiments, the input disconnects 968-972 may be opened using point-on-wave (POW) techniques. For example, the second input disconnect 970 may be opened based upon a first current zero-crossing, and the first input disconnect 968 and the third input disconnect 972 may be opened based upon a subsequent current zero-crossing. Similarly, in some embodiments, the output disconnects 980-984 may be opened substantially simultaneously. In other embodiments, the output disconnects 980-984 may be opened using POW techniques. For example, the second output disconnect 982 may be opened based upon a first current zero-crossing, and the first output disconnect 980 and the third output disconnect 984 may be opened based upon a subsequent current zero-crossing.

To reduce the possibility of electric power being back fed into the motor drive 960 via the outputs, the bypass switching devices 974-978 may be closed after the output disconnects 980-984 are opened. In some embodiments, the bypass switching devices 974-978 may be closed substantially simultaneously. In other embodiments, the bypass switching devices 974-978 may be closed using POW techniques. For example, the first bypass switching device 974 and the third bypass switching device 978 may close based upon a first predicted current zero-crossing, and the second bypass switching device 976 may close based upon a subsequent predicted current zero-crossing.

Once the bypass switching device 974-978 make, the first phase of electric power may be supplied from the first mains lines 918 through the first bypass switching device 974 to the first motor terminal 920, the second phase of electric power may be supplied from the second mains lines 922 through the second bypass switching device 976 to the second motor terminal 924, and the third phase of electric power may be supplied from the third mains line 926 through the third bypass switching device 978 to the third motor terminal 928. In other words, the drive bypass 958 enables the electric motor 24 to continue actuating even after the motor drive 960 is bypassed. This may prove especially useful for high reliability systems, such as a waste management system.

Figure 73:
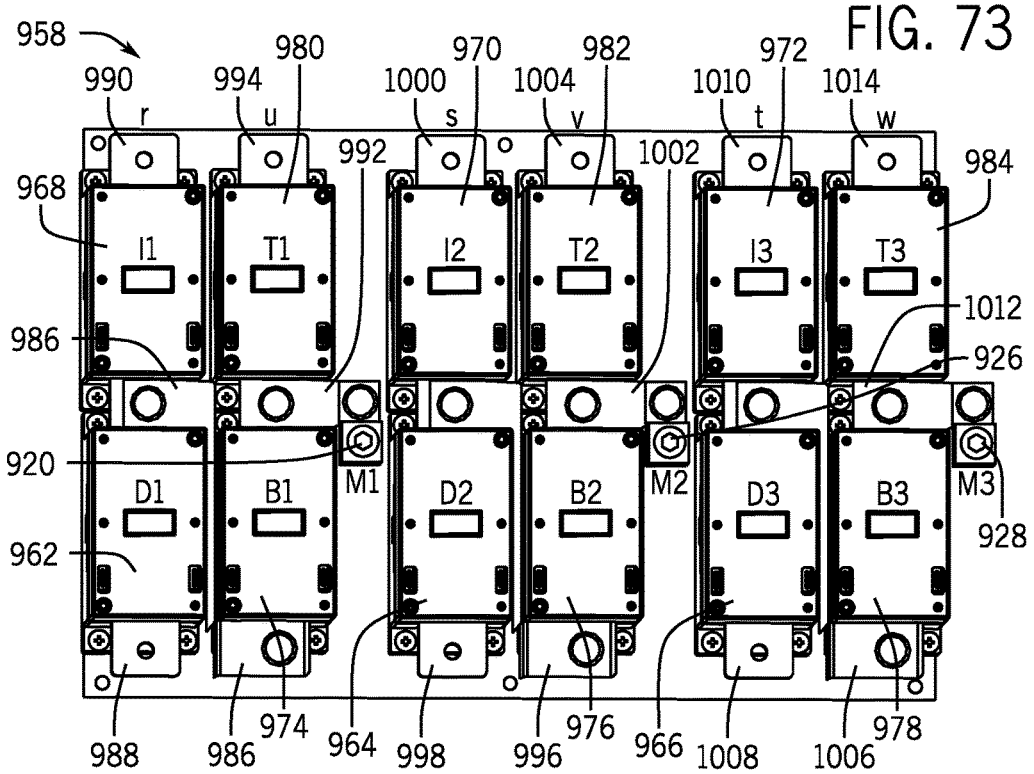
FIG. 73 is a top view of an assembly of single-pole switching devices to create the circuit of FIG. 72, in accordance with an embodiment.

In some of the embodiments of the drive bypass 958 described above, each switching device may be controlled independently. For example, as described above, the first bypass switching device 974 and the second bypass switching device 976 may make/break at different times and in different orders. Accordingly, to improve the control over each switching device, the drive bypass 958 may be implemented with single-pole switching devices 218 (e.g., single-pole, single current-carrying path switching devices), as depicted in FIG. 73.

To implement the drive bypass 958, as depicted, the output terminal of the first mains disconnect 962 is electrically coupled to the input terminal of the first input disconnect 968 and the input terminal of the first bypass switching device 974 via the first interconnect 986 (e.g., a first bus bar). Thus, the first mains line 918 may be connected to the input terminal 988 of the first mains disconnect 962 and the output terminal 990 of the first input disconnect 968 may be connected to the r input of the motor drive 960.

Similarly, as depicted, the output terminal of the second mains disconnect 964 is electrically coupled to the input terminal of the second input disconnect 970 and the input terminal of the second bypass switching device 976 via the second interconnect (e.g., a second bus bar). Thus, the second mains line 922 may be connected to the input terminal 998 of the second mains disconnect 964 and the output terminal 1000 of the second input disconnect 970 may be connected to the s input of the motor drive 960.

Furthermore, as depicted, the output terminal of the third mains disconnect 966 is electrically coupled to the input terminal of the third input disconnect 972 and the input terminal of the third bypass switching device 978 via the third interconnect 1006 (e.g., a third bus bar). Thus, the third mains line 926 may be connected to the input terminal 1008 of the third mains disconnect 966 and the output terminal 1010 of the third input disconnect 970 may be connected to the t input of the motor drive 960.

As depicted, the output terminal of the first output disconnect 980 and the output terminal of the first bypass switching device 974 are electrically coupled by the fourth interconnect 992 (e.g., a fourth bus bar). Similarly, the output terminal of the second output disconnect 982 and the output terminal of the second bypass switching device 974 are electrically coupled by the fifth interconnect 1002 (e.g., a fifth bus bar). Additionally, the output terminal of the third output disconnect 984 and the output terminal of the third bypass switching device 978 are electrically coupled by the sixth interconnect 1012 (e.g., a sixth bus bar).

Thus, the input terminal 994 of the first output disconnect 980 may be connected to the u output of the motor drive 960, the input terminal 1004 of the second output disconnect 982, may be connected to the v output of the motor drive 960, and the input terminal 1014 of the third output disconnect 984 may be connected to the w output of the motor drive 960. Moreover, the first motor terminal 920 may be electrically coupled to the output terminal of the first output disconnect 980, the output terminal of the first bypass switching device 974, or the fourth interconnect 992. Similarly, the second motor terminal 924 may be electrically coupled to the output terminal of the second output disconnect 982, the output terminal of the second bypass switching device 976, or the fifth interconnect 1002. Furthermore, the third motor terminal 928 may be electrically coupled to the output terminal of the third output disconnect 984, the output terminal of the third bypass switching device 978, or the sixth interconnect 1012.

Additionally, as described above, the drive bypass 958 may be implemented with or without the main line disconnects 962-966. Thus, the modular nature of the single-pole switching devices 218 (e.g., single-pole, single current-carrying path switching devices) enables each implementation to be individually configured. For example, in a first configuration, the drive bypass 958 may include the main line disconnects 962-966, but in a second configuration, the drive bypass 958 may exclude the main line disconnects 962-966. In fact, in some embodiments, excluding the main line disconnects 962-966 may enable the bypass switching devices 974-978 and the output disconnects 980-984 to be adjacent with a mechanical interlock placed therebetween. Moreover, by adjusting the size and length of the bus bars may enable the placement of each switching device 218 to be individually determined.

Figure 74:
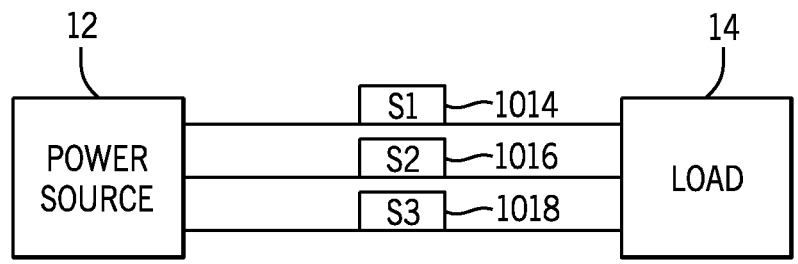
FIG. 74 is a diagrammatical representation of a three single-pole switching device configuration used in various control schemes, in accordance with an embodiment.

Starting with FIG. 74, the single-pole switching devices 1014, 1016, and 1018 may function as a three pole contactor using direct on line (DOL) operation to connect and disconnect three phase power from the power source 12 to the load 14. It should be appreciated that the configuration depicted in FIG. 74 may function as a three pole contactor using DOL with or without POW techniques. As described above, various benefits may be achieved using POW techniques, such as reducing inrush current when closing and inhibiting arcing when opening.

In some embodiments, each of the single-pole switching devices 1014, 1016, and 1018 may be independently controllable and can be operated in any desired sequence. For example, each single-pole switching device may be opened/closed at the same time. In another example, two of the single-pole switching devices 1014 and 1016 may be opened/closed at a first time and a third single-pole switching device 1018 may be closed at a second time after the first time. In yet another example, one of the single-pole switching devices 1014 may be opened/closed at first time and then the other two single-pole switching devices 1016 and 1018 may be closed at a second time after the first time.

To this end, using single-pole switching devices enables taking turns between the order with which the single-pole switching devices are opened/closed to enable reducing wear and tear on the switching devices. For example, the single-pole switching device that breaks first during one operation may be controlled to break last in a subsequent operation. Indeed, certain schemes may be used, such as round robin, when selecting the order in which to break and/or make the single-pole switching devices.

Figure 75:
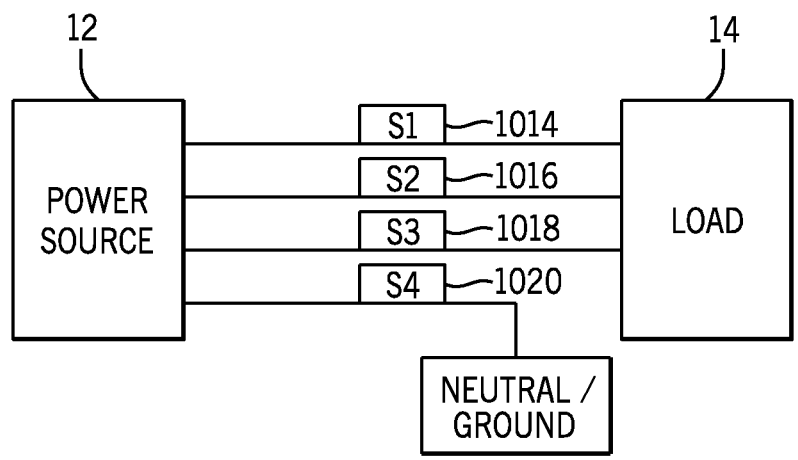
FIG. 75 is a diagrammatical representation of a four single-pole switching device configuration used in various control schemes, in accordance with an embodiment.

FIG. 75 depicts the three single-pole switching devices 1014, 1016, and 1018 with an added fourth single-pole switching device 1020 used as a neutral or ground. The single-pole switching devices 1014, 1016, 1018, and 1020 may supply power from the power source 12 to the load 14. Essentially, in some embodiments, the depicted configuration may be operated in the same way as the configuration in FIG. 74 as a standard three pole contactor using DOL operation with or without POW techniques but accounting for the fourth single-pole switching device 1020 to connect and disconnect to ground as desired. Additionally, in some embodiments, the four single-pole switching devices 1014, 1016, 1018, and 1020 may be independently controlled to connect and disconnect in any sequence to function as a soft starter for a motor (e.g., using wye-delta) with or without POW techniques, as described above.

The modular configurations of single-pole switching devices described above may be achieved through various connection arrangements as shown in FIGS. 76-80. As may be appreciated, the design of the power terminals on the single-pole switching devices may be modified as desired to enable the switching devices to be connected in multiple ways that may reduce wiring complexity and configuration size.

Figure 76:
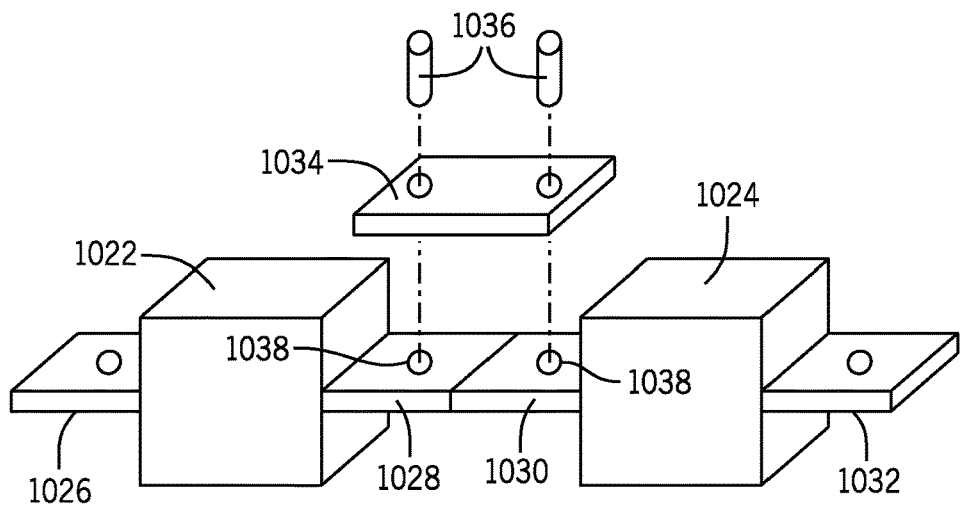
FIG. 76 is a perspective view of two single-pole switching devices connected via a bus bar, in accordance with an embodiment.

For example, FIG. 76 illustrates two identical single-pole switching devices 1022 and 1024 arranged next to one another. The single-pole switching device 1022 and 1024 each includes two power terminals located at the same height protruding from two opposite sides of the switching devices 1022 and 1024. That is, the single-pole switching device 1022 includes a first power terminal 1026 and a second power terminal 1028 at the same height and the single-pole switching device 1024 includes a first power terminal 1030 and a second power terminal 1032 at the same height. As depicted, the second power terminal 1028 of the single-pole switching device 1022 is aligned with the first power terminal 1030 of the single-pole switching device 1024. The power terminals 1028 and 1030 may be connected using a bus bar 1034 with connecting pins 1036 that are inserted through apertures 1038 in the bus bar 1034 and the power terminals 1028 and 1030.

Figure 77:
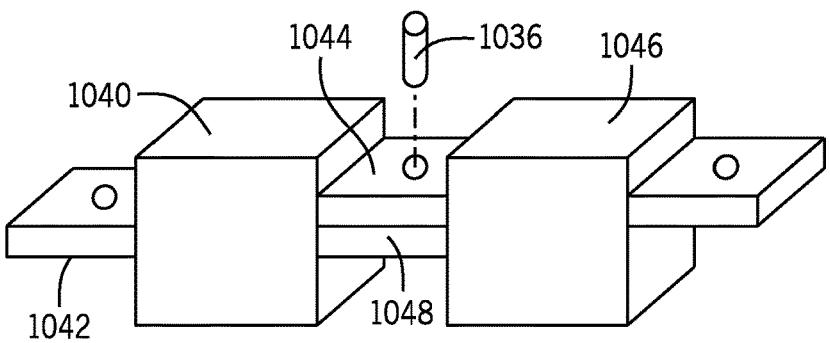
FIG. 77 is a perspective view of two single-pole switching devices with varying height power terminals connected via a single connector pin, in accordance with an embodiment.

In another embodiment, the power terminals of the single-pole switching devices may be located at different heights on the two opposing sides, as shown in FIG. 77. As illustrated, a single-pole switching device 1040 includes a first power terminal 1042 located at a lower height on one side than a second power terminal 1044 on an opposing side of the single-pole switching device 1040. Using an identical single-pole switching device 1046 with power terminals located at the same heights, the two switching devices 1040 and 1046 may be connected by overlapping the power terminals. As shown, a first power terminal 1048 of the single-pole switching device 1046 aligns underneath the second power terminal 1044 of the single-pole switching device 1040, and the power terminals 1044 and 1048 are connected via a connecting pin 1036. As such, the depicted configuration may obviate use of a bus bar to connect the single-pole switching devices 1040 and 1046.

Figure 78:
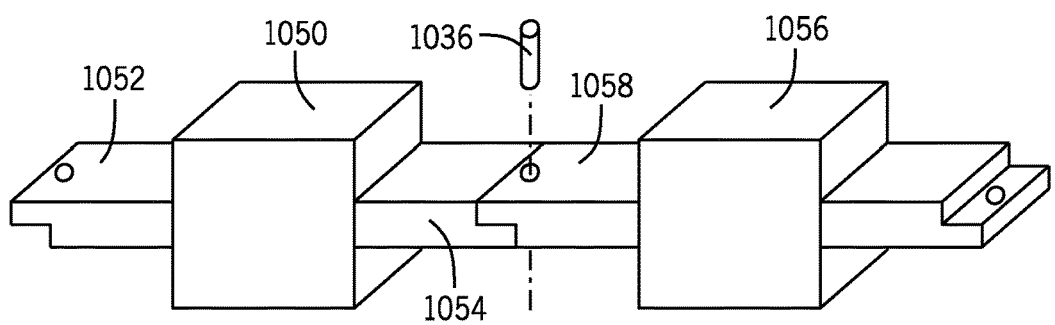
FIG. 78 is a perspective view of two single-pole switching devices with mating power terminals connected via a single connector pin, in accordance with an embodiment.

In another embodiment, the power terminals of the single-pole switching devices may be configured to fit together, as shown in FIG. 78. As illustrated, a single-pole switching device 1050 includes a first power terminal 1052 with a groove on the bottom of the terminal on one side and a second power terminal 1054 with a groove on the top of the terminal that matches the groove of the first power terminal 1052 on the opposing side. Using an identical single-pole switching device 1056 with power terminals including the grooves, the two switching devices 1050 and 1056 may be connected by mating the power terminals together. As shown, a first power terminal 1058 of the single-pole switching device 1056 fits with the second power terminal 1054 of the single-pole switching device 1050 by mating grooves, and the power terminals 1054 and 1058 are connected via a single connecting pin 1036. As such, the depicted configuration may obviate use of a bus bar to connect the single-pole switching devices 1050 and 1056.

Figure 79:
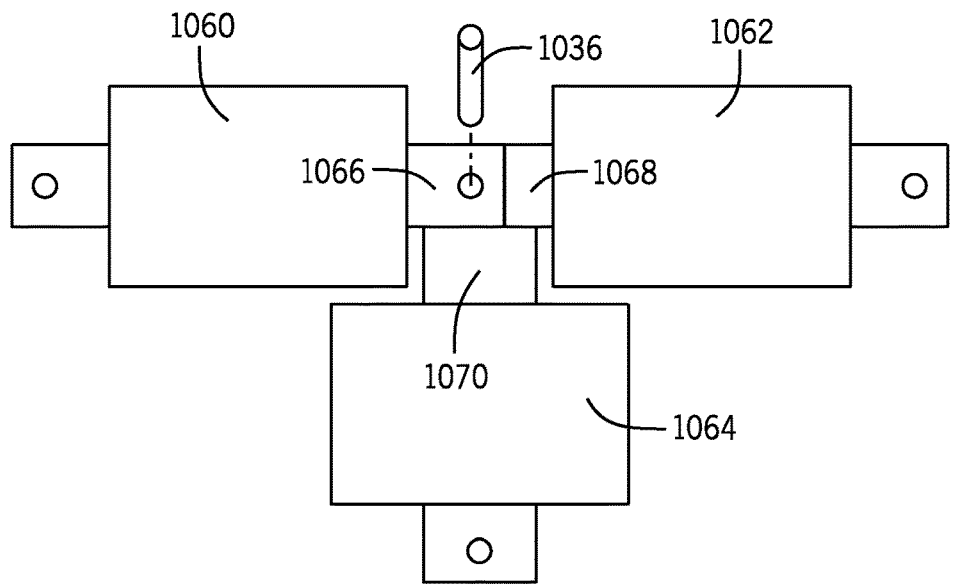
FIG. 79 is a top view of three single-pole switching devices with varying height power terminals connected via a single connector pin, in accordance with an embodiment.
Figure 80:
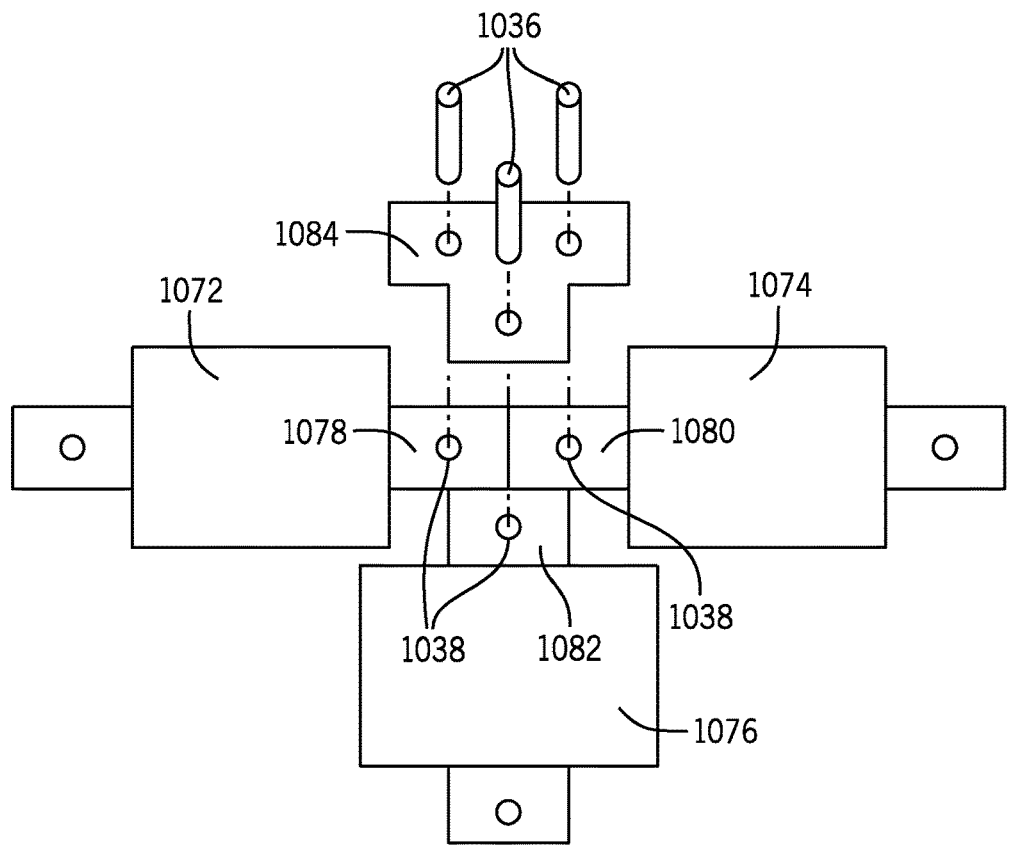
FIG. 80 is a top view of three single-pole switching devices connected via a "T" bus bar, in accordance with an embodiment.

FIGS. 79 and 80 depict top views of various configurations of more than two single-pole switching devices that reduce the amount of wiring needed to connect the switching devices. For example, FIG. 79 illustrates single-pole switching devices 1060, 1062, and 1064 that include power terminals at varying heights so the power terminals may overlap one another. That is, power terminal 1066 of switching device 1060 is highest, power terminal 1068 of switching device 1062 is at an intermediate height, and power terminal 1070 is at a lowest height. Accordingly, the power terminals may be stacked on top of one another and connected via a single connecting pin 1036. As may be appreciated, single-pole switching devices may be arranged to fit within the physical constraints of certain housings and may do so by reducing wiring through direct connections via power terminals with a single connector pin 1036.

Additionally, FIG. 80 illustrates single-pole switching devices 1072, 1074, and 1076 that include power terminals 1078, 1080, and 1082 located at the same heights. As described above, a bus bar may be used to connect power terminals that do not overlap. For example, in the depicted embodiment, the three power terminals 1078, 1080, and 1082 are connected via a "T" bus bar 1084 that aligns with apertures 1038 and secured with connecting pins 1036. Using the above configurations to connect the single-pole switching devices may provide the benefit of reducing wiring complexity when arranging certain motor starters.

Provided System Improvements

Moreover, the techniques described herein may facilitate improved operation of one or more components in the system 10. In some embodiments, sniffing techniques may be used to facilitate controlling temperature of a load 14, particularly when the load 14 is not in operation. For example, control circuitry 18 may instruct single pole switching devices (e.g., 576, 578, or 580) to periodically conduct current through windings in an electric motor 24, thereby heating the windings. In some embodiments, heating the windings may facilitate subsequent startup of the motor 24, particularly in cold environments.

Figure 81:
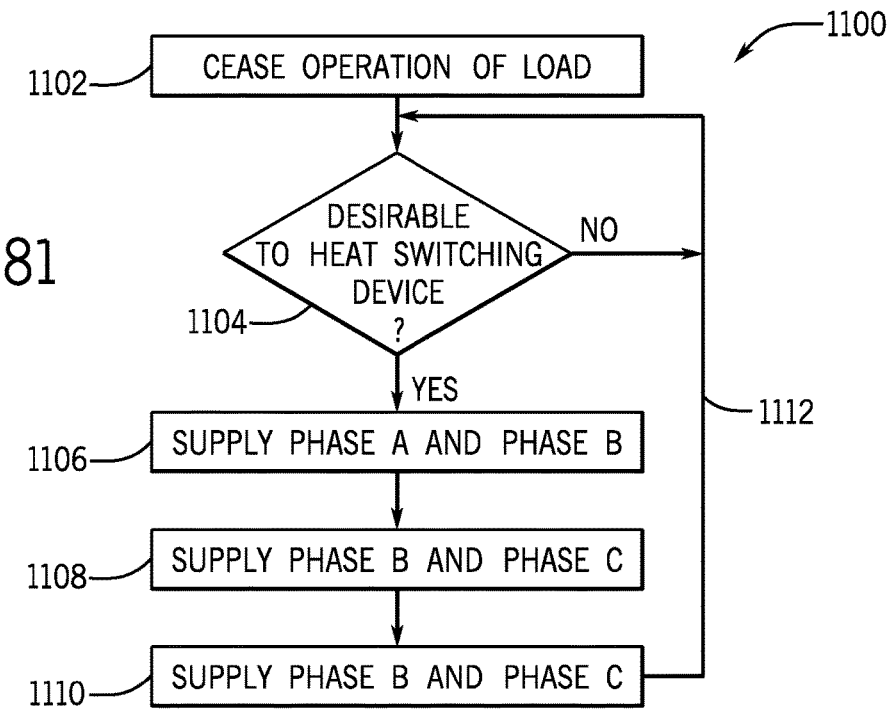
FIG. 81 is a block diagram of logic for controlling temperature of an electric motor, in accordance with an embodiment.

To help illustrate, one embodiment of a process 1100 for maintaining temperature in an electric motor is described in FIG. 81. Generally, process 1100 includes ceasing operation of a load (process block 1102) and determining whether desirable to heat the load (decision block 1104). When desirable to heat the load, the process 1100 further includes supplying a first phase and a second phase of electric power (process block 1106), supplying the first phase and a third phase of electric power (process block 1108), and supplying the second phase and the third phase of electric power (process block 1110). The process 1100 may be implemented via computer-readable instructions stored in a non-transitory article of manufacture (e.g., the memory 226, 20, 46 and/or other memories) and executed via processor 224, 19, 45 and/or other control circuitry.

Accordingly, control circuitry 18 may instruct an electric motor 24 to cease operation (process block 1102). In some embodiments, the control circuitry 18 may cease operation of the electric motor 24 by instructing one or more switching devices (e.g., single pole switching devices 576, 578, and 580) to open, thereby disconnecting electric power from the motor 24.

The control circuitry 18 may then determine whether it is desirable to heat the electric motor 24 (decision block 1104). In some embodiments, the control circuitry 18 may determine temperature of the electric motor 24 via a temperature sensor. In such embodiments, the control circuitry 18 may determine that it is desirable to heat the electric motor 24 when the temperature of the motor 24 reaches a threshold. Additionally or alternatively, the control circuitry 18 may periodically determine that it is desirable to heat the electric motor, for example, based on a timer.

When not desirable to heat the electric motor, control circuitry 18 may continue waiting until heating is desired (arrow 1112). In some embodiments, the control circuitry 18 may periodically poll the temperature sensors to determine whether temperature has reached the threshold.

On the other hand, when heating is desirable, the control circuitry 18 may instruct the one or more switching devices to connect a first phase (e.g., phase A) and a second phase (e.g., phase B) of electric power to a first winding in the motor 24 for the short duration (process block 1106). For example, in some embodiments the control circuitry 18 may instruct the first single pole switching device 576 and the second single pole switching device 578 to close for a short duration (e.g., sniff) at a first time. In this manner, the first winding may be heated due to conduction of current.

Additionally, the control circuitry 18 may instruct the one or more switching devices to connect the first phase (e.g., phase A) and a third phase (e.g., phase C) of electric power to a second winding in the motor 24 for the short duration (process block 1108). For example, in some embodiments, the control circuitry 18 may instruct the first single pole switching device 576 and the third single pole switching device 580 to close for a short duration (e.g., sniff) at a second time. In this manner, the second winding may be heated due to conduction of current.

Furthermore, the control circuitry 18 may instruct the one or more switching devices to connect the second phase (e.g., phase B) and the third phase (e.g., phase C) of electric power to a third winding in the motor 24 for the short duration (process block 1110). For example, in some embodiments, the control circuitry 18 may instruct the second single pole switching device 578 and the third single pole switching device 580 to close for a short duration (e.g., sniff) at a third time. In this manner, the third winding may be heated due to conduction of current.

As described above, supplying two phases of electric power when the motor 24 is stationary may be insufficient to begin rotation of the motor 24. As such, the heating of the windings may be performed while maintaining the motor 24 stationary (e.g., non-operational). Additionally, in some embodiments, heating of the electric motor 24 may be coordinated with testing for phase-to-ground faults and/or phase-to-phase faults. Accordingly, the control circuitry 18 may instruct each pair of the single pole switching device 576, 578, and 580 to close based at least in part on a predicted current-zero crossing, thereby reducing impact of any potential faults.

Moreover, even when the load 14 is in operation (e.g., electric motor 24 is rotating), the temperature of the load 14 may be controlled to improve operation. For example, when an electric motor 24 is connected in a partial wye, a partial delta, or a mixed wye-delta configuration, the electric power supplied to each of the windings may vary. As such, the temperature of each winding may differ based at least in part on the amount of conducted electric power. Thus, to facilitate maintaining approximately equal temperature between the windings, a wye-delta starter may periodically rotate which windings are connected in what configuration, particularly remaining in a configuration for an extended period.

For example, in a configuration where the wye-delta starter only connects one winding in a delta configuration (e.g., a partial delta configuration described in FIG. G), the wye-delta starter may periodically change which winding is connected in the delta configuration. More specifically, the wye-delta starter may periodically rotate between connecting the first winding 386 in the delta configuration, connecting the second winding 388 in the delta configuration, and connecting the third winding 390 in the delta configuration. In this manner, by connecting each winding for approximately the same duration in the delta configuration, the temperature of the windings may be maintained approximately equal. One of ordinary skill should appreciate that such a rotation between the windings may also be applicable to other partial delta configuration, partial wye configurations, and mixed wye delta configurations.

In addition to improving operation of a load 14, the techniques described herein may also facilitate improving operation of the switching devices. More specifically, oxidation may build up on contactor pads of the switching devices due to contactor contamination or environmental conditions, such as dust. Accordingly, controlled arcing may be used to clean the contactor pads by burning off oxidation, thereby improving performance and/or lifespan of the switching device.

Figure 82:
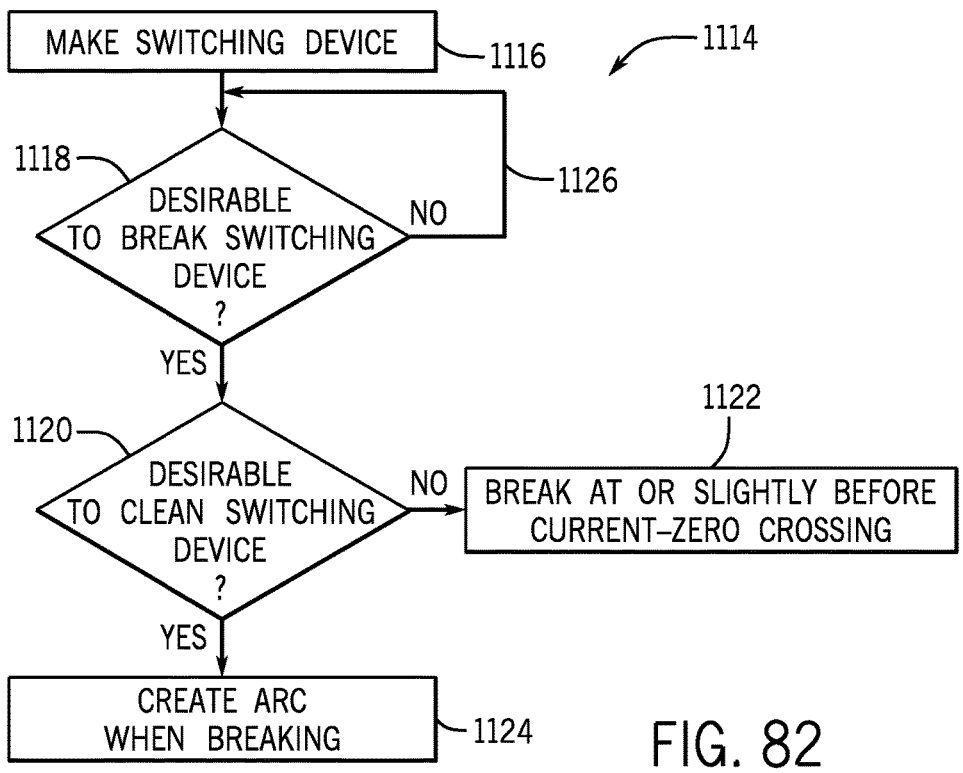
FIG. 82 is a block diagram of logic for cleaning contactor pads of a switching device, in accordance with an embodiment.

To help illustrate, one embodiment of a process 1114 for cleaning contactor pads of a switching device is described in FIG. 82. Generally, the process 1114 includes making a switching device (process block 1116) and determining when desirable to break the switching device (decision block 1118). When desired to break the switching device, the process includes determine whether desirable to clean the switching device (decision block 1120), breaking based on a current zero-crossing when not desirable to clean the switching device (process block 1122), and creating an arc when breaking when desirable to clean the switching device (process block 1124). The process 1114 may be implemented via computer-readable instructions stored in a non-transitory article of manufacture (e.g., the memory 226, 20, 46 and/or other memories) and executed via processor 224, 19, 45 and/or other control circuitry.

Accordingly, control circuitry 18 may instruct a switching device to make, thereby connecting electric power to a load 14 (process block 1116). The control circuitry 18 may then determine whether it is desirable to break the switching device (process block 1118). In some embodiments, the control circuitry 18 may determine that it is desirable to break when desirable to disconnect electric power from the load 14. If not desirable to break, the control circuitry 18 may instruct the switching device to remain closed and wait until desirable to break (arrow 1126).

On the other hand, when desirable to break, the control circuitry 18 may determine whether it is desirable to clean the switching device (decision block 1120). In some embodiments, the control circuitry 18 may determine that is desirable to clean the switching device after a set number of breaks, for example, every twentieth break. Additionally or alternatively, the control circuitry 18 may determine that it is desirable to clean based on duration the switching device has been in operation and/or duration the switching device has been closed.

When not desirable to clean, the control circuitry 18 may instruct the switching device to break based at least in part on a current zero-crossing of the conducted electric power (process block 1122). In some embodiments, the control circuitry 18 may instruct the switching device to break slightly before or at the current zero-crossing, thereby reducing the likelihood and/or magnitude of any arcing. As described above, it may be desirable to miss the mark short of the current zero-crossing and open when the current is going downward on a half cycle to the current zero-cross, as opposed to missing the mark after the current zero-crossing.

On the other when desirable to clean, the control circuitry 18 may instruct the switching device to break such that an arc is created as the contactor pads open (process block 1124). In this manner, the heat produced by the arcing may burn off any oxidation on the contactor pads, thereby cleaning the switching device. As described above, the magnitude of arcing may be directly based on where on the current waveform the switching device breaks. More specifically, the farther the break is from a subsequent current zero-crossing the larger the magnitude of produced arcing. As such, in some embodiments, the control circuitry 18 may determine when to break based on a desired amount of arcing. For example, when the switching device has not been cleaned for a longer duration, the control circuitry 18 may determine that greater amount of cleaning is desirable and break farther from the subsequent current-zero crossing.

Additionally, in some instances, arcing may cause atoms from one contactor pad to transfer to the other contactor pad. Thus, in some embodiments, the control circuitry 18 may also determine when to break the switching device based on direction desirable to transfer atoms. In fact, in some embodiments, the control system 18 may break the switching device such that the contact pads take turns being the anode and the cathode. In this manner, it may be possible to retain relatively even number of atoms on each contactor pad.

74 illustrates an embodiment where three single-pole switching devices 1014, 1016, and 1018 are used to connect and disconnect three phase power and FIG. 75 illustrates an embodiment where four single-pole switching devices 1014, 1016, 1018, and 1020 are used to connect and disconnect three phase power plus a neural (e.g., ground).

While only certain features of the disclosure have been illustrated and described herein, many modifications and changes will occur to those skilled in the art. It is, therefore, to be understood that the appended claims are intended to cover all such modifications and changes as fall within the true spirit of the disclosure.

The invention claimed is:

1. An interlock to be used in an electromechanical switching system, comprising:
   a housing;
   a first camming lockout member disposed in the housing, the first camming lockout member comprising a first actuating element extending in an axial direction and configured to contact an auxiliary operator of a first electromechanical switching device, wherein the first camming lockout member pivots in a plane within the housing, wherein the axial direction is perpendicular to the plane and extends into the first electromechanical switching device when the housing is attached to the first electromechanical switching device; and
   a second camming lockout member disposed in the housing, the second camming lockout member comprising a second actuating element extending in the axial direction and configured to contact an auxiliary operator of a second electromechanical switching device;
   wherein the first camming lockout member contacts the second camming lockout member when the first actuating element is moved to an actuated position by the first electromechanical switching device to block movement of the second camming lockout member to an actuated position;
   wherein the first actuating element and the second actuating element are disposed though a common axis in the axial direction to align co-axially such that a center of the first actuating element and a center of the second actuating element align through the common axis when neither the first actuating element is actuated by the first electromechanical switching device or the second actuating element is actuated by the second electromechanical switching device.

2. The interlock of claim 1, wherein the housing comprises two substantially identical housing halves.

3. The interlock of claim 1, wherein the first camming lockout member and the second camming lockout member are substantially identical.

4. The interlock of claim 1, wherein the housing has apertures on sides thereof to:
   enable mechanical connection of the first camming lock member with the first auxiliary operator of the first electromechanical switching device; and
   enable mechanical connection of the second camming lockout member with the second auxiliary operator of the second electromechanical switching device.

5. The interlock of claim 1, wherein the housing is configured to be sandwiched between the first electromechanical switching device and the second electromechanical switching device.

6. The interlock of claim 1, wherein the first camming lockout member and the second camming lockout member are pivotally mounted within the housing.

7. An electromechanical switching system, comprising:
- a first electromechanical switching device having a first auxiliary operator accessible from a side thereof and energizable to shift from an open configuration to a closed configuration to facilitate conducting electrical current from a source to a load;
- a second electromechanical switching device having a second auxiliary operator accessible from a side thereof energizable to shift from an open configuration to a closed configuration to facilitate conducting electrical current from the source to the load; and
- an interlock sandwiched between the first electromechanical switching device and the second electromechanical switching device; wherein the interlock comprises a housing, a first camming lockout member disposed in the housing; wherein the first camming lockout member comprises a first actuating element extending in an axial direction contacting the first auxiliary operator, and a second camming lockout member disposed in the housing, wherein the first camming lockout member pivots in a plane within the housing, wherein the axial direction is perpendicular to the plane and extends into the first electromechanical switching device; wherein the second camming lockout member comprises a second actuating element extending in the axial direction contacting the second auxiliary operator; wherein the first actuating element and the second actuating element are disposed through a common axis in the axial direction to align co-axially such that a center of the first actuating element and a center of the second actuating element align through the common axis when neither the first actuating element is actuated by the first electromechanical switching device or the second actuating element is actuated by the second electromechanical switching device thereby allowing modularity between the interlock and electromechanical switching devices in multiple configurations; and
- wherein the first camming lockout member contacts the second camming lockout member when the first actuating element is moved to an actuated position by movement of the first electromechanical switching device to the closed configuration to block movement of the second camming lockout member to an actuated position and thereby to block movement of the second electromechanical switching device to the closed configuration.

8. The system of claim 7, wherein the first camming lockout member and the second camming lockout member are substantially identical.

9. The system of claim 7, wherein the housing has apertures on sides thereof to:
- enable mechanical connection of the first camming lock member with the first auxiliary operator of the first electromechanical switching device; and
- enable mechanical connection of the second camming lockout member with the second auxiliary operator of the second electromechanical switching device.

10. The system of claim 7, wherein the first camming lockout member and the second camming lockout member are pivotally mounted within the housing.

11. The system of claim 7, wherein each of the first electromechanical switching device and the second electromechanical switching device comprises a single pole, single current-carrying path device.

12. The system of claim 7, wherein the first electromechanical switching device and the second electromechanical switching device are substantially identical.

13. An electromechanical switching system, comprising:
- a first electromechanical switching device having a first auxiliary operator accessible from a side thereof and energizable to shift from an open configuration to a closed configuration to facilitate conducting electrical current from a source to a load;
- a second electromechanical switching device having a second auxiliary operator accessible from a side thereof energizable to shift from an open configuration to a closed configuration to facilitate conducting electrical current from the source to the load; and
- an interlock sandwiched between the first electromechanical switching device and the second electromechanical switching device; wherein the interlock comprises a housing, a first camming lockout member disposed in the housing, wherein the first camming lockout member comprises a first actuating element extending in an axial direction contacting the first auxiliary operator, and a second camming lockout member disposed in the housing, wherein the first camming lockout member pivots in a plane within the housing, wherein the axial direction is perpendicular to the plane and extends into the first electromechanical switching device; wherein the second camming lockout member comprises a second actuating element extending in the axial direction contacting the second auxiliary operator; wherein the first actuating element and the second actuating element are disposed though a common axis in the axial direction to align co-axially such that a center of the first actuating element and a center of the second actuating element align through the common axis when neither the first actuating element is actuated by the first electromechanical switching device or the second actuating element is actuated by the second electromechanical switching device thereby allowing modularity between the interlock and electromechanical switching devices in multiple configurations;
- wherein each of the first electromechanical switching device and the second electromechanical switching device comprises a single pole, single current-carrying path device electrically coupled to provide power to one phase conductor of a load; and
- wherein the first camming lockout member contacts the second camming lockout member when the first actuating element is moved to an actuated position by movement of the first electromechanical switching device to the closed configuration to block movement of the second camming lockout member to an actuated position and thereby to block movement of the second electromechanical switching device to the closed configuration.

14. The system of claim 13, wherein the system comprises a wye-delta motor starter, and wherein the first electromechanical switching device and the second electromechanical switching device are electrically coupled to provide alternative paths used to supply electrical power to a motor winding.

15. The system of claim 13, wherein the system comprises a motor reverser, and wherein the first electromechanical switching device and the second electromechanical switching device are electrically coupled to provide alternative paths used to supply electrical power to a motor winding.

16. The system of claim 13, wherein the system comprises a motor drive bypass, and wherein the first electromechanical switching device and the second electromechanical switching device are electrically coupled to provide alternative paths used to supply electrical power to a motor winding.

17. The system of claim 13, wherein the first camming lockout member and the second camming lockout member are substantially identical.

18. The system of claim 13, wherein the housing has apertures on sides thereof to enable mechanical connection of the first camming lock member with the first auxiliary operator of the first electromechanical switching device; and enable mechanical connection of the second camming lockout member with the second auxiliary operator of the second electromechanical switching device.

19. The system of claim 13, wherein the first camming lockout member and the second camming lockout member are pivotally mounted within the housing.

20. The interlock of claim 1, wherein the first actuating element and the second actuating element align co-axially such that they overlap completely with respect to one another in the axial direction, wherein the first actuating element is configured to contact the auxiliary operator of the first electromechanical switching device and the second actuating element is configured to contact the auxiliary operator of the second electromechanical switching device such that the first electromechanical switching device and the second electromechanical switching device are aligned in the axial direction and facing the same direction.

21. The interlock of claim 1, wherein the first actuating element protrudes beyond a first face of the housing, and the second actuating element protrudes beyond a second face of the housing, wherein the first face of the housing and the second face of the housing are located on opposing sides of the housing.

* * * * *